United States Patent
Watabe et al.

(10) Patent No.: US 11,985,892 B2
(45) Date of Patent: May 14, 2024

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Takeyoshi Watabe, Kanagawa (JP); Ryohei Yamaoka, Kanagawa (JP); Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 459 days.

(21) Appl. No.: 16/645,104

(22) PCT Filed: Sep. 5, 2018

(86) PCT No.: PCT/IB2018/056757
§ 371 (c)(1),
(2) Date: Mar. 6, 2020

(87) PCT Pub. No.: WO2019/053559
PCT Pub. Date: Mar. 21, 2019

(65) Prior Publication Data
US 2021/0384442 A1      Dec. 9, 2021

(30) Foreign Application Priority Data

Sep. 12, 2017  (JP) .................................. 2017-174456
Dec. 1, 2017   (JP) .................................. 2017-231719
(Continued)

(51) Int. Cl.
*H01L 29/08*      (2006.01)
*H10K 85/30*      (2023.01)
(Continued)

(52) U.S. Cl.
CPC ....... *H10K 85/6572* (2023.02); *H10K 85/342* (2023.02); *H10K 85/631* (2023.02);
(Continued)

(58) Field of Classification Search
CPC ............. H01L 51/0072; H01L 51/0059; H01L 51/0067; H01L 51/0074; H01L 51/0085;
(Continued)

(56) References Cited

U.S. PATENT DOCUMENTS 6,762,553 B1   7/2004 Yokogawa et al.
7,148,508 B2   12/2006 Miyazawa
(Continued)

FOREIGN PATENT DOCUMENTS

CN   101868868 A   10/2010
CN   102244202 A   11/2011
(Continued)

OTHER PUBLICATIONS

Shin, H. et al., "Sky-Blue Phosphorescent OLEDs with 34.1% External Quantum Efficiency Using a Low Refractive Index Electron Transporting Layer," Advanced Materials, Jun. 22, 2016, vol. 28, No. 24, pp. 4920-4925.
(Continued)

*Primary Examiner* — Ismail A Muse
(74) *Attorney, Agent, or Firm* — Husch Blackwell LLP

(57) ABSTRACT

A light-emitting device with high outcoupling efficiency is provided.
In the light-emitting device including a light-emitting layer between a pair of electrodes, a low refractive index layer containing an organic compound and an inorganic compound is provided between the light-emitting layer and an anode or between the light-emitting layer and a cathode, and
(Continued)

the low refractive index layer has a refractive index of less than or equal to 1.80 at a wavelength of light extracted from the light-emitting layer.

20 Claims, 69 Drawing Sheets

(30) Foreign Application Priority Data

Mar. 2, 2018 (JP) .................. 2018-037254
May 21, 2018 (JP) .................. 2018-096997

(51) Int. Cl.
| | |
|---|---|
| H10K 85/60 | (2023.01) |
| B82Y 20/00 | (2011.01) |
| H10K 50/11 | (2023.01) |
| H10K 50/115 | (2023.01) |
| H10K 50/16 | (2023.01) |
| H10K 50/858 | (2023.01) |
| H10K 101/10 | (2023.01) |
| H10K 101/40 | (2023.01) |

(52) U.S. Cl.
CPC ....... *H10K 85/654* (2023.02); *H10K 85/6576* (2023.02); *B82Y 20/00* (2013.01); *H10K 50/11* (2023.02); *H10K 50/115* (2023.02); *H10K 50/16* (2023.02); *H10K 50/858* (2023.02); *H10K 2101/10* (2023.02); *H10K 2101/40* (2023.02)

(58) Field of Classification Search
CPC ............. H01L 51/5004; H01L 51/5016; H01L 51/502; H01L 51/5072; H01L 51/5275; H01L 51/5265; H01L 27/32; H01L 27/3225; H01L 51/5056; H01L 51/5088; H01L 51/5215; H01L 51/5218; H01L 51/5231; B82Y 20/00; G09F 9/33; H05B 33/02; H05B 33/24; H05B 33/26; H05B 33/28
See application file for complete search history.

(56) References Cited

U.S. PATENT DOCUMENTS

| | | | |
|---|---|---|---|
| 7,202,504 | B2 | 4/2007 | Ikeda et al. |
| 7,529,102 | B2 | 5/2009 | Miyazawa |
| 7,696,519 | B2 | 4/2010 | Miyazawa |
| 7,696,524 | B2 | 4/2010 | Ikeda et al. |
| 8,212,280 | B2 | 7/2012 | Ikeda et al. |
| 8,436,390 | B2 | 5/2013 | Ikeda et al. |
| 8,563,143 | B2 | 10/2013 | Park et al. |
| 8,669,579 | B2 | 3/2014 | Ikeda et al. |
| 8,759,819 | B2 | 6/2014 | Nishimura et al. |
| 8,809,891 | B2 | 8/2014 | Ikeda et al. |
| 8,956,738 | B2 | 2/2015 | Begley et al. |
| 9,054,319 | B2 | 6/2015 | Nishimura et al. |
| 9,105,855 | B2 | 8/2015 | Ikeda et al. |
| 9,209,426 | B2 | 12/2015 | Suzuki et al. |
| 9,349,775 | B2 | 5/2016 | Ikeda et al. |
| 9,401,483 | B2 | 7/2016 | Suzuki et al. |
| 9,614,012 | B2 | 4/2017 | Ikeda et al. |
| 9,660,213 | B2 | 5/2017 | Ohuchi et al. |
| 9,818,984 | B2 | 11/2017 | Mizuno |
| 10,784,465 | B2 | 9/2020 | Ikeda et al. |
| 11,063,236 | B2 | 7/2021 | Ikeda et al. |
| 11,683,952 | B2 | 6/2023 | Ikeda et al. |
| 2006/0119255 | A1 | 6/2006 | Kimura |
| 2007/0055085 | A1 | 3/2007 | Kubota et al. |
| 2007/0092759 | A1 | 4/2007 | Begley et al. |
| 2007/0207347 | A1 | 9/2007 | Begley et al. |
| 2009/0167156 | A1 | 7/2009 | Kawamura et al. |
| 2010/0301744 | A1 | 12/2010 | Osaka et al. |
| 2012/0080667 | A1 | 4/2012 | Nowatari et al. |
| 2012/0235197 | A1 | 9/2012 | Okuyama |
| 2014/0131680 | A1* | 5/2014 | Nishimura ............. C09K 11/06 257/40 |
| 2015/0008409 | A1 | 1/2015 | Ito et al. |
| 2015/0041795 | A1 | 2/2015 | Suzuki et al. |
| 2015/0194621 | A1* | 7/2015 | Nishimura .......... H01L 51/0072 257/40 |
| 2015/0287928 | A1* | 10/2015 | Kubota ............... H01L 51/0058 585/26 |
| 2015/0372258 | A1* | 12/2015 | Mizuno ................ H10K 50/818 257/40 |
| 2016/0043146 | A1* | 2/2016 | Uesaka .................. H10K 50/11 257/40 |
| 2016/0093678 | A1 | 3/2016 | Seo et al. |
| 2017/0062749 | A1 | 3/2017 | Seo et al. |
| 2017/0244059 | A1 | 8/2017 | Sasaki et al. |
| 2018/0240982 | A1* | 8/2018 | Kim ..................... C07D 265/38 |

FOREIGN PATENT DOCUMENTS

| | | |
|---|---|---|
| CN | 103682137 A | 3/2014 |
| CN | 104282835 A | 1/2015 |
| CN | 106486607 A | 3/2017 |
| EP | 1 748 505 A2 | 1/2007 |
| EP | 2 221 896 A1 | 8/2010 |
| JP | 2004-004610 A | 1/2004 |
| JP | 2004-079422 A | 3/2004 |
| JP | 2005-220088 A | 8/2005 |
| JP | 2006-004917 A | 1/2006 |
| JP | 2006-135101 A | 5/2006 |
| JP | 2007-036175 A | 2/2007 |
| JP | 2007-242927 A | 9/2007 |
| JP | 2008-270225 A | 11/2008 |
| JP | 2009-514222 | 4/2009 |
| JP | 2010-135841 A | 6/2010 |
| JP | 2013-033706 A | 2/2013 |
| JP | 2013-051155 A | 3/2013 |
| JP | 2013-172071 A | 9/2013 |
| JP | 2014-032851 A | 2/2014 |
| JP | 2014-192214 A | 10/2014 |
| JP | 2014-207356 A | 10/2014 |
| JP | 2015-029089 A | 2/2015 |
| JP | 2015-144233 A | 8/2015 |
| KR | 2014-0091807 A | 7/2014 |
| KR | 2015-0005453 A | 1/2015 |
| KR | 2015-0018437 A | 2/2015 |
| WO | WO 2007/050334 A1 | 5/2007 |
| WO | WO 2011/044009 A1 | 4/2011 |
| WO | WO 2013/128504 A1 | 9/2013 |
| WO | WO 2013/172835 A1 | 11/2013 |
| WO | WO 2014/171313 A1 | 10/2014 |

OTHER PUBLICATIONS

International Search Report re Application No. PCT/IB2018/056757, dated Dec. 25, 2018.
Written Opinion re Application No. PCT/IB2018/056757, dated Dec. 25, 2018.
Lee, J. et al., "Synergetic Electrode Architecture for Efficient Graphene-Based Flexible Organic Light-Emitting Diodes," Nature Communications, Jun. 2, 2016, vol. 7, pp. 11791-1-11791-9.
Shun, H. et al., "Sky-Blue Phosphorescent OLEDs with 34.1% External Quantum Efficiency Using a Low Refractive Index Electron Transporting Layer," Advanced Materials, Jun. 22, 2016, vol. 28, No. 24, pp. 4920-4925.
Fuchs, C. et al., "Enhanced Light Emission from Top-Emitting Organic Light-Emitting Diodes by Optimizing Surface Plasmon Polariton Losses," Physical Review. B, Dec. 11, 2015, vol. 92, pp. 245306-1-245306-10.
Chinese Office Action (Application No. 201880059333.8) dated Mar. 18, 2023.

* cited by examiner

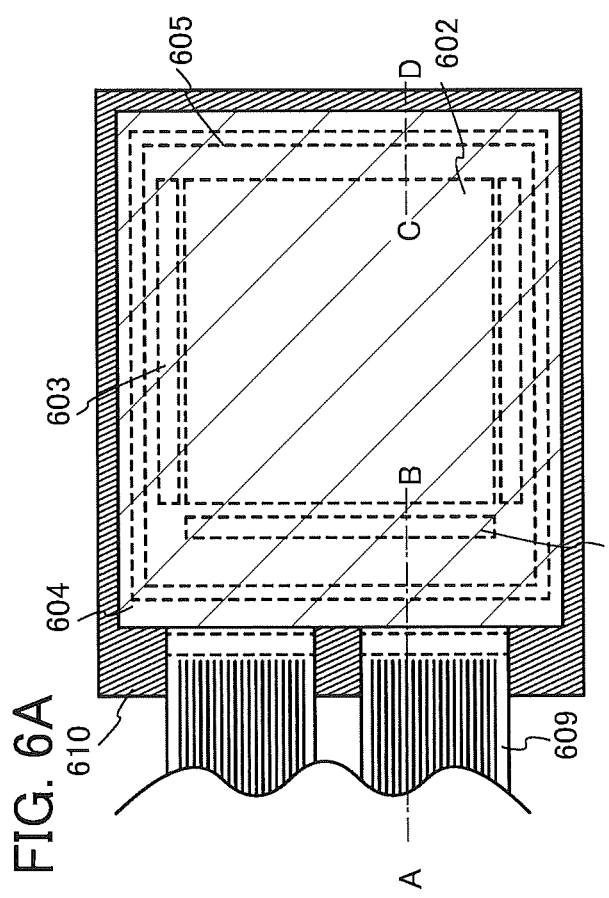
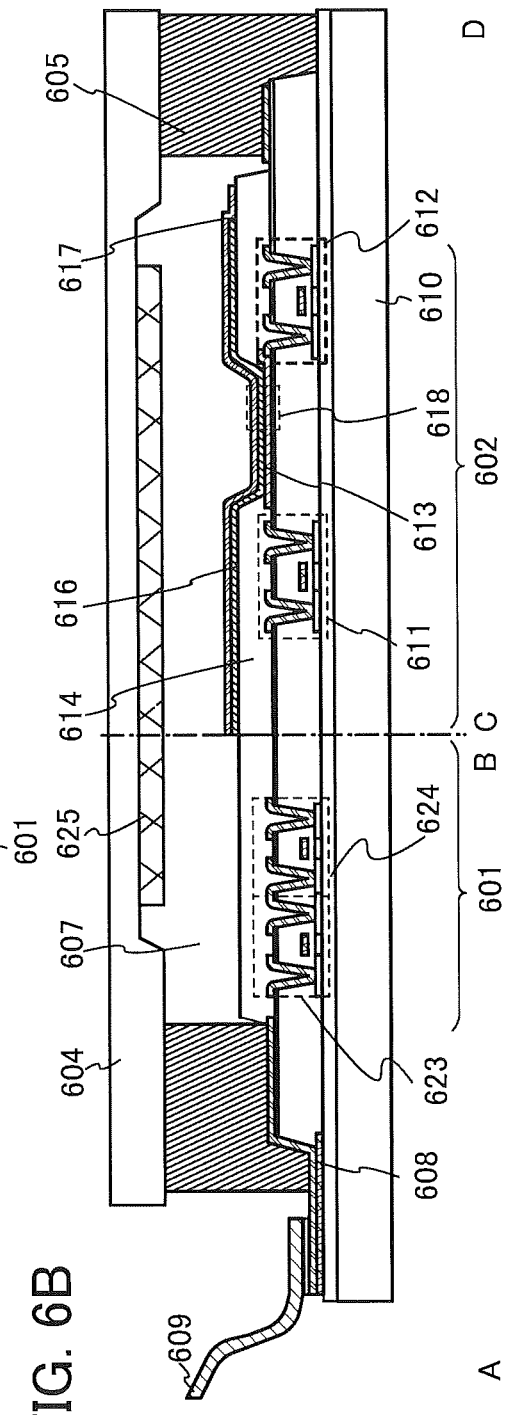
FIG. 6A
FIG. 6B

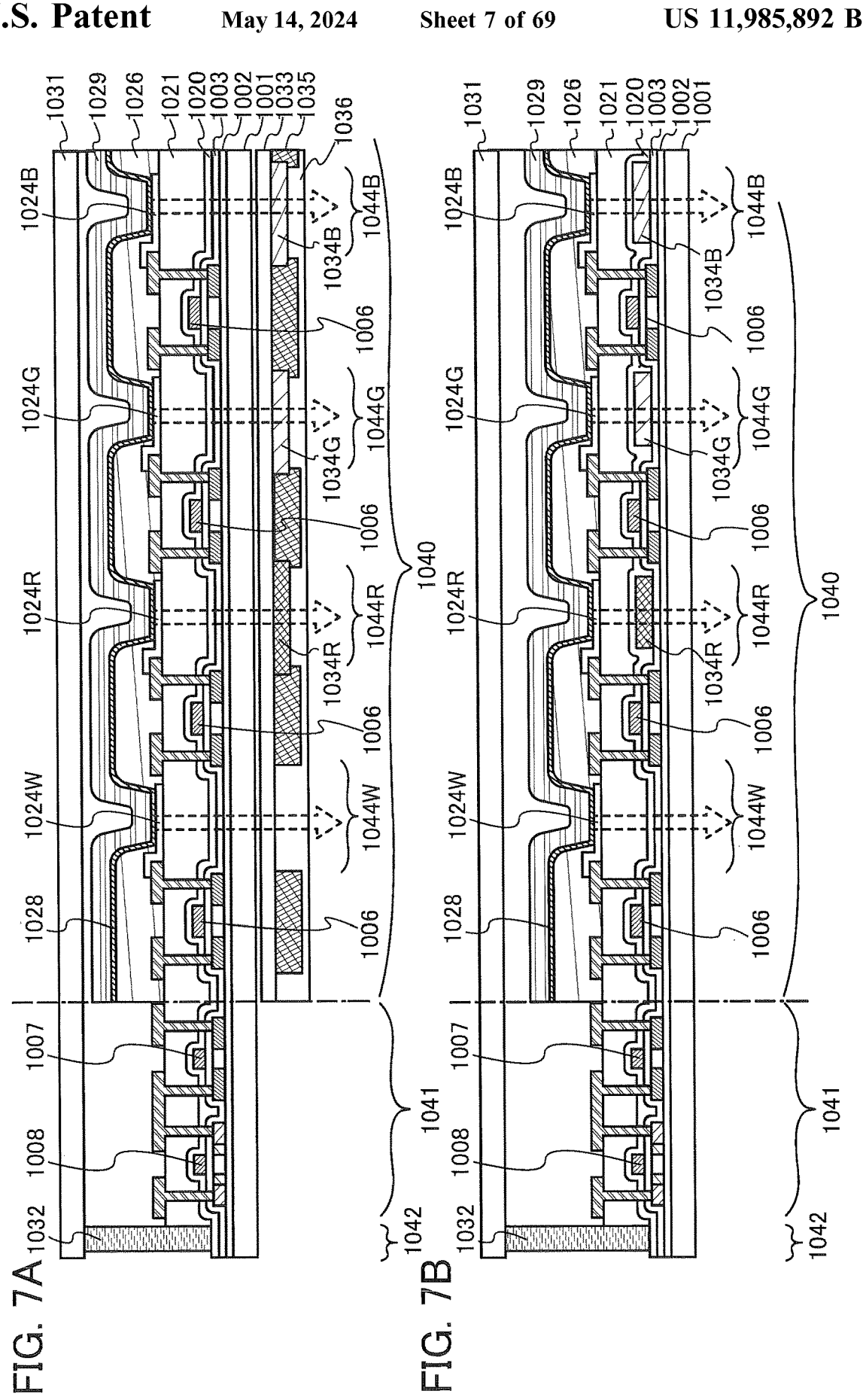

FIG. 48A
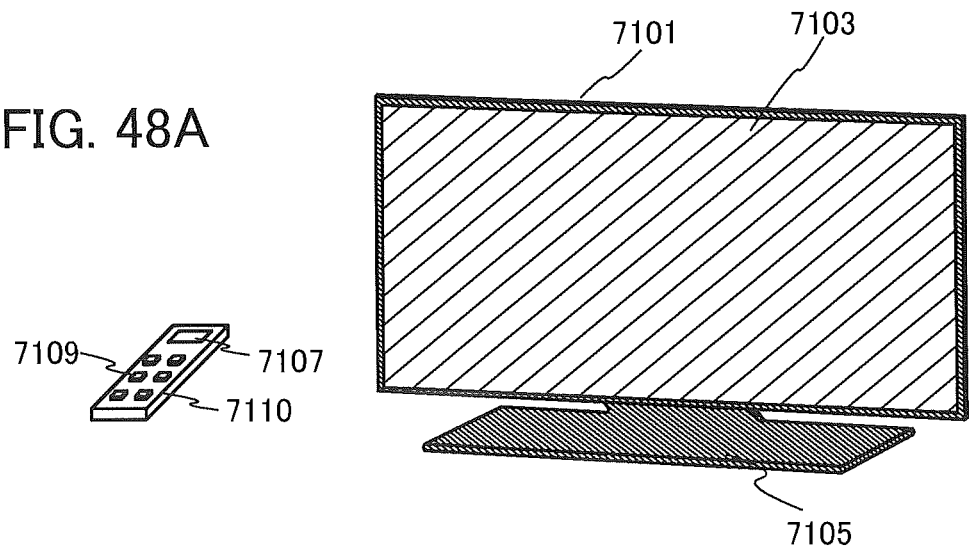
FIG. 48B1
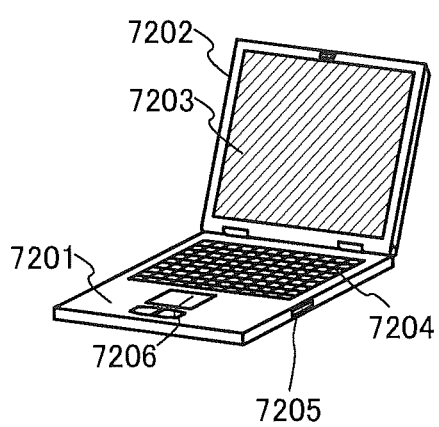
FIG. 48B2
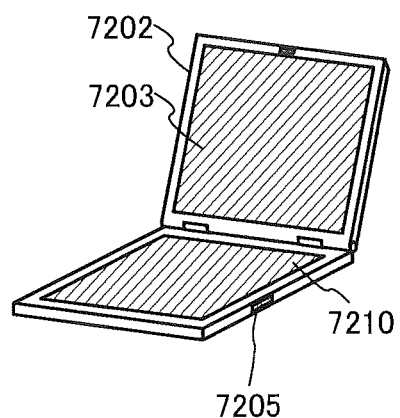
FIG. 48C
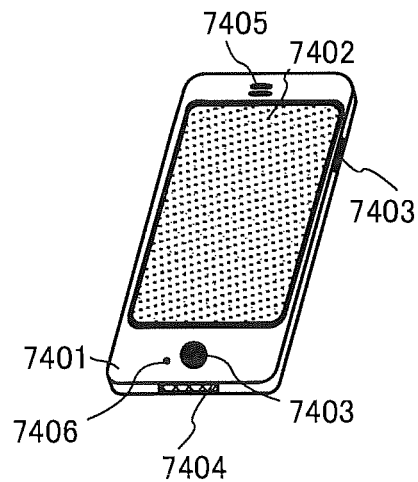

US 11,985,892 B2

LIGHT-EMITTING DEVICE, LIGHT-EMITTING APPARATUS, ELECTRONIC DEVICE, AND LIGHTING DEVICE

This application is a 371 of international application PCT/IB2018/056757 filed on Sep. 5, 2018 which is incorporated herein by reference.

TECHNICAL FIELD

One embodiment of the present invention relates to a novel light-emitting device. Another embodiment of the present invention relates to a light-emitting device including a low refractive index layer between a pair of electrodes. Another embodiment of the present invention relates to a light-emitting apparatus, an electronic device, and a lighting device each including the light-emitting device.

Note that one embodiment of the present invention is not limited to the above technical field. One embodiment of the present invention relates to an object, a method, or a manufacturing method. The present invention relates to a process, a machine, manufacture, or a composition of matter. In particular, one embodiment of the present invention relates to a semiconductor device, a light-emitting apparatus, a display device, a lighting device, a light-emitting device, or a manufacturing method thereof.

BACKGROUND ART

Light-emitting devices (organic EL devices) that use organic compounds and utilize electroluminescence (EL) have been put into practical use. In the basic structure of such light-emitting devices, a semiconductor layer containing an organic compound is interposed between a pair of electrodes.

Such light-emitting devices have various advantages such as light weight, flexibility, good design, and applicability of an application process, and thus have been actively researched and developed. In particular, light-emitting devices are of self-light-emitting type, and have advantages such as high visibility and no need for backlight when used for pixels of a display; accordingly, the light-emitting devices are suitable as flat panel display elements.

In such light-emitting devices, an organic semiconductor layer obtained by thinning an organic compound is mainly formed, and the organic compound and the layer structure significantly affect the light-emitting devices; thus, selection of the organic compound and the layer structure is important. Furthermore, a structure with high outcoupling efficiency is crucial for light-emitting devices.

Various methods for improving the outcoupling efficiency of an organic EL device have been proposed. For example, in Patent Document 1, the outcoupling efficiency is improved by formation of unevenness on part of an electrode or an EL layer. In Patent Document 2, the outcoupling efficiency is improved by providing a low refractive index layer and a high refractive index layer outside an electrode.

Low outcoupling efficiency is often a problem in an organic EL device. In particular, attenuation due to reflection caused by a difference in refractive index is a significant factor in decreasing the efficiency of the device; thus, in order to reduce the influence, a structure in which a layer composed of a low refractive index material is formed in an EL layer has been proposed (e.g., see Non-Patent Document 1).

PRIOR ART DOCUMENTS

Patent Document

[Patent Document 1] Japanese Published Patent Application No. 2013-33706
[Patent Document 2] Japanese Published Patent Application No. 2008-270225
[Non-Patent Document 1] J.-J. Kim, Adv, Mater. 28, 4920 (2016)

SUMMARY OF THE INVENTION

Problems to be Solved by the Invention

As a method for improving the outcoupling efficiency as described above in a light-emitting device, a method in which a low refractive index layer is provided in a light-emitting device is known. However, many of materials that can be used for a low refractive index layer have a low carrier-transport property; therefore, providing a low refractive index layer between a pair of electrodes causes a problem that the carrier-transport property of a light-emitting device is inhibited. In addition, in the case where a low refractive index layer is provided outside an electrode, there is a problem that the manufacturing process becomes complicated. In view of the above, a layer structure that can be easily manufactured and allows an improvement in outcoupling efficiency is needed.

In view of the above-described problems, an object of one embodiment of the present invention is to provide a light-emitting device having high outcoupling efficiency. Another object of one embodiment of the present invention is to provide a light-emitting device including a low refractive index layer. Another object of one embodiment of the present invention is to provide a light-emitting device with a low driving voltage. Another object of one embodiment of the present invention is to provide a light-emitting device with reduced power consumption. Another object of one embodiment of the present invention is to provide a light-emitting device with high reliability. Another object of one embodiment of the present invention is to provide a light-emitting device with high emission efficiency. Another object of one embodiment of the present invention is to provide a novel light-emitting device. Another object of one embodiment of the present invention is to provide a novel electronic device. Another object of one embodiment of the present invention is to provide a novel lighting device.

Note that the description of the above objects does not disturb the existence of other objects. In one embodiment of the present invention, there is no need to achieve all of these objects. Other objects are apparent from the description of the specification and the like and can be derived from the description of the specification and the like.

Means for Solving the Problems

One embodiment of the present invention is a light-emitting device that includes a first electrode, a second electrode, a light-emitting layer, and an organic layer, and in which the light-emitting layer and a first layer are provided between the first electrode and the second electrode; the second electrode is provided between the first electrode and the organic layer; the organic layer is provided in contact with the second electrode; the first electrode has a function of reflecting light; the second electrode has a function of reflecting light and a function of transmitting light; light emission with a peak wavelength λ is obtained from the light-emitting layer; the first layer is provided in a region with an optical path length of less than or equal to λ/2 from a first electrode-side interface of the light-emitting layer or in a region with an optical path length of less than or equal to λ/2 from a second electrode-side interface of the light-emitting layer; and a refractive index of the first layer is less than or equal to 1.80.

Another embodiment of the present invention is a light-emitting device that includes a first electrode, a second electrode, a light-emitting layer, and an organic layer, and in which the light-emitting layer and a first layer are provided between the first electrode and the second electrode; the second electrode is provided between the first electrode and the organic layer; the organic layer is provided in contact with the second electrode; the first electrode has a function of reflecting light; the second electrode has a function of reflecting light and a function of transmitting light; light emission with a peak wavelength λ is obtained from the light-emitting layer; the first layer is provided in a region with an optical path length of less than or equal to λ/2 from a first electrode-side interface of the light-emitting layer or in a region with an optical path length of less than or equal to λ/2 from a second electrode-side interface of the light-emitting layer; the first layer contains a first organic compound; and a refractive index of the first organic compound is less than or equal to 1.80.

Another embodiment of the present invention is a light-emitting device that includes a first electrode, a second electrode, a third electrode, a light-emitting layer, and an organic layer, and in which the light-emitting layer and a first layer are provided between the first electrode and the second electrode; the second electrode is provided between the first electrode and the organic layer; the organic layer is provided in contact with the second electrode; the first electrode and the third electrode are in contact with each other; the first electrode has a function of reflecting light; the second electrode has a function of reflecting light and a function of transmitting light; light emission with a peak wavelength λ, is obtained from the light-emitting layer; the first layer is provided in a region with an optical path length of less than or equal to λ/2 from a first electrode-side interface of the light-emitting layer or in a region with an optical path length of less than or equal to λ/2 from a second electrode-side interface of the light-emitting layer; an optical path length from one of the first electrode-side interface and the second electrode-side interface of the light-emitting layer to the third electrode is within a range of λ/4±50 nm, an optical path length from one of the first electrode-side interface and the second electrode-side interface of the light-emitting layer to the first electrode is within a range of 3λ4±50 nm, and a refractive index of the first layer is less than or equal to 1.80.

Another embodiment of the present invention is a light-emitting device that includes a first electrode, a second electrode, a third electrode, a light-emitting layer, and an organic layer, and in which the light-emitting layer and a first layer are provided between the first electrode and the second electrode; the second electrode is provided between the first electrode and the organic layer; the organic layer is provided in contact with the second electrode; the first electrode and the third electrode are in contact with each other; the first electrode has a function of reflecting light; the second electrode has a function of reflecting light and a function of transmitting light; light emission with a peak wavelength λ is obtained from the light-emitting layer; the first layer is provided in a region with an optical path length of less than or equal to λ/2 from a first electrode-side interface of the light-emitting layer or in a region with an optical path length of less than or equal to λ/2 from a second electrode-side interface of the light-emitting layer; an optical path length from one of the first electrode-side interface and the second electrode-side interface of the light-emitting layer to the third electrode is within a range of 2.14±50 nm; an optical path length from one of the first electrode-side interface and the second electrode-side interface of the light-emitting layer to the first electrode is within a range of 3λ/4±50 nm; the first layer contains a first organic compound; and a refractive index of the first organic compound is less than or equal to 1.80.

In the above structure, the first layer preferably has a thickness of greater than or equal to 5 nm.

In the above structure, the first electrode and the second electrode are preferably an anode and a cathode, respectively.

In the above structure, the first layer preferably has a lower refractive index than the third electrode.

In the above structure, the third electrode preferably has a light-transmitting property.

In the above structure, the first organic compound preferably has an electron-donating property.

In the above structure, the first layer preferably has a lower refractive index than the light-emitting layer.

Another embodiment of the present invention is a light-emitting device that includes an anode, a cathode, and an EL layer, and in which the EL layer is positioned between the anode and the cathode; the EL layer contains an organic compound and an inorganic compound; and at least part of the inorganic compound exists in a microcrystalline state.

Another embodiment of the present invention is the light-emitting device having the above structure in which the EL layer includes a light-emitting layer, and the inorganic compound in a microcrystalline state exists between the light-emitting layer and the cathode.

Another embodiment of the present invention is the light-emitting device having the above structure in which the EL layer includes an electron-transport layer, the electron-transport layer is positioned between the light-emitting layer and the cathode, and the inorganic compound in a microcrystalline state exists in the electron-transport layer.

Another embodiment of the present invention is the light-emitting device having the above structure in which the compound in a microcrystalline state is in contact with the cathode.

Another embodiment of the present invention is a light-emitting device that includes an anode, a cathode, and an EL layer, and in which the EL layer is positioned between the anode and the cathode; the EL layer includes a light-emitting layer; and the EL layer includes a low refractive index layer containing an organic compound and an inorganic compound, between the light-emitting layer and the cathode.

Another embodiment of the present invention is the light-emitting device having the above structure in which the inorganic compound is a fluoride of an alkali metal or a fluoride of an alkaline earth metal.

Another embodiment of the present invention is the light-emitting device having the above structure in which the low refractive index layer has a refractive index of less than or equal to 1.70 at a wavelength of light extracted from the light-emitting layer.

Another embodiment of the present invention is the light-emitting device having the above structure in which the EL layer further includes an electron-transport layer, the electron-transport layer is positioned between the light-emitting layer and the cathode, and at least part of the low refractive index layer serves as the electron-transport layer.

Another embodiment of the present invention is the light-emitting device having the above structure in which the low refractive index layer is the electron-transport layer.

Another embodiment of the present invention is the light-emitting device having the above structure in which the EL layer includes a second low refractive index layer between the light-emitting layer and the anode.

Another embodiment of the present invention is the light-emitting device having the above structure in which the EL layer includes the low refractive index layer containing a first substance, a second substance, and a third substance, between the light-emitting layer and the anode, the first substance is a compound containing fluorine, the second substance is an organic compound having a hole-transport property, and the third substance is a substance exhibiting an electron-accepting property with respect to the second substance.

Another embodiment of the present invention is the light-emitting device having the above structure in which the first substance is a fluoride of an alkali metal, a fluoride of an alkaline earth metal, or alkyl fluoride.

Another embodiment of the present invention is the light-emitting device having the above structure in which the first substance is a fluoride of an alkaline earth metal.

Another embodiment of the present invention is the light-emitting device having the above structure in which the first substance is lithium fluoride, calcium fluoride, or magnesium fluoride.

Another embodiment of the present invention is the light-emitting device having the above structure in which the third substance is any one or more of a transition metal oxide, oxides of metals belonging to Group 4 to Group 8 in the periodic table, and an organic compound having an electron-withdrawing group.

Another embodiment of the present invention is the light-emitting device having the above structure in which the third substance is one or more kinds selected from titanium oxide, vanadium oxide, tantalum oxide, molybdenum oxide, tungsten oxide, rhenium oxide, ruthenium oxide, chromium oxide, zirconium oxide, hafnium oxide, silver oxide, 7,7,8,8-tetracyano-2,3,5,6-tetrafluoroquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and α,α',α''-1,2,3-cyclopropanetriylidenetris[4-cyano-2,3,5,6-tetrafluorobenzeneacetonitrile].

Another embodiment of the present invention is the light-emitting device having the above structure in which the third substance is molybdenum oxide.

Another embodiment of the present invention is the light-emitting device having the above structure in which the second substance is a λ-electron rich heteroaromatic compound or an aromatic amine compound.

Another embodiment of the present invention is the light-emitting device having the above structure in which the second substance has a HOMO level of higher than or equal to −5.7 eV.

Another embodiment of the present invention is the light-emitting device having the above structure in which the second substance has a HOMO level of higher than or equal to −5.5 eV.

Another embodiment of the present invention is the light-emitting device having the above structure in which the low refractive index layer has a refractive index of less than or equal to 1.70.

Another embodiment of the present invention is the light-emitting device having the above structure in which the EL layer includes a hole-transport layer between the light-emitting layer and the low refractive index layer, and the hole-transport layer contains an organic compound having a hole-transport property.

Another embodiment of the present invention is the light-emitting device having the above structure in which the EL layer includes a hole-injection layer in contact with the anode, the hole-injection layer includes a first hole-injection layer and a second hole-injection layer, the first hole-injection layer is positioned between the second hole-injection layer and the anode, the first hole-injection layer is the low refractive index layer, the second hole-injection layer contains a fourth substance and a fifth substance, the fourth substance is an organic compound having a hole-transport property, and the fifth substance is a substance exhibiting an acceptor property with respect to the fourth substance.

Another embodiment of the present invention is the light-emitting device having the above structure in which the fifth substance and the third substance are the same.

Another embodiment of the present invention is a light-emitting device that includes an anode, a cathode, and an EL layer, and in which the EL layer is positioned between the anode and the cathode; the EL layer contains an organic compound and an inorganic compound; the inorganic compound is a fluoride of an alkali metal or a fluoride of an alkaline earth metal; and when analyzed by energy dispersive X-ray spectrometry, the EL layer includes a portion where the number of fluorine atoms is larger than that of nitrogen atoms.

Another embodiment of the present invention is the light-emitting device having the above structure in which the number of fluorine atoms is three times or more that of nitrogen atoms.

Another embodiment of the present invention is the light-emitting device having the above structure in which the EL layer includes a light-emitting layer, and the portion where the number of fluorine atoms is larger than that of nitrogen atoms exists between the light-emitting layer and the cathode.

Another embodiment of the present invention is the light-emitting device having the above structure in which the EL layer further includes an electron-transport layer, the electron-transport layer is positioned between the light-emitting layer and the cathode, and the electron-transport layer includes the portion where the number of fluorine atoms is larger than that of nitrogen atoms.

Another embodiment of the present invention is a light-emitting device that includes an anode, a cathode, and an EL layer, and in which the EL layer is positioned between the anode and the cathode, the EL layer includes a light-emitting layer and an electron-transport layer, the electron-transport layer is positioned between the light-emitting layer and the cathode, the electron-transport layer contains an organic compound and an inorganic compound, the inorganic compound is a fluoride of an alkali metal or a fluoride of an alkaline earth metal, and a concentration of the inorganic compound in the electron-transport layer is higher than or equal to 50 vol %.

Another embodiment of the present invention is the light-emitting device having the above structure in which a concentration of the inorganic compound in the electron-transport layer is higher than or equal to 50 vol % and lower than 95 vol %.

Another embodiment of the present invention is the light-emitting device having the above structure in which the organic compound is an organic compound having an electron-transport property.

Another embodiment of the present invention is the light-emitting device having the above structure in which the organic compound is π-electron deficient heteroaromatic.

Another embodiment of the present invention is the light-emitting device having the above structure in which the organic compound has a bipyridine skeleton.

Another embodiment of the present invention is the light-emitting device having the above structure in which the organic compound has a phenanthroline skeleton.

Another embodiment of the present invention is the light-emitting device having the above structure in which the organic compound is 2,9-bis(naphthalen-2-yl)-4,7-diphenyl-1,10-phenanthroline.

Another embodiment of the present invention is the light-emitting device having the above structure in which the inorganic compound is any one of lithium fluoride, calcium fluoride, and magnesium fluoride.

Another embodiment of the present invention is an electronic device including the above light-emitting device, and a sensor, an operation button, a speaker, or a microphone.

Another embodiment of the present invention is a light-emitting apparatus including the above light-emitting device, and a transistor or a substrate.

Another embodiment of the present invention is a lighting device including the above light-emitting device, and a housing.

Another embodiment of the present invention is a material containing an organic compound and a crystallized salt of an alkali metal or a crystallized salt of an alkaline earth metal.

Another embodiment of the present invention is a material containing an organic compound and a crystallized fluoride of an alkali metal or a crystallized fluoride of an alkaline earth metal.

Another embodiment of the present invention is the material having the above structure in which the organic compound has a bipyridine skeleton.

Another embodiment of the present invention is the material having the above structure in which the organic compound has a phenanthroline skeleton.

Another embodiment of the present invention is the material having the above structure in which the organic compound is 2,9-bis(naphthalen-2-yl)-4,7-diphenyl-1,10-phenanthroline.

Another embodiment of the present invention is the material having the above structure in which the crystallized fluoride of an alkali metal or the crystallized fluoride of an alkaline earth metal is any one of lithium fluoride, calcium fluoride, and magnesium fluoride.

Another embodiment of the present invention is a material for a light-emitting device that contains the above material.

Another embodiment of the present invention is a film containing the above material.

Another embodiment of the present invention is a light-emitting device including a layer composed of the above material.

Another embodiment of the present invention is an electronic device including the light-emitting device having the above structure, and at least one of a housing and a touch sensor. Another embodiment of the present invention is a lighting device including the light-emitting device having any of the above structures, and at least one of a housing, a connection terminal, and a protective cover. The category of one embodiment of the present invention includes not only a light-emitting apparatus including a light-emitting device but also an electronic device including a light-emitting apparatus. Accordingly, a light-emitting apparatus in this specification refers to an image display device or a light source (including a lighting device). A display module in which a connector such as an FPC (Flexible Printed Circuit) or a TCP (Tape Carrier Package) is connected to a light-emitting device, a display module in which a printed wiring board is provided on the tip of a TCP, and a display module in which an IC (integrated circuit) is directly mounted on a light-emitting device by a COG (Chip On Glass) method are also embodiments of the present invention.

Effect of the Invention

One embodiment of the present invention can provide a light-emitting device having high outcoupling efficiency. Another embodiment of the present invention can provide a light-emitting device including a low refractive index layer. Another embodiment of the present invention can provide a light-emitting device with a low driving voltage. Another embodiment of the present invention can provide a light-emitting device with reduced power consumption. Another embodiment of the present invention can provide a light-emitting device with high reliability. Another embodiment of the present invention can provide a light-emitting device having high emission efficiency. Another embodiment of the present invention can provide a novel light-emitting device. Another embodiment of the present invention can provide a novel electronic device. Another embodiment of the present invention can provide a novel lighting device.

Note that the description of these effects does not disturb the existence of other effects. Note that one embodiment of the present invention does not need to have all these effects. Other effects will be apparent from the description of the specification, the drawings, the claims, and the like and can be derived from the description of the specification, the drawings, the claims, and the like.

BRIEF DESCRIPTION OF THE DRAWINGS

FIGS. 6A and 6B are conceptual views of an active matrix light-emitting apparatus of one embodiment of the present invention.

FIGS. 7A and 7B are conceptual views of active matrix light-emitting apparatuses of embodiments of the present invention.

FIGS. 48A-48C are views illustrating electronic devices of embodiments of the present invention.

MODE FOR CARRYING OUT THE INVENTION

Embodiments of the present invention are described in detail below with reference to drawings. Note that the present invention is not limited to the following description, and the modes and details of the present invention can be modified in various ways without departing from the spirit and scope of the present invention. Accordingly, the present invention should not be interpreted as being limited to the description of the embodiments below.

Note that the position, size, range, or the like of each component illustrated in drawings and the like is not accurately represented in some cases for easy understanding. Therefore, the disclosed invention is not necessarily limited to the position, size, range, or the like disclosed in drawings and the like.

In this specification and the like, the ordinal numbers such as first and second are used for convenience, and do not denote the order of steps or the stacking order of layers in some cases. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In describing structures of the invention in this specification and the like with reference to drawings, common numerals are used for the same components in different drawings in some cases.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

Examples of a refractive index n includes a refractive index of an ordinary ray, n Ordinary, a refractive index of an extraordinary ray, n Extra-ordinary, and the average of them, n average. In this specification, the simple term "refractive index" may be rephrased as n average when anisotropy analysis is not performed, and as n Ordinary when anisotropy analysis is performed. Note that anisotropy is represented by a difference between n Ordinary and n Extraordinary. Note that n average is a value obtained by dividing the sum of n Extra-ordinary and 2 n Ordinary by 3.

Note that in this specification and the like, room temperature refers to a temperature in the range of higher than or equal to 0° C. and lower than or equal to 40° C.

Embodiment 1

In this embodiment, a light-emitting device of one embodiment of the present invention is described below with reference to FIG. 1.

Figure 1A:
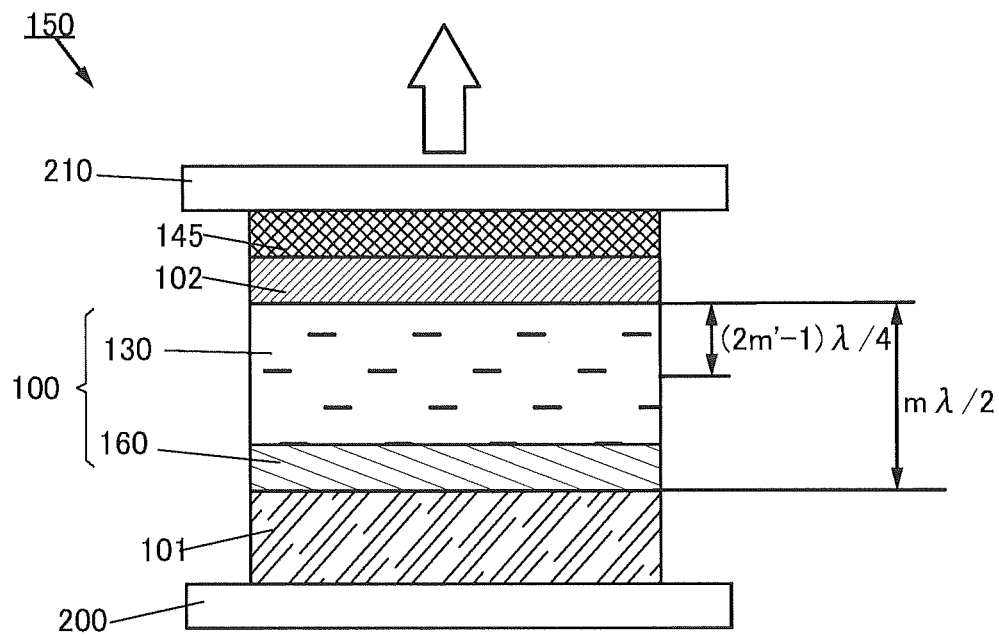
FIGS. 1A-1C are schematic cross-sectional views of light-emitting devices of embodiments of the present invention, and a diagram illustrating optical path lengths.
Figure 1B:
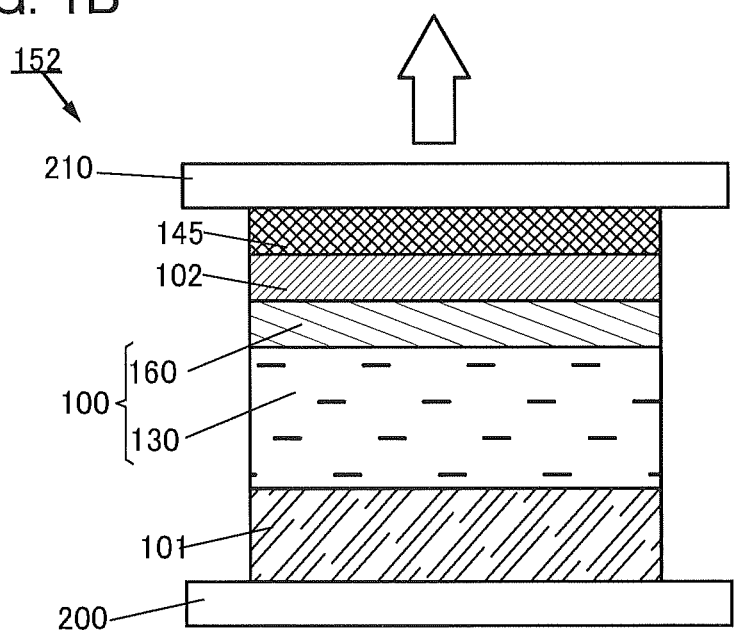

FIG. 1(A) is a schematic cross-sectional view of a light-emitting device 150 of one embodiment of the present invention.

The light-emitting device 150 includes a pair of electrodes (an electrode 101 and an electrode 102) and an EL layer 100 provided between the pair of electrodes. The EL layer 100 includes at least a light-emitting layer 130 and a low refractive index layer 160. In addition, a cap layer 145 is provided in contact with the electrode 102 and opposite to the EL layer.

Although the low refractive index layer 160 is provided between the light-emitting layer 130 and the electrode 101 in FIG. 1(A), the structure of the light-emitting device 150 is not limited thereto. The low refractive index layer 160 may be provided between the light-emitting layer 130 and the electrode 102 as in a light-emitting device 152 illustrated in FIG. 1(B).

The refractive index of the low refractive index layer 160 is preferably less than or equal to 1.80, further preferably less than or equal to 1.75, still further preferably less than or equal to 1.70.

Figure 2A:
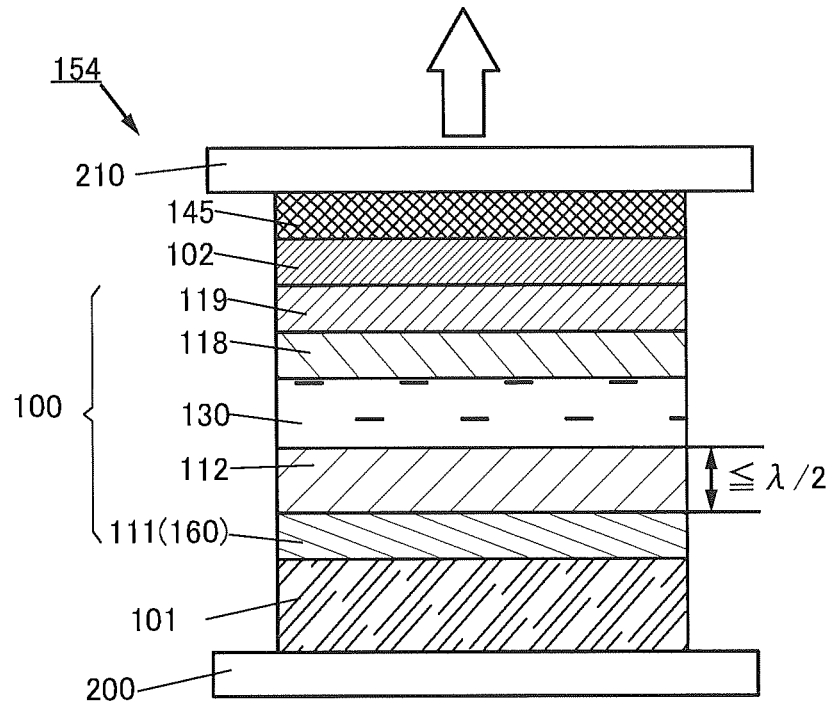
FIGS. 2A and 2B are schematic cross-sectional views of light-emitting devices of embodiments of the present invention, and diagrams illustrating optical path lengths.
Figure 2B:
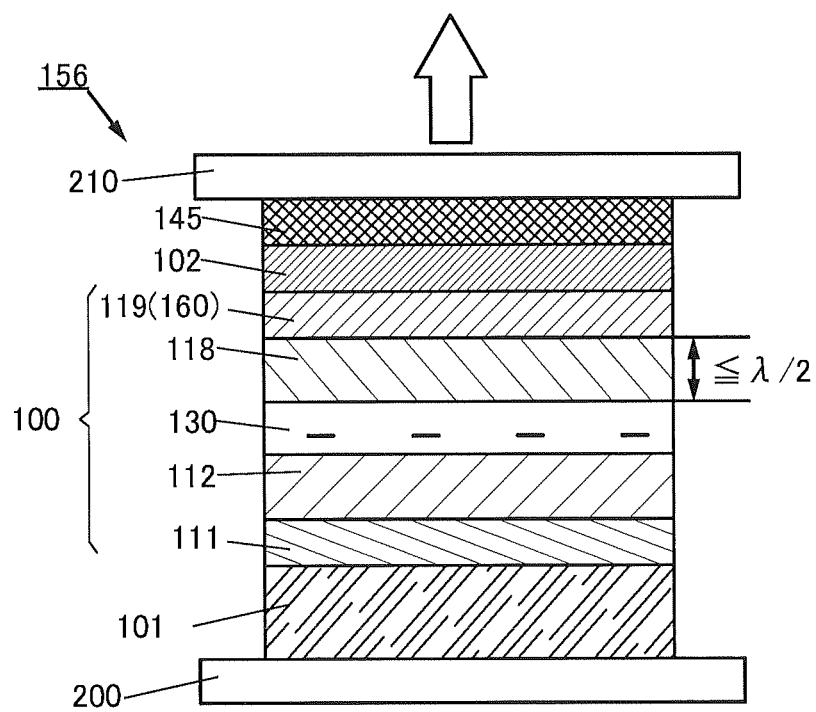

As in a light-emitting device 154 illustrated in FIG. 2(A), the EL layer 100 includes functional layers such as a hole-injection layer 111, a hole-transport layer 112, an electron-transport layer 118, and an electron-injection layer 119, and it is preferable that at least one of the hole-injection layer 111, the hole-transport layer 112, the electron-transport layer 118, and the electron-injection layer 119 have the characteristics of the low refractive index layer 160. FIG. 2(A) illustrates a structure in which the hole-injection layer 111 has the characteristics of the low refractive index layer 160, and FIG. 2(B) illustrates a structure in which the electron-injection layer 119 has the characteristics of the low refractive index layer 160.

Although description in this embodiment is given on the assumption that the electrode 101 has a function of reflecting light and the electrode 102 has a function of reflecting light and a function of transmitting light, the structure of the light-emitting device 150 is not limited thereto. In other words, the electrode 101 may have a function of reflecting light and a function of transmitting light, and the electrode 102 may have a function of reflecting light.

Although description in this embodiment is given on the assumption that the electrode 101 and the electrode 102 of the pair of electrodes serve as an anode and a cathode, respectively, the structure of the light-emitting device 150 is not limited thereto. That is, the electrode 101 may serve as a cathode, the electrode 102 may serve as an anode, and the stacking order of layers between the electrodes may be reversed. In other words, the hole-injection layer 111, the hole-transport layer 112, the light-emitting layer 130, the electron-transport layer 118, and the electron-injection layer 119 may be stacked in this order from the anode side.

Although description in this embodiment is given on the assumption that the direction of arrows shown in FIGS. 1(A) and 1(B) and FIGS. 2(A) and 2(B), i.e., the electrode 102 (cathode) side is the light extraction side, the structure of the light-emitting device 150 is not limited thereto. That is, the light extraction side may be the electrode 101 (anode) side, or light may be extracted from both the electrode 101 and the electrode 102. In the case where the light extraction side is the electrode 101 side, the cap layer 145 is preferably formed in contact with the electrode 101 and opposite to the EL layer. In the case where light is extracted from both the electrode 101 and the electrode 102, the cap layer 145 is preferably formed in contact with each of the electrode 101 and the electrode 102.

Note that the structure of the EL layer 100 is not limited to the structure shown in FIG. 1(A), and the EL layer 100 includes at least the light-emitting layer 130 and does not need to include the hole-injection layer 111, the hole-transport layer 112, the electron-transport layer 118, and the electron-injection layer 119. The EL layer 100 may have a structure including functional layers which have a function such as capability of lowering a hole- or electron-injection barrier, improving a hole- or electron-transport property, inhibiting a hole- or electron-transport property, suppressing a quenching phenomenon by an electrode, or suppressing exciton diffusion. Note that the functional layers may each be a single layer or have a structure in which a plurality of layers are stacked.

<<Microcavity Structure>>

In the light-emitting device of one embodiment of the present invention, the electrode 101 has a function of reflecting light, and the electrode 102 has a function of reflecting light and a function of transmitting light. Thus, when the electrode 101, the electrode 102, and the EL layer 100 have a micro optical resonator (microcavity) structure, light emission obtained from the light-emitting layer 130 included in the EL layer 100 can be resonated between both the electrodes, and light emitted from the electrode 102 can be intensified.

Specifically, when the peak wavelength of light obtained from the light-emitting layer 130 is λ, the distance between the electrode 101 and the electrode 102 is preferably adjusted to be in the neighborhood of mλ/2 (m is a natural number). The distance between the electrodes is preferably within the range of an ideal distance (mλ/2)±50 nm, and the distance between the electrodes is further preferably within the range of an ideal distance (mλ/2)±20 nm. With this structure, the effect of microcavity can be efficiently obtained.

To amplify desired light (peak wavelength: λ) obtained from the light-emitting layer 130, the optical path length from the electrode 101 to a region where the desired light is obtained (light-emitting region) in the light-emitting layer and the optical path length from the electrode 102 to the region where the desired light is obtained (light-emitting region) in the light-emitting layer 130 are preferably adjusted to be in the neighborhood of (2 m'−1)λ/4 (m' is a natural number). The optical path length is preferably within the range of an ideal length (2 m'−1)λ/4±50 nm, and the optical path length is further preferably within the range of the ideal length (2 m'−1)λ/4±20 nm. With this structure, the effect of microcavity can be efficiently obtained. In this specification, the light-emitting region means a region where holes and electrons are recombined in the light-emitting layer 130. FIG. 1(A) illustrates the case where a light-emitting region exists near the center of the light-emitting layer 130.

By such optical adjustment, the spectrum of specific monochromatic light obtained from the light-emitting layer 130 can be narrowed and light emission with high color purity can be obtained.

In order to efficiently obtain light emission from the light-emitting device 150, the light-emitting device 150 preferably has high outcoupling efficiency. It is known that the outcoupling efficiency is improved by providing a low refractive index layer between the layer having a function of reflecting light and the EL layer. However, many of materials that can be used for the low refractive index layer have low conductivity, and when such a material is used in the EL layer, the conductivity is sometimes inhibited; therefore, the material is provided opposite to the electrode 101 and the EL layer. This structure has problems such as complexity of the number of manufacturing steps and high manufacturing costs.

The present inventors have found that when the light-emitting layer 130 and the low refractive index layer 160 are provided between the pair of electrodes (the electrode 101 and the electrode 102) and the peak wavelength of light emitted from the light-emitting layer 130 is $\lambda$, the low refractive index layer 160 is provided in a region with an optical path length of greater than or equal to 0 nm and less than or equal to $\lambda/2$ from the light-emitting layer 130 as illustrated in FIG. 2, and the cap layer 145 is provided in contact with the electrode 102, which is the light extraction side, whereby a light-emitting device with high outcoupling efficiency can be provided with easy manufacturing steps.

The low refractive index layer 160 is preferably provided in a region with an optical path length of greater than or equal to 0 nm and less than or equal to $\lambda/2$ from the light-emitting layer 130, in which case a light extraction effect due to a microcavity structure and a light extraction effect due to introduction of the low refractive index layer 160 can be efficiently obtained. When the low refractive index layer 160 is provided in the EL layer 100, light attenuation due to an evanescent mode, which is generated in the vicinity of the electrode 101, the electrode 102, or the electrode 103 described later, can be inhibited. With this structure, the thickness of the EL layer 100 is not increased; therefore, the driving voltage can be reduced. Furthermore, with this structure, the optical path length between the light-emitting layer and the electrode 101 having a function of reflecting light can be reduced; thus, loss due to a waveguide mode of light obtained from the light-emitting layer can be inhibited. The low refractive index layer 160 is further preferably provided so as to have an optical path length of less than or equal to $\lambda/4$ from the light-emitting layer 130.

As illustrated in FIG. 2(A), it is preferable that the low refractive index layer 160 be provided between the anode and the light-emitting layer 130 and the optical path length between the anode-side interface of the light-emitting layer 130 and the light-emitting layer 130-side interface of the low refractive index layer 160 be greater than or equal to 0 nm and less than or equal to $\lambda/2$. Further preferably, the optical path length is greater than or equal to 0 nm and less than or equal to $\lambda/4$. This structure allows easy optical design (the design of the thickness of each of the layers included in the EL layer 100).

As in a light-emitting device 156 illustrated in FIG. 2(B), it is preferable that the low refractive index layer 160 be provided between the cathode and the light-emitting layer 130 and the optical path length between the cathode-side interface of the light-emitting layer 130 and the light-emitting layer 130-side interface of the low refractive index layer 160 be greater than or equal to 0 nm and less than or equal to $\lambda/2$. Further preferably, the optical path length is greater than or equal to 0 nm and less than or equal to $\lambda/4$. This structure allows easy optical design.

The refractive index of the low refractive index layer 160 is preferably less than or equal to 1.80. The refractive index of the low refractive index layer 160 is further preferably less than or equal to 1.75, still further preferably less than or equal to 1.70. This structure enables a light-emitting device with high outcoupling efficiency to be provided.

The refractive index of the low-refractive index layer 160 is preferably lower than that of the light-emitting layer 130. With this structure, attenuation due to a waveguide mode can be inhibited, and outcoupling efficiency can be improved.

In addition, the refractive index of at least one of the hole-injection layer 111, the hole-transport layer 112, the electron-transport layer 118, and the electron-injection layer 119 is preferably low. That is, in the light-emitting device of one embodiment of the present invention, it is preferable that at least one of the hole-injection layer 111, the hole-transport layer 112, the electron-transport layer 118, and the electron-injection layer 119 also function as the low refractive index layer 160. With this structure, the low refractive index layer 160 can be introduced into the EL layer 100 while the number of manufacturing steps of a conventional light-emitting device is maintained, so that a light-emitting device with high outcoupling efficiency can be easily provided.

In addition, in the case where at least one of the hole-injection layer 111, the hole-transport layer 112, the electron-transport layer 118, and the electron-injection layer 119 also functions as the low refractive index layer 160, the thickness of the layer having a function of the low refractive index layer 160 is preferably greater than or equal to 5 nm. With this structure, while the original functions of layers (e.g., the hole-injection property of the hole-injection layer 111) are maintained, a layer having a function of a low refractive index layer can be formed.

When the cap layer 145 is provided in contact with the electrode on the light extraction side and opposite to the EL layer 100, the outcoupling efficiency can be increased. When the cap layer 145 is provided in contact with the electrode 102 in the light-emitting device 150, the difference in refractive index at the interface between the electrode 102 and the air can be reduced, resulting in improvement in outcoupling efficiency. The thickness is preferably greater than or equal to 5 nm and less than or equal to 120 nm. Further preferably, the thickness is greater than or equal to 30 nm and less than or equal to 90 nm. This structure enables the cap layer 145 to have high film quality. For the cap layer, a conductive material such as ITO is preferably used, for example. Like the electrode 102, an electrode having a function of reflecting light and a function of transmitting light needs to be thin; thus, the film quality becomes insufficient and the conductivity becomes worse in some cases. With the use of a conductive material for the cap layer 145, while the outcoupling efficiency is improved, the conductivity can be ensured and the manufacturing yield of the light-emitting device can be improved. For the cap layer 145, an organic compound can be favorably used. In particular, an organic compound that is less likely to absorb light in a visible light region can be favorably used. An organic compound used for the EL layer 100 can be used for the cap layer 145; thus, the cap layer 145 can be formed in a deposition apparatus or deposition chamber in which the EL layer 100 is formed, allowing easy film formation of the cap layer 145.

Figure 3:
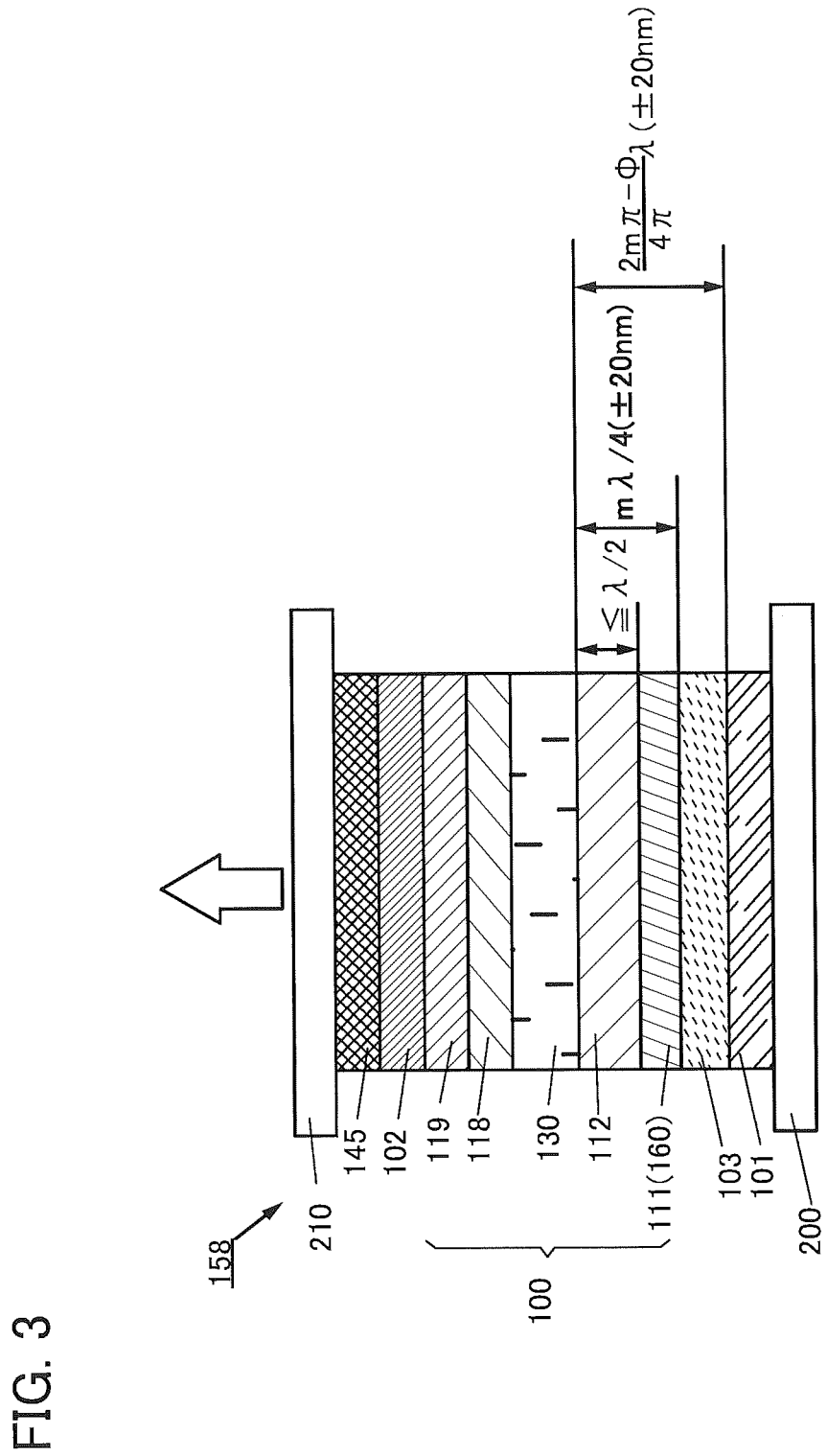
FIG. 3 is a schematic cross-sectional view of a light-emitting device of one embodiment of the present invention, and a diagram illustrating optical path lengths.

As in a light-emitting device 158 illustrated in FIG. 3, the electrode 103 is preferably introduced so as to be in contact with the electrode 101 and the EL layer 100. The electrode 101 has a function of reflecting light, and a material whose surface is likely to react, such as Ag or Cu, is used for the function in some cases. Thus, the quality of the surface of the electrode 101 might be changed when the electrode 101 is exposed to the air in the manufacturing process of the electrode 101 or after manufacture of the electrode 101. Forming the electrode 103 over the electrode 101 can inhibit the change in quality. The electrode 103 is preferably a transparent electrode, and further preferably contains indium (In) and tin (Sn). For example, ITO or ITSO, which is described later, can be favorably used. In addition, titanium oxide is favorably used as an electrode with a high refractive index.

The light-emitting device of one embodiment of the present invention includes the low refractive index layer between the light-emitting layer 130 and the third electrode 103. When the refractive index of the third electrode is higher than that of a layer in contact with the third electrode (the hole-injection layer 111 in FIG. 3) and light emitted from the light-emitting layer is reflected at the interface of the layer in contact with the third electrode, light reflection is fixed end reflection; thus, the phase of reflected light is different from the phase of light emitted from the light-emitting layer by 7E. Therefore, in order to form a microcavity structure between the electrode 103 and the electrode 102 to improve outcoupling efficiency, the optical path length between the light-emitting layer 130 and the electrode 103 is preferably within a range of λ/4±50 nm. With this structure, light emitted from the light-emitting layer and light reflected by the electrode 103 can intensify each other. In addition, the optical path length between the light-emitting layer 130 and the electrode 103 is preferably within a range of an ideal thickness (λ/4)±50 nm, further preferably within a range of the ideal thickness (λ/4)±20 nm. With this structure, a microcavity effect can be obtained efficiently.

Thus, when the hole-injection layer 111 in contact with the third electrode 103 also functions as the low refractive index layer 160, the optical path length is preferably adjusted, in which case a microcavity effect can be efficiently obtained. Furthermore, this structure is preferable because attenuation of light emission due to an evanescent mode can be inhibited.

Light that has been emitted from the light-emitting layer 130 and has passed through the electrode 103 is reflected by the electrode 101. In order to form a microcavity structure between the electrode 103 and the electrode 102 to improve outcoupling efficiency, the optical path length (d) between the light-emitting layer 130 and the electrode 103 is preferably within a range of the value satisfying the following formula ±50 nm.

[Formula 1]

$$m = \frac{2d}{\lambda} + \frac{\Phi}{2\pi} \quad (1)$$

In the above formula, m is a natural number, and Φ is a phase shift caused by reflection. A phase shift means a phase difference between incident light and reflected light when reflection is caused; a phase shift is π in the case of ideal fixed end reflection. With this structure, light emitted from the light-emitting layer and light reflected by the electrode 103 can intensify each other. In the case of ideal fixed end reflection, d=(2 m−1)λ/4.

In the light-emitting device of one embodiment of the present invention, the hole-injection layer 111 preferably also functions as the low refractive index layer 160. In other words, the hole-injection layer 111 preferably has a low refractive index (a refractive index of less than or equal to 1.80) and a hole-injection property. A substance having an electron-accepting property is mixed with an organic compound having an electron-donating property to obtain the hole-injection property of the hole-injection layer 111. A thin film having this structure is less likely to have a change in the hole-injection property due to a change in film thickness. That is, by changing the thickness of the hole-injection layer 111, optical adjustment between the light-emitting layer and each of the electrode 101 and the electrode 103 can be easily performed while the carrier balance of the EL layer is maintained.

Furthermore, the use of an organic compound with a low refractive index for the hole-injection layer 111 allows formation of a layer with a hole-injection property and a low refractive index even in the case of using a substance with a high refractive index and an electron-accepting property. The use of an organic compound with a low refractive index for the hole-injection layer 111 enables an improvement in outcoupling efficiency even in the case where a material with a low refractive index is not used for the light-emitting layer and layers in the vicinity of the light-emitting layer (the light-emitting layer 130, the hole-transport layer 112, and the electron-transport layer 118), which significantly affect the characteristics of the light-emitting device. That is, the range of choices of organic compounds that can be used for the light-emitting layer and the layers in the vicinity of the light-emitting layer can be expanded. When the refractive index of the hole-injection layer 111 is lowered or an organic compound with a low refractive index is used for the hole-injection layer 111, outcoupling efficiency and a microcavity effect can be improved while the characteristics of the EL layer are maintained.

With regard to the mixture ratio between the organic compound having an electron-donating property and the substance having an electron-accepting property, the volume ratio of the substance having an electron-accepting property to the organic compound is preferably higher than or equal to 0.01 and lower than or equal to 0.3. With this structure, the hole-injection layer 111 with a low refractive index can be formed using an organic compound with a low refractive index as the organic compound, even when a substance with a high refractive index is used as the substance having an electron-accepting property.

The refractive index of the organic compound having an electron-donating property is preferably less than or equal to 1.80. The refractive index of the organic compound having an electron-donating property is further preferably less than or equal to 1.75, still further preferably less than or equal to 1.70. With this structure, the hole-injection layer 111 with a low refractive index can be formed.

<Organic Compound with Low Refractive Index and Carrier-Transport Property>

The layers (the hole-injection layer 111, the hole-transport layer 112, the electron-transport layer 118, and the electron-injection layer 119) included in the EL layer are required to have a carrier (electron or hole)-transport property. For the low refractive index layer of the light-emitting device of one embodiment of the present invention, an organic compound with a low refractive index and a carrier-transport property is favorably used.

The refractive index of a high molecule is expressed by a Lorentz-Lorenz equation (Formula (2)) below.

[Formula 2]

$$\frac{n^2-1}{n^2+2} = \frac{4\pi}{3}N\alpha = \frac{4\pi}{3}\frac{\rho N_A}{M}\alpha = \frac{[R]}{V_0} = \phi \quad (2)$$

Formula (3) is obtained by modifying Formula (2).

[Formula 3]

$$n = \sqrt{\frac{1+2\phi}{1-\phi}} \quad (3)$$

In Formula (2) and Formula (3), n represents a refractive index, $\alpha$ represents polarizability, N represents the number of molecules per unit volume, $\rho$ represents a density, $N_A$ represents Avogadro's number, M represents a molecular weight, $V_0$ represents a molar volume, and [R] represents atomic refraction.

According to Formula (3), $\phi$ is reduced to lower the refractive index n, and according to Formula (2), the atomic refraction [R] is reduced to reduce $\phi$. That is, in order to lower the refractive index n, an organic compound is selected such that the atomic refraction [R] is reduced.

Since the above formula is a formula for a high molecule, when the formula is used for a low molecular weight compound, the value obtained by calculation may slightly deviate but have a substantially similar tendency; thus, an organic compound used for the low refractive index layer is preferably selected such that the atomic refraction [R] is reduced. Furthermore, an organic compound having a π-conjugated system in a molecule has a favorable carrier-transport property. The low refractive index layer needs to have a carrier-transport property; thus, an organic compound with a small atomic refraction [R] and a π-conjugated system in a molecule is preferably used for the low refractive index layer.

The atomic refraction [R] tends to be small when a substituent containing fluorine, such as a fluoro group or a trifluoromethyl group, a cyclohexyl group, or a bond through aromatic rings that has a structure in which a conjugation between the aromatic rings is cut typically by an sp³ hybrid orbital is included. Thus, an organic compound used for the low refractive index layer is preferably an organic compound having the above-mentioned substituent or bond.

As an organic compound used for the low refractive index layer, an organic compound including an aromatic amine skeleton, a pyrrole skeleton, or a fluorene skeleton or an organic compound including an aromatic ring that has a bulky substituent such as a methyl group, a t-butyl group, or an isopropyl group can also be favorably used. These organic compounds each have a π-conjugated system in a molecule and thus tend to have a lower refractive index.

<Material>

Next, components of a light-emitting device of one embodiment of the present invention are described in detail below.

<<Light-Emitting Layer>>

Figure 1C:
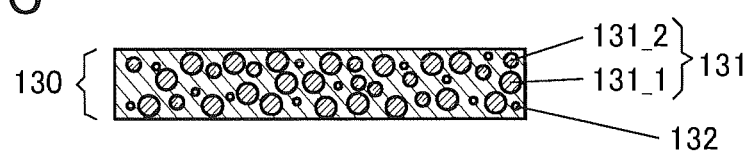

The light-emitting layer 130 includes at least the host material 131 and preferably further includes the guest material 132, as illustrated in FIG. 1(C). The host material 131 may include an organic compound 131_1 and an organic compound 131_2. In the light-emitting layer 130, the host material 131 is present in the highest proportion by weight, and the guest material 132 is dispersed in the host material 131. When the guest material 132 is a fluorescent compound, the S1 level of the host material 131 (the organic compound 131_1 and the organic compound 131_2) in the light-emitting layer 130 is preferably higher than the S1 level of the guest material (the guest material 132) in the light-emitting layer 130. When the guest material 132 is a phosphorescent compound, the T1 level of the host material 131 (the organic compound 131_1 and the organic compound 131_2) in the light-emitting layer 130 is preferably higher than the T1 level of the guest material (the guest material 132) in the light-emitting layer 130.

The organic compound 131_1 preferably includes a heteroaromatic skeleton having two or more nitrogen atoms and 1 to 20 carbon atoms. A compound including a pyrimidine skeleton and a triazine skeleton is preferable. As the organic compound 131_1, a material having a property of transporting more electrons than holes (an electron-transport material) can be used, and a material having an electron mobility of $1\times10^{-6}$ cm²/Vs or higher is preferable.

Specifically, for example, heterocyclic compounds including a diazine skeleton, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm), or heterocyclic compounds including a triazine skeleton, a pyrimidine skeleton, or a triazole skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn), 2-{3-[3-(benzo[b]naphtho[1,2-d]furan-8-yl)phenyl]phenyl}-4,6-diphenyl-1,3,5-triazine (abbreviation: mBnfBPTzn), 2,4,6-tris(biphenyl-3-yl)-1,3,5-triazine (abbreviation: T2T), 2,4,6-tris[3'-(pyridin-3-yl)-biphenyl-3-yl]-1,3,5-triazine (abbreviation: TmPPPyTz), and 9-[4-(3,5-diphenyl-1H-1,2,4-triazol-1-yl)]phenyl-9H-carbazole (abbreviation: CzTAZ(1H)) are preferred because of their high stability and reliability. In addition, the heterocyclic compounds having such skeletons have a high electron-transport property to contribute to a reduction in driving voltage. The substances listed here are mainly substances having an electron mobility of $1\times10^{-6}$ cm²/Vs or higher. Note that other substances may also be used as long as they have a property of transporting more electrons than holes.

As the organic compound 131_1, a compound such as a pyridine derivative, a pyrazine derivative, a pyridazine derivative, a bipyridine derivative, a quinoxaline derivative, a dibenzoquinoxaline derivative, a phenanthroline derivative, or a purine derivative can also be favorably used. Such an organic compound is preferably a material having an electron mobility of $1\times10^{-6}$ cm²/Vs or higher.

Specific examples include heterocyclic compounds including a pyridine skeleton, such as bathophenanthroline (abbreviation: BPhen), 2,9-bis(naphthalen-2-yl)-4,7-diphenyl-1,10-phenanthroline (abbreviation: NBPhen), and bathocuproine (abbreviation: BCP); heteroaromatic ring compounds including a pyrazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation:

2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), and (2-[3-(3,9'-bi-9H-carbazol-9-yl)phenyl]dibenzo[f,h]quinoxaline) (abbreviation: 2mCzCzPDBq); and heterocyclic compounds including a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. Note that other substances may also be used as long as they have a property of transporting more electrons than holes.

The organic compound 131_2 preferably includes a heteroaromatic skeleton having two or more nitrogen atoms and 1 to 20 carbon atoms. In particular, a nitrogen-containing five-membered heterocyclic skeleton is preferable. Examples include an imidazole skeleton, a triazole skeleton, and a tetrazole skeleton. As the organic compound 131_2, a material having a property of transporting more holes than electrons (a hole-transport material) can be used, and a material having a hole mobility of $1 \times 10^{-6}$ cm$^2$/Vs or higher is preferable. Furthermore, the hole-transport material may be a high molecular compound.

Specifically, 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and the like can be used, for example.

As the organic compound 131_2, a compound including another nitrogen-containing five-membered heterocyclic skeleton or a tertiary amine skeleton can also be suitably used. Specifically, a pyrrole skeleton and an aromatic amine skeleton are enumerated. Examples include an indole derivative, a carbazole derivative, and a triarylamine derivative. As the organic compound 131_2, a material having a property of transporting more holes than electrons (a hole-transport material) can be used, and a material having a hole mobility of $1 \times 10^{-6}$ cm$^2$/Vs or higher is preferable. Furthermore, the hole-transport material may be a high molecular compound.

Specific examples of the aromatic amine compounds that can be used as the material having a high hole-transport property include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and 4,4'-bis(9-carbazolyl)-2,2'-dimethyl-biphenyl (abbreviation: dmCBP).

Other examples of the carbazole derivative that can be used include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 7-[4-(10-phenyl-9-anthryl)phenyl]-7H-dibenzo[c,g]carbazole (abbreviation: cgDBCzPA), and 1,4-bis[4-(N-carbazolyl)phenyl]-2,3,5,6-tetraphenylbenzene.

Furthermore, it is possible to use N,N-diphenyl-9-[4-(10-phenyl-9-anthryl)phenyl]-9H-carbazol-3-amine (abbreviation: CzA1PA), 4-(10-phenyl-9-anthryetriphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), N,N,N',N',N'',N'',N''',N'''-octaphenyldibenzo[g,p]chrysene-2,7,10,15-tetraamine (abbreviation: DBC1), or the like.

It is also possible to use high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

As the material having a high hole-transport property, the following aromatic amine compounds can be used for example: 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-ye-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)

amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N',N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBAF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). In addition, amine compounds, carbazole compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), and 2,8-di(9H-carbazol-9-yl)-dibenzothiophene (abbreviation: Cz2DBT) can be used. Among the above compounds, compounds including a pyrrole skeleton or an aromatic amine skeleton are preferred because of their high stability and reliability. In addition, the compounds having such skeletons have a high hole-transport property to contribute to a reduction in driving voltage.

Although the guest material 132 in the light-emitting layer 130 is not particularly limited, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like is preferred as a fluorescent compound, and for example, the following substances can be used.

Specific examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N'-bis[4-(9-phenyl-9H-fluoren-9-yl)phenyl]-N,N'-diphenyl-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N,N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}-propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

As the guest material 132 (phosphorescent compound), an iridium-, rhodium-, or platinum-based organometallic complex or metal complex is enumerated; in particular, an organoiridium complex such as an iridium-based ortho-metalated complex is preferable. Examples of an ortho-metalated ligand include a 4H-triazole ligand, a 1H-triazole ligand, an imidazole ligand, a pyridine ligand, a pyrimidine ligand, a pyrazine ligand, and an isoquinoline ligand. Examples of the metal complex include a platinum complex having a porphyrin ligand.

Examples of the substance that has an emission peak in blue or green include organometallic iridium complexes including a 4H-triazole skeleton, such as tris{2-[5-(2-methylphenyl)-4-(2,6-dimethylphenyl)-4H-1,2,4-triazol-3-yl-κN²]phenyl-κC}iridium (III) (abbreviation: Ir(mpptz-dmp)$_3$), tris(5-methyl-3,4-diphenyl-4H-1,2,4-triazolato)iridium (III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes including a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation:

Ir(Prptz1-Me)$_3$); organometallic iridium complexes including an imidazole skeleton, such as fac-tris[1-(2,6-diisopropylphenyl)-2-phenyl-1H-imidazole]iridium(III) (abbreviation: Ir(iPrpmi)$_3$), tris[3-(2,6-dimethylphenyl)-7-methylimidazo[1,2-f]phenanthridinato]iridium(III) (abbreviation: Ir(dmpimpt-Me)$_3$), and tris {2-[1-(4-cyano-2,6-diisobutylphenyl)-1H-benzimidazol-2-yl-κN$^3$]phenyl-}iridium (III) (abbreviation: Ir(pbi-diBuCNp)$_3$); and organometallic iridium complexes in which a phenylpyridine derivative having an electron-withdrawing group is a ligand, such as bis[2-(4',6'-difluorophenyl)pyridinato-N,C$^{2'}$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_{3ppy}$)$_2$(pic)), and bis[2-(4',6'-difluorophenyl)pyridinato-N, C$^{2'}$]iridium (III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in green or yellow include organometallic iridium complexes including a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), (acetylacetonato)bis{4,6-dimethyl-2-[6-(2,6-dimethylphenyl)-4-pyrimidinyl-κN$^3$]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes including a pyrazine skeleton, such as (acetylacetonato)bis(3,5-dimethyl-2-phenylpyrazinato)iridium (HI) (abbreviation: Ir(mppr-Me)$_2$(acac)) and (acetylacetonato)bis (5-isopropyl-3-methyl-2-phenylpyrazinato)iridium(III) (abbreviation: Ir(mppr-iPr)$_2$(acac)); organometallic iridium complexes including a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium (III) (abbreviation: Ir(pq)$_3$), and bis(2-phenylquinolinato-N, C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N, C$^{2'}$)iridium(III) acetylacetonate (abbreviation: Ir(bt)$_2$(acac)); and a rare earth metal complex such as tris(acetylacetonato) (monophenanthroline)terbium (III) (abbreviation: Tb(acac)$_3$(Phen)). Among the materials given above, the organometallic iridium complexes including a pyrimidine skeleton have distinctively high reliability and emission efficiency and are thus especially preferable.

Examples of the substance that has an emission peak in yellow or red include organometallic iridium complexes including a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes including a pyrazine skeleton, such as (acetylacetonato)bis(2,3,5-triphenylpyrazinato) iridium(III) (abbreviation: Ir(tppr)$_2$(acac)), bis(2,3,5-triphenylpyrazinato)(dipivaloylmethanato)iridium (III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes including a pyridine skeleton, such as tris(1-phenylisoquinolinato-N,C$^{2'}$)iridium(III) (abbreviation: Ir(piq)$_3$) and bis(1-phenylisoquinolinato-N, C$^{2'}$)iridium(III) acetylacetonate (abbreviation: Ir(piq)$_2$ (acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline) europium(III) (abbreviation: Eu(TTA)$_3$(Phen)). Among the materials given above, the organometallic iridium complexes including a pyrimidine skeleton have distinctively high reliability and emission efficiency and are thus especially preferable. Furthermore, the organometallic iridium complexes including a pyrazine skeleton can emit red light with favorable chromaticity.

The light-emitting material included in the light-emitting layer 130 is preferably a material that can convert the triplet excitation energy into light emission. Examples of the material that can convert the triplet excitation energy into light emission include a thermally activated delayed fluorescent (TADF) material in addition to the phosphorescent compound. Therefore, it is acceptable that the phosphorescent compound in the description is replaced with a thermally activated delayed fluorescent material. Note that a thermally activated delayed fluorescent material is a material having a small difference between the triplet excitation energy level and the singlet excitation energy level and a function of converting triplet excitation energy into singlet excitation energy by reverse intersystem crossing. Thus, a thermally activated delayed fluorescent material can up-convert a triplet excited state into a singlet excited state (i.e., reverse intersystem crossing is possible) using a little thermal energy and efficiently exhibit light emission (fluorescence) from the singlet excited state. Thermally activated delayed fluorescence is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where a thermally activated delayed fluorescent material is composed of one kind of material, the following materials can be used, for example.

First, a fullerene, a derivative thereof, an acridine derivative such as proflavine, eosin, and the like can be given. Furthermore, a metal-containing porphyrin containing magnesium (Mg), zinc (Zn), cadmium (Cd), tin (Sn), platinum (Pt), indium (In), palladium (Pd), or the like can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP).

As a thermally activated delayed fluorescent material composed of one kind of material, a heterocyclic compound including a π-electron rich heteroaromatic ring and a π-electron deficient heteroaromatic ring can also be used. Specific examples include 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DP S), and 10-phenyl-10H,10'H-spiro[acridin-9,9'-anthracen]-10'-one (abbreviation: ACRSA). The heterocyclic compound is preferable because of its high electron-transport property and hole-transport property due to the π-electron rich heteroaromatic ring and the π-electron deficient heteroaromatic ring contained therein. Among skeletons having the π-electron deficient heteroaromatic ring, a diazine skeleton (a pyrimidine skeleton, a pyrazine skeleton, or a pyridazine skeleton) and a triazine skeleton are particularly preferable because of their high stability and reliability. Among skeletons having the π-electron rich heteroaromatic ring, an acridine skeleton, a phenoxazine skeleton, a thiophene skeleton, a furan skeleton, and a pyrrole skeleton have high stability and reliability; therefore, any one or more selected from these skeletons are preferably included. As the pyrrole skeleton, an indole skeleton, a carbazole skeleton, and a 3-(9-phenyl-9H-carbazol-3-yl)-9H-carbazole skeleton are particularly preferred. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both increased and the difference between the energy level in the singlet excited state and the energy level in the triplet excited state becomes small.

The light-emitting layer 130 may contain another material in addition to the host material 131 and the guest material 132.

Examples of the material that can be used for the light-emitting layer 130 are, but not limited to, condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), 6,12-dimethoxy-5,11-diphenylchrysene, 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more kinds of substances having a singlet excitation energy level or a triplet excitation energy level higher than the excitation energy level of the guest material 132 are selected from these substances and known substances and used.

For example, a compound including a heteroaromatic skeleton, such as an oxadiazole derivative, can be used for the light-emitting layer 130. Specific examples include heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), and 4,4'-bis(5-methylbenzoxazol-2-yl)stilbene (abbreviation: BzOs).

In addition, a metal complex (e.g., a zinc- or aluminum-based metal complex) with a heterocycle, for example, can be used for the light-emitting layer 130. Examples include metal complexes having a quinoline ligand, a benzoquinoline ligand, an oxazole ligand, and a thiazole ligand. Specific examples include metal complexes including a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium (II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Furthermore, metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ) can be used.

The light-emitting layer 130 can be formed of two or more layers. For example, in the case where the light-emitting layer 130 is formed by stacking a first light-emitting layer and a second light-emitting layer in this order from the hole-transport layer side, a substance having a hole-transport property is used as the host material of the first light-emitting layer and a substance having an electron-transport property is used as the host material of the second light-emitting layer. Light-emitting materials included in the first light-emitting layer and the second light-emitting layer may be the same or different from each other, and the materials may have functions of emitting light of the same color or light of different colors. Light-emitting materials having functions of emitting light of different colors are used for the two light-emitting layers, so that light of a plurality of emission colors can be obtained at the same time. It is particularly preferable to select light-emitting materials used for the light-emitting layers so that white light can be obtained by light emission from the two light-emitting layers.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (an oligomer, a dendrimer, a polymer, or the like) may be included.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide having an electron-donating property, a phthalocyanine derivative, an aromatic amine, a heteropolyacid, or the like. Examples of the transition metal oxide include titanium oxide, vanadium oxide, tantalum oxide, molybdenum oxide, tungsten oxide, rhenium oxide, ruthenium oxide, chromium oxide, zirconium oxide, hafnium oxide, and silver oxide; the transition metal oxide is preferable because it has an excellent electron-accepting property and can be easily deposited by a vacuum evaporation method or a wet process. Examples of the phthalocyanine derivative include phthalocyanine and metal phthalocyanine. Examples of the aromatic amine include a benzidine derivative and a phenylenediamine derivative. It is also possible to use a high molecular compound such as polythiophene or polyaniline; a typical example thereof is poly(ethylenedioxythiophene)/poly(styrenesulfonic acid), which is self-doped polythiophene. Examples of the heteropolyacid include a phosphomolybdic acid, a phosphotungstic acid, a silicomolybdic acid, and a silicotungstic acid. The heteropolyacid and the high molecular compound are preferable because they can be easily deposited by a wet process.

As the hole-injection layer 111, a layer containing a composite material of the above-described hole-transport material having a substituent, a skeleton, or a chemical bond with which the atomic refraction [R] is small and the above-described material having an electron-accepting property is preferably used. With such a structure, a layer with hole-injection and hole-transport properties and a low refractive index can be formed. As the organic material having an electron-accepting property, 7,7,8,8-tetracyanoquinodimethane (abbreviation: TCNQ), 7,7,8,8-tetracyano-2,3,5,6-tetrafluoroquinodimethane (abbreviation: F4-TCNQ), or 1,3,4,5,7,8-hexafluorocyano-naphthoquinodimethane (abbreviation: F6TCNNQ) can be suitably used. A stack of a layer containing a material having an electron-accepting property and a layer containing a hole-transport material may also be used. In a steady state or in the presence of an electric field, electric charge can be transferred between these materials. In addition to TCNQ, F4TCNQ, and F6TCNNQ described above, examples of the organic material having an electron-accepting property include organic acceptors such as a quinodimethane derivative, a chloranil derivative, and a hexaazatriphenylene derivative. A specific example is a compound having an electron-withdrawing group (a halogen group or a cyano group), such as chloranil or 2,3,6,7,10,11-hexacyano-1,4,5,8,9,12-hexaazatriphenylene (abbreviation: HAT-CN). A [3]radialene derivative including an electron-withdrawing group has a very high electron-accepting property and thus is preferred; specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. A substance containing oxygen and a transition metal such as titanium, vanadium, tantalum, molybdenum, tungsten, rhenium, ruthenium, chromium, zirconium, hafnium, or silver can also be used. Specific examples include titanium oxide, vanadium oxide, tantalum oxide, molybdenum oxide, tungsten oxide, rhenium oxide, ruthenium oxide, chromium oxide, zirconium oxide, hafnium oxide, silver oxide, a phosphomolybdic acid, molybdenum copper, and tungsten copper. In particular, molybdenum oxide is preferable because of stability in the air, a low hygroscopic property, and easiness of handling.

As described above, as the hole-transport material with a low refractive index used for the hole-injection layer 111, an organic compound having a structure in which a conjugation between aromatic rings is cut typically by an spa bond, or an organic compound including an aromatic ring that has a bulky substituent can be suitably used. However, these compounds tend to have poor carrier-transport properties and thus are not suitable for a conventional hole-injection layer. On the other hand, the above-described substance containing a transition metal and oxygen itself has an excellent effect of increasing a hole-injection property but has a problem of a high refractive index. However, it is found that when the above-described substance containing a transition metal and oxygen is used, as the material exhibiting an electron-accepting property, in combination with the hole-transport material with a low refractive index for the hole-injection layer 111, the hole-injection layer 111 can have hole-injection and hole-transport properties while keeping its refractive index low. That is, this structure can cancel disadvantages of both of the materials and offer only advantages. This is probably because the substance containing a transition metal oxide has a high electron-accepting property and thus addition of a small amount of the substance can ensure a hole-injection property.

As the hole-transport material, a material having a property of transporting more holes than electrons can be used, and a material having a hole mobility of $1 \times 10^{-6}$ cm$^2$/Vs or higher is preferable. As described above, the refractive index of the hole-transport material is preferably higher than or equal to 1 and lower than or equal to 1.75, further preferably higher than or equal to 1 and lower than or equal to 1.73, still further preferably higher than or equal to 1 and lower than or equal to 1.70. Specifically, the aromatic amine, carbazole derivative, aromatic hydrocarbon, stilbene derivative, and the like described as examples of the hole-transport material that can be used in the light-emitting layer 130 can be used, and the heteroaromatic skeleton having two or more nitrogen atoms and 1 to 20 carbon atoms is particularly preferably included. In particular, a nitrogen-containing five-membered heterocyclic skeleton is preferable. Furthermore, the hole-transport material may be a high molecular compound.

Other examples of the hole-transport material include aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can be used. The aromatic hydrocarbon having a hole mobility of $1 \times 10^{-6}$ cm$^2$/Vs or higher and having 14 to 42 carbon atoms is particularly preferably used.

The aromatic hydrocarbon may include a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

In addition, thiophene compounds, furan compounds, fluorene compounds, triphenylene compounds, phenanthrene compounds, and the like such as 4-{3-[3-(9-phenyl-9H-fluoren-9-yl)phenyl]phenyl}dibenzofuran (abbreviation: mmDBFFLB i-II), 4,4',4''-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II) can be used. Among the above compounds, compounds including a pyrrole skeleton, a furan skeleton, a thiophene skeleton, or an aromatic amine skeleton are preferred because of their high stability and reliability. In addition, the compounds including such skeletons have a high hole-transport property to contribute to a reduction in driving voltage.

<<Hole-Transport Layer>>

The hole-transport layer 112 is a layer containing a hole-transport material, and the hole-transport materials described as examples of the material of the hole-injection layer 111 can be used. In order that the hole-transport layer 112 can have a function of transporting holes injected into the hole-injection layer 111 to the light-emitting layer 130, the HOMO (Highest Occupied Molecular Orbital) level of the hole-transport layer 112 is preferably equal or close to the HOMO level of the hole-injection layer 111.

A substance having a hole mobility of $1\times10^{-6}$ cm$^2$/Vs or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specific examples include a pyridine derivative, a bipyridine derivative, a pyrimidine derivative, a triazine derivative, a quinoxaline derivative, a dibenzoquinoxaline derivative, a phenanthroline derivative, a triazole derivative, a benzimidazole derivative, and an oxadiazole derivative, which are listed above as the electron-transport material that can be used for the light-emitting layer 130, and a heteroaromatic skeleton having two or more nitrogen atoms and 1 to 20 carbon atoms is preferably included. A compound including a pyrimidine skeleton and a triazine skeleton is particularly preferable. A substance having an electron mobility of $1\times10^{-6}$ cm$^2$/Vs or higher is preferable. Note that other substances may also be used for the electron-transport layer as long as they have a property of transporting more electrons than holes. The electron-transport layer 118 is not limited to a single layer, and two or more layers containing the aforementioned substances may be stacked.

In addition, metal complexes with a heterocycle, such as metal complexes having a quinoline ligand, a benzoquinoline ligand, an oxazole ligand, and a thiazole ligand, can be given. Specific examples include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), and bis(8-quinolinolato)zinc(II) (abbreviation: Znq). Besides, metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ) can be used.

A layer that controls transfer of electron carriers may be provided between the electron-transport layer 118 and the light-emitting layer 130. This layer is formed by addition of a small amount of a substance having a high electron-trapping property to the material having a high electron-transport property described above, and the layer is capable of adjusting carrier balance by suppressing transport of electron carriers. Such a structure is very effective in suppressing a problem (e.g., a decrease in element lifetime) which occurs in the case where the electron-transport property of the electron-transport material is significantly higher than the hole-transport property of the hole-transport material.

<<Electron-Injection Layer>>

The electron-injection layer 119 has a function of reducing a barrier for electron injection from the electrode 102 to promote electron injection, and a Group 1 metal, a Group 2 metal, or an oxide, a halide, a carbonate, or the like of them can be used, for example. Alternatively, a composite material of the electron-transport material described above and a material having a property of donating electrons thereto can be used. Examples of the material having an electron-donating property include a Group 1 metal, a Group 2 metal, and an oxide of them. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound such as erbium fluoride (ErF$_3$) can be used. Electride may also be used for the electron-injection layer 119. Examples of the electride include a substance in which electrons are added at high concentration to a mixed oxide of calcium and aluminum. The substance that can be used for the electron-transport layer 118 can be used for the electron-injection layer 119.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons; specifically, the above-listed substances contained in the electron-transport layer 118 (the metal complexes, heteroaromatic compounds, and the like) can be used, for example. As the electron donor, a substance showing an electron-donating property with respect to the organic compound may be used. Specifically, an alkali metal, an alkaline earth metal, and a rare earth metal are preferable, and examples include lithium, sodium, cesium, magnesium, calcium, erbium, and ytterbium. In addition, an alkali metal oxide or an alkaline earth metal oxide is preferable, and examples include lithium oxide, calcium oxide, and barium oxide. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, gravure printing, or the like. Besides the above-mentioned materials, an inorganic compound such as a quantum dot or a high molecular compound (an oligomer, a dendrimer, a polymer, or the like) may be used for the light-emitting layer, the hole-injection layer, the hole-transport layer, the electron-transport layer, and the electron-injection layer described above.

<<Quantum Dot>>

A quantum dot is a semiconductor nanocrystal with a size of several nanometers to several tens of nanometers and contains approximately $1\times10^3$ to $1\times10^6$ atoms. Since energy shift of quantum dots depends on their size, quantum dots made of the same substance emit light with different emission wavelengths depending on their size. Thus, emission wavelengths can be easily changed by varying the size of quantum dots to be used.

Since a quantum dot has an emission spectrum with a narrow peak width, emission with high color purity can be obtained. In addition, a quantum dot is said to have a theoretical internal quantum efficiency of approximately 100%, which far exceeds that of a fluorescent organic compound, i.e., 25%, and is comparable to that of a phosphorescent organic compound. Therefore, the use of a quantum dot as a light-emitting material enables a light-emitting device having high emission efficiency to be obtained. Furthermore, since a quantum dot, which is an inorganic material, has high inherent stability, a light-emitting device that is favorable also in terms of lifetime can be obtained.

Examples of a material of a quantum dot include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light emission because the emission wavelength can be changed by varying the content ratio of elements.

As the structure of the quantum dot, any of a core type, a core-shell type, a core-multishell type, and the like may be used. When a core is covered with a shell formed of another inorganic material having a wider band gap, the influence of defects and dangling bonds existing at the surface of a nanocrystal can be reduced. Since this can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It is also possible to reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, the emission wavelengths of the quantum dots can be adjusted over a wavelength range of a spectrum of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots have a function of emitting directional light; thus, quantum rods can be used as a light-emitting material to obtain a light-emitting device with higher external quantum efficiency.

In most organic EL devices, to improve emission efficiency, concentration quenching of the light-emitting materials is suppressed by dispersing light-emitting materials in host materials. The host materials need to be materials having singlet excitation energy levels or triplet excitation energy levels higher than or equal to those of the light-emitting materials. In the case of using blue phosphorescent materials as light-emitting materials, it is particularly difficult to develop host materials which have triplet excitation energy levels higher than or equal to those of the blue phosphorescent materials and which are excellent in terms of a lifetime. Even when a light-emitting layer is composed of quantum dots and made without a host material, the quantum dots enable emission efficiency to be ensured; thus, a light-emitting device that is favorable in terms of a lifetime can be obtained. In the case where the light-emitting layer is composed of quantum dots, the quantum dots preferably have core-shell structures (including core-multishell structures).

In the case of using quantum dots as the light-emitting material in the light-emitting layer, the thickness of the light-emitting layer is set to 3 nm to 100 nm, preferably 10 nm to 100 nm, and the quantum dot content of the light-emitting layer is 1 volume % to 100 volume %. Note that it is preferable that the light-emitting layer be composed of the quantum dots. To form a light-emitting layer in which the quantum dots are dispersed as light-emitting materials in host materials, the quantum dots may be dispersed in the host materials, or the host materials and the quantum dots may be dissolved or dispersed in an appropriate liquid medium, and then a wet process (e.g., a spin coating method, a casting method, a die coating method, blade coating method, a roll coating method, an inkjet method, a printing method, a spray coating method, a curtain coating method, or a Langmuir-Blodgett method) may be employed. For a light-emitting layer using a phosphorescent material, a vacuum evaporation method, as well as the wet process, can be suitably employed.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

<<Pair of Electrodes>>

The electrode 101 and the electrode 102 function as an anode and a cathode of a light-emitting device. The electrode 101 and the electrode 102 can be formed using a metal, an alloy, a conductive compound, a mixture or a stack thereof, or the like.

One of the electrode 101 and the electrode 102 is preferably formed using a conductive material having a function of reflecting light. Examples of the conductive material include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting device with aluminum. Furthermore, silver (Ag), an alloy containing Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like may be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as W, chromium (Cr), molybdenum (Mo), Cu, or Ti can be used.

Light emitted from the light-emitting layer is extracted through one or both of the electrode 101 and the electrode 102. Thus, at least one of the electrode 101 and the electrode 102 is preferably formed using a conductive material having a function of transmitting light. An example of the conductive material is a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm.

The electrode 101 and the electrode 102 may be formed using a conductive material having a function of transmitting light and a function of reflecting light. An example of the conductive material is a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

In this specification and the like, as the material having a function of transmitting light, a material that has a function of transmitting visible light and has conductivity is used, and examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor) are mixed and a composite material in which an organic compound and an electron acceptor (acceptor) are mixed. Alternatively, an inorganic carbon-based material such as graphene may be used. The resistivity of the material is preferably lower than or equal to $1\times10^{5}$ Ω·cm, further preferably lower than or equal to $1\times10^{4}$ Ω·cm.

Alternatively, one or both of the electrode 101 and the electrode 102 may be formed by stacking two or more of these materials.

In order to improve the outcoupling efficiency, a material whose refractive index is higher than that of an electrode having a function of transmitting light may be formed in contact with the electrode. The material may be conductive or non-conductive as long as it has a function of transmitting visible light. In addition to the oxide conductors described above, an oxide semiconductor and an organic substance are given as examples. Examples of the organic substance include the materials for the light-emitting layer, the hole-injection layer, the hole-transport layer, the electron-transport layer, and the electron-injection layer given as examples. Furthermore, an inorganic carbon-based material or a metal film thin enough to transmit light can be used, and stacked layers with a thickness of several nanometers to several tens of nanometers may be used.

In the case where the electrode 101 or the electrode 102 have a function of a cathode, the electrode preferably contains a material with a low work function (3.8 eV or lower). For example, it is possible to use an element belonging to Group 1 or Group 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, or the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light of a desired wavelength emitted from each light-emitting layer resonates and the light of a desired wavelength is intensified, which is preferable.

As the method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Substrate>>

A light-emitting device of one embodiment of the present invention is formed over a substrate of glass, plastic, or the like. As for the order of forming layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Furthermore, a flexible substrate can be used. The flexible substrate means a substrate that can be bent, such as a plastic substrate made of polycarbonate or polyarylate, for example. Furthermore, a film, an inorganic vapor deposition film, or the like can be used. Another material may be used as long as the substrate functions as a support in a manufacturing process of the light-emitting device or an optical element or as long as it has a function of protecting the light-emitting device or the optical element.

In the present invention and the like, a light-emitting device can be formed using any of a variety of substrates, for example. The type of substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of the flexible substrate, the attachment film, the base material film, and the like include substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper.

Furthermore, a flexible substrate may be used as the substrate and the light-emitting device may be formed directly on the flexible substrate. Alternatively, a separation layer may be provided between the substrate and the light-emitting device. The separation layer can be used when part or the whole of a light-emitting device formed thereover is separated from the substrate and transferred onto another substrate. In such a case, the light-emitting device can be transferred to a substrate having low heat resistance or a flexible substrate as well. For the above separation layer, a stacked structure of inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to and arranged over another substrate. Examples of the substrate to which the light-emitting device is transferred include, in addition to the above substrates, a cellophane substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. With the use of such a substrate, a light-emitting device with high durability, a light-emitting device with high heat resistance, a light-emitting device with reduced weight, or a light-emitting device with reduced thickness can be obtained.

The light-emitting device 150 may be formed over an electrode electrically connected to a field-effect transistor (FET), for example, that is formed over the above-described substrate. Accordingly, an active matrix display device in which the FET controls the driving of the light-emitting device 150 can be fabricated.

Components of a solar cell, which is an example of the electronic device of one embodiment of the present invention, are described below.

For the solar cell, the material that can be used for the above-described light-emitting device can be used. In the solar cell, the above-described hole-transport material and electron-transport material can be used for a carrier-transport layer, and the above-described hole-transport material and electron-transport material, a light-emitting material, silicon, a perovskite crystal typified by $CH_3NH_3PbI_3$, and the like can be used for a light-generation layer. For a substrate and an electrode, the materials that can be used for the above-described light-emitting device can be referred to.

The structure described above in this embodiment can be used in appropriate combination with the other embodiments.

Embodiment 2

Figure 35A:
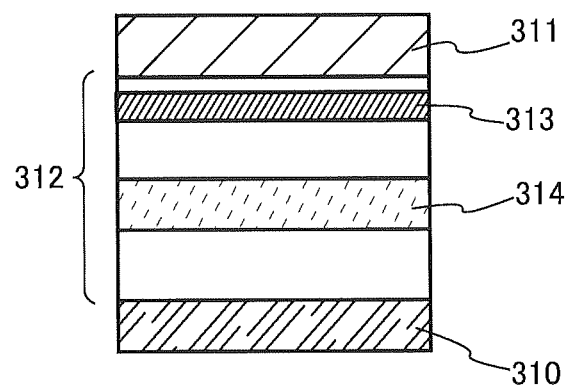
FIGS. 35A and 35B are schematic views of light-emitting devices of embodiments of the present invention.

FIG. 35(A) illustrates a light-emitting device of one embodiment of the present invention. The light-emitting device of one embodiment of the present invention includes an anode 310, a cathode 311, and an EL layer 312 containing an organic compound interposed between the anode 310 and the cathode 311.

The EL layer 312 includes a light-emitting layer 314 and a first layer 313. The light-emitting layer 314 is a layer having a light-emitting function in the light-emitting device, and light emission is mainly obtained from the light-emitting layer 314 in the light-emitting device. The first layer 313 is a layer containing an organic compound and an inorganic compound.

The organic compound in the first layer 313 is preferably an organic compound having an electron-transport property, and the inorganic compound is preferably a layer containing a fluoride of an alkali metal or a fluoride of an alkaline earth metal.

The refractive index of an organic compound having a high carrier-transport property that is used for an organic electronic device is approximately 1.7. Since the refractive index of a fluoride of an alkali metal or a fluoride of an alkaline earth metal is approximately 1.35, the first layer 313 containing an organic compound and a fluoride of an alkali metal or a fluoride of an alkaline earth metal can be a layer having a lower refractive index than a layer using a material used for a typical light-emitting device.

Figure 36:
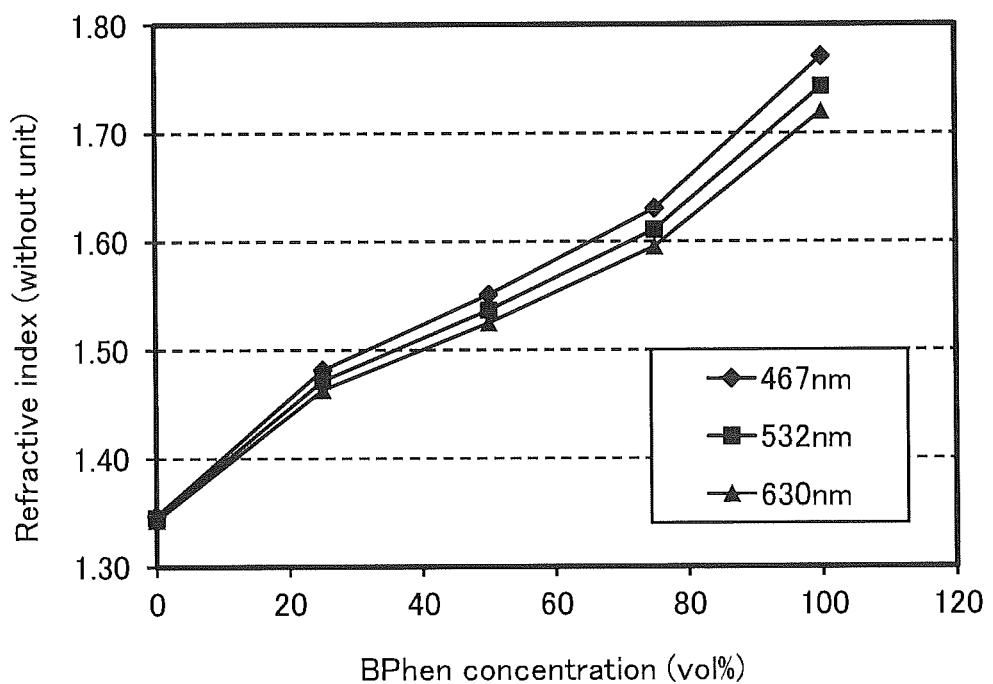
FIG. 36 is a graph showing the refractive indices of films containing BPhen and lithium fluoride.

FIG. 36 is a graph showing the refractive index of a mixed film composed of BPhen and lithium fluoride. In the graph, the horizontal axis represents the concentration of BPhen. Note that the rightmost plot indicates the refractive index of Bphen, and the leftmost plot indicates the refractive index of lithium fluoride. According to FIG. 36, although there is a difference between wavelengths, the refractive index of the film is changed in accordance with the content of each of lithium fluoride and BPhen; therefore, it is found that the first layer 313 containing a fluoride of an alkali metal or a fluoride of an alkaline earth metal is a layer having a lower refractive index than a layer using a material used for a typical light-emitting device, as described above.

As described above, according to one embodiment of the present invention, a layer with a low refractive index can be provided between the light-emitting layer and the cathode. Providing a layer with a low refractive index in a light-emitting device can improve the emission efficiency of the light-emitting device as described in Non-Patent Document 1. The improvement in efficiency is probably attributed to inhibition of a thin film mode and a surface plasmon polariton mode. Thus, the first layer 313 with a low refractive index is provided in the light-emitting device as in one embodiment of the present invention, whereby the light-emitting device of one embodiment of the present invention can have high emission efficiency.

When the content of a fluoride of an alkali metal or a fluoride of an alkaline earth metal in the first layer 313 is higher than 0 vol %, the first layer 313 has a lower refractive index than that composed of only an organic compound; accordingly, the emission efficiency of the light-emitting device is improved. As described above, as the fluoride content in the first layer 313 is increased, the refractive index is lowered and thus the emission efficiency of the light-emitting device is improved; however, as a result of consideration by the present inventors, it has been found that when the lithium fluoride content is higher than or equal to 95 vol %, efficiency is noticeably low (see FIG. 37). Therefore, the content of a fluoride of an alkali metal or a fluoride of an alkaline earth metal in the first layer 313 is preferably lower than 95 vol %.

Figure 38:
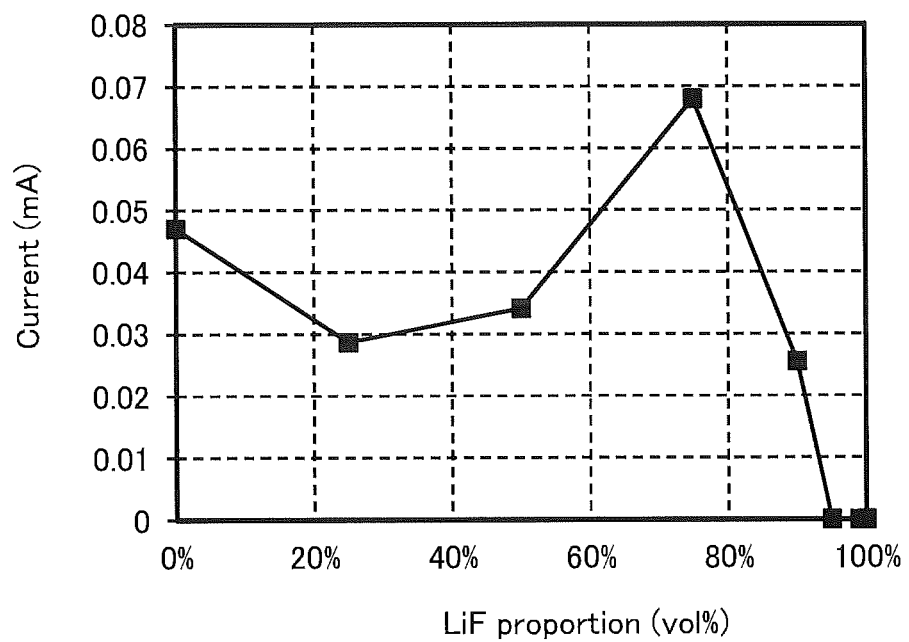
FIG. 38 is a graph showing the relation between LiF ratio and current at 3V.

It has also been found that in a light-emitting device in which the content of a fluoride of an alkali metal or a fluoride of an alkaline earth metal in the first layer 313 is higher than or equal to 0 vol % and lower than 50 vol %, an increase in the fluoride content tends to decrease the amount of current at the same driving voltage (see FIG. 38). That is, in this concentration range, the driving voltage of the light-emitting device increases. However, surprisingly, the examination by the present inventors has revealed that when the fluoride content is higher than or equal to 50 vol %, a tendency changes such that an increase in the fluoride content increases the amount of current at the same voltage. As a result, in a region where the fluoride content is higher than or equal to 50 vol %, driving voltage also becomes low; therefore, the content of a fluoride of an alkali metal or a fluoride of an alkaline earth metal in the first layer 313 is preferably higher than or equal to 50 vol %.

This lithium fluoride content of 50 vol % is the concentration at which a fluoride of an alkali metal or a fluoride of an alkaline earth metal in the first layer 313 starts to be crystallized, and the description about that is given below. That is, a decrease in driving voltage accompanying an increase in the amount of current may have something to do with crystallization due to an increase in the content of a fluoride of an alkali metal or a fluoride of an alkaline earth metal in the first layer 313. Note that it is also known that a fluoride of an alkali metal or a fluoride of an alkaline earth metal contained in the first layer 313 at greater than or equal to 50 vol % exists in a microcrystalline state in the layer.

According to the above description, in one embodiment of the present invention, the content of a fluoride of an alkali metal or a fluoride of an alkaline earth metal in the first layer 313 is preferably higher than or equal to 50 vol % and lower than 95 vol %. The fluoride content is further preferably higher than or equal to 60 vol % and lower than or equal to 80 vol %, where the driving voltage is more favorable. When the fluoride content is 75 vol %, the characteristics are most favorable; thus, the fluoride content is still further preferably higher than or equal to 70 vol % and lower than or equal to 80 vol %.

Although in one embodiment of the present invention, the content of a fluoride of an alkali metal or a fluoride of an alkaline earth metal in the first layer 313 is preferably higher than or equal to 50 vol %, the composition of a material conventionally used for an electron-injection layer or an electron-transport layer, which contains a large amount of a fluoride of an alkali metal or a fluoride of an alkaline earth metal as in one embodiment of the present invention, has not been examined. This is presumably because a fluoride of an alkali metal or a fluoride of an alkaline earth metal originally has an insulating property; thus, the deterioration of characteristics was considered inevitable. The fact that the driving voltage actually gets worse in a region where the fluoride content is lower than 50 vol % as is expected is also a significant hindrance. However, in such a situation, one embodiment of the present invention should be very innovative in terms of achievement of a light-emitting device having high efficiency by being provided with a layer with a low refractive index and a favorable driving voltage due to driving voltage characteristics improved on the contrary in a region where the fluoride content is higher than or equal to 50 vol %.

Note that an organic compound used for the first layer 313 is preferably an organic compound having an electron-transport property, and the first layer 313 is preferably provided between the light-emitting layer 314 and the cathode 311. The first layer 313 can function as part of an electron-transport layer. In particular, the first layer that contains an organic compound having an electron-transport property and a fluoride of an alkali metal or a fluoride of an alkaline earth metal and in which the content of the fluoride of an alkali metal or the fluoride of an alkaline earth metal is higher than or equal to 50 vol % includes microcrystals of the fluoride and has a high electron-transport property. Therefore, the structure where the first layer 313 described above is used as a part or the whole of the electron-transport layer is preferable because the driving voltage can be reduced. The first layer 313 has favorable characteristics even when it is in direct contact with the cathode 311; thus, the first layer 313 can also serve as an electron-injection layer. When the first layer 313 also serves as an electron-transport layer, the number of layers included in the light-emitting device can be reduced, and this structure has a cost advantage.

An organic compound having an electron-transport property is preferably a π-electron deficient heteroaromatic compound, and among π-electron deficient heteroaromatic compounds, an organic compound having a bipyridine skeleton such as a phenanthroline skeleton is preferable. Specifically, bathophenanthroline (abbreviation: BPhen) and 2,9-bis(naphthalen-2-yl)-4,7-diphenyl-1,10-phenanthroline (abbreviation: NBPhen) are preferable, and NBPhen, which has a high glass transition point (Tg) and high heat resistance, is particularly favorable.

Figure 39A:
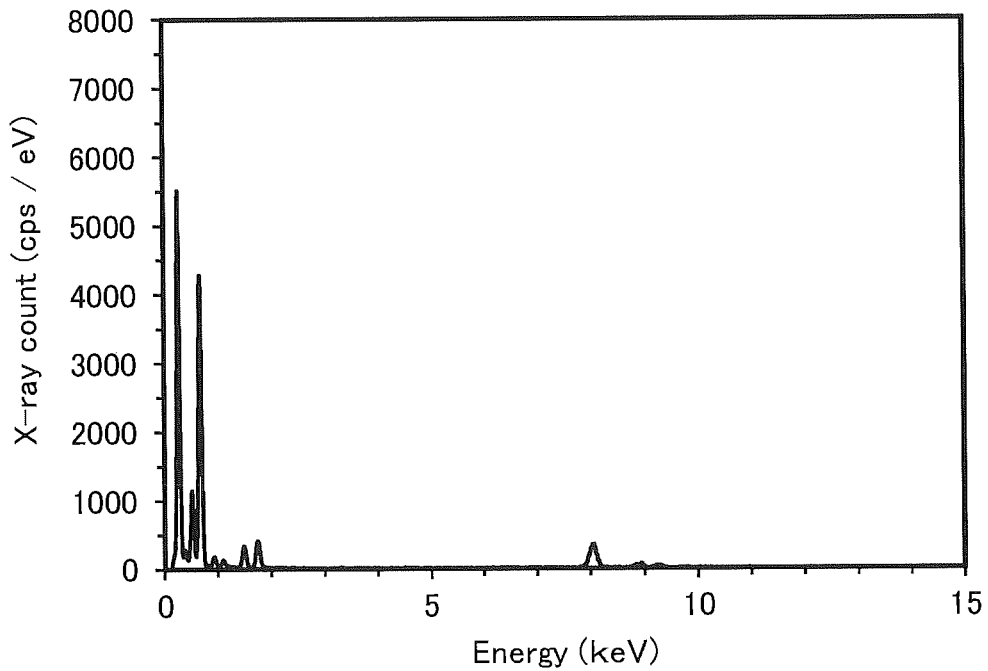
FIGS. 39A and 39B are graphs showing EDX spectrum data.
Figure 39B:
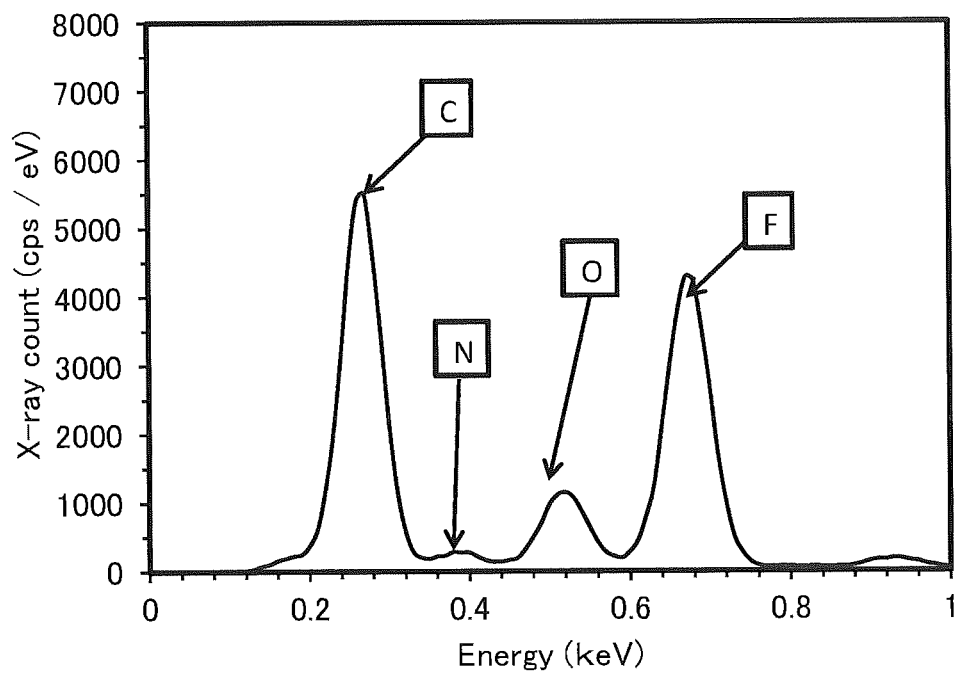

FIG. 39 shows results obtained by analyzing a portion corresponding to the first layer 313 in the light-emitting device having the structure of one embodiment of the present invention by energy dispersive X-ray spectroscopy (EDX) with a scanning transmission electron microscope (HD-2700) produced by Hitachi High-Technologies Corporation. In the EDX measurement, an EDX spectrum of a point is obtained in such a manner that electron beam irradiation is performed on the point in an analysis target region of a sample, and the energy of characteristic X-ray of the sample generated by the irradiation and its frequency are measured. In this embodiment, an element was identified from a peak energy of the EDX spectrum of each point, and the element concentration ratio was calculated from the peak intensity ratio using accessary software for HD-2700.

The first layer 313 in the light-emitting device that was used as a sample was a film containing BPhen, represented by the following structural formula, and lithium fluoride, and the lithium fluoride content was 75 vol %.

[Chemical Formula 1]

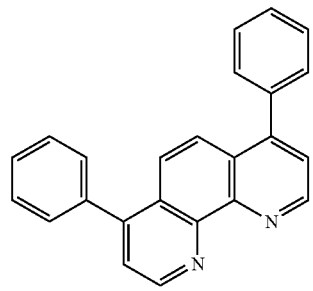

BPhen

Table 11 is the existence ratio of atoms calculated from spectrum peaks in FIG. 39.

TABLE 11

| Element | wt % | atom % |
|---|---|---|
| C | 27.23 | 41.08 |
| N | 0.74 | 0.95 |
| F | 43.94 | 41.90 |

As in FIG. 39 and Table 11, the number of fluorine atoms is clearly larger than that of nitrogen atoms in the layer, and fluorine with an intensity three times or more that of nitrogen was detected. The fact that lithium fluoride is contained in the film can be confirmed by TOF-SIMS, TEM-EELS, XPS, or the like. Characteristic measurement results of the film and the light-emitting device of one embodiment of the present invention are obtained by the above-described analyses. Note that although a substance containing a large amount of fluorine is contained as part of the organic compound, TOF-SIMS, TEM-EELS, XPS can confirm the existence of such an organic compound, which allows separation from the results of the present invention.

Figure 40:
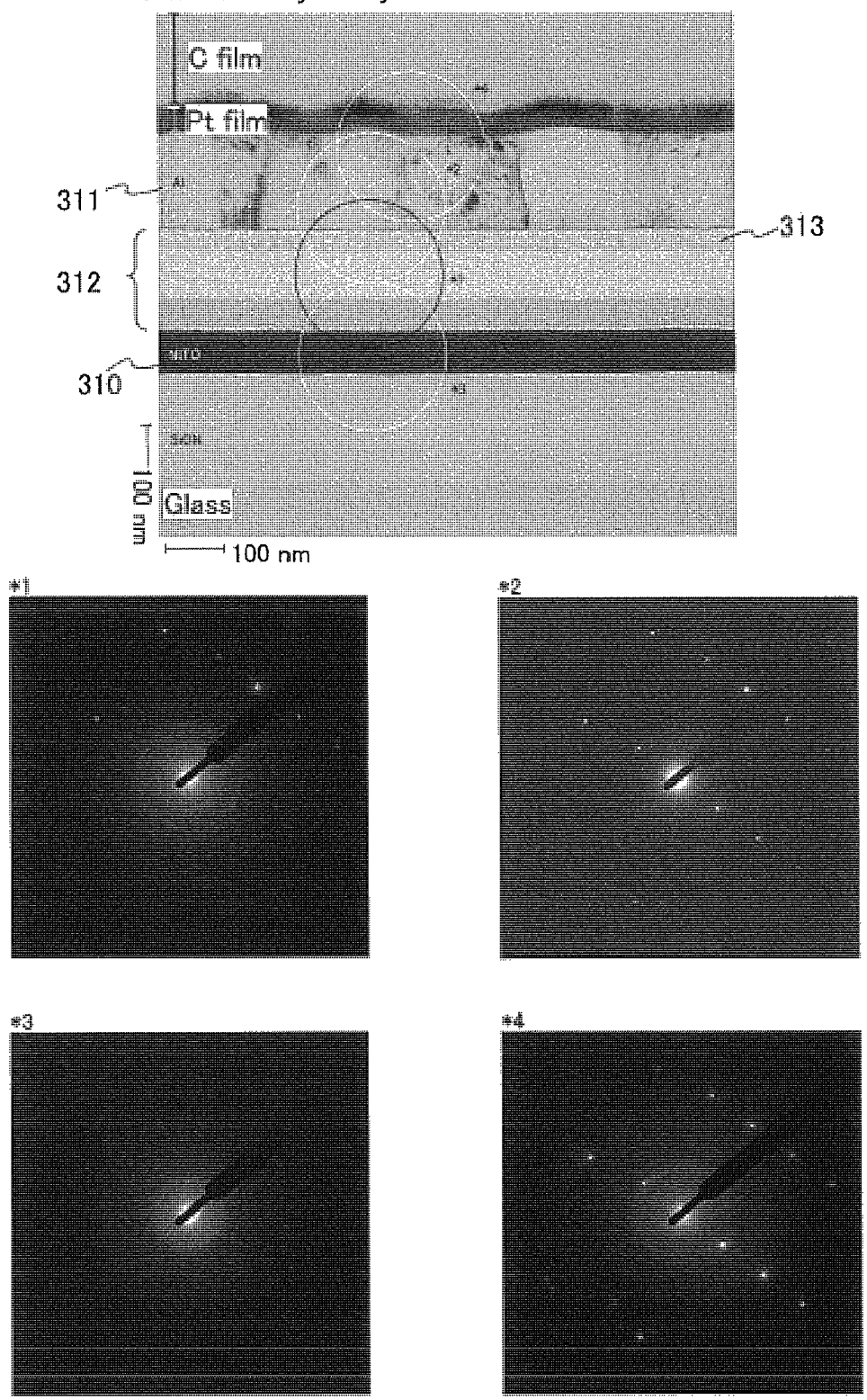
FIG. 40 is the results of selected-area electron diffraction analysis of a mixed film of BPhen and LiF.

Next, results obtained by performing selected-area electron diffraction analysis on the light-emitting device of one embodiment of the present invention are shown. A view shown in FIG. 40 is a cross-sectional transmission electron microscope (TEM) photograph of the light-emitting device of one embodiment of the present invention, and four circles shown in FIG. 40 are each a portion subjected to selected-area electron diffraction analysis. The cross-sectional transmission electron microscope (TEM) observation and selected-area electron diffraction analysis were performed using an H-9000NAR produced by Hitachi High-Technologies Corporation.

The result obtained by performing selected-area electron diffraction analysis on each measurement portion is shown in a lower part of FIG. 40, and corresponds to the photograph with the corresponding reference numeral in the TEM photograph in an upper part of FIG. 40. The first layer 313 is a layer composed of BPhen and lithium fluoride, and a sample in which the lithium fluoride content in the first layer 313 was 75 vol % was used.

The upper view of FIG. 40 shows that measurement portions including the first layer 313 are represented by *1 and *2, and *3 and *4 are measurement portions not including the first layer 313, and bright spots in the form of particles in a ring-like pattern were observed only in lower views of *1 and *2. This pattern suggests that crystals with different directions exist in the layer. Note that in *3 and *4, crystals with different directions do not exist, and a halo pattern indicating an amorphous state and spots derived from aluminum used in a cathode were observed. Thus, it was found that the first layer 313 is highly likely to include microcrystals.

Figure 41:
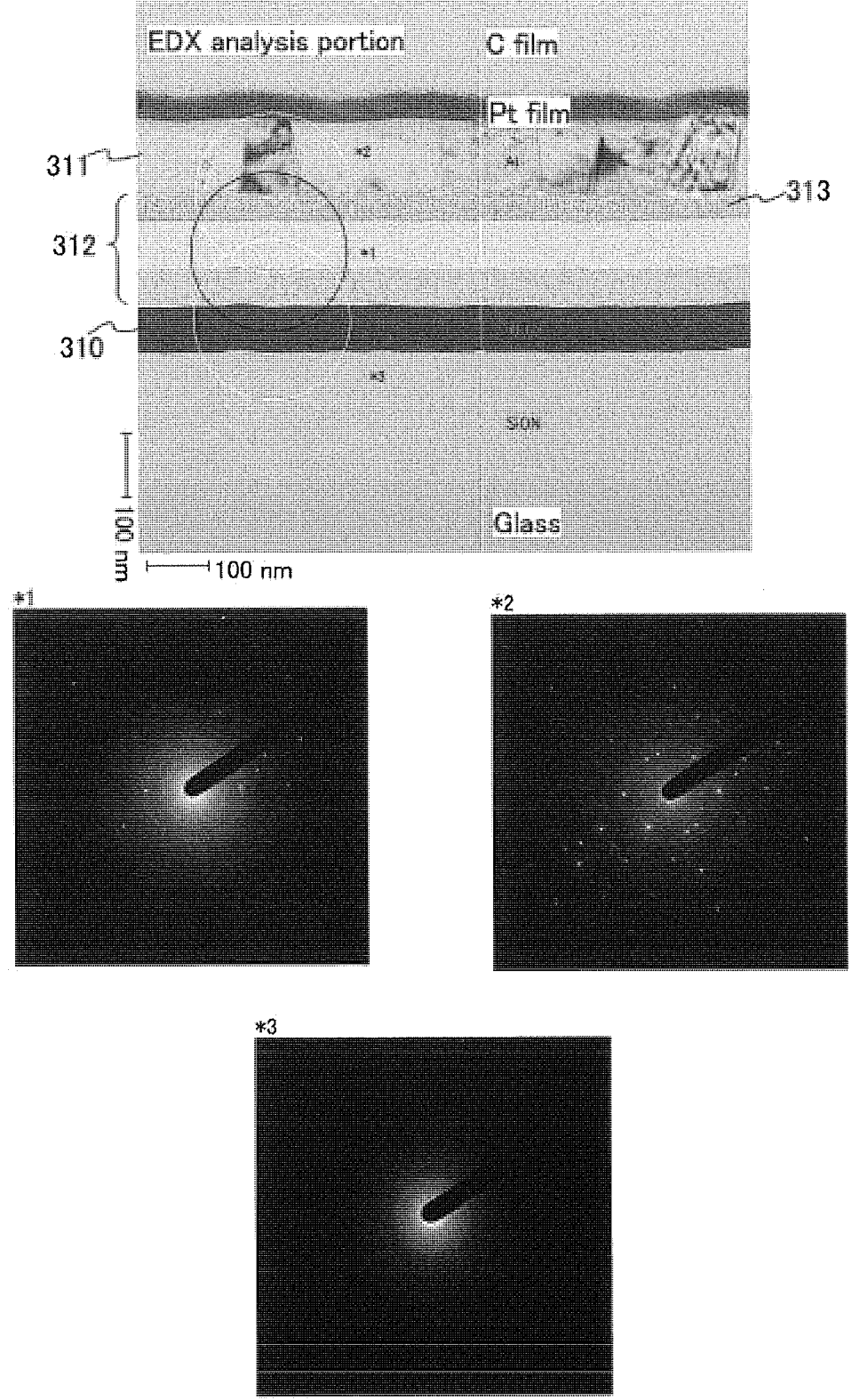
FIG. 41 is the results of selected-area electron diffraction analysis of a mixed film of BPhen and $CaF_2$.

The same analysis was also performed on a light-emitting device using calcium fluoride instead of lithium fluoride. The first layer 313 in a TEM photograph in an upper part of FIG. 41 is a layer composed of BPhen and calcium fluoride, and the calcium fluoride content in the first layer 313 is 75 vol %. Three circles shown in the TEM photograph represent portions subjected to selected-area electron diffraction analysis.

The upper view of FIG. 41 shows that measurement portions including the first layer 313 are represented by *1 and *2, and *3 is a measurement portion not including the first layer 313, and bright spots in the form of particles in a ring-like pattern were observed only in lower views of *1 and *2. This pattern suggests that crystals with different directions exist in the layer. Note that in *3, crystals with different directions do not exist, and only a halo pattern indicating an amorphous state was observed. Thus, it was found that the first layer 313 is highly likely to include microcrystals.

Figure 42:
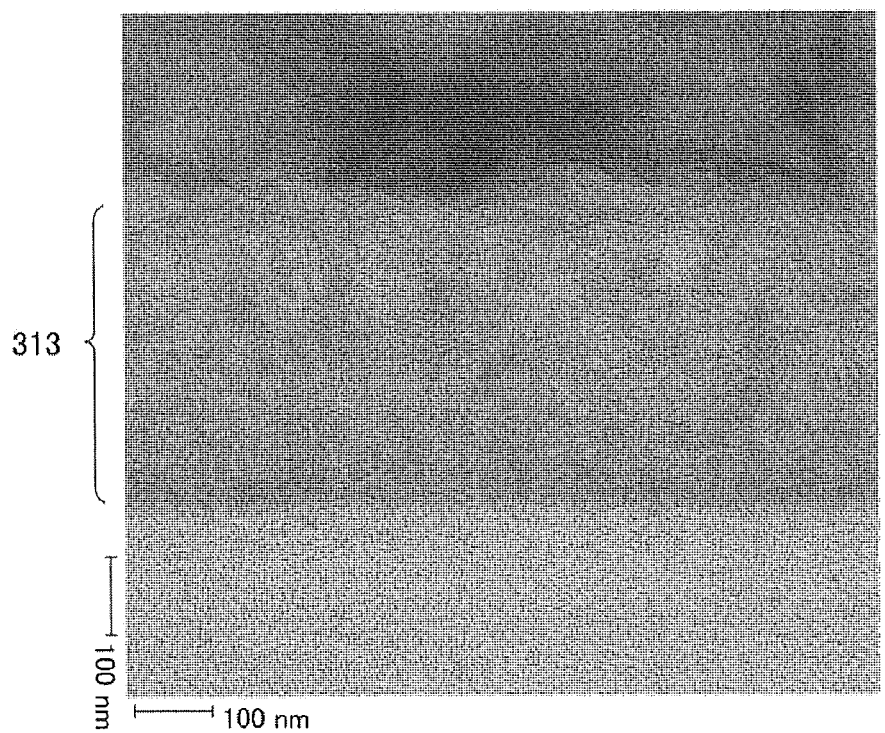
FIG. 42 is a high-magnification TEM photograph of a mixed film of BPhen and $CaF_2$.

Then, a high magnification TEM observation was performed on this sample, and as a result, lattice fringes were observed (FIG. 42). In FIG. 42, lattice fringes, indicating crystallization, are observed with a size of approximately 10 nm. The orientations of lines of the lattice fringes are random. This result also indicates that microcrystals with random crystal orientations are formed in the first layer 313 composed of BPhen and calcium fluoride.

Figure 43A:
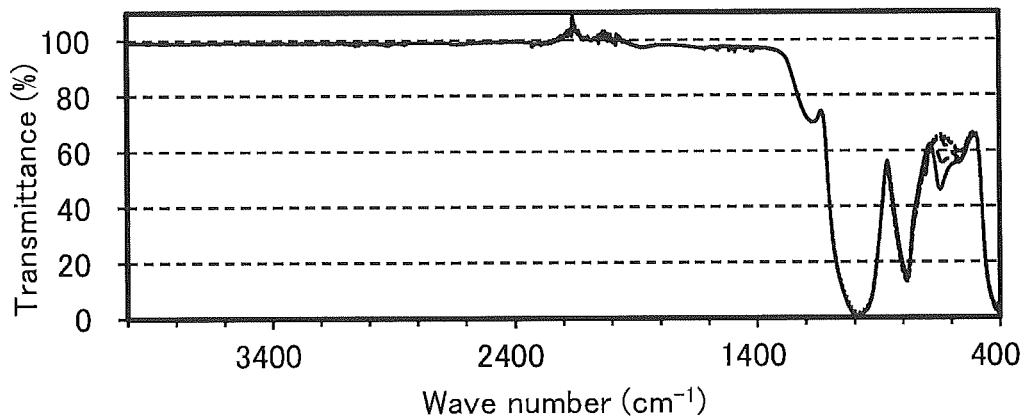
FIGS. 43A-43C are IR measurement results of mixed films of BPhen and $CaF_2$.
Figure 43B:
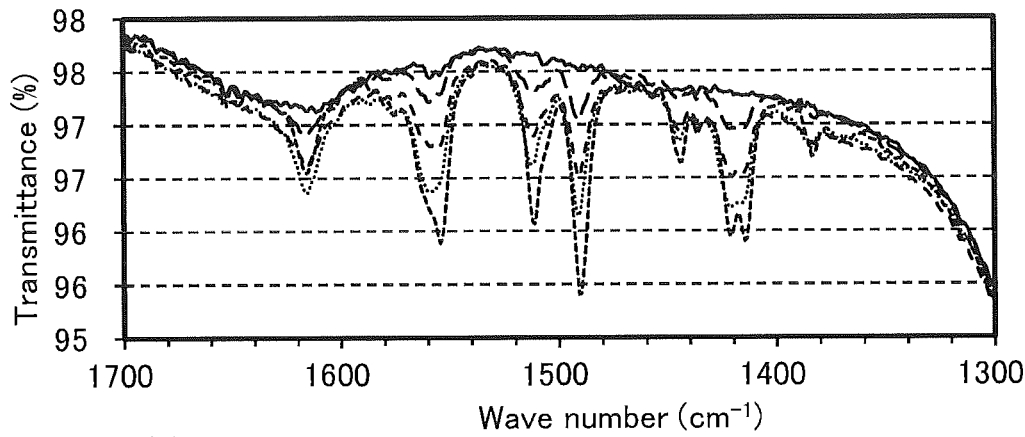
Figure 43C:
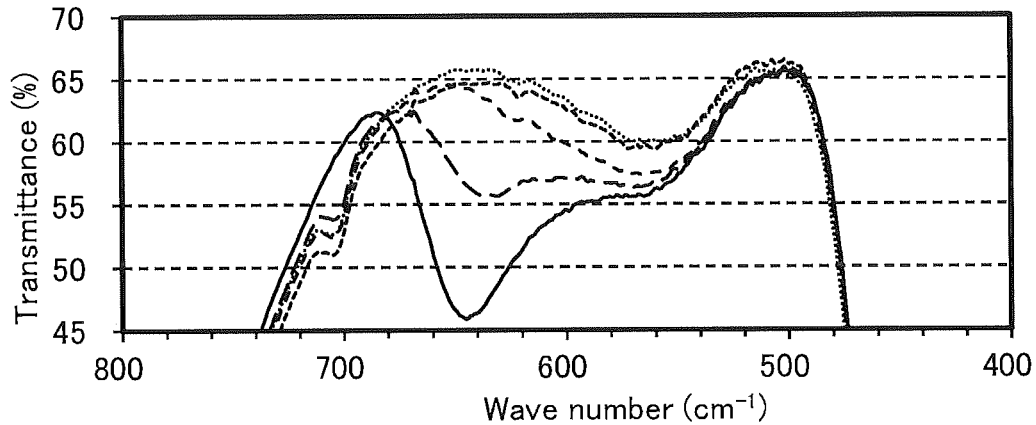

FIGS. 43(A) to 43(C) show results obtained by performing attenuated total reflection (AIR method) in fourier transform infrared spectroscopy (FT-IR) on mixed films of BPhen and lithium fluoride. The FT-IR measurement was conducted using Nicolet iS50 Analytical manufactured by Thermo Fisher Scientific K.K. As measurement samples, evaporation films each formed to a thickness of 50 nm over a quartz substrate were used.

In this measurement, the mixed films of BPhen and lithium fluoride were measured, and films having different mixture ratios were used as a plurality of kinds of samples. FIG. 43(B) is an enlarged graph showing the range of 1300 $cm^{-1}$ to 1700 $cm^{-1}$ in FIG. 43(A), and FIG. 43(C) is an enlarged graph showing the range of 400 $cm^{-1}$ to 800 $cm^{-1}$. The absorption in the range of 1400 $cm^{-1}$ to 1700 $cm^{-1}$ is mainly derived from BPhen, and the absorption in the range of 500 $cm^{-1}$ to 700 $cm^{-1}$, which has a peak at 650 $cm^{-1}$, is mainly derived from vibration of lithium fluoride.

The tendency is seen in which the absorption derived from BPhen at 1400 $cm^{-1}$ to 1700 $cm^{-1}$ increases as the BPhen content increases. Meanwhile, the absorption derived from lithium fluoride at 500 $cm^{-1}$ to 700 $cm^{-1}$ tends to have almost no change until the lithium fluoride content becomes approximately 50 vol % and increases when the lithium fluoride content exceeds 50 vol %.

Figure 44:
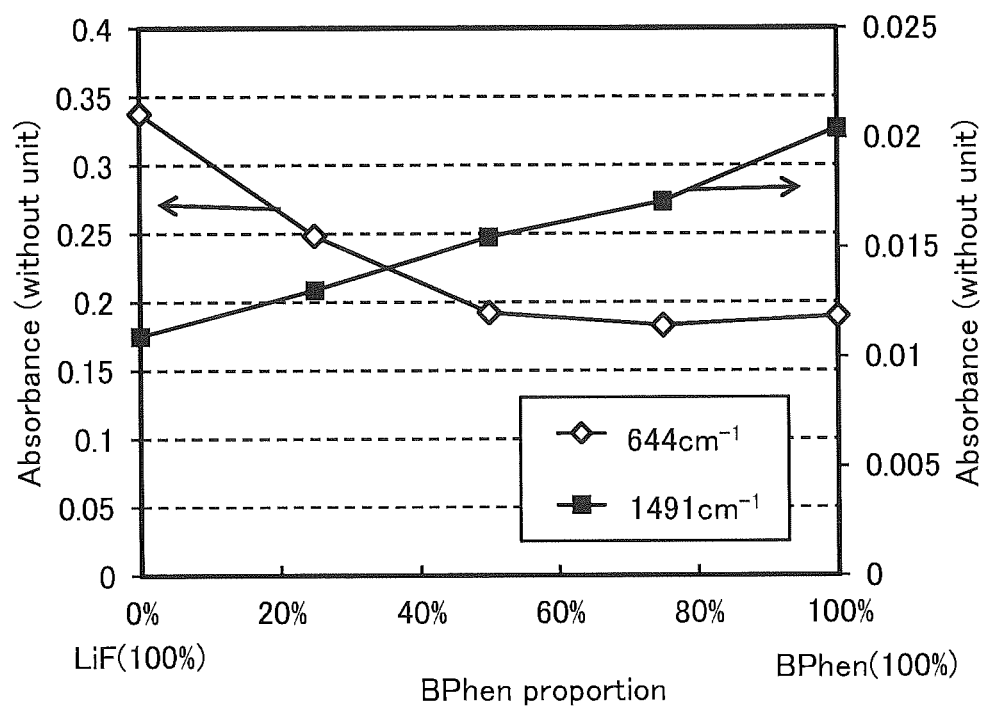
FIG. 44 is the relation between the mixture ratio and absorbance of mixed films of BPhen and $CaF_2$.

FIG. 44 shows results where the relations between the proportion of BPhen and absorbance at 1491 $cm^{-1}$ and at 644 $cm^{-1}$ are plotted. FIG. 44 clearly shows that the absorption derived from BPhen having a peak at 1491 $cm^{-1}$ increases as the concentration of BPhen increases, and the intensity of the absorption having a peak at 644 $cm^{-1}$ does not increase at the stage where the concentration of lithium fluoride is low and starts to increases at around 50 vol %. The ER absorption of lithium fluoride having a peak at 644 $cm^{-1}$ is derived from vertical optical lattice vibration of a lithium fluoride crystal; thus, it was found that lithium fluoride starts to be crystallized when its content exceeds 50 vol %, and the amount of crystallized portions increase as the concentration of lithium fluoride increases.

That is, as a result of consideration also based on the above-described selected-area electron diffraction analysis results, the first layer 313 in which the lithium fluoride content is higher than or equal to 50 vol % can be said to be a layer including microcrystals of lithium fluoride. In addition, these results and the results in FIG. 38 (an increase in the lithium fluoride content reduces the amount of current and increases driving voltage, but when the lithium fluoride content exceeds 50 vol %, the amount of current increases and driving voltage decreases) imply that the driving voltage of the light-emitting device is lowered with the crystallization of the first layer 313.

Thus, the light-emitting device including the first layer 313 containing an organic compound and a fluoride of an alkali metal or a fluoride of an alkaline earth metal can have a low driving voltage by including microcrystals of the fluoride of an alkali metal or the fluoride of an alkaline earth metal, which is an inorganic compound, in the first layer 313.

Since a salt of an alkali metal or an alkaline earth metal, such as a fluoride of an alkali metal or a fluoride of an alkaline earth metal, is inexpensive, a light-emitting device using an electron-transport layer containing such a salt for half or more thereof can be inexpensive and thus has a cost advantage.

Note that an important point of the present invention is that the light-emitting device can be fabricated without a significant adverse effect on the characteristics thereof even when the first layer 313 described above is provided inside the device.

In general, a low refractive index and a high carrier-transport property or reliability when an organic compound is used for a light-emitting device have a trade-off relation. This is because the carrier-transport property and reliability of an organic compound largely depend on an unsaturated bond, and an organic compound having many unsaturated bonds tends to have a high refractive index.

The refractive index of a material is expressed by the square root of ($\mu\varepsilon/\mu_0\varepsilon_0$), where $\mu$ is the permeability of the material, $\varepsilon$ is the dielectric constant of the material, $\mu_0$ is permeability in vacuum, and $\varepsilon_0$ is the dielectric constant in vacuum, and as a non-dielectric constant is larger, a refractive index is likely to be higher. When it comes to organic compounds, a substance having a larger number of unsaturated bonds tends to have a higher dielectric constant because electric charge transfer in molecules is easier; consequently, the existence of an unsaturated bond is a factor for increasing a refractive index.

It is known that an organic compound having a high carrier-transport property is unsaturated hydrocarbon having a broad π-conjugated system, and an organic compound that can impart high reliability when used as a material for a light-emitting device is unsaturated hydrocarbon having a rigid structure due to unsaturated bonds and having a high Tg. Thus, selecting an organic compound having less unsaturated bonds in order to form a layer having a low refractive index is likely to lead to an increase in driving voltage due to the poor carrier-transport property of the organic compound and a reduction in reliability due to no rigid structure. Therefore, it has been very difficult to form a layer with a low refractive index in a light-emitting device using an organic material, without forcing a great sacrifice on the device characteristics.

In one embodiment of the present invention, an organic compound with a high content of a fluoride of an alkali metal and a fluoride of an alkaline earth metal, which is not a conventional content, is used as the first layer 313. This enables effects such as an increase in emission efficiency, a decrease in driving voltage, and low-cost fabrication.

Next, a material that can be used for the first layer 313 is specifically described. As described above, the first layer 313 is a layer containing an organic compound and an inorganic compound.

The inorganic compound is a salt of an alkali metal or a salt of an alkaline earth metal, preferably a fluoride of an alkali metal or a fluoride of an alkaline earth metal. As a fluoride of an alkali metal, lithium fluoride is preferable. As a fluoride of an alkaline earth metal, calcium fluoride or magnesium fluoride is preferable.

As the organic compound described above, an organic compound having an electron-transport property is preferable; specifically, an organic compound having an electron mobility of higher than or equal to $10^{-6}$ cm$^2$/Vs is preferable. Furthermore, the organic compound described above is preferably a π-electron deficient heteroaromatic compound. Examples of a material having an electron-transport property include a heterocyclic compound having the above-described metal complex and an azole skeleton, a diazine skeleton, or a pyridine skeleton. Among them, BPhen and NBPhen, which have a bipyridine skeleton such as a phenanthroline skeleton, are preferable, and NBPhen is particularly favorable.

As described above, in the light-emitting device of one embodiment of the present invention, the refractive index of the first layer 313 can be greatly lower than those of peripheral materials, and a light-emitting device in which the concentration of the fluoride of an alkali metal or an alkaline earth metal is greater than or equal to 0 vol % and less than 95 vol % can have higher emission efficiency. Furthermore, the first layer 313 containing a salt of an alkali metal or an alkaline earth metal at greater than or equal to 50 vol % allows a light-emitting device with an improved driving voltage to be obtained.

<Structure Example of Light-Emitting Device>

Figure 35B:
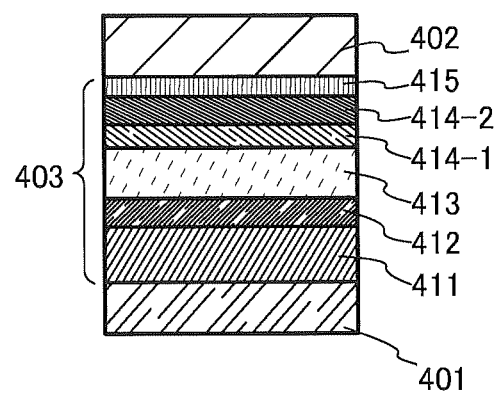

FIG. 35(B) is a view illustrating a light-emitting device of one embodiment of the present invention. The light-emitting device of one embodiment of the present invention includes an anode 401, a cathode 402, and an EL layer 403, and the EL layer 403 includes a light-emitting layer 413 and the first layer; FIG. 35(B) illustrates the case where the above first layer is an electron-transport layer, as an example.

FIG. 35(B) illustrates the case where the electron-transport layer is two layers, a first electron-transport layer 414-1 and a second electron-transport layer 414-2, as an example. The first layer 313 in FIG. 35(A) corresponds to the second electron-transport layer 414-2. The first electron-transport layer 414-1 is an electron-transport layer which does not contain a fluoride of an alkali metal or a fluoride of an alkaline earth metal.

The EL layer 403 may further include a hole-injection layer 411, a hole-transport layer 412, an electron-injection layer 415, and the like.

Although FIG. 35(B) illustrates, as an example, the structure of the light-emitting device provided with the hole-injection layer 411, the hole-transport layer 412, the light-emitting layer 413, the first electron-transport layer 414-1, the second electron-transport layer 414-2, and the electron-injection layer 415 in this order from the anode 401 side, the light-emitting device of one embodiment of the present invention may have a structure including a functional layer other than these layers or a structure without any one or more layers other than the second electron-transport layer 414-2 and the light-emitting layer 413. Note that the materials given as examples in Embodiment 1 can be used for the anode 401, the cathode 402, the hole-injection layer 411, the hole-transport layer 412, the light-emitting layer 413, the first electron-transport layer 414-1, and the electron-injection layer 415.

The above structure can be combined as appropriate with other structures in the other embodiments and this embodiment.

Embodiment 3

In this embodiment, a structure in which a layer with a low refractive index is also provided between the light-emitting layer 314 and the anode 310 is described with reference to FIG. 45. Note that components between the light-emitting layer 314 and the cathode 311 are similar to those in Embodiment 2; thus, the description thereof is omitted. The description in Embodiment 2 is to be referred to. In this embodiment, the EL layer 312 includes a second layer 315, which is a layer with a low refractive index, between an anode and a light-emitting layer, and includes the first layer 313, which is a layer with a low refractive index, between the light-emitting layer and a cathode, whereby the light-emitting device with improved emission efficiency can be provided.

Figure 45:
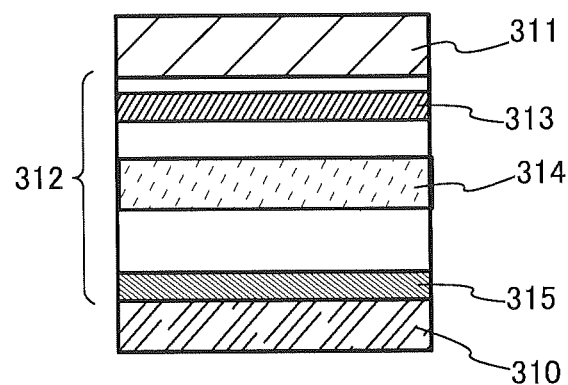
FIG. 45 is a schematic view of a light-emitting device of one embodiment of the present invention.

In this embodiment, as illustrated in FIG. 45, the second layer 315, which is a layer with a low refractive index, is provided between the light-emitting layer 314 and the anode 310, in addition to the first layer 313, which is a layer with a low refractive index. The second layer 315 is a layer containing a first substance containing fluorine, a second substance, which is an organic compound with a hole-transport property, and a third substance exhibiting an electron-accepting property with respect to the second substance. The second layer 315 can have a low refractive index by containing the first substance containing fluorine.

Furthermore, by containing the second substance, which is an organic compound having a hole-transport property, and the third substance exhibiting an electron-accepting property with respect to the second substance, the second layer 315 has excellent properties of hole injection and hole transport from an electrode.

The existence of the first substance has no significant influence on a hole-injection property and a hole-transport property due to the interaction between the second substance and the third substance; thus, both a refractive index lowered by the first substance and the hole-injection property and the hole-transport property of the second layer 315 can be achieved. The second layer 315, which is a layer having an excellent hole-injection property and an excellent hole-transport property, can function as a hole-injection layer in contact with the anode.

Depending on the HOMO level of an organic compound selected as the second substance, the second layer 315 might increase driving voltage compared with a film not containing the first substance; however, in such a case, forming a third layer not containing the first substance and composed of only the second substance and the third substance, in contact with a cathode-side surface of the second layer 315, can reduce the influence. In that case, the second substance and the third substance used for the third layer may be the same as or different from those used for the second layer 315.

Furthermore, when a film included in the second layer 315 has a spin density of greater than or equal to $1.0\times10^{18}$ spins/cm$^3$, favorable characteristics can be obtained, so that the spin density of the second layer 315 is preferably greater than or equal to $1.0\times10^{18}$ spins/cm$^3$. Spin density can be measured by an ESR method, and increases or decreases depending on the content and the kind of each of the first substance to the third substance.

The first substance containing fluorine is preferably a fluoride of an alkali metal, a fluoride of an alkaline earth metal, or alkyl fluoride. Specifically, the first substance is preferably any of lithium fluoride, magnesium fluoride, and calcium fluoride.

The third substance is preferably any one or more of a transition metal oxide, oxides of metals belonging to Group 4 to Group 8 in the periodic table, and an organic compound having an electron-withdrawing group; specific examples include titanium oxide, vanadium oxide, tantalum oxide, molybdenum oxide, tungsten oxide, rhenium oxide, ruthenium oxide, chromium oxide, zirconium oxide, hafnium oxide, silver oxide, 7,7,8,8-tetracyano-2,3,5,6-tetrafluoroquinodimethane, chloranil, 2,3,6,7,10,11-hexacyano-1,4,5,8,9,12-hexaazatriphenylene, 1,3,4,5,7,8-hexafluorotetracyano-naphthoquinodimethane, and α,α',α"-1,2,3-cyclopropanetriylidenetris[4-cyano-2,3,5,6-tetrafluorobenzeneacetonitrile]. Note that among them, molybdenum oxide is particularly preferable because of its high electron-accepting property and high stability.

As the second substance, which is an organic compound having a hole-transport property, the substances enumerated in Embodiment 1 as organic compounds having a hole-transport property can be used; however, the second substance is preferably a λ-electron rich heteroaromatic compound or an aromatic amine compound. Particularly with a substance with a HOMO level of higher than or equal to −5.7 eV, further preferably with a HOMO level of −5.5 eV, a light-emitting device having no increase in driving voltage and thus having more favorable characteristics can be obtained.

Note that the refractive index of the second layer 315 can be changed depending on the first substance content; however, the refractive index of the second layer 315 is preferably less than or equal to 1.70, in which case the effect of an improvement in emission efficiency is great. Note that a feature of this structure is that even when the content of the first substance in the second layer 315 is larger than those of the second substance and the first substance, the refractive index of the second layer 315 can be markedly reduced without a significant influence on the characteristics of a light-emitting device.

When the second layer 315 is in contact with the light-emitting layer 314, quenching occurs in some cases; thus, a hole-transport layer preferably exists between the second layer 315 and the light-emitting layer 314.

Furthermore, the second layer 315 is preferably provided within a range of an optical path length of approximately ¼λ from an anode-side interface of the light-emitting layer. The interface between the second layer 315 and the anode is preferably set approximately ¼ away from the center of light-emitting layer.

The light-emitting device having such a structure can have extremely high efficiency owing to the effect of the first layer 313 and the second layer 315, which are low refractive index layers existing on the anode side and on the cathode side.

Embodiment 4

In this embodiment, a light-emitting device having a structure different from the structure of the light-emitting device described in Embodiment 1 and a light emission mechanism of the light-emitting device will be described below with reference to FIG. 4 and FIG. 5. Note that in FIG. 4 and FIG. 5, a portion having a function similar to that of a portion denoted by a reference numeral shown in FIG. 1(A) is represented by the same hatch pattern and the reference numeral is omitted in some cases. In addition, common reference numerals are used for portions having similar functions, and a detailed description thereof is omitted in some cases.

<Structure Example 1 of Light-Emitting Device>

Figure 4A:
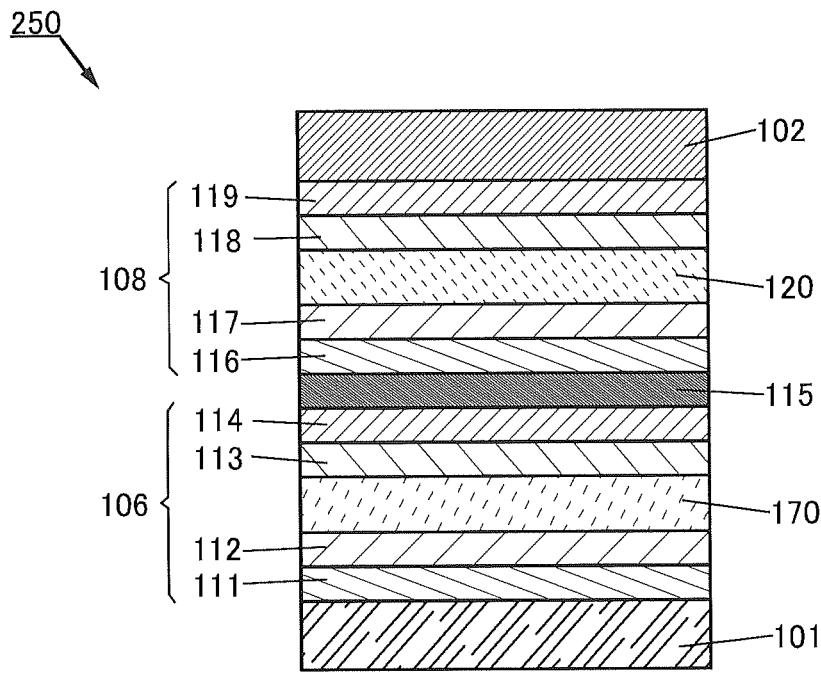
FIGS. 4A-4C are schematic cross-sectional views of a light-emitting device of one embodiment of the present invention, and a diagram showing the correlations of energy levels of a light-emitting layer.

FIG. 4(A) is a schematic cross-sectional view of a light-emitting device 250.

The light-emitting device 250 shown in FIG. 4(A) includes a plurality of light-emitting units (a light-emitting unit 106 and a light-emitting unit 108 in FIG. 4(A)) between a pair of electrodes (the electrode 101 and the electrode 102). Note that the electrode 101 functions as an anode and the electrode 102 functions as a cathode in the light-emitting device 250 in the following description; however, the functions of the electrodes may be reversed as the structure of the light-emitting device 250.

Moreover, in the light-emitting device 250 shown in FIG. 4(A), the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures.

The light-emitting device 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 170. The light-emitting unit 108 includes a hole-injection layer 116, a hole-transport layer 117, the electron-transport layer 118, and the electron-injection layer 119 in addition to the light-emitting layer 120.

The charge-generation layer 115 may have either a structure in which a substance having an acceptor property, which is an electron acceptor, is added to a hole-transport material or a structure in which a substance having a donor property, which is an electron donor, is added to an electron-transport material. Alternatively, both of these structures may be stacked.

In the case where the charge-generation layer 115 contains a composite material of an organic compound and a substance having an acceptor property, the composite material that can be used for the hole-injection layer 111 described in Embodiment 1 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1 \times 10^{-6}$ cm$^2$/Vs or higher is preferably used as the organic compound. Note that other substances may also be used as long as their hole-transport properties are higher than their electron-transport properties. Since the composite material of an organic compound and a substance having an acceptor property has excellent carrier-injection and carrier-transport properties, low-voltage driving or low-current driving can be achieved. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 4(A), the charge-generation layer 115 injects electrons into the light-emitting unit 106 and injects holes into the light-emitting unit 108 when voltage is applied such that the potential of the electrode 101 is higher than the potential of the electrode 102.

Note that in terms of outcoupling efficiency, the charge-generation layer 115 preferably has a property of transmitting visible light (specifically, the transmittance of visible light through the charge-generation layer 115 is higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in driving voltage in the case where the light-emitting layers are stacked.

The light-emitting device having two light-emitting units has been described with reference to FIG. 4(A); however, a light-emitting device in which three or more light-emitting units are stacked can be similarly employed. When a plurality of light-emitting units partitioned by the charge-generation layer are arranged between a pair of electrodes as in the light-emitting device 250, it is possible to achieve a light-emitting device that can emit high-luminance light with the current density kept low and has a long lifetime. Moreover, a light-emitting device having low power consumption can be achieved.

Note that in each of the above-described structures, the emission colors of the guest materials used for the light-emitting unit 106 and the light-emitting unit 108 may be the same or different. In the case where guest materials having a function of emitting light of the same color are used for the light-emitting unit 106 and the light-emitting unit 108, the light-emitting device 250 can exhibit high emission luminance at a small current value, which is preferable. In the case where guest materials having a function of emitting light of different colors are used for the light-emitting unit 106 and the light-emitting unit 108, the light-emitting device 250 can exhibit multi-color light emission, which is preferable. In this case, with the use of a plurality of light-emitting materials with different emission wavelengths in one or both of the light-emitting layer 120 and the light-emitting layer 170, the light-emitting device 250 emits light obtained by synthesizing light emission having different emission peaks; thus, its emission spectrum has at least two maximum values.

The above structure is also suitable for obtaining white light emission. When the light-emitting layer 120 and the light-emitting layer 170 emit light of complementary colors, white light emission can be obtained. It is particularly favorable to select the guest materials so that white light emission with high color rendering properties or light emission of at least red, green, and blue can be obtained.

In the case of a light-emitting device in which three or more light-emitting units are stacked, colors of light emitted from guest materials used in the light-emitting units may be the same or different from each other. In the case where a plurality of light-emitting units that exhibit the same emission color are included, the emission color of the plurality of light-emitting units can have higher emission luminance at a smaller current value than another color. Such a structure can be suitably used for adjustment of emission colors. The structure is particularly suitable when guest materials that emit light of different colors with different luminous efficiencies are used. For example, when three layers of light-emitting units are included, the intensity of fluorescence and phosphorescence can be adjusted with two layers of light-emitting units that contain a fluorescent material for the same color and one layer of a light-emitting unit that contains a phosphorescent material that emits light of a color different from the emission color of the fluorescent material. That is, the emission intensity of light of each color can be adjusted by the number of light-emitting units.

In the case of the light-emitting device including two layers of fluorescent units and one layer of a phosphorescent unit, it is preferable that the light-emitting device include the two layers of the light-emitting units including a blue fluorescent material and the one layer of the light-emitting unit including a yellow phosphorescent material; that the light-emitting device include the two layers of the light-emitting units including a blue fluorescent material and the one layer of the light-emitting-layer unit including a red phosphorescent material and a green phosphorescent material; or that the light-emitting device include the two layers of the light-emitting units including a blue fluorescent material and the one layer of the light-emitting-layer unit including a red phosphorescent material, a yellow phosphorescent material, and a green phosphorescent material, in which case white light emission can be obtained efficiently.

At least one of the light-emitting layer 120 or the light-emitting layer 170 may further be divided into layers and the divided layers may contain different light-emitting materials. That is, at least one of the light-emitting layer 120 or the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors.

When any of the structures described in Embodiment 1 is used for at least one of the plurality of units, a light-emitting device with excellent outcoupling efficiency can be provided. Specifically, it is preferable that a region that is 0 nm to λ/2 inclusive from the light-emitting layer 170 have a low refractive index. In FIG. 4, it is particularly preferable that the hole-injection layer 111 also serve as a layer with a low refractive index.

Figure 4B:
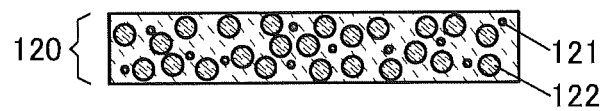

The light-emitting layer 120 included in the light-emitting unit 108 includes a guest material 121 and a host material 122 as shown in FIG. 4(B). Note that the guest material 121 is described below as a fluorescent material.

<<Light Emission Mechanism of Light-Emitting Layer 120>>

The light emission mechanism of the light-emitting layer 120 is described below.

The electrons and holes injected from the pair of electrodes (the electrode 101 and the electrode 102) or the charge-generation layer are recombined in the light-emitting layer 120, whereby excitons are generated. The amount of the host material 122 is larger than that of the guest material 121; thus, the excited states are formed mostly as those of the host material 122 by the exciton generation. Note that the exciton refers to a pair of carriers (an electron and a hole).

In the case where the formed excited state of the host material 122 is a singlet excited state, singlet excitation energy transfers from the S1 level of the host material 122 to the S1 level of the guest material 121, thereby forming the singlet excited state of the guest material 121.

Since the guest material 121 is a fluorescent material, the formation of a singlet excited state in the guest material 121 makes the guest material 121 immediately emit light. To obtain high emission efficiency in this case, the fluorescence quantum yield of the guest material 121 is preferably high. The same applies to the case where the excited state formed by carrier recombination in the guest material 121 is a singlet excited state.

Figure 4C:
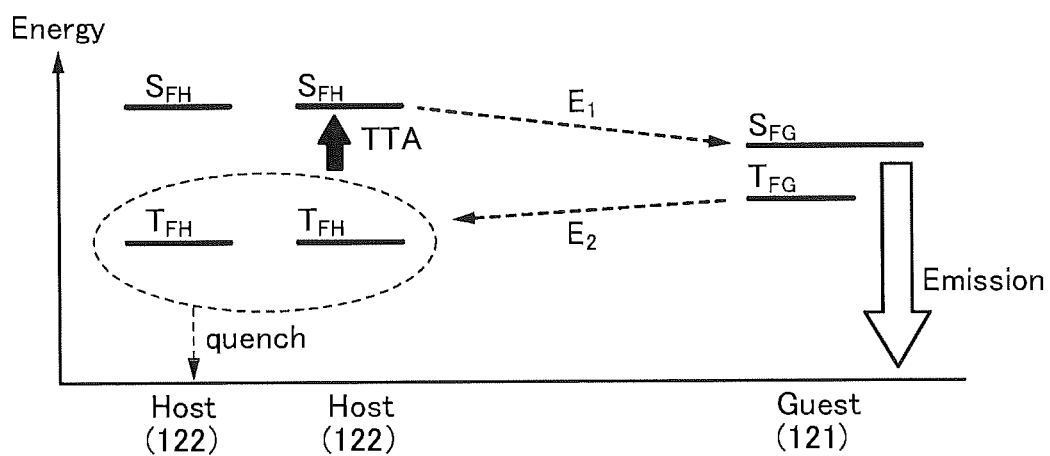

Next, the case where carrier recombination forms a triplet excited state of the host material 122 is described. The correlation between energy levels of the host material 122 and the guest material 121 in this case is shown in FIG. 4(C). The following explains what terms and numerals in FIG. 4(C) represent. Note that it is preferable that the T1 level of the host material 122 be lower than the T1 level of the guest material 121 and thus FIG. 4(C) shows such a case; however, the T1 level of the host material 122 may be higher than the T1 level of the guest material 121.

Guest (121): the guest material 121 (fluorescent material);
Host (122): the host material 122;
$S_{FG}$: the S1 level of the guest material 121 (fluorescent material);
$T_{FG}$: the T1 level of the guest material 121 (fluorescent material);
$S_{FH}$: the S1 level of the host material 122;
$T_{FH}$: the T1 level of the host material 122; and
Energy: energy As shown in FIG. 4(C), triplet-triplet annihilation (TTA) occurs, that is, triplet excitons formed by carrier recombination interact with each other, and excitation energy is transferred and spin angular momenta are exchanged between them; as a result, a reaction in which the triplet excitons are converted into singlet excitons having energy of the S1 level ($S_{FH}$) of the host material 122 is caused (see TTA in FIG. 4(C)). The singlet excitation energy of the host material 122 is transferred from $S_{FH}$ to the 51 level ($S_{FG}$) of the guest material 121 having a lower energy than $S_{FH}$ (see Route $E_1$ in FIG. 4(C)), and a singlet excited state of the guest material 121 is formed, whereby the guest material 121 emits light (Emission).

Note that in the case where the density of triplet excitons in the light-emitting layer 120 is sufficiently high (e.g., $1 \times 10^{12}$ cm$^{-3}$ or higher), only the reaction of two triplet excitons close to each other can be considered whereas deactivation (quench) of a single triplet exciton is ignored.

In the case where a triplet excited state is formed by carrier recombination in the guest material 121, the triplet excited state of the guest material 121 is thermally deactivated and thus is difficult to use for light emission. However, in the case where the T1 level ($T_{FH}$) of the host material 122 is lower than the T1 level ($T_{FG}$) of the guest material 121, the triplet excitation energy of the guest material 121 can be transferred from the T1 level ($T_{FG}$) of the guest material 121 to the T1 level ($T_{FH}$) of the host material 122 (see Route $E_2$ in FIG. 4(C)) and then is utilized for TTA.

In other words, the host material 122 preferably has a function of converting triplet excitation energy into singlet excitation energy by TTA. Accordingly, the triplet excitation energy generated in the light-emitting layer 120 can be partly converted into singlet excitation energy by TTA in the host material 122; then, the singlet excitation energy can be transferred to the guest material 121 and extracted as fluorescence. In order to achieve this, the S1 level ($S_{FH}$) of the host material 122 is preferably higher than the S1 level ($S_{FG}$) of the guest material 121. In addition, the T1 level ($T_{FH}$) of the host material 122 is preferably lower than the T1 level ($T_{FG}$) of the guest material 121.

Note that particularly in the case where the T1 level ($T_{FG}$) of the guest material 121 is lower than the T1 level ($T_{FH}$) of the host material 122, the weight ratio of the guest material 121 to the host material 122 is preferably low. Specifically, the weight ratio of the guest material 121 to the host material 122 is preferably greater than 0 and less than or equal to 0.05 when the host material 122 is 1. In such a case, the probability of carrier recombination in the guest material 121 can be reduced. In addition, the probability of energy transfer from the T1 level ($T_{FH}$) of the host material 122 to the T1 level ($T_{FG}$) of the guest material 121 can be reduced.

Note that the host material 122 may be composed of a single compound or a plurality of compounds.

In the case where the light-emitting unit 106 and the light-emitting unit 108 contain guest materials with different emission colors, light emitted from the light-emitting layer 120 preferably has an emission peak on the shorter wavelength side than light emitted from the light-emitting layer 170. The luminance of a light-emitting device using a material having a high triplet excitation energy level tends to degrade quickly. With the use of TTA in the light-emitting layer emitting light with a short wavelength, a light-emitting device with small luminance degradation can be provided.

<Structure Example 2 of Light-Emitting Device>

Figure 5A:
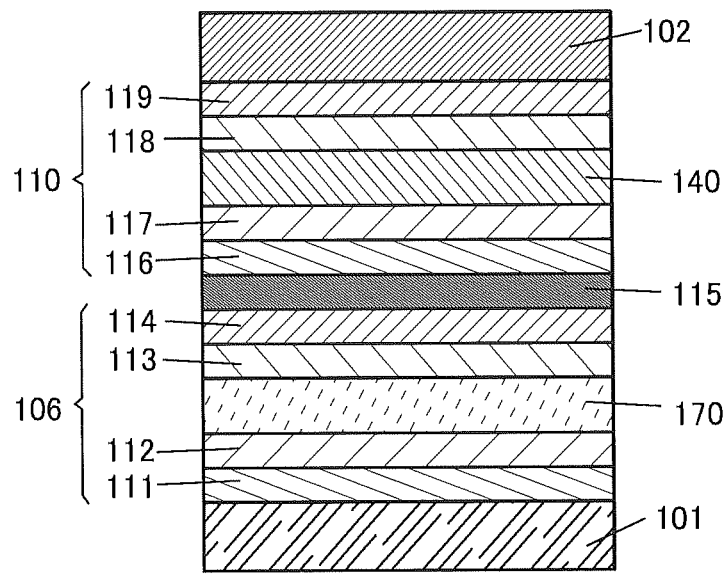
FIGS. 5A-5C are schematic cross-sectional views of a light-emitting device of one embodiment of the present invention, and a diagram showing the correlations of energy levels of a light-emitting layer.

FIG. 5(A) is a schematic cross-sectional view of a light-emitting device 252.

The light-emitting device 252 shown in FIG. 5(A) includes, like the light-emitting device 250 described above, a plurality of light-emitting units (the light-emitting unit 106 and a light-emitting unit 110 in FIG. 5(A)) between a pair of electrodes (the electrode 101 and the electrode 102). At least one of the light-emitting units has a structure similar to that of the EL layer 100. Note that the light-emitting unit 106 and the light-emitting unit 110 may have the same structure or different structures.

Moreover, in the light-emitting device 252 shown in FIG. 5(A), the light-emitting unit 106 and the light-emitting unit 110 are stacked, and the charge-generation layer 115 is provided between the light-emitting unit 106 and the light-emitting unit 110. The EL layer 100 is preferably used in the light-emitting unit 106, for example.

The light-emitting device 252 includes a light-emitting layer 140 and the light-emitting layer 170. The light-emitting unit 106 includes the hole-injection layer 111, the hole-transport layer 112, the electron-transport layer 113, and the electron-injection layer 114 in addition to the light-emitting layer 170. The light-emitting unit 110 includes the hole-injection layer 116, the hole-transport layer 117, the electron-transport layer 118, and the electron-injection layer 119 in addition to the light-emitting layer 140.

When any of the structures described in Embodiment 1 is used for at least one of the plurality of units, a light-emitting device with excellent outcoupling efficiency can be provided. Specifically, it is preferable that a region that is 0 nm to λ/2 inclusive from the light-emitting layer 170 have a low refractive index. In FIG. 5, it is particularly preferable that the hole-injection layer 111 also serve as a layer with a low refractive index.

Figure 5B:
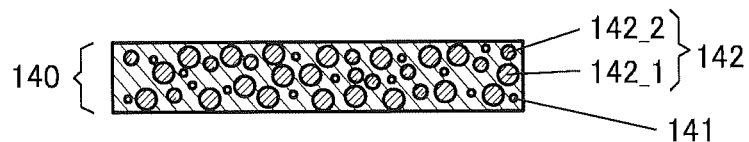

The light-emitting layer 140 included in the light-emitting unit 110 includes a guest material 141 and a host material 142 as shown in FIG. 5(B). The host material 142 includes an organic compound 142_1 and an organic compound 142_2. Note that the guest material 141 included in the light-emitting layer 140 is described below as a phosphorescent material.

<<Light Emission Mechanism of Light-Emitting Layer 140>>

Next, the light emission mechanism of the light-emitting layer 140 is described below.

The organic compound 142_1 and the organic compound 142_2 which are included in the light-emitting layer 140 form an exciplex.

Although it is acceptable as long as the combination of the organic compound 142_1 and the organic compound 142_2 can form an exciplex, it is preferable that one of them be a compound having a hole-transport property and the other be a compound having an electron-transport property.

Figure 5C:
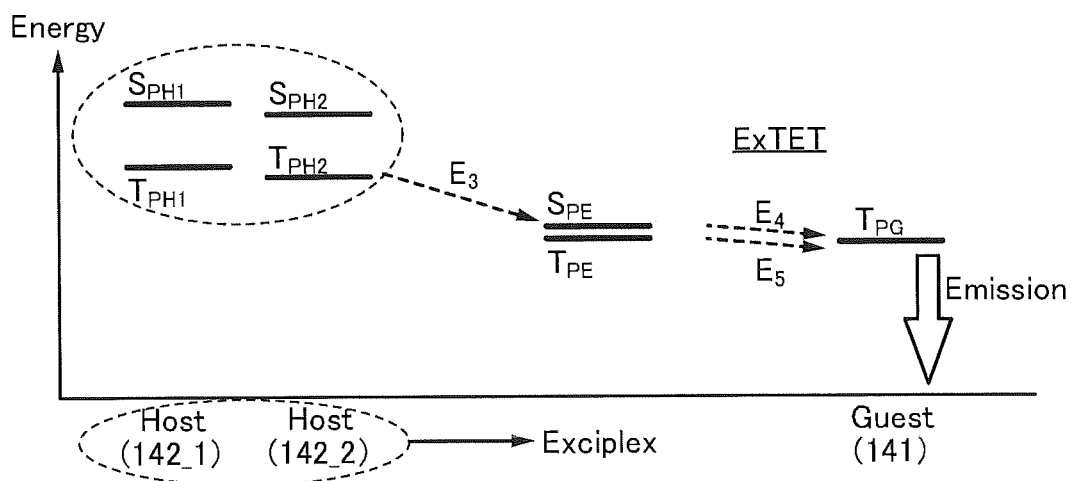

FIG. 5(C) shows a correlation between the energy levels of the organic compound 142_1, the organic compound 142_2, and the guest material 141 in the light-emitting layer 140. The following explains what terms and numerals in FIG. 5(C) represent.

Guest (141): the guest material 141 (phosphorescent material);
Host (142_1): the organic compound 142_1 (host material);
Host (142_2): the organic compound 142_2 (host material);
$T_{PG}$: the T1 level of the guest material 141 (phosphorescent material);
$S_{PH1}$: the S1 level of the organic compound 142_1 (host material);
$T_{PH1}$: the T1 level of the organic compound 142_1 (host material);
$S_{PH2}$: the S1 level of the organic compound 142_2 (host material);
$T_{PH2}$: the T1 level of the organic compound 142_2 (host material);
$S_{PE}$: the S1 level of the exciplex;
$T_{PE}$: the T1 level of the exciplex; and
Energy: energy The organic compound 142_1 and the organic compound 142_2 form an exciplex, and the S1 level ($S_{PE}$) and the T1 level ($T_{PE}$) of the exciplex become energies adjacent to each other (see Route $E_3$ in FIG. 5(C)).

One of the organic compound 142_1 and the organic compound 142_2 receives a hole and the other receives an electron to readily form an exciplex. Alternatively, when one of the organic compounds is brought into an excited state, the one immediately interacts with the other to form an exciplex. Consequently, most excitons in the light-emitting layer 140 exist as exciplexes. Because the excitation energy levels ($S_{PE}$ or $T_{PE}$) of the exciplex are lower than the S1 levels ($S_{PH1}$ and $S_{PH2}$) of the host materials (the organic compound 142_1 and the organic compound 142_2) that form the exciplex, the excited state of the host material 142 can be formed with lower excitation energy. This can reduce the driving voltage of the light-emitting device.

Both energies ($S_{PE}$) and ($T_{PE}$) of the exciplex are then transferred to the T1 level of the guest material 141 (phosphorescent material) (see Routes $E_4$ and $E_5$ in FIG. 5(C)); thus, light emission is obtained (Emission).

Note that the T1 level ($T_{PE}$) of the exciplex is preferably higher than the T1 level ($T_{PG}$) of the guest material 141. In this way, the singlet excitation energy and the triplet excitation energy of the generated exciplex can be transferred from the S1 level ($S_{PE}$) and the T1 level ($T_{PE}$) of the exciplex to the T1 level ($T_{PG}$) of the guest material 141.

In order to efficiently transfer excitation energy from the exciplex to the guest material 141, the T1 level ($T_{PE}$) of the exciplex is preferably lower than or equal to the T1 levels ($T_{PH1}$ and $T_{PH2}$) of the organic compounds (the organic compound 142_1 and the organic compound 142_2) that form the exciplex. Thus, quenching of the triplet excitation energy of the exciplex due to the organic compounds (the organic compound 142_1 and the organic compound 142_2) is less likely to occur, resulting in efficient energy transfer from the exciplex to the guest material 141.

In order for the organic compound 142_1 and the organic compound 142_2 to form an exciplex efficiently, it is preferable that the HOMO level of one of the organic compound 142_1 and the organic compound 142_2 be higher than the HOMO level of the other and the LUMO level of the one of the organic compound 142_1 and the organic compound 142_2 be higher than the LUMO level of the other. For example, when the organic compound 142_1 has a hole-transport property and the organic compound 142_2 has an electron-transport property, it is preferable that the HOMO level of the organic compound 142_1 be higher than the HOMO level of the organic compound 142_2 and the LUMO level of the organic compound 142_1 be higher than the LUMO level of the organic compound 142_2. Alternatively, when the organic compound 142_2 has a hole-transport property and the organic compound 142_1 has an electron-transport property, it is preferable that the HOMO level of the organic compound 142_2 be higher than the HOMO level of the organic compound 142_1 and the LUMO level of the organic compound 142_2 be higher than the LUMO level of the organic compound 142_1. Specifically, the energy difference between the HOMO level of the organic compound 142_1 and the HOMO level of the organic compound 142_2 is preferably greater than or equal to 0.05 eV, further preferably greater than or equal to 0.1 eV, still further preferably greater than or equal to 0.2 eV. Moreover, the energy difference between the LUMO level of the organic compound 142_1 and the LUMO level of the organic compound 142_2 is preferably greater than or equal to 0.05 eV, further preferably greater than or equal to 0.1 eV, still further preferably greater than or equal to 0.2 eV.

In the case where the combination of the organic compound 142_1 and the organic compound 142_2 is a combination of a compound having a hole-transport property and a compound having an electron-transport property, the carrier balance can be easily controlled by adjusting the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily.

When the light-emitting layer 140 has the above-described structure, light emission from the guest material 141 (phosphorescent material) of the light-emitting layer 140 can be obtained efficiently.

Note that the above-described processes through Routes $E_3$ to $E_5$ are sometimes referred to as ExTET (Exciplex-Triplet Energy Transfer) in this specification and the like. In other words, in the light-emitting layer 140, excitation energy is transferred from the exciplex to the guest material 141. In this case, the efficiency of reverse intersystem crossing from $T_{PE}$ to $S_{PE}$ need not necessarily be high and the emission quantum yield from $S_{PE}$ need not necessarily be high; thus, materials can be selected from a wide range of options.

Note that light emitted from the light-emitting layer 170 preferably has an emission peak on the shorter wavelength side than light emitted from the light-emitting layer 140. The luminance of a light-emitting device using a phosphorescent material emitting light with a short wavelength tends to degrade quickly. In view of the above, fluorescence is used for light emission with a short wavelength, so that a light-emitting device with small luminance degradation can be provided.

<Examples of Material that can be Used in Light-Emitting Layers>

Next, materials that can be used in the light-emitting layer 120, the light-emitting layer 140, and the light-emitting layer 170 are described below.

<<Material that can be Used in Light-Emitting Layer 120>>

In the light-emitting layer 120, the host material 122 is present in the highest proportion by weight, and the guest material 121 (fluorescent material) is dispersed in the host material 122. The S1 level of the host material 122 is preferably higher than the S1 level of the guest material 121 (fluorescent material) while the T1 level of the host material 122 is preferably lower than the T1 level of the guest material 121 (fluorescent material).

The guest material 121 in the light-emitting layer 120 is preferably, but not particularly limited to, an anthracene derivative, a tetracene derivative, a chrysene derivative, a phenanthrene derivative, a pyrene derivative, a perylene derivative, a stilbene derivative, an acridone derivative, a coumarin derivative, a phenoxazine derivative, a phenothiazine derivative, or the like, and any of the fluorescent compounds described in Embodiment 1 can be suitably used.

Although there is no particular limitation on a material that can be used as the host material 122 in the light-emitting layer 120, for example, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium (II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq, bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB) can be used. Other examples include condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N, 9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 3,3',3"-(benzene-1,3,5-triyl)tripyrene (abbreviation: TPB3). One or more substances having a wider energy gap than the guest material 121 are selected from these substances and known substances.

The light-emitting layer 120 can have a structure in which two or more layers are stacked. For example, in the case where the light-emitting layer 120 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

In the light-emitting layer 120, the host material 122 may be composed of one kind of compound or a plurality of compounds. Alternatively, the light-emitting layer 120 may contain another material in addition to the host material 122 and the guest material 121.

<<Material that can be Used in Light-Emitting Layer 140>>

In the light-emitting layer 140, the host material 142 is present in the highest proportion by weight, and the guest material 141 (phosphorescent material) is dispersed in the host material 142. The T1 levels of the host material 142 (the organic compound 142_1 and the organic compound 142_2) of the light-emitting layer 140 are preferably higher than the T1 level of the guest material 141.

Examples of the organic compound 142_1 include, in addition to a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples include an aromatic amine and a carbazole derivative. Specifically, the electron-transport material and the hole-transport material described in Embodiment 1 can be used.

As the organic compound 142_2, a substance that can form an exciplex together with the organic compound 142_1 is preferably used. Specifically, the electron-transport material and the hole-transport material described in Embodiment 1 can be used. In that case, the organic compound 142_1, the organic compound 142_2, and the guest material 141 (phosphorescent material) are preferably selected such that the emission peak of the exciplex formed by the organic compound 142_1 and the organic compound 142_2 overlaps with an absorption band, specifically an absorption band on the longest wavelength side, of a triplet MLCT (Metal to Ligand Charge Transfer) transition of the guest material 141 (phosphorescent material). This makes it possible to provide a light-emitting device with drastically improved emission efficiency. Note that in the case where a thermally activated delayed fluorescent material is used instead of the phosphorescent material, the absorption band on the longest wavelength side is preferably a singlet absorption band.

Examples of the guest material 141 (phosphorescent material) include an iridium-, rhodium-, or platinum-based organometallic complex or metal complex; in particular, an organoiridium complex such as an iridium-based ortho-metalated complex is preferred. As an ortho-metalated ligand, a 4H-triazole ligand, a 1H-triazole ligand, an imidazole ligand, a pyridine ligand, a pyrimidine ligand, a pyrazine ligand, an isoquinoline ligand, or the like can be given. Examples of the metal complex include a platinum complex having a porphyrin ligand. Specifically, the material described in Embodiment 1 as an example of the guest material 132 can be used.

The light-emitting material contained in the light-emitting layer 140 is a material that can convert triplet excitation energy into light emission. Examples of the material that can convert triplet excitation energy into light emission include, in addition to the phosphorescent material, a thermally activated delayed fluorescent material. Therefore, the term "phosphorescent material" in the description may be replaced with "thermally activated delayed fluorescent material".

The material that exhibits thermally activated delayed fluorescence may be a material that can form a singlet excited state from a triplet excited state by reverse intersystem crossing or may be a combination of a plurality of materials which form an exciplex.

In the case where the thermally activated delayed fluorescent material is formed of one kind of material, specifically, any of the thermally activated delayed fluorescent materials described in Embodiment 1 can be used.

In the case where the thermally activated delayed fluorescent material is used as the host material, it is preferable to use a combination of two kinds of compounds that form an exciplex. In this case, it is particularly preferable to use the above-described combination of a compound that easily accepts electrons and a compound that easily accepts holes, which form an exciplex.

<<Material that can be Used in Light-Emitting Layer 170>>

As a material that can be used in the light-emitting layer 170, a material that can be used in the light-emitting layer in Embodiment 1 can be used, so that a light-emitting device with high emission efficiency can be formed.

The emission colors of the light-emitting materials contained in the light-emitting layer 120, the light-emitting layer 140, and the light-emitting layer 170 are not limited, and they may be the same or different from each other. Light emitted from the light-emitting materials is mixed and then extracted to the outside of the element; therefore, for example, in the case where their emission colors are complementary colors, the light-emitting device can emit white light. In consideration of the reliability of the light-emitting device, the emission peak wavelength of the light-emitting material contained in the light-emitting layer 120 is preferably shorter than that of the light-emitting material contained in the light-emitting layer 170.

Note that the light-emitting unit 106, the light-emitting unit 108, the light-emitting unit 110, and the charge-generation layer 115 can be formed by a method such as an evaporation method (including a vacuum evaporation method), an inkjet method, a coating method, or gravure printing.

The structures described above in this embodiment can be used in an appropriate combination with any of the structures described in the other embodiments.

Embodiment 5

FIG. 6(A) is a top view of a light-emitting apparatus, and FIG. 6(B) is a cross-sectional view taken along A-B and C-D in FIG. 6(A). This light-emitting apparatus includes a driver circuit portion (a source side driver circuit) 601, a pixel portion 602, and a driver circuit portion (a gate side driver circuit) 603, which are indicated by dotted lines, as components controlling light emission from a light-emitting device. Furthermore, 604 denotes a sealing substrate, 625 denotes a desiccant, 605 denotes a sealing material, and a portion surrounded by the sealing material 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is shown here, a printed wiring board (PWB) may be attached to the FPC. The light-emitting device in this specification includes not only the light-emitting device itself but also the state where the FPC or the PWB is attached thereto.

Next, a cross-sectional structure of the above light-emitting apparatus is described with reference to FIG. 6(B). The driver circuit portion and the pixel portion are formed over an device substrate 610; here, the source side driver circuit 601, which is the driver circuit portion, and one pixel in the pixel portion 602 are illustrated.

Note that in the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, the driver circuit need not necessarily be integrated and can be formed not over the substrate but outside the substrate.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed using a positive photosensitive resin film.

In order to improve the coverage with a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative or positive photosensitive material can be used as the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, such as MgAg, MgIn, or AlLi) is preferably used. Note that in the case where light generated in the EL layer 616 passes through the second electrode 617, a stacked layer of a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the first electrode 613, the EL layer 616, and the second electrode 617 constitute a light-emitting device 618. The light-emitting device 618 is preferably a light-emitting device having any of the structures described in Embodiment 1 to Embodiment 4. The pixel portion includes a plurality of light-emitting devices, and the light-emitting apparatus of this embodiment may include both the light-emitting device with the structure described in Embodiment 1 to Embodiment 4 and a light-emitting device with a different structure.

The sealing substrate 604 and the device substrate 610 are attached to each other using the sealing material 605, so that a structure in which the light-emitting device 618 is provided in the space 607 surrounded by the device substrate 610, the sealing substrate 604, and the sealing material 605 is employed. Note that the space 607 is filled with a filler, and may be filled with an inert gas (nitrogen, argon, or the like) or a resin and/or a desiccant.

Note that an epoxy-based resin or glass frit is preferably used for the sealing material 605. Furthermore, these materials are preferably materials that transmits as little moisture or oxygen as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting apparatus using the light-emitting device described in Embodiment 1 and Embodiment 2 can be obtained.

<Structure Example 1 of Light-Emitting Apparatus>

As an example of a light-emitting apparatus, FIG. 7 shows a light-emitting apparatus including a light-emitting device exhibiting white light emission and a coloring layer (a color filter).

FIG. 7(A) illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition wall 1026, an EL layer 1028, a second electrode 1029 of the light-emitting devices, a sealing substrate 1031, a sealing material 1032, and the like.

In FIG. 7(A) and FIG. 7(B), coloring layers (a red coloring layer 1034R, a green coloring layer 1034G, and a blue coloring layer 1034B) are provided on a transparent base material 1033. A black layer (black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 7(A), a light-emitting layer from which light is emitted to the outside without passing through the coloring layer and light-emitting layers from which light is emitted to the outside, passing through the coloring layers of the respective colors are shown. Since light that does not pass through the coloring layer is white and light that passes through the coloring layer is red, blue, or green, an image can be expressed using pixels of the four colors.

FIG. 7(B) shows an example in which the red coloring layer 1034R, the green coloring layer 1034G, and the blue coloring layer 1034B) are formed between the gate insulating film 1003 and the first interlayer insulating film 1020. As illustrated in FIG. 7(B), the coloring layers may be provided between the substrate 1001 and the sealing substrate 1031.

The above-described light-emitting apparatus is a light-emitting apparatus having a structure in which light is extracted on the substrate 1001 side where the TFTs are formed (a bottom emission type), but may be a light-emitting apparatus having a structure in which light is extracted on the sealing substrate 1031 side (a top emission type).

<Structure Example 2 of Light-Emitting Apparatus>

Figure 8:
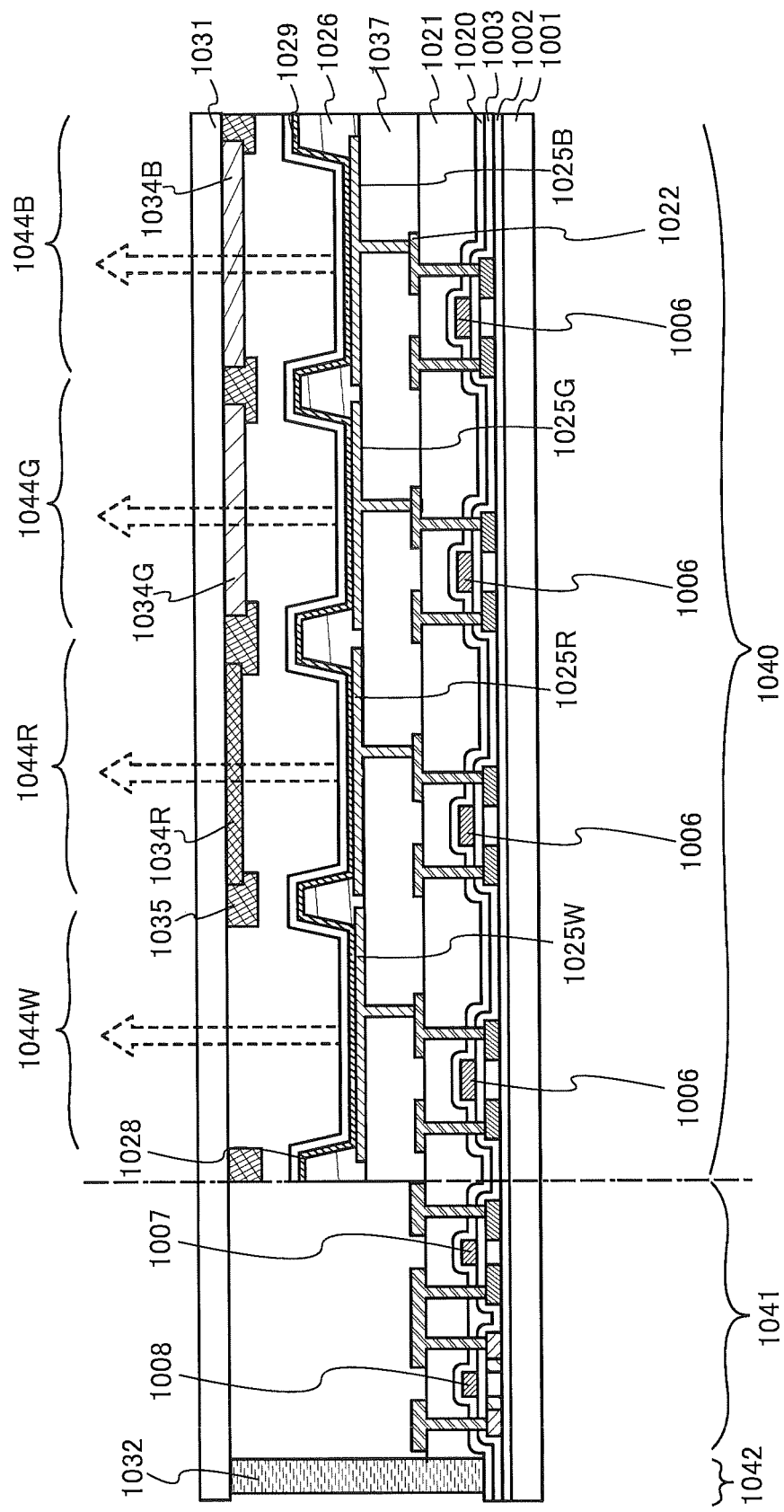
FIG. 8 is a conceptual view of an active matrix light-emitting apparatus of one embodiment of the present invention.

FIG. 8 illustrates a cross-sectional view of a top-emission-type light-emitting apparatus. In this case, a substrate that does not transmit light can be used as the substrate 1001. The process up to the formation of a connection electrode that connects the TFT and the anode of the light-emitting device is performed in a manner similar to that of a bottom-emission-type light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

First lower electrodes 1025W, 1025R, 1025G, and 1025B of the light-emitting devices each function as an anode here, but may function as a cathode. Furthermore, in the case of the top-emission-type light-emitting apparatus as shown in FIG. 8, the lower electrodes 1025W, 1025R, 1025G, and 1025B are preferably reflective electrodes. Note that the second electrode 1029 preferably has a function of reflecting light and a function of transmitting light. It is preferable that a microcavity structure be used between the second electrode 1029 and the lower electrodes 1025W, 1025R, 1025G, and 1025B, in which case light having a specific wavelength is amplified. The EL layer 1028 is formed to have a device structure similar to the structure described in Embodiment 2, with which white light emission can be obtained.

In FIG. 7(A), FIG. 7(B), and FIG. 8, the structure of the EL layer for providing white light emission can be achieved by, for example, using a plurality of light-emitting layers or using a plurality of light-emitting units. Note that the structure for providing white light emission is not limited thereto.

In the case of such a top-emission structure as in FIG. 8, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1035 which is positioned between pixels. The coloring layers (the red coloring layer 1034R, the green coloring layer 1034G, and the blue coloring layer 1034B) and the black layer (black matrix) may be covered with the overcoat layer. Note that a substrate having a light-transmitting property is used as the sealing substrate 1031.

Although an example in which full color display is performed using four colors of red, green, blue, and white is shown here, there is no particular limitation and full color display using three colors of red, green, and blue may be performed. Alternatively, full color display using four colors of red, green, blue, and yellow may be performed.

Figure 46A:
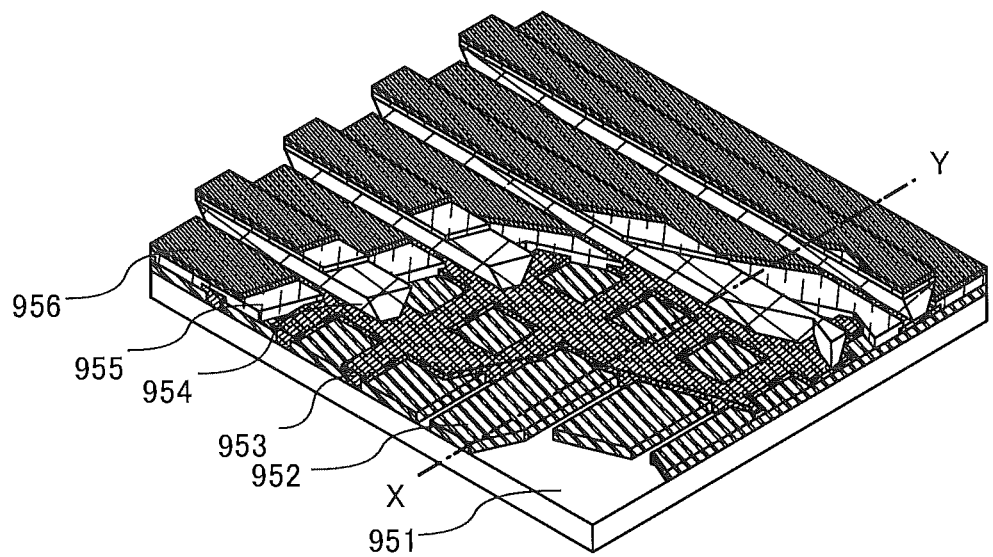
FIGS. 46A and 46B are conceptual views of a passive matrix light-emitting apparatus of one embodiment of the present invention.
Figure 46B:
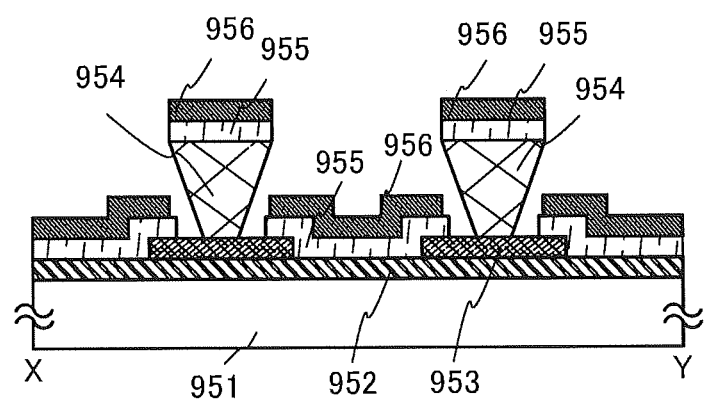

The active matrix light-emitting apparatus has been described above, whereas a passive matrix light-emitting apparatus is described below. FIG. 46 illustrate a passive matrix light-emitting apparatus fabricated by application of the present invention. Note that FIG. 46(A) is a perspective view illustrating the light-emitting apparatus, and FIG. 46(B) is a cross-sectional view taken along X-Y of FIG. 46(A). In FIG. 46, an EL layer 955 is provided between an electrode 952 and an electrode 956 over a substrate 951. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in the short side direction of the partition layer 954 is a trapezoidal shape, and the lower side (the side facing the same direction as the plane direction of the insulating layer 953 and touching the insulating layer 953) is shorter than the upper side (the side facing the same direction as the plane direction of the insulating layer 953, and not touching the insulating layer 953). By providing the partition layer 954 in this manner, defects of the light-emitting device due to static charge or the like can be prevented. The light-emitting device described in Embodiment 1 to Embodiment 4 is also used in the passive-matrix light-emitting apparatus, enabling the light-emitting apparatus with low power consumption.

Since many minute light-emitting devices arranged in a matrix can each be controlled in the above-described light-emitting apparatus, the above-described light-emitting apparatus can be suitably used as a display device for expressing images.

Note that this embodiment can be combined as appropriate with any of the other embodiments.

Embodiment 6

In this embodiment, electronic devices of embodiments of the present invention will be described.

One embodiment of the present invention is a light-emitting device using organic EL, and thus, the use of the light-emitting device of one embodiment of the present invention enables an electronic device with a flat surface, high emission efficiency, and high reliability to be manufactured. In addition, an electronic device with a curved surface, high emission efficiency, and high reliability can be manufactured according to one embodiment of the present invention. In addition, an electronic device with flexibility, high emission efficiency, and high reliability can be manufactured according to one embodiment of the present invention.

Examples of the electronic devices include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The light-emitting apparatus of one embodiment of the present invention can achieve high visibility regardless of the intensity of external light. Thus, the light-emitting apparatus of one embodiment of the present invention can be suitably used for a portable electronic device, a wearable electronic device (wearable device), an e-book reader, or the like.

Figure 9A:
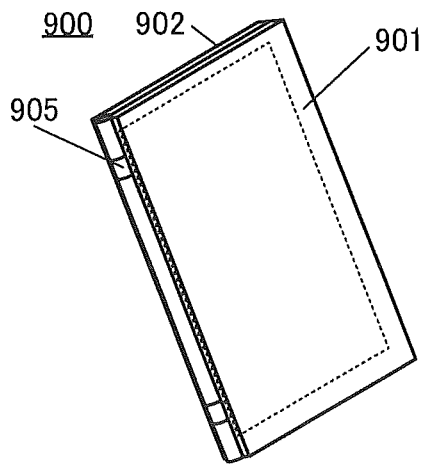
FIGS. 9A-9D are schematic views of electronic devices of embodiments of the present invention.
Figure 9B:
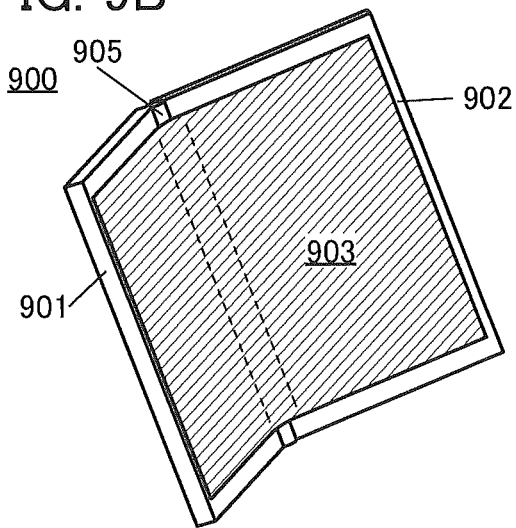

A portable information terminal 900 shown in FIGS. 9(A) and 9(B) includes a housing 901, a housing 902, a display portion 903, a hinge portion 905, and the like.

The housing 901 and the housing 902 are joined together by the hinge portion 905. The portable information terminal 900 can be opened as shown in FIG. 9(B) from a closed state (FIG. 9(A)). Thus, the portable information terminal 900 has high portability when carried and excellent visibility with its large display region when used.

In the portable information terminal 900, the flexible display portion 903 is provided across the housing 901 and the housing 902 which are joined together by the hinge portion 905.

The light-emitting apparatus manufactured using one embodiment of the present invention can be used for the display portion 903. Thus, the portable information terminal can be manufactured with a high yield.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held while being in a significantly curved form. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 90° and less than 180° and can be typically 90°, 120°, 135°, 150°, 175°, or the like. In this way, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be achieved.

The housing 901 and the housing 902 may be provided with a power button, an operation button, an external connection port, a speaker, a microphone, or the like.

One of the housing 901 or the housing 902 is provided with a wireless communication module, and data can be transmitted and received through a computer network such as the Internet, a LAN (Local Area Network), or Wi-Fi (registered trademark) (Wireless Fidelity).

Figure 9C:
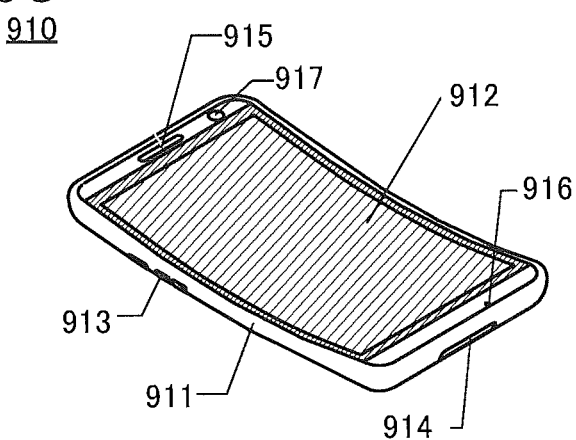

A portable information terminal 910 shown in FIG. 9(C) includes a housing 911, a display portion 912, an operation button 913, an external connection port 914, a speaker 915, a microphone 916, a camera 917, and the like.

The light-emitting apparatus manufactured using one embodiment of the present invention can be used for the display portion 912. Thus, the portable information terminal can be manufactured with a high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal can be used as a smartphone. The portable information terminal 910 is capable of executing a variety of applications such as mobile phone calls, e-mailing, text viewing and writing, music replay, video replay, Internet communication, and games, for example.

Figure 9D:
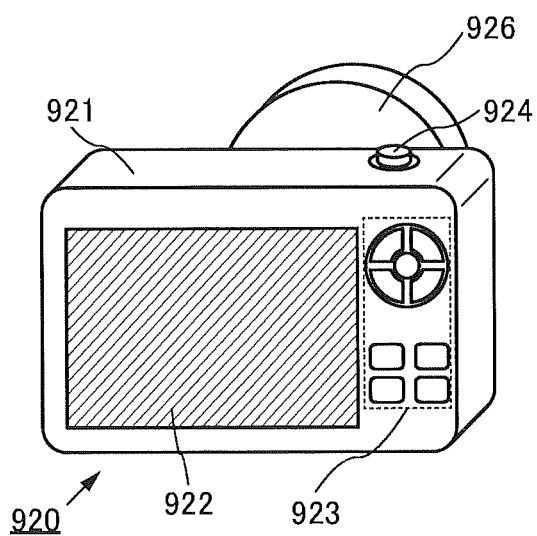

A camera 920 shown in FIG. 9(D) includes a housing 921, a display portion 922, operation buttons 923, a shutter button 924, and the like. Furthermore, a detachable lens 926 is attached to the camera 920.

The light-emitting apparatus manufactured using one embodiment of the present invention can be used for the display portion 922. Thus, the camera can be manufactured with a high yield.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

FIGS. 10(A) to 10(E) are diagrams showing electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The light-emitting apparatus manufactured using one embodiment of the present invention can be suitably used for the display portion 9001. Thus, the electronic devices can be manufactured with a high yield.

The electronic devices shown in FIGS. 10(A) to 10(E) can have a variety of functions. For example, they can have a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting or receiving a variety of data with a wireless communication function, a function of reading a program or data stored in a storage medium and displaying the program or data on the display portion, and the like. Note that the functions of the electronic devices shown in FIGS. 10(A) to 10(E) are not limited to the above, and the electronic devices may have other functions.

Figure 10A:
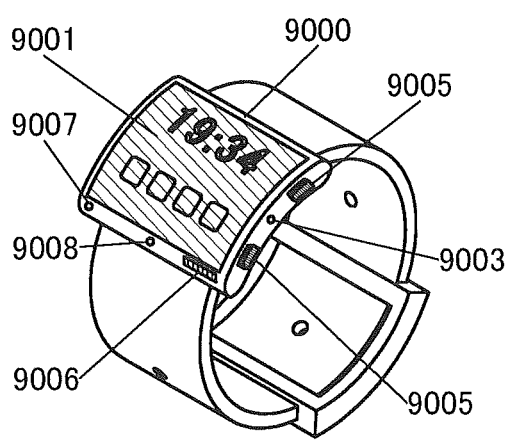
FIGS. 10A-10E are schematic views of electronic devices of embodiments of the present invention.
Figure 10B:
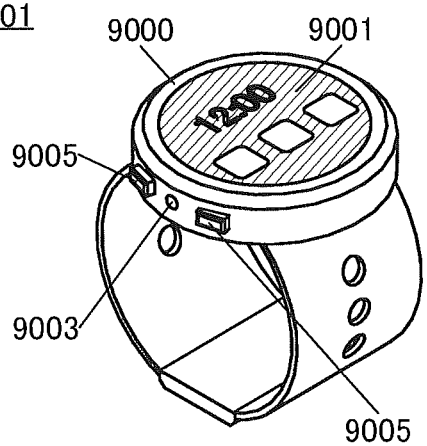

FIG. 10(A) is a perspective view of a wristwatch-type portable information terminal 9200, and FIG. 10(B) is a perspective view of a wristwatch-type portable information terminal 9201.

The portable information terminal 9200 shown in FIG. 10(A) is capable of executing a variety of applications such as mobile phone calls, e-mailing, text viewing and writing, music replay, Internet communication, and computer games, for example. The display surface of the display portion 9001 is curved and provided, and display can be performed along the curved display surface. The portable information terminal 9200 can perform near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

Unlike in the portable information terminal shown in FIG. 10(A), the display surface of the display portion 9001 is not curved in the portable information terminal 9201 shown in FIG. 10(B). Furthermore, the shape of the display portion of the portable information terminal 9201 is non-rectangular (a circular shape in FIG. 10(B)).

Figure 10C:
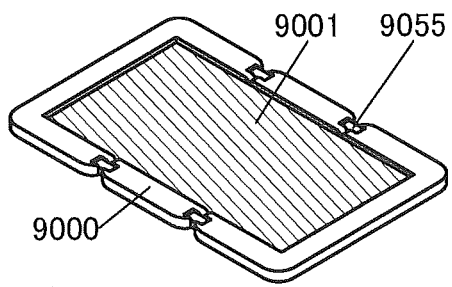
Figure 10D:
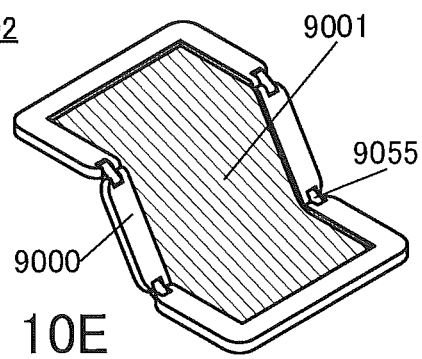
Figure 10E:
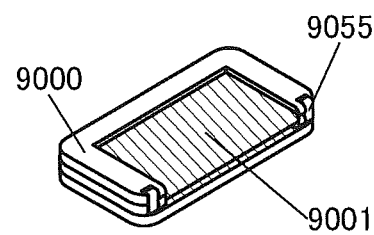

FIGS. 10(C) to 10(E) are perspective views of a foldable portable information terminal 9202. FIG. 10(C) is a perspective view of the portable information terminal 9202 that is opened, FIG. 10(D) is a perspective view of the portable information terminal 9202 that is being changed from one of an opened state or a folded state to the other, and FIG. 10(E) is a perspective view of the portable information terminal 9202 that is folded.

The portable information terminal 9202 is highly portable in the folded state, and is highly browsable with its seamless large display region in the opened state. The display portion 9001 of the portable information terminal 9202 is supported by three housings 9000 joined together by hinges 9055. By being bent between two housings 9000 with the hinges 9055, the portable information terminal 9202 can be reversibly changed in shape from the opened state to the folded state. The portable information terminal 9202 can be bent with a radius of curvature of greater than or equal to 1 mm and less than or equal to 150 mm, for example.

This embodiment can be combined with the other embodiments as appropriate.

Embodiment 7

In this embodiment, examples in which the light-emitting device of one embodiment of the present invention is used for various lighting devices will be described with reference to FIG. 11 and FIG. 12. With the use of the light-emitting device of one embodiment of the present invention, a highly reliable lighting device with high emission efficiency can be manufactured.

Fabricating the light-emitting device of one embodiment of the present invention over a substrate having flexibility enables an electronic device or a lighting device that has a light-emitting region with a curved surface to be obtained.

Furthermore, a light-emitting apparatus in which the light-emitting device of one embodiment of the present invention is used can also be used for lighting for motor vehicles; for example, such lighting can be provided on a windshield, a ceiling, and the like.

Figure 11A:
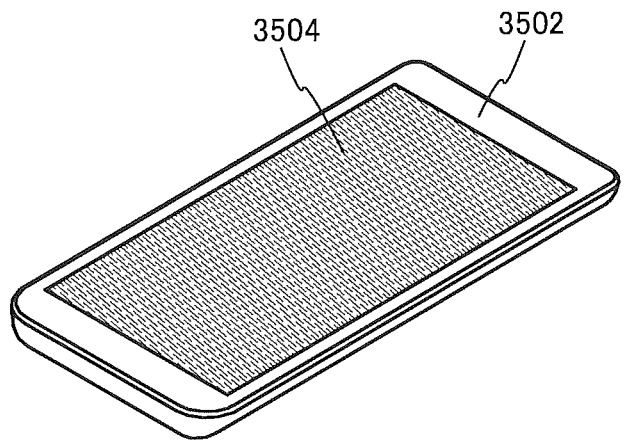
FIGS. 11A-11C are views showing lighting devices of embodiments of the present invention.
Figure 11B:
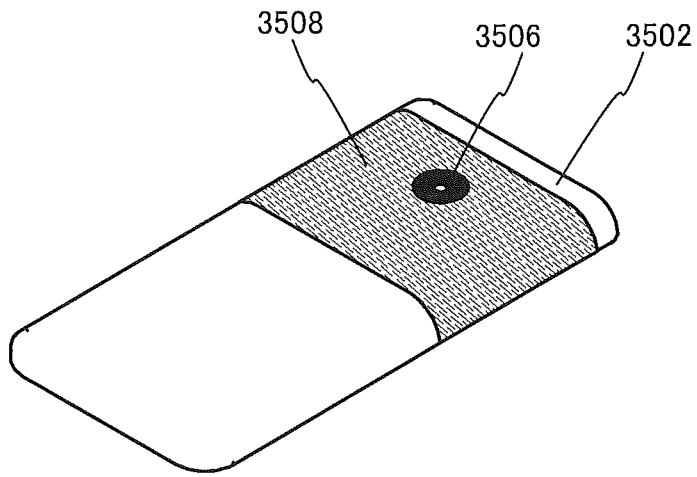

FIG. 11(A) is a perspective view of one surface of a multifunction terminal 3500, and FIG. 11(B) is a perspective view of the other surface of the multifunction terminal 3500. In a housing 3502 of the multifunction terminal 3500, a display portion 3504, a camera 3506, lighting 3508, and the like are incorporated. The light-emitting apparatus of one embodiment of the present invention can be used for the lighting 3508.

The lighting 3508 that includes the light-emitting apparatus of one embodiment of the present invention functions as a planar light source. Thus, unlike a point light source typified by an LED, the lighting 3508 can provide light emission with low directivity. When the lighting 3508 and the camera 3506 are used in combination, for example, an image can be taken by the camera 3506 with the lighting 3508 lighting or flashing. Because the lighting 3508 functions as a planar light source, a photograph as if taken under natural light can be taken.

Note that the multifunction terminal 3500 shown in FIGS. 11(A) and 11(B) can have a variety of functions as in the electronic devices shown in FIG. 10(A) to FIG. 10(C).

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone, and the like. When a detection device including a sensor for detecting inclination, such as a gyroscope sensor or an acceleration sensor, is provided inside the multifunction terminal 3500, display on the screen of the display portion 3504 can be automatically changed by determining the orientation (horizontal or vertical) of the multifunction terminal 3500.

The display portion 3504 can function as an image sensor. For example, an image of a palm print, a fingerprint, or the like is taken when the display portion 3504 is touched with the palm or the finger, whereby personal authentication can be performed. Furthermore, with the use of a backlight which emits near-infrared light or a sensing light source which emits near-infrared light in the display portion 3504, an image of a finger vein, a palm vein, or the like can be taken. Note that the light-emitting apparatus of one embodiment of the present invention may be used for the display portion 3054.

Figure 11C:
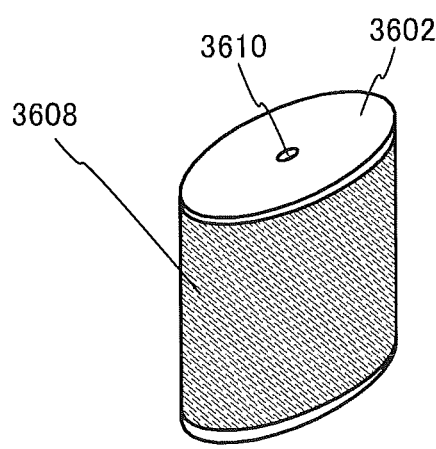

FIG. 11(C) is a perspective view of a security light 3600. The light 3600 includes lighting 3608 on the outside of the housing 3602, and a speaker 3610 and the like are incorporated in the housing 3602. The light-emitting device of one embodiment of the present invention can be used for the lighting 3608.

The light 3600 can emit light when the lighting 3608 is gripped or held, for example. An electronic circuit that can control the manner of light emission from the light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may also be incorporated.

The light 3600 can emit light in any directions; therefore, it is possible to intimidate a thug or the like with light, or light and sound. Moreover, the light 3600 may include a camera such as a digital still camera to have a photography function.

Figure 12:
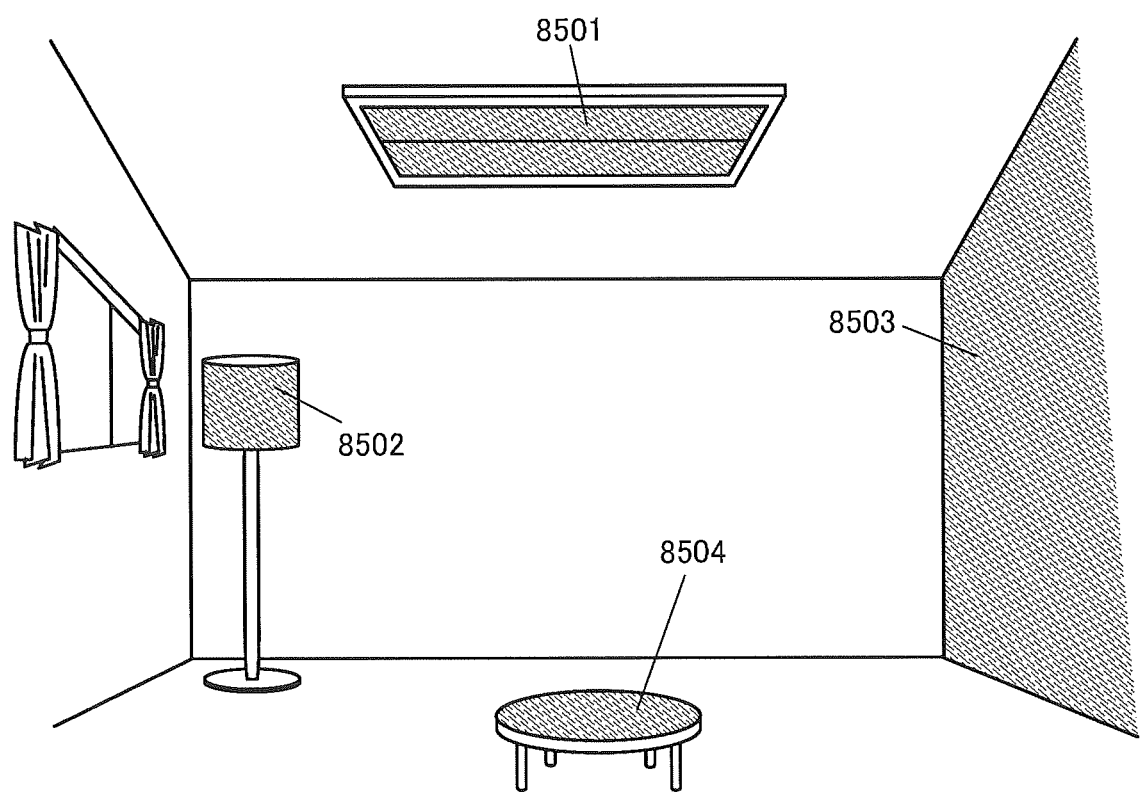
FIG. 12 is a view showing lighting devices of embodiments of the present invention.

FIG. 12 illustrates an example in which the light-emitting device is used for an indoor lighting device 8501. Since the light-emitting device can have a larger area, a lighting device having a large area can also be formed. In addition, a lighting device 8502 in which a light-emitting region has a curved surface can also be formed with the use of a housing with a curved surface. A light-emitting device described in this embodiment is in the form of a thin film, which allows the housing to be designed more freely. Thus, the lighting device can be elaborately designed in a variety of ways. Furthermore, a wall of the room may be provided with a large-sized lighting device 8503. The lighting devices 8501, 8502, and 8503 may be provided with a touch sensor with which power-on or off is performed.

Moreover, when the light-emitting device is used on the surface side of a table, a lighting device 8504 which has a function as a table can be obtained. When the light-emitting device is used as part of other furniture, a lighting device having a function of the furniture can be obtained.

As described above, lighting devices and electronic devices can be obtained by application of the light-emitting apparatus of one embodiment of the present invention. Note that the light-emitting apparatus can be used for electronic devices in a variety of fields without being limited to the lighting devices and the electronic devices described in this embodiment.

The structure described above in this embodiment can be used in combination as appropriate with any of the structures described in the other embodiments.

Embodiment 8

Figure 47A:
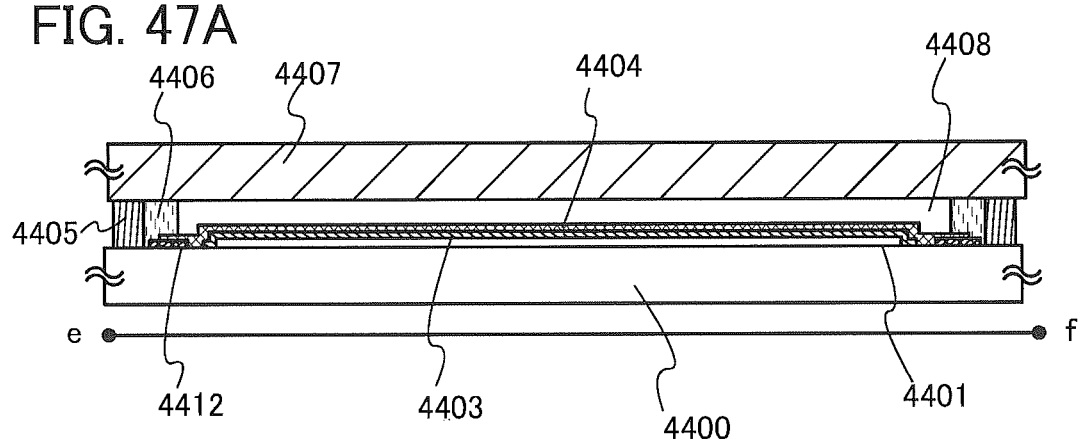
FIGS. 47A and 47B are views illustrating a lighting device of one embodiment of the present invention.
Figure 47B:
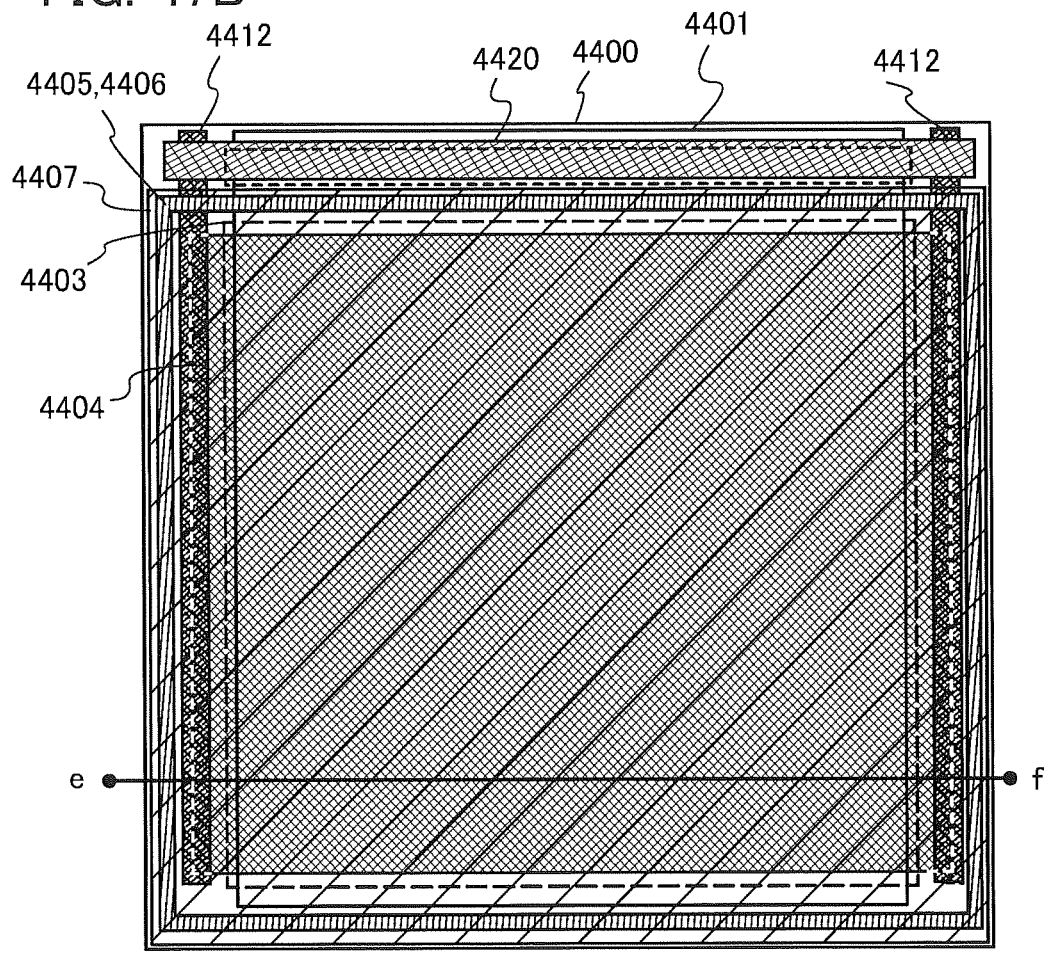

In this embodiment, an example in which the light-emitting device described in any of Embodiment 1 to embodiment 4 is used as a lighting device will be described with reference to FIG. 47. FIG. 47(B) is a top view of the lighting device, and FIG. 47(A) is an e-f cross-sectional view in FIG. 47(B).

In the lighting device of this embodiment, an anode 4401 is formed over a substrate 4400 which is a support having a light-transmitting property. The anode 4401 corresponds to the electrode 101, 103 or the anode 401 in any of Embodiment 1 to Embodiment 4. When light emission is extracted from the anode 4401 side, the anode 4401 is formed using a material having a light-transmitting property.

A pad 4412 for applying voltage to a cathode 4404 is formed over the substrate 4400.

An EL layer 4403 is formed over the anode 4401. The EL layer 4403 corresponds to the structure of the EL layer, the structure of light-emitting units 106, 108, and 110 in any of Embodiment 1 to Embodiment 4, the structure of a light-emitting unit, or the like. For these structures, the corresponding description can be referred to.

The cathode 4404 is formed to cover the EL layer 4403. The cathode 4404 corresponds to the electrode 102 or the cathode 402 in any of Embodiment 1 to Embodiment 4. When light emission is extracted from the anode 4401 side, the cathode 4404 is formed using a material with high reflectance. Through being connected to the pad 4412, the cathode 4404 is supplied with voltage.

As described above, the lighting device described in this embodiment includes a light-emitting device including the anode 4401, the EL layer 4403, and the cathode 4404. Since the light-emitting device is a light-emitting device with high emission efficiency, the lighting device in this embodiment can be a lighting device with low power consumption.

The substrate 4400 provided with the light-emitting device having the above structure is fixed to a sealing substrate 4407 with sealing materials 4405 and 4406 and sealing is performed, whereby the lighting device is completed. It is possible to use only either the sealing material 4405 or 4406. In addition, the inner sealing material 4406 (not shown in FIG. 47(B)) can be mixed with a desiccant, which enables moisture to be adsorbed, resulting in improved reliability.

When parts of the pad 4412 and the anode 4401 are extended to the outside of the sealing materials 4405 and 4406, the extended parts can function as external input terminals. An IC chip 4420 mounted with a converter or the like may be provided over the external input terminals.

As described above, the lighting device described in this embodiment uses the light-emitting device described in any of Embodiment 1 to Embodiment 4 as an EL device, and thus can be a light-emitting apparatus with low power consumption.

Embodiment 9

In this embodiment, examples of electronic devices each including the light-emitting device described in any of Embodiment 1 to Embodiment 4 will be described. The light-emitting device described in any of Embodiment 1 to Embodiment 4 has high emission efficiency and favorable driving voltage. Thus, the electronic devices described in this embodiment can be electronic devices with reduced power consumption.

Examples of electronic devices in which the above light-emitting device is used are television devices (also referred to as TV or television receivers), monitors for computers and the like, digital cameras, digital video cameras, digital photo frames, mobile phones (also referred to as cell-phones or cell-phone units), portable game machines, portable information terminals, audio reproducing devices, and large game machines such as pachinko machines. Specific examples of these electronic devices are described below.

FIG. 48(A) illustrates an example of a television device. In the television device, a display portion 7103 is incorporated in a housing 7101. Here, a structure in which the housing 7101 is supported by a stand 7105 is shown. Images can be displayed by the display portion 7103, and the display portion 7103 is formed in such a manner that light-emitting devices described in any one of Embodiment 1 to Embodiment 4 are arranged in a matrix.

The television device can be operated with an operation switch of the housing 7101 or a separate remote controller 7110. With operation keys 7109 of the remote controller 7110, channels and volume can be operated and images displayed on the display portion 7103 can be operated. Furthermore, a structure in which the remote controller 7110 is provided with a display portion 7107 for displaying data output from the remote controller 7110 may be employed.

Note that the television device has a structure provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 48(B1) illustrates a computer and includes a main body 7201, a housing 7202, a display portion 7203, a keyboard 7204, an external connection port 7205, a pointing device 7206, and the like. Note that this computer is manufactured by using light-emitting devices described in any of Embodiment 1 to Embodiment 4 arranged in a matrix in the display portion 7203. The computer in FIG. 48(B1) may be such a mode as illustrated in FIG. 48(B2). The computer in FIG. 48(B2) is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

FIG. 48(C) illustrates an example of a portable terminal. The portable terminal is provided with a display portion 7402 incorporated in a housing 7401, operation buttons 7403, an external connection port 7404, a speaker 7405, a microphone 7406, and the like. Note that the portable terminal includes the display portion 7402 which is formed by arranging the light-emitting devices described in any of Embodiment 1 to Embodiment 4 in a matrix.

The portable terminal illustrated in FIG. 48(C) may have a structure in which information can be input by touching the display portion 7402 with a finger or the like. In this case, operations such as making a call and creating an e-mail can be performed by touching the display portion 7402 with a finger or the like.

The screen of the display portion 7402 mainly has three modes. The first one is a display mode mainly for displaying images. The second one is an input mode mainly for inputting data such as text. The third one is a display+input mode in which two modes of the display mode and the input mode are combined.

In the case of making a call or creating an e-mail, for example, a text input mode mainly for inputting text is selected for the display portion 7402 so that an operation of inputting text displayed on the screen may be performed. In this case, it is preferable to display a keyboard or number buttons on almost the entire screen of the display portion 7402.

When a detection device including a sensor for detecting inclination, such as a gyroscope sensor or an acceleration sensor, is provided inside the portable terminal, display on the screen of the display portion 7402 can be automatically changed by determining the orientation (horizontal or vertical) of the portable terminal (vertically or horizontally).

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode. When the signal is text data, the screen mode is changed to the input mode.

Moreover, in the input mode, when input by the touch operation of the display portion 7402 is not performed for a certain period while a signal detected by an optical sensor in the display portion 7402 is detected, the screen mode may be controlled so as to be changed from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by using a backlight which emits near-infrared light or a sensing light source which emits near-infrared light in the display portion, an image of a finger vein, a palm vein, or the like can be taken.

Note that the structures described in this embodiment can be combined with the structures described in any of Embodiment 1 to Embodiment 4 as appropriate.

As described above, the application range of the light-emitting apparatus including the light-emitting device described in any of Embodiment 1 to Embodiment 4 is very wide, so that this light-emitting apparatus can be applied to electronic devices in a variety of fields. By using the light-emitting device described in any of Embodiment 1 to Embodiment 4, an electronic device having low power consumption can be obtained.

Figure 49A:
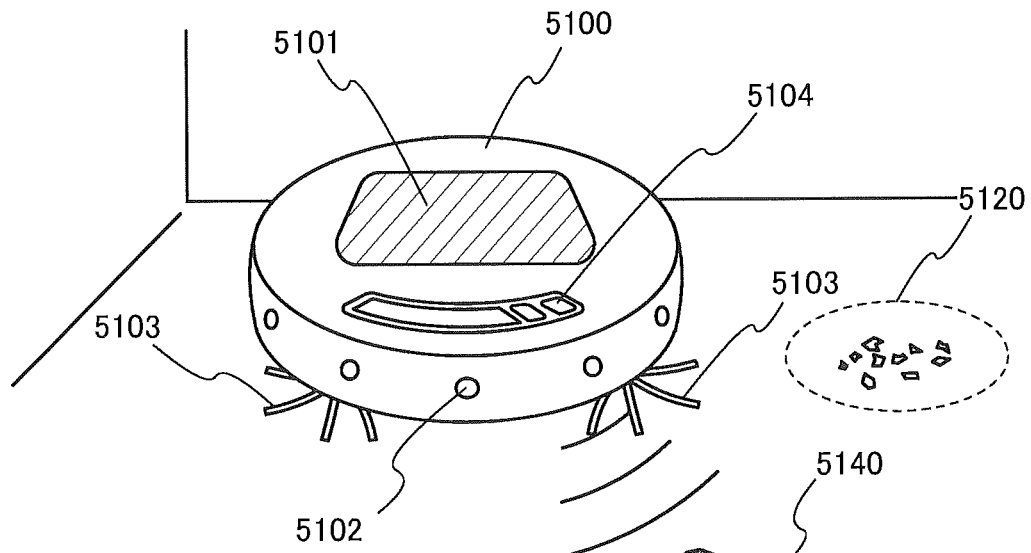
FIGS. 49A-49C are views illustrating electronic devices of embodiments of the present invention.

FIG. 49(A) is a schematic view showing an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. In addition, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display the path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The images taken by the cameras 5102 can be displayed on the portable electronic device 5140. Accordingly, an owner of the cleaning robot 5100 can monitor the room even from the outside. The display on the display 5101 can be checked by the portable electronic device such as a smartphone.

The light-emitting apparatus of one embodiment of the present invention can be used for the display 5101.

Figure 49B:
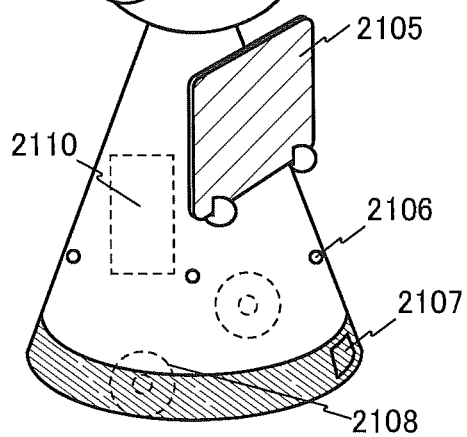

A robot 2100 illustrated in FIG. 49(B) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect, with the use of the moving mechanism 2108, the presence of an obstacle in the direction where the robot 2100 advances. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 49C:
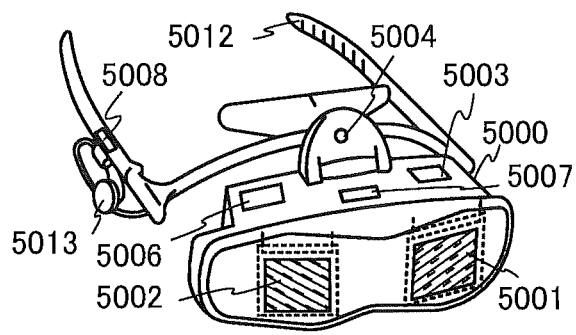

FIG. 49(C) illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 50:
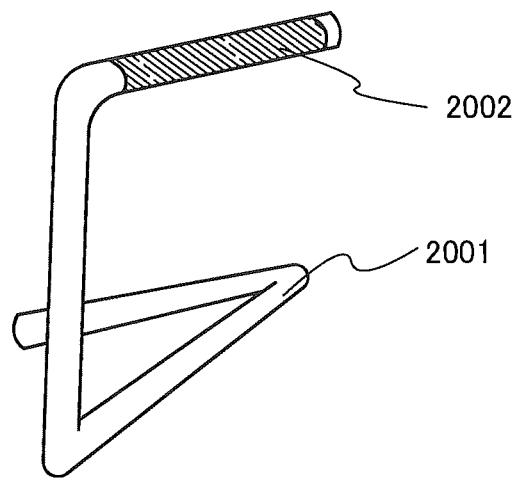
FIG. 50 is a view illustrating a lighting device of one embodiment of the present invention.

FIG. 50 illustrates an example in which the light-emitting device described in any of Embodiment 1 to Embodiment 4 is used for a table lamp which serves as a lighting device. The table lamp illustrated in FIG. 50 includes a housing 2001 and a light source 2002, and the lighting device described in Embodiment 8 may be used for the light source 2002.

Figure 51:
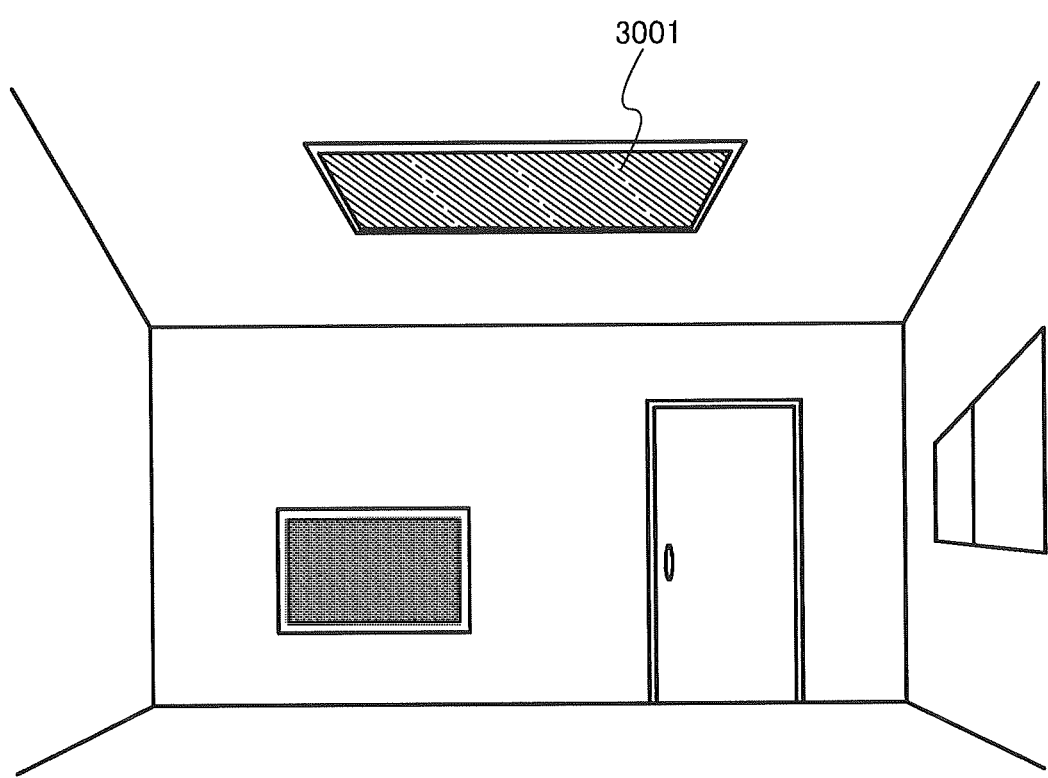
FIG. 51 is a view illustrating lighting devices of embodiments of the present invention.

FIG. 51 illustrates an example in which the light-emitting device described in any of Embodiment 1 to Embodiment 4 is used for an indoor lighting device 3001. Since the light-emitting device described in any of Embodiment 1 to Embodiment 4 has high emission efficiency, a lighting device having low power consumption can be obtained. Furthermore, since the light-emitting device described in any of Embodiment 1 to Embodiment 4 can have a large area, the light-emitting device can be used for a large-area lighting device. Furthermore, since the light-emitting device described in any of Embodiment 1 to Embodiment 4 is thin, the light-emitting device can be used for a lighting device having a reduced thickness.

Figure 52:
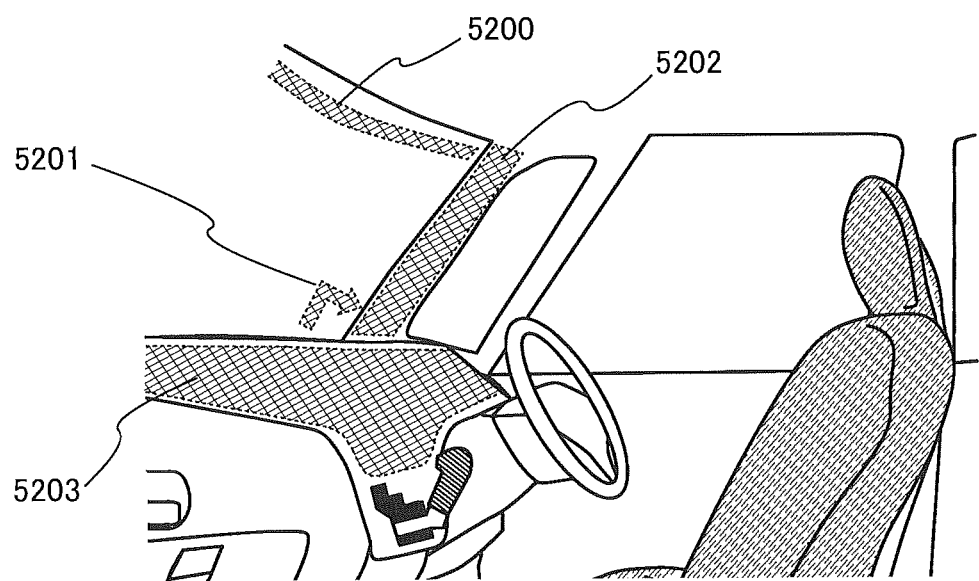
FIG. 52 is a view illustrating an in-vehicle display device and a lighting device of embodiments of the present invention.

The light-emitting device described in any of Embodiment 1 to Embodiment 4 can also be incorporated in an automobile windshield or an automobile dashboard. FIG. 52 illustrates one mode in which the light-emitting device described in any of Embodiment 1 to Embodiment 4 is used for an automobile windshield and an automobile dashboard. Display regions 5200 to 5203 are each a display using the light-emitting device described in any of Embodiment 1 to Embodiment 4.

The display region 5200 and the display region 5201 are display devices provided in the automobile windshield, in which the light-emitting devices described in any of Embodiment 1 to Embodiment 4 are incorporated. The light-emitting devices described in any of Embodiment 1 to Embodiment 4 can be formed into what is called a see-through display device, through which the opposite side can be seen, by including an anode and a cathode formed of electrodes having light-transmitting properties. See-through displays can be provided without hindering the vision even when being provided in the automobile windshield. Note that in the case where a driving transistor or the like is provided, a transistor having a light-transmitting property, such as an organic transistor using an organic semiconductor material or a transistor using an oxide semiconductor, is preferably used.

The display region 5202 is a display device provided in a pillar portion, in which the light-emitting devices described in any of Embodiment 1 to Embodiment 4 are incorporated. The display region 5202 can compensate for the view hindered by the pillar by displaying an image taken by an imaging means provided on the car body. Similarly, the display region 5203 provided in the dashboard portion can compensate for the view hindered by the car body by displaying an image taken by an imaging means provided on the outside of the automobile. Thus, blind areas can be compensated for and the safety can be enhanced. Showing an image to compensate for the area that cannot be seen makes it possible to confirm safety more naturally and comfortably.

The display region 5203 can also provide a variety of other kinds of information such as navigation information, a speedometer, a tachometer, a mileage, fuel, a gear state, and air-condition setting. The content or layout of the display can be changed freely in accordance with the preference of a user. Note that such information can also be provided on the display region 5200 to the display region 5202. The display region 5200 to the display region 5203 can also be used as lighting devices.

Figure 53A:
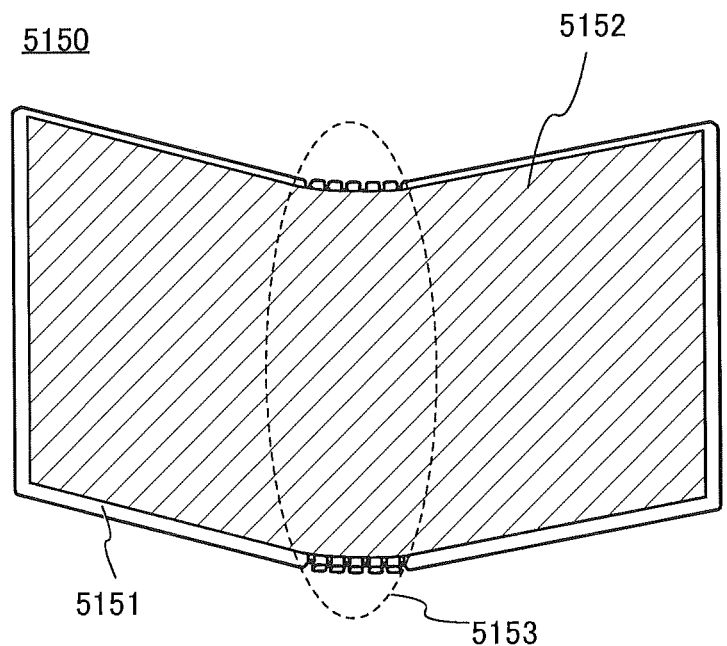
FIGS. 53A and 53B are views illustrating an electronic device of one embodiment of the present invention.
Figure 53B:
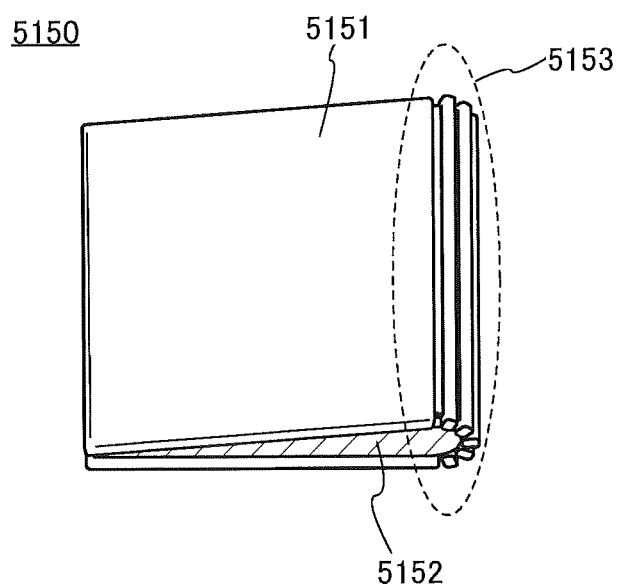

FIGS. 53(A) and (B) illustrate a foldable portable information terminal 5150. The foldable portable information terminal 5150 includes a housing 5151, a display region 5152, and a bend portion 5153. FIG. 53(A) illustrates the portable information terminal 5150 that is opened. FIG. 53(B) illustrates the portable information terminal that is folded. Despite its large display region 5152, the portable information terminal 5150 is compact in size and has excellent portability when folded.

The display region 5152 can be folded in half with the bend portion 5153. The bend portion 5153 is made up of a flexible member and a plurality of supporting members, and when the display region 5152 is folded, the flexible member is stretched. The bend portion 5153 has a radius of curvature of greater than or equal to 2 mm, preferably greater than or equal to 3 mm when folded.

Note that the display region 5152 may be a touch panel (an input/output device) including a touch sensor (an input device). The light-emitting apparatus of one embodiment of the present invention can be used for the display region 5152.

Figure 54A:
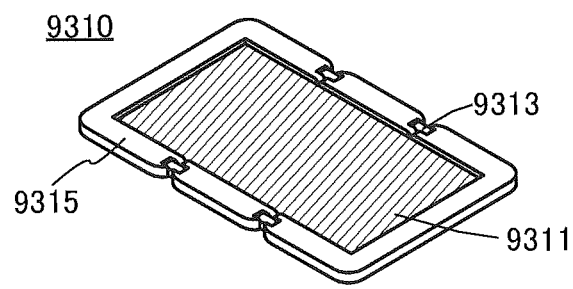
FIGS. 54A-54C are views illustrating an electronic device of one embodiment of the present invention.
Figure 54B:
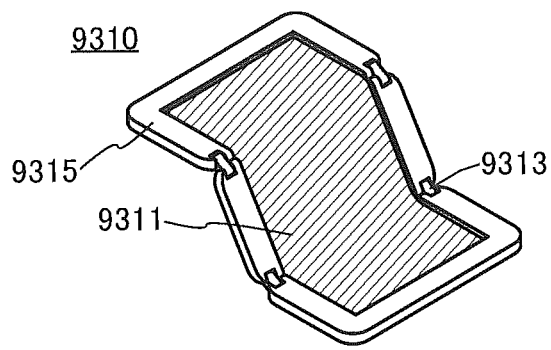
Figure 54C:
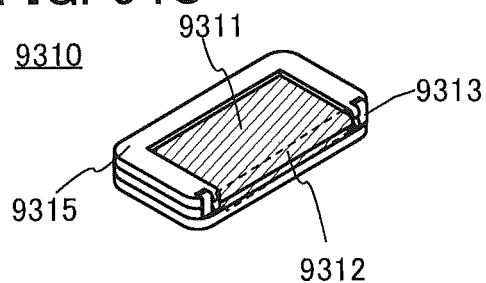

FIGS. 54 (A) to (C) illustrate a foldable portable information terminal 9310. FIG. 54(A) illustrates the portable information terminal 9310 which is opened. FIG. 54(B) illustrates the portable information terminal 9310 which is in the state of being changed from one of an opened state and a folded state to the other. FIG. 54(C) illustrates the portable information terminal 9310 which is folded. The portable information terminal 9310 is highly portable in the folded state, and is highly browsable with its seamless large display region in the opened state.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. A light-emitting apparatus of one embodiment of the present invention can be used for the display panel 9311. A display region 9312 in the display panel 9311 is a display region that is positioned at a side surface of the portable information terminal 9310 which is folded. On the display region 9312, information icons, file shortcuts of frequently used applications or programs, and the like can be displayed, and confirmation of information and start of an application can be smoothly performed.

Example 1

In this example, examples of fabricating light-emitting devices of embodiments of the present invention, and the characteristics of the light-emitting devices are described. The refractive indices of organic compounds used for hole-injection layers and the refractive indices of the hole-injection layers are also described. FIG. 3 shows a cross-sectional view of device structures fabricated in this example. Table 1 shows the details of the device structures. The structures and abbreviations of compounds that were used are shown below.

[Chemical Formulae 2]

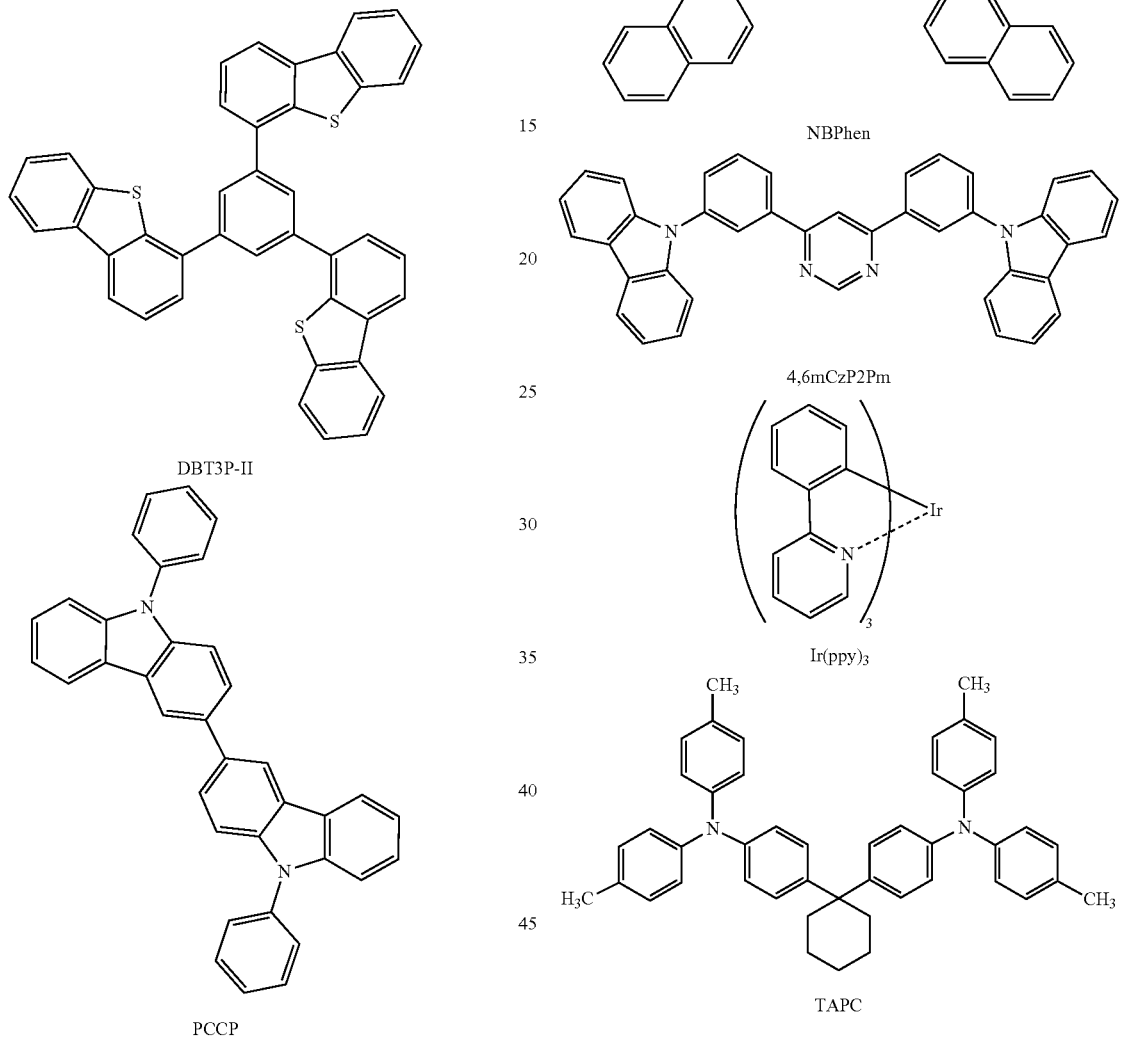

TABLE 1

| | Layer | Reference numeral | Thickness (nm) | Material | Weight ratio |
|---|---|---|---|---|---|
| Light-emitting devices 1 to 4 | Cap film | 145 | 70 | DBT3P-II | — |
| | Electrode (cathode) | 102(2) | 24 | Ag | — |
| | | 102(1) | 1 | Al | — |
| | Electron-injection layer | 119 | 1 | LiF | — |
| | Electron-transport layer | 118(2) | 15 | NBPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111 | $x_1$ | TAPC:MoO$_3$ | 2:0.5 |
| | Anode | 101(2) | 110 | ITSO | — |
| | | 101(1) | 100 | APC | — |

TABLE 1-continued

| | Layer | Reference numeral | Thickness (nm) | Material | Weight ratio |
|---|---|---|---|---|---|
| Comparative light-emitting devices 5 to 8 | Cap film | 145 | 70 | DBT3P-II | — |
| | Cathode | 102(2) | 24 | Ag | — |
| | | 102(1) | 1 | Al | — |
| | Electron-injection layer | 119 | 1 | LiF | — |
| | Electron-transport layer | 118(2) | 15 | NBPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111 | $x_1$ | DBT3P-II:MoO$_3$ | 2:0.5 |
| | Electrode (anode) | 101(2) | 110 | ITSO | — |
| | | 101(1) | 100 | APC | — |

TABLE 2

| | Layer | Reference numeral | Thickness (nm) | Material | Weight ratio |
|---|---|---|---|---|---|
| Comparative light-emitting devices 9 to 12 | Electrode (cathode) | 102(2) | 24 | Ag | — |
| | | 102(1) | 1 | Al | — |
| | Electron-injection layer | 119 | 1 | LiF | — |
| | Electron-transport layer | 118(2) | 15 | NBPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111 | $x_1$ | TAPC:MoO$_3$ | 2:0.5 |
| | Electrode (anode) | 101(2) | 110 | ITSO | — |
| | | 101(1) | 100 | APC | — |
| Comparative light-emitting devices 13 to 16 | Electrode (cathode) | 102(2) | 24 | Ag | — |
| | | 102(1) | 1 | Al | — |
| | Electron-injection layer | 119 | 1 | LiF | — |
| | Electron-transport layer | 118(2) | 15 | NBPhen | — |
| | | 118(1) | 20 | 4,6mCzP2Pm | — |
| | Light-emitting layer | 130(2) | 20 | 4,6mCzP2Pm:PCCP:Ir(ppy)$_3$ | 0.8:0.2:0.1 |
| | | 130(1) | 20 | 4,6mCzP2Pm:PCCP:Ir(ppy)$_3$ | 0.5:0.5:0.1 |
| | Hole-transport layer | 112 | 20 | PCCP | — |
| | Hole-injection layer | 111 | $x_1$ | DBT3P-II:MoO$_3$ | 2:0.5 |
| | Electrode (anode) | 101(2) | 110 | ITSO | — |
| | | 101(1) | 100 | APC | — |

TABLE 3

| Light-emitting device 1, Comparative light-emitting device 5, Comparative light-emitting device 9, and Comparative light-emitting device 13 | Light-emitting device 2, Comparative light-emitting device 6, Comparative light-emitting device 10, and Comparative light-emitting device 14 | Light-emitting device 3, Comparative light-emitting device 7, Comparative light-emitting device 11, and Comparative light-emitting device 15 | Light-emitting device 4, Comparative light-emitting device 8, Comparative light-emitting device 12, and Comparative light-emitting device 16 |
|---|---|---|---|
| $x_1$ 25 | 30 | 35 | 40 |

<Measurement of Refractive Indices>

The refractive indices of the organic compounds used for the hole-injection layers 111 and the refractive indices of the hole-injection layers 111 of light-emitting devices 1 to 4 and comparative light-emitting devices 5 to 16 were measured. The refractive indices were measured at room temperature with a rotating compensator variable incident angle light speed spectroscopic ellipsometer (M-2000U) produced by J. A. Woollam. The measurement samples were formed over a quartz substrate by a vacuum evaporation method. Note that n Ordinary and n Extra-ordinary were measured to calculate n average.

Figure 13:
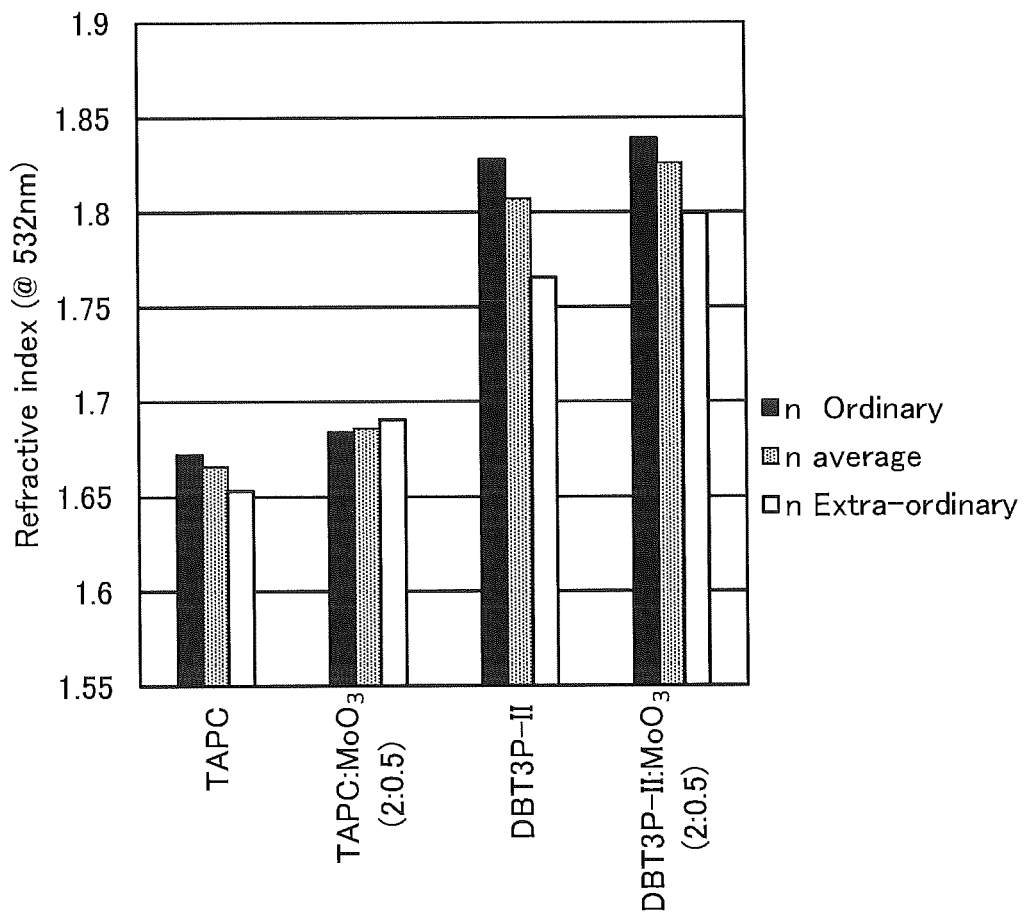
FIG. 13 is a graph showing refractive indices in Example.

FIG. 13 shows the measurement results of the refractive indices of the films with respect to light with a wavelength of 532 nm. FIG. 13 reveals that TAPC used for a light-emitting device 1 to a light-emitting device 4 and a comparative light-emitting device 9 to a comparative light-emitting device 12 is an organic compound with an extremely low refractive index: n Ordinary is lower than or equal to 1.70. It was found that DBT3P-II used for a light-emitting device 5 to a light-emitting device 8 and a comparative light-emitting device 13 to a comparative light-emitting device 16 has a high refractive index: n Ordinary is higher than 1.80.

The hole-injection layer 111 is required to have a hole-injection property and thus preferably contains an electron-donating material. The hole-injection layer 111 of each of the light-emitting devices containing, as the electron-donating material, MoO$_3$ with a high refractive index presumably has a high refractive index. However, as shown in FIG. 13, the refractive indices of the films of the organic compounds to which MoO$_3$ is added, each of which serves as the hole-injection layer 111 of each of the light-emitting devices, are found to be slightly higher than the refractive indices of the organic compounds. That is, it was found that even when a material with a high refractive index is used as the electron-donating material, the use of the refractive index of an organic compound for the hole-injection layer 111 enables the hole-injection layer 111 with a low refractive index to be obtained.

FIG. 13 also shows that the difference between n Ordinary and Extra-ordinary in the hole-injection layer 111 of each of the light-emitting devices is smaller than that in the film of each of the organic compounds. That is, it was found that the anisotropy of a mixed film of an organic compound and $MoO_3$, which is an electron-donating material, is lower than that of an organic compound film.

<Fabrication of Light-Emitting Devices>

<<Fabrication of Light-Emitting Device 1 to Light-Emitting Device 4>>

An alloy of silver, palladium, and copper (also referred to as Ag—Pd—Cu or APC) as a first anode (1) and an ITSO film as a second anode (2) were sequentially formed over the substrate 200 to a thickness of 100 nm and a thickness of 110 nm, respectively, so that the electrode 101 was formed. The ITSO film is a conductive film having a function of transmitting light, the APC film is a conductive film having a function of reflecting light and a function of transmitting light. Note that the electrode area of the electrode 101 was set to 4 mm$^2$ (2 mm×2 mm). The refractive index (n Ordinary) of the ITSO film with respect to 532-nm light is 2.07.

Next, as the hole-injection layer 111, 1,1-bis-(4-bis(4-methyl-phenyl)-amino-phenyl)-cyclohexane (abbreviation: TAPC), and $MoO_3$ were deposited on the first electrode 101(2) by co-evaporation at a weight ratio (TAPC: $MoO_3$) of 2:0.5 to a thickness of $x_1$ nm. Note that the value $x_1$ differs between the light-emitting devices, and Table 3 shows the value $x_1$ in each of the light-emitting devices.

Then, as the hole-transport layer 112, PCCP was deposited on the hole-injection layer 111 by evaporation to a thickness of 20 nm.

Then, as a first light-emitting layer 130(1), 4,6mCzP2Pm, PCCP, and Ir(ppy)$_3$ were deposited on the hole-transport layer 112 by co-evaporation at a weight ratio (4,6mCzP2Pm: PCCP: Ir(ppy)$_3$) of 0.5:0.5:0.1 to a thickness of 20 nm, and successively, as a second light-emitting layer 130(2), 4,6mCzP2Pm, PCCP, and Ir(ppy)$_3$ were deposited by co-evaporation at a weight ratio of 0.8:0.2:0.1 to a thickness of 20 nm. Note that in the first light-emitting layer 130(1) and the second light-emitting layer 130(2), Ir(ppy)$_3$ is a guest material that emits phosphorescence.

Then, as a first electron-transport layer 118(1), 4,6mCzP2Pm was deposited on the second the light-emitting layer 130(2) by evaporation to a thickness of 20 nm. Subsequently, as a second electron-transport layer 118(2), NBPhen was deposited on the first electron-transport layer 118(1) by evaporation to a thickness of 15 nm.

Then, as the electron-injection layer 119, lithium fluoride (LiF) was deposited on the second electron-transport layer 118(2) by evaporation to a thickness of 1 nm.

Then, as the first electrode 102(1), aluminum (Al) was deposited on the electron-injection layer 119 to a thickness of 1 nm. Then, as the second electrode 102(2), Ag was deposited on the first electrode 102(1) by evaporation to a thickness of 24 nm.

Then, as the cap layer 145, DBT3P-II was deposited on the second electrode 102(2) by evaporation to a thickness of 70 nm.

Next, in a glove box containing a nitrogen atmosphere, the light-emitting device 1 to the light-emitting device 4 were sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the light-emitting device 1 to the light-emitting device 4 were obtained.

<<Fabrication of Comparative Light-Emitting Device 5 to Comparative Light-Emitting Device 8>>

The comparative light-emitting device 5 to the comparative light-emitting device 8 were fabricated through the same steps as the steps of fabricating the light-emitting device 1 to the light-emitting device 4 except for the step of forming the hole-injection layer 111.

As the hole-injection layer 111, DBT3P-II and $MoO_3$ were deposited on the electrode 101 by co-evaporation at a weight ratio (DBT3P-II: $MoO_3$) of 2:0.5 to a thickness of $x_1$ nm. Note that the value $x_1$ differs between the light-emitting devices, and Table 3 shows the value $x_1$ in each of the light-emitting devices.

<<Fabrication of Comparative Light-Emitting Device 9 to Comparative Light-Emitting Device 12>>

The comparative light-emitting device 9 to the comparative light-emitting device 12 were fabricated through the same steps as the steps of fabricating the light-emitting device 1 to the light-emitting device 4 except for the step of forming the cap layer 145.

In the comparative light-emitting device 9 to the comparative light-emitting device 12, the cap layer 145 was not formed. That is, sealing was performed after the formation of the electrode 102(2), whereby the comparative light-emitting device 9 to the comparative light-emitting device 12 were obtained.

<<Fabrication of Comparative Light-Emitting Device 13 to Comparative Light-Emitting Device 16>>

The comparative light-emitting device 13 to the comparative light-emitting device 16 were fabricated through the same steps as the steps of fabricating the comparative light-emitting device 5 to the comparative light-emitting device 8 except for the step of forming the cap layer 145.

In the comparative light-emitting device 13 to the comparative light-emitting device 16, the cap layer 145 was not formed. That is, sealing was performed after the formation of the electrode 102(2), whereby the comparative light-emitting device 13 to the comparative light-emitting device 16 were obtained.

The light-emitting device 1 to the light-emitting device 4 and the comparative light-emitting device 5 and the comparative light-emitting device 16 are top-emission light-emitting devices, and the light extraction side is the electrode 102 side.

<Characteristics of Light-Emitting Devices>

Next, the characteristics of the fabricated light-emitting device 1 to light-emitting device 4 and the fabricated comparative light-emitting device 5 to comparative light-emitting device 16 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.). Note that the measurement of the light-emitting devices was performed at room temperature (in an atmosphere maintained at 23° C.).

Figure 14:
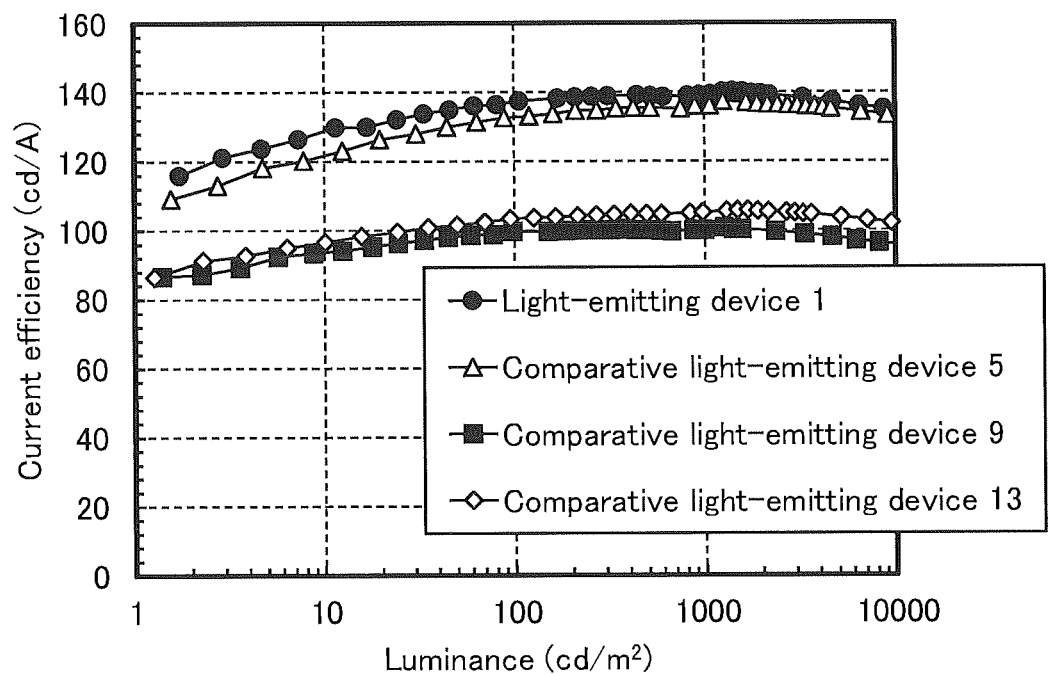
FIG. 14 is a graph showing the current efficiency-luminance characteristics of light-emitting devices in Example.
Figure 15:
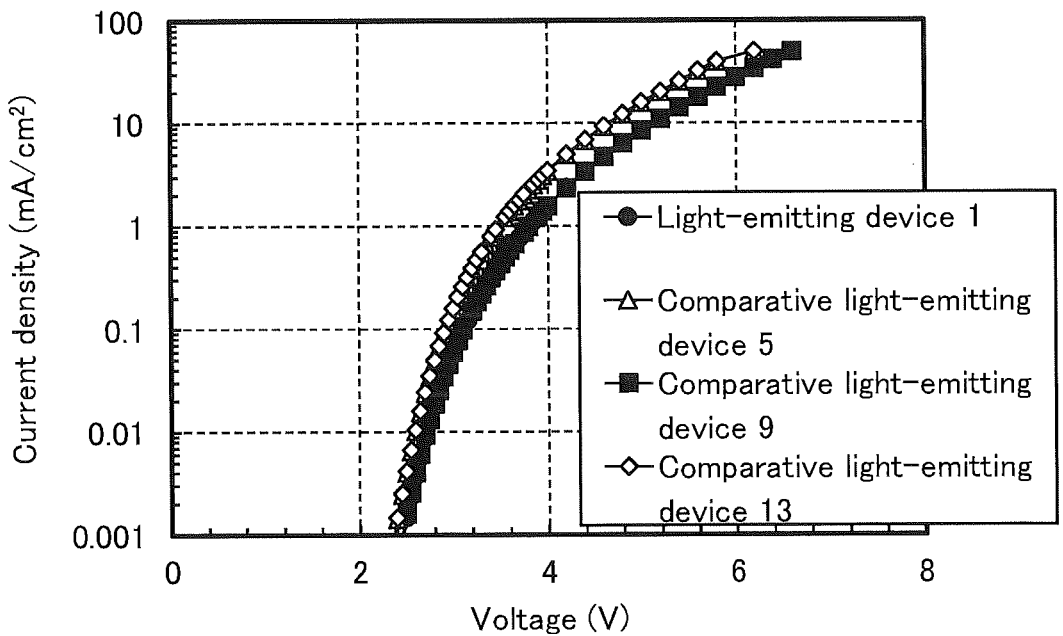
FIG. 15 is a graph showing the current density-voltage characteristics of the light-emitting devices in Example.
Figure 16:
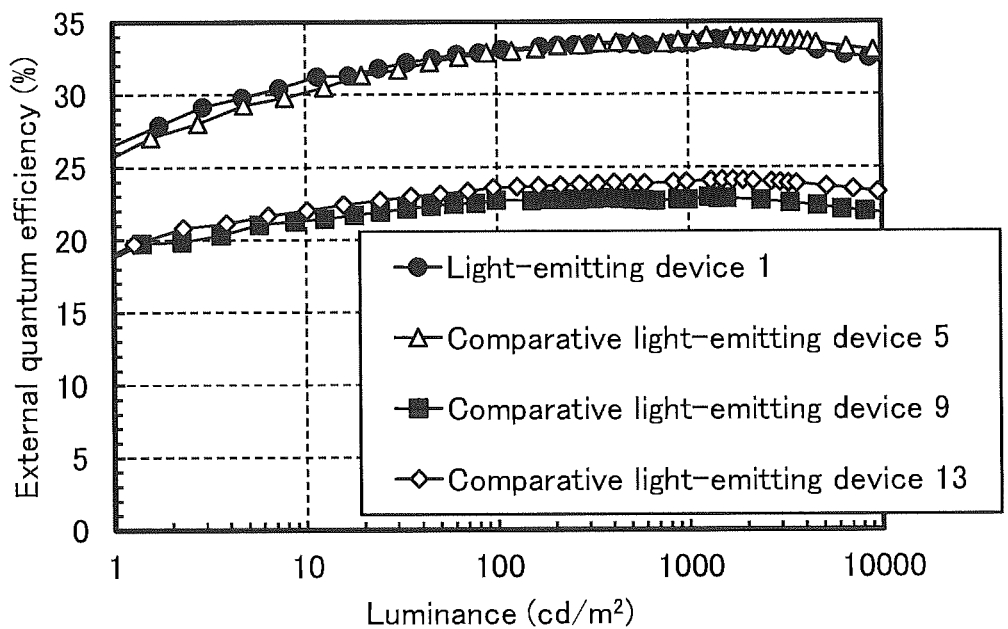
FIG. 16 is a graph showing the external quantum efficiency-luminance characteristics of the light-emitting devices in Example.

FIG. 14 shows the current efficiency-luminance characteristics of the light-emitting device 1, the comparative light-emitting device 5, the comparative light-emitting device 9, and the comparative light-emitting device 13 among the fabricated light-emitting devices. FIG. 15 shows the current density-voltage characteristics. FIG. 16 shows the external quantum efficiency-luminance characteristics. As described above, the light-emitting device 1 and the comparative light-emitting device 9 are devices using TAPC, which has a low refractive index, as an organic compound of the hole-injection layer 111, and the comparative light-emitting device 5 and the comparative light-emitting device 13 are devices using DBT3P-II. The light-emitting device 1 and the comparative light-emitting device 5 include the cap layer 145, and the comparative light-emitting device 9 and the comparative light-emitting device 13 do not include the cap layer 145. All the light-emitting devices have the same device structure except for an organic compound used for the hole-injection layer 111 and presence or absence of the cap layer 145.

FIG. 15 shows that the light-emitting device 1, the comparative light-emitting device 5, the comparative light-emitting device 9, and the comparative light-emitting device 13 have equivalent current density-voltage characteristics. This indicates that even when an organic compound with a low refractive index is used for the hole-injection layer 111, these devices have favorable hole-injection properties.

FIG. 14 and FIG. 16 show that the light-emitting device 1, the comparative light-emitting device 5, the comparative light-emitting device 9, and the comparative light-emitting device 13 have a current efficiency higher than 100 cd/A and an external quantum efficiency higher than 20%. When the light-emitting device 1 and the comparative light-emitting device 9 are compared, the light-emitting device 1 has higher current efficiency and higher external quantum efficiency. The light-emitting device 1 includes the cap layer 145, whereas the comparative light-emitting device 9 does not include the cap layer 145. Thus, the light-emitting device 1 having high outcoupling efficiency has higher current efficiency and higher external quantum efficiency. The same applies to the relation between the comparative light-emitting device 5 and the comparative light-emitting device 13.

Figure 17:
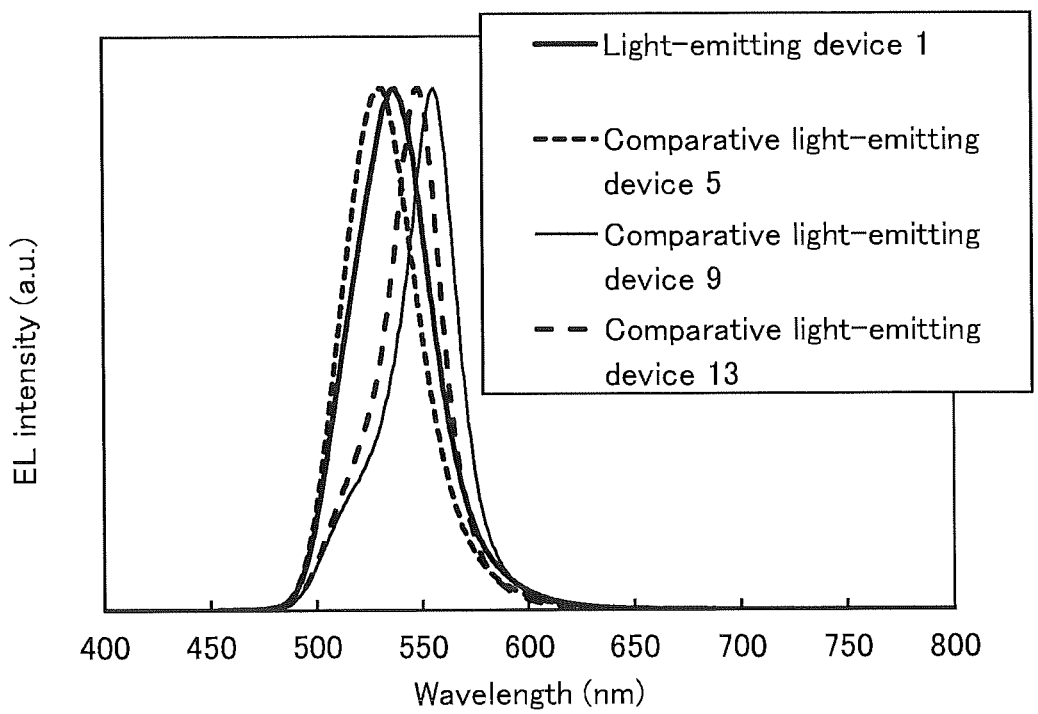
FIG. 17 is a graph showing emission spectra in Example.

FIG. 17 shows emission spectra when current at a current density of 25 mA/cm$^2$ was supplied to the light-emitting device 1, the comparative light-emitting device 5, the comparative light-emitting device 9, and the comparative light-emitting device 13. As shown in FIG. 17, it was found that the emission spectra of the light-emitting device 1, the comparative light-emitting device 5, the comparative light-emitting device 9, and the comparative light-emitting device 13 respectively have peaks at around 530 nm, 538 nm, 548 nm, and 556 nm, which are derived from light emission of a guest material Ir(ppy)$_3$ contained in the light-emitting layer 130.

Table 4 shows the device characteristics of the light-emitting device 1 to the light-emitting device 4 and the comparative light-emitting device 5 to the comparative light-emitting device 16 at around 1000 cd/m$^2$.

TABLE 4

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting device 1 | 3.40 | 0.780 | (0.233, 0.724) | 1060 | 136 | 126 | 33.7 |
| Light-emitting device 2 | 3.40 | 0.766 | (0.272, 0.698) | 1050 | 137 | 126 | 32.5 |
| Light-emitting device 3 | 3.40 | 0.787 | (0.310, 0.666) | 1030 | 130 | 121 | 30.5 |
| Light-emitting device 4 | 3.40 | 0.801 | (0.343, 0.638) | 964 | 120 | 111 | 28.2 |
| Comparative light-emitting device 5 | 3.65 | 0.674 | (0.258, 0.706) | 937 | 139 | 120 | 33.5 |
| Comparative light-emitting device 6 | 3.70 | 0.742 | (0.302, 0.672) | 996 | 134 | 114 | 31.5 |
| Comparative light-emitting device 7 | 3.70 | 0.741 | (0.341, 0.638) | 910 | 123 | 104 | 29.0 |
| Comparative light-emitting device 8 | 3.75 | 0.851 | (0.376, 0.606) | 919 | 108 | 90.5 | 26.0 |
| Comparative light-emitting device 9 | 3.45 | 0.926 | (0.285, 0.690) | 973 | 105 | 95.7 | 24.0 |
| Comparative light-emitting device 10 | 3.45 | 0.901 | (0.333, 0.647) | 879 | 97.5 | 88.8 | 22.2 |
| Comparative light-emitting device 11 | 3.50 | 1.09 | (0.377, 0.607) | 948 | 86.9 | 78.0 | 20.2 |

TABLE 4-continued

| | Voltage (V) | Current density (mA/cm²) | CIE chromaticity (x, y) | Luminance (cd/m²) | Current efficiency (cd/A) | Power efficiency (lm/W) | External quantum efficiency (%) |
|---|---|---|---|---|---|---|---|
| Comparative light-emitting device 12 | 3.55 | 1.26 | (0.415, 0.571) | 954 | 75.4 | 66.8 | 18.1 |
| Comparative light-emitting device 13 | 3.80 | 0.994 | (0.323, 0.655) | 993 | 99.9 | 82.6 | 22.8 |
| Comparative light-emitting device 14 | 3.80 | 0.955 | (0.375, 0.607) | 840 | 87.9 | 72.7 | 20.5 |
| Comparative light-emitting device 15 | 3.95 | 1.36 | (0.423, 0.563) | 998 | 73.6 | 58.5 | 18.0 |
| Comparative light-emitting device 16 | 4.00 | 1.49 | (0.460, 0.528) | 911 | 61.1 | 48.0 | 15.8 |

The above results demonstrate that the light-emitting device 1 to the light-emitting device 4 and the comparative light-emitting device 5 to the comparative light-emitting device 16 fabricated in this example have favorable driving voltage and emission efficiency regardless of the structure of the hole-injection layer 111. It is also found that the light-emitting device 1 to the light-emitting device 4 and the comparative light-emitting device 5 to the comparative light-emitting device 8 each including the cap layer 145 have higher efficiency than the comparative light-emitting device 9 to the comparative light-emitting device 16.

Presumably, a guest material Ir(ppy)$_3$ emits light in the light-emitting device 1 to the light-emitting device 4 and the comparative light-emitting device 5 to the comparative light-emitting device 16. Thus, the peak wavelengths of light emitted from the light-emitting device 1 to the light-emitting device 4 and the comparative light-emitting device 5 to the comparative light-emitting device 16 are probably approximately 530 nm to 580 nm, according to FIG. 17. The optical path length between the hole-injection layer 111, which is a layer with a low refractive index, and the light-emitting layer 130 is less than or equal to λ/2 of the peak wavelength, in the light-emitting device 1 to the light-emitting device 4 and the comparative light-emitting device 9 to the comparative light-emitting device 12. The optical path length from the anode (the electrode 101) side or the cathode (the electrode 102) side of the light-emitting layer 130 to the electrode 101(2) is less than or equal to λ/4±50 nm, and the optical path length from the anode (the electrode 101) side or the cathode (the electrode 102) side of the light-emitting layer 130 and from the electrode 101(2) to the electrode 101(1) is less than or equal to 3214±50 nm.

<Relation Between Refractive Index of Hole-Injection Layer 111 and External Quantum Efficiency>

Figure 18:
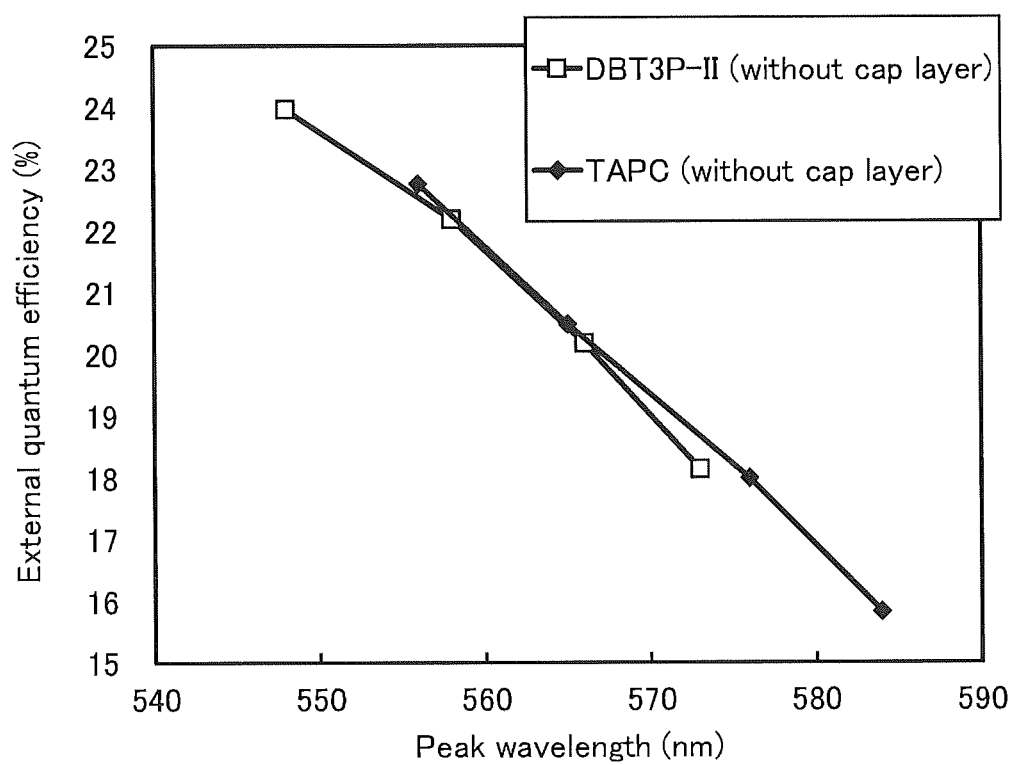
FIG. 18 is a graph showing the relation between external quantum efficiency and peak wavelength of light-emitting devices in Example.

FIG. 18 shows the relation between external quantum efficiency at around 1000 cd/m² of the comparative light-emitting device 9 to the comparative light-emitting device 16, and emission peak wavelength obtained from the light-emitting devices. In FIG. 18, the values of the comparative light-emitting device 9 to the comparative light-emitting device 12 were used as data on a curve of "TAPC", and the values of the comparative light-emitting device 13 to the comparative light-emitting device 16 were used as data on a curve of "DBT3P-II".

Figure 19:
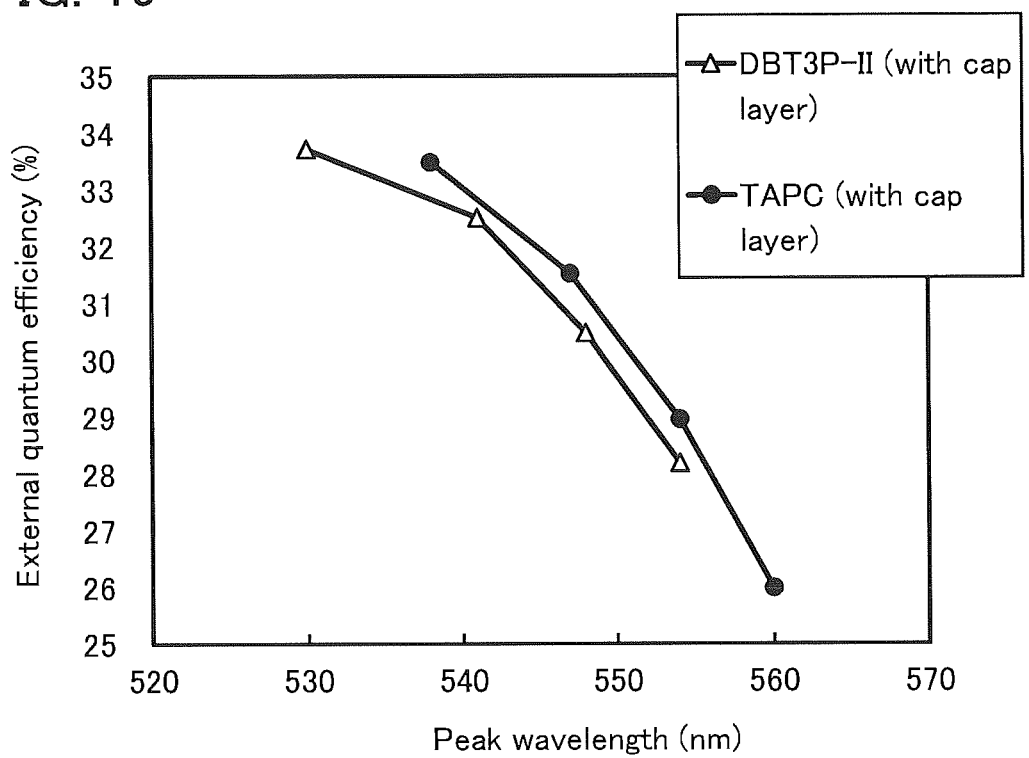
FIG. 19 is a graph showing the relation between external quantum efficiency and peak wavelength of light-emitting devices in Example.

FIG. 19 shows the relation between external quantum efficiency at around 1000 cd/m² of the light-emitting device 1 to the light-emitting device 4 and the comparative light-emitting device 5 to the comparative light-emitting device 8 and emission peak wavelength obtained from the light-emitting devices. In FIG. 19, the values of the light-emitting device 1 to the light-emitting device 4 were used as data on a curve of "TAPC", and the values of the comparative light-emitting device 5 to the comparative light-emitting device 8 were used as data on a curve of "DBT3P-II".

FIG. 18 and FIG. 19 show that external quantum efficiency and a peak wavelength have such a relation that in the range of the thickness of the hole-injection layer 111 formed in this example, external quantum efficiency tends to decrease as the peak wavelength becomes long. In FIG. 18, data on the curve of "TAPC" and data on the curve of "DBT3P-II" of the light-emitting devices without the cap layer 145 overlap each other; thus, the light-emitting devices without the cap layer 145 have almost the same efficiency regardless of the refractive index of the hole-injection layer 111. Meanwhile, in FIG. 19, data on the curve of "TAPC" of the light-emitting devices including the cap layer 145 indicates higher efficiency than data on the curve of "DBT3P-II" thereof. This means that the use of a hole-injection layer having a low refractive index in a light-emitting device including the cap layer 145 can improve emission efficiency.

Thus, it was found that the use of the hole-injection layer 111 having a low refractive index and the cap layer 145 in a top-emission light-emitting device can improve efficiency.

Example 2

In this example, examples of fabricating light-emitting devices different from those in Example 1, as light-emitting devices of embodiments of the present invention, and the characteristics of the light-emitting devices are described. Table 5 shows the details of the device structures. The structures and abbreviations of the compounds used are shown below. Example 1 above can be referred to for other organic compounds.

[Chemical Formulae 3]

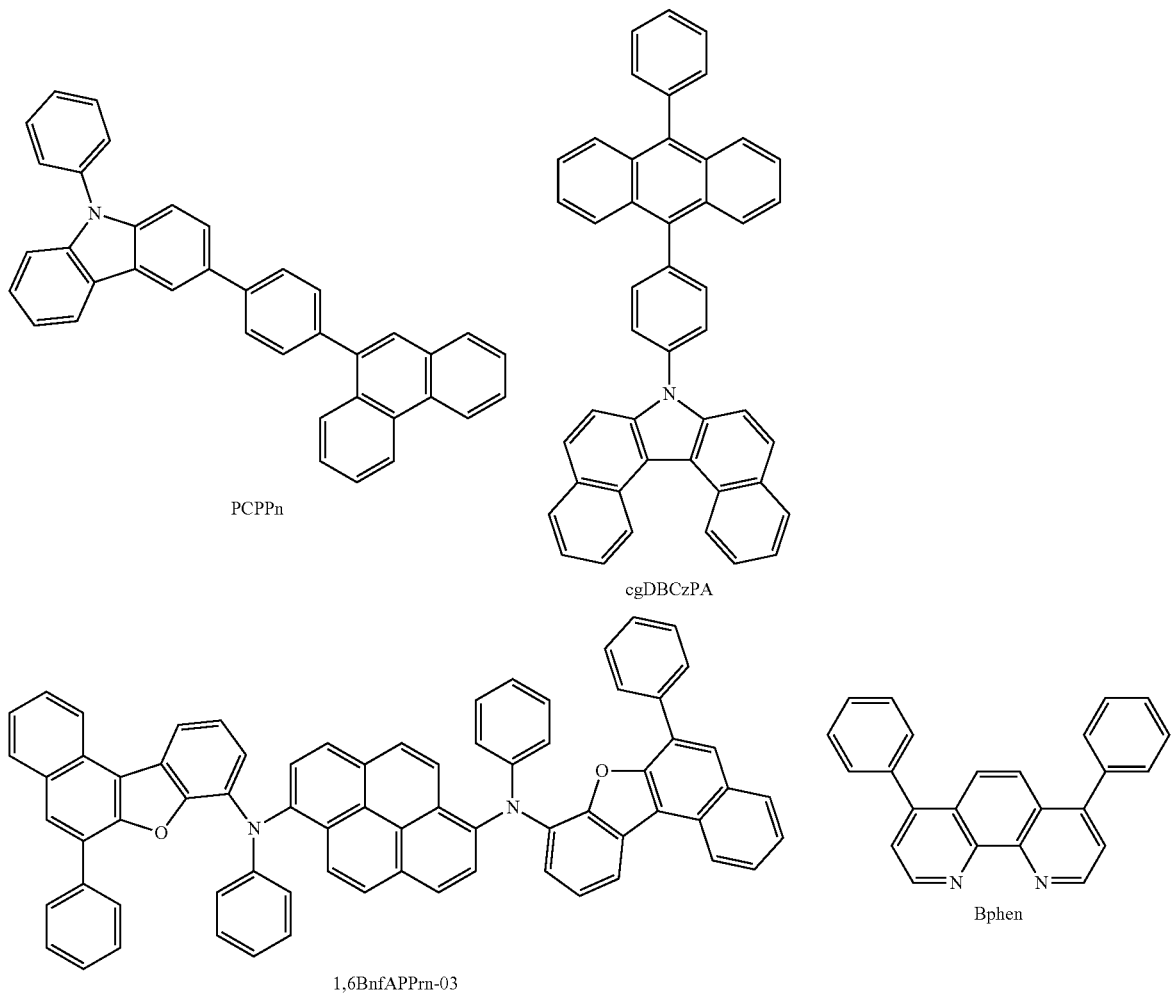

TABLE 5

| | Layer | Reference numeral | Thickness (nm) | Material | Weight ratio |
|---|---|---|---|---|---|
| Light-emitting device 17 | Cap film | 145 | 70 | DBT3P-II | — |
| | Electrode (cathode) | 102 | 25 | Ag:Mg | 1:0.017 |
| | | 119 | 15 | BPhen:LiF | 8:1 |
| | Electron-transport layer | 118(2) | 5 | BPhen | — |
| | | 118(1) | 5 | cgDBCzPA | — |
| | Light-emitting layer | 130 | 25 | cgDBCzPA:1,6BnfAPrn-03 | 1:0.03 |
| | Hole-transport layer | 112 | 30 | PCPPn | — |
| | Hole-injection layer | 111 | 20 | PCPPn:MoO$_3$ | 2:0.5 |
| | Electrode (anode) | 101(2) | 85 | ITSO | — |
| | | 101(1) | 100 | APC | — |
| Comparative light-emitting device 18 | Cap film | 145 | 70 | DBT3P-II | — |
| | Electrode (cathode) | 102 | 25 | Ag:Mg | 1:0.017 |
| | | 119 | 1 | LiF | — |
| | Electron-transport layer | 118(2) | 15 | BPhen | — |
| | | 118(1) | 5 | cgDBCzPA | — |
| | Light-emitting layer | 130 | 25 | cgDBCzPA:1,6BnfAPrn-03 | 1:0.03 |
| | Hole-transport layer | 112 | 30 | PCPPn | — |
| | Hole-injection layer | 111 | 20 | PCPPn:MoO$_3$ | 2:0.5 |
| | Electrode (anode) | 101(2) | 85 | ITSO | — |
| | | 101(1) | 100 | APC | — |

<<Fabrication of Light-Emitting Device 17>>

The electrode 101 was formed in such a manner that APC and an ITSO film were formed over the substrate 200 to a thickness of 100 nm and a thickness of 85 nm, respectively.

Next, as the hole-injection layer 111, PCPPn and MoO$_3$ were deposited on the electrode 101 by co-evaporation at a weight ratio (PCPPn: MoO$_3$) of 2:0.5 to a thickness of 20 nm.

Then, as the hole-transport layer 112, PCPPn was deposited on the hole-injection layer 111 by evaporation to a thickness of 30 nm.

Next, as the light-emitting layer 130, cgDBCzPA and N,N'-(pyrene-1,6-diyl)bis[(6,N-diphenylbenzo[b]naphtho[1,2-d]furan)-8-amine] (abbreviation: 1,6BnfAPrn-03) were deposited on the hole-transport layer 112 by co-evaporation at a weight ratio (cgDBCzPA:1,6BnfAPrn-03) of 1:0.03 to a thickness of 25 nm. Note that in the light-emitting layer 130, 1,6BnfAPrn-03 is a guest material that emits blue fluorescence.

Then, as the first electron-transport layer 118(1), cgDBCzPA was deposited on the light-emitting layer 130 by evaporation to a thickness of 5 nm. Subsequently, as the second electron-transport layer 118(2), BPhen was deposited on the first electron-transport layer 118(1) by evaporation to a thickness of 5 nm.

Then, as the electron-injection layer 119, BPhen and LiF were deposited on the second electron-transport layer 118(2) by co-evaporation at a weight ratio (BPhen: LiF) of 8:1 to a thickness of 15 nm. It is known that a film obtained by co-evaporation of a fluoride and an organic compound has a lower refractive index than a film of an organic compound alone. Thus, in the light-emitting device 17, the electron-injection layer 119 functions as an electron-injection layer and a layer with a low refractive index.

Then, as the electrode 102, Ag and Mg were deposited on the electron-injection layer 119 at a weight ratio of (Ag: Mg)=1:0.017 to a thickness of 25 nm.

Then, as the cap layer 145, DBT3P-II was deposited on the electrode 102 by evaporation to a thickness of 70 nm.

Then, in a glove box containing a nitrogen atmosphere, the light-emitting device 17 was sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the light-emitting device 17 was obtained.

<<Fabrication of Comparative Light-Emitting Device 18>>

The fabrication steps for a comparative light-emitting device 18 differs from those for the light-emitting device 17 only in steps for forming the electron-transport layer 118(2) and the electron-injection layer 119, and the other steps were performed as in the case of the light-emitting device 17.

As the electron-transport layer 118(2) of the comparative light-emitting device 18, BPhen was deposited by evaporation to a thickness of 15 nm. Then, as the electron-injection layer 119, LiF was deposited by evaporation to a thickness of 1 nm.

<Characteristics of Light-Emitting Devices>

Next, the characteristics of the fabricated light-emitting device 17 and comparative light-emitting device 18 were measured. The measurement was performed in a manner similar to that in Example 1.

Figure 20:
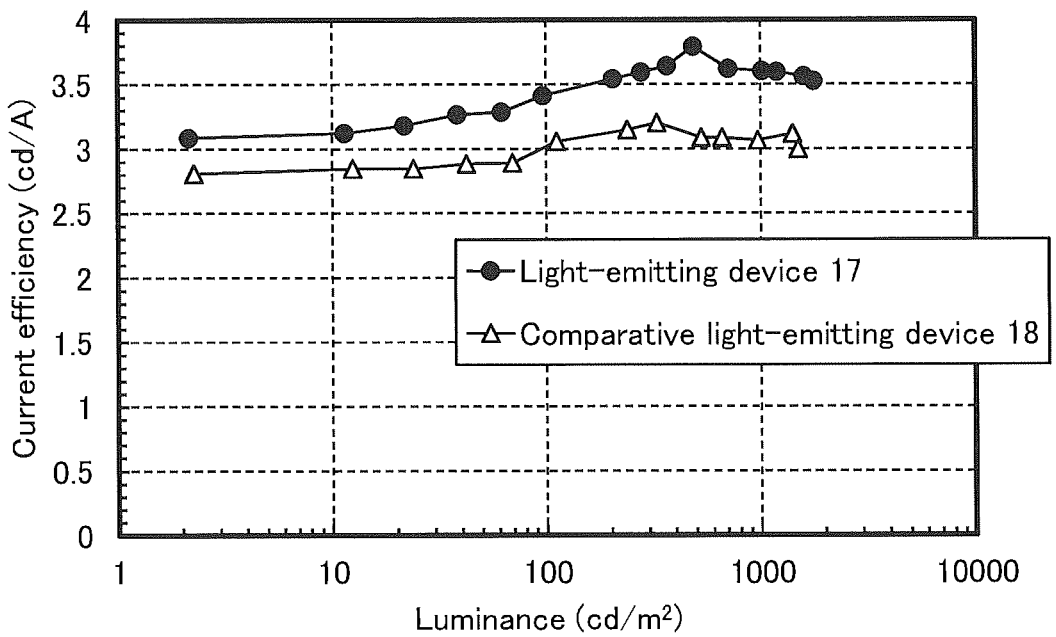
FIG. 20 is a graph showing the current efficiency-luminance characteristics of light-emitting devices in Example.
Figure 21:
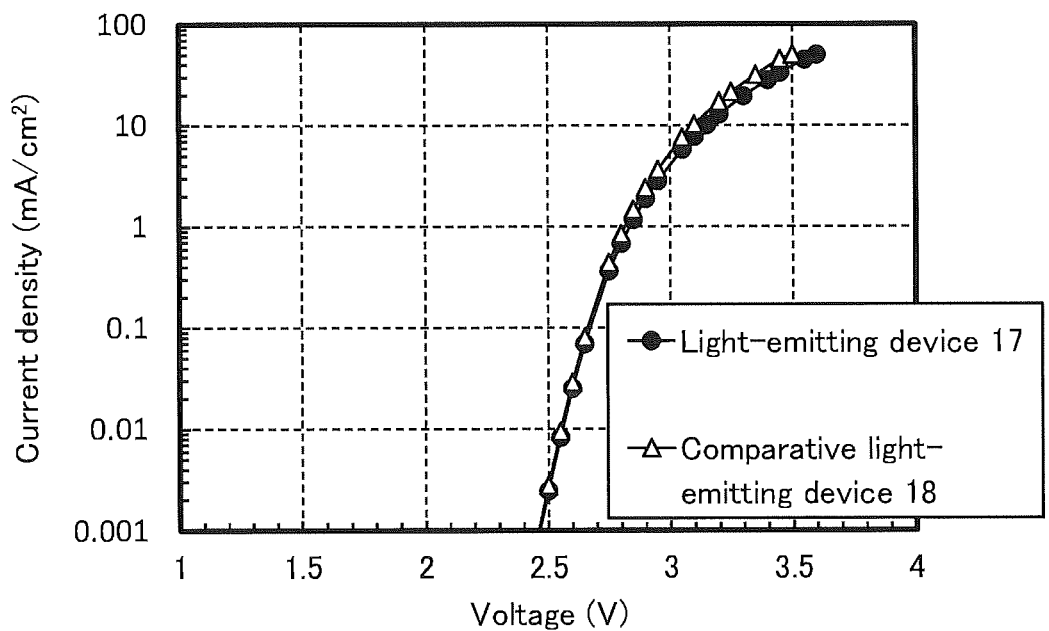
FIG. 21 is a graph showing the current density-voltage characteristics of the light-emitting devices in Example.
Figure 22:
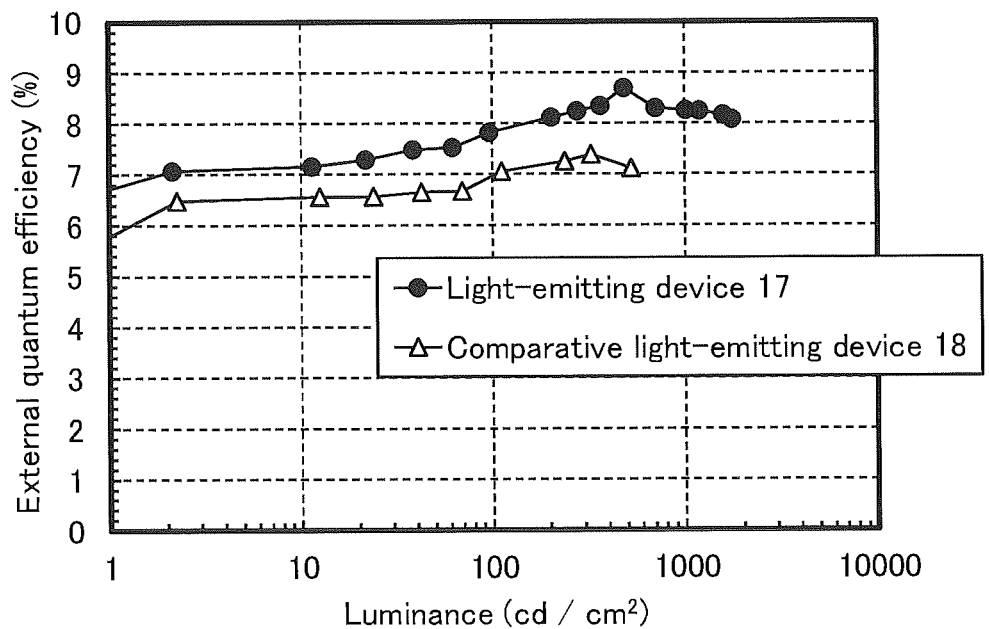
FIG. 22 is a graph showing the external quantum efficiency-luminance characteristics of the light-emitting devices in Example.

FIG. 20 shows the current efficiency-luminance characteristics of the light-emitting device 17 and the comparative light-emitting device 18. FIG. 21 shows the current density-voltage characteristics thereof. FIG. 22 shows the external quantum efficiency-luminance characteristics thereof.

Table 6 shows the device characteristics of the light-emitting device 17 and the comparative light-emitting device 18 at approximately 1000 cd/m$^2$.

TABLE 6

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting device 17 | 3.40 | 28.1 | (0.142, 0.034) | 1010 | 3.60 | 3.33 | 8.26 |
| Comparative light-emitting device 18 | 3.35 | 31.6 | (0.142, 0.033) | 970 | 3.06 | 2.87 | 7.07 |

FIG. 21 and Table 6 show that the light-emitting device 17 and the comparative light-emitting device 18 have equivalent current density-voltage characteristics.

FIG. 20, FIG. 22, and Table 6 demonstrate that the light-emitting device 17 and the comparative light-emitting device 18 have high current efficiency and high external quantum efficiency. It was also found that the light-emitting device 17 including a mixed film of BPhen and LiF, which is a layer with a low refractive index, has higher current efficiency and higher external quantum efficiency than the comparative light-emitting device 18 without the mixed film, i.e., a layer with a low refractive index. Thus, the use of the electron-injection layer 119 with a low refractive index in a light-emitting device including the cap layer 145 can improve emission efficiency.

Figure 23:
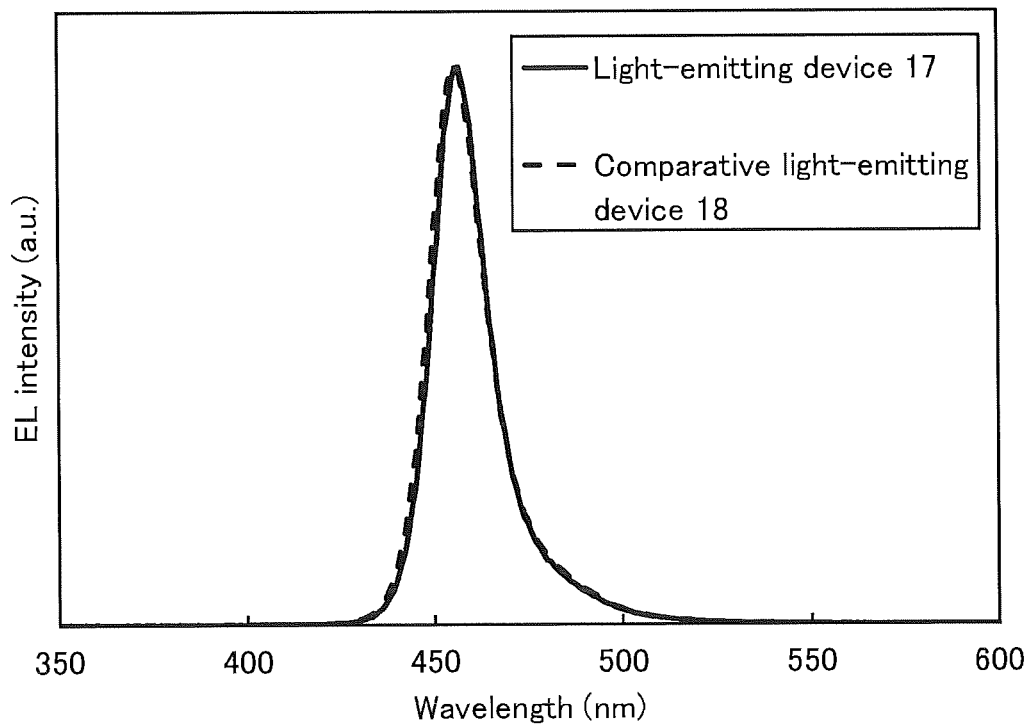
FIG. 23 is a graph showing emission spectra in Example.

FIG. 23 shows emission spectra when current at a current density of 2.5 mA/cm$^2$ was supplied to the light-emitting device 17 and the comparative light-emitting device 18. As shown in FIG. 23, the emission spectra of the light-emitting device 17 and the comparative light-emitting device 18 have peaks at around 457 nm, which were found to be derived from light emission of a guest material 1,6BnfAPrn-03 contained in the light-emitting layer 130. Here, in the light-emitting device 17, the optical path length between the electron-injection layer 119, which is a layer with a low refractive index, and the light-emitting layer 130 is less than or equal to $\lambda/2$ of the peak wavelength. In addition, the optical path length from the light-emitting layer 130 to the electrode 101(2) is less than or equal to $\lambda/4$, and the optical path length from the light-emitting layer 130 to the electrode 101(1) is less than or equal to $3\lambda/4$.

Example 3

In this example, fabrication examples of light-emitting devices and comparative light-emitting devices of embodiments of the present invention, which are different from those in the above example, and the characteristics of the light-emitting devices are described. Cross-sectional views of the device structures fabricated in this example are similar to that in FIG. 3. Table 7 shows the details of the device structures. Note that the above examples and embodiments can be referred to for the structures of compounds used.

TABLE 7

| | Layer | Reference numeral | Thickness (nm) | Material | Weight ratio |
|---|---|---|---|---|---|
| Light-emitting device 19 | Cap film | 145 | 70 | DBT3P-II | — |
| | Electrode (cathode) | 102 | 15 | Ag:Mg | 1:0.017 |
| | Electron-injection layer | 119 | 30 | BPhen:LiF | 8:1 |
| | Electron-transport layer | 118 | 5 | NBPhen | — |
| | Light-emitting layer | 130 | 25 | cgDBCzPA:1,6BnfAPrn-03 | 1:0.03 |
| | Hole-transport layer | 112 | 10 | PCPPn | — |
| | Hole-injection layer | 111(2) | 5 | PCPPn:MoO$_3$ | 2:0.5 |
| | | 111(1) | 35 | CaF$_2$:TAPC:MoO$_3$ | 3:1:0.5 |
| | Electrode (anode) | 101(2) | 85 | ITSO | — |
| | | 101(1) | 100 | APC | — |
| Comparative light-emitting device 20 | Cap film | 145 | 70 | DBT3P-II | — |
| | Electrode (cathode) | 102 | 15 | Ag:Mg | 1:0.017 |
| | Electron-injection layer | 119 | 1 | LiF | — |
| | Electron-transport layer | 118 | 25 | NBPhen | — |
| | Light-emitting layer | 130 | 25 | cgDBCzPA:1,6BnfAPrn-03 | 1:0.03 |
| | Hole-transport layer | 112 | 10 | PCPPn | — |
| | Hole-injection layer | 111 | 35 | PCPPn:MoO$_3$ | 2:1 |
| | Electrode (anode) | 101(2) | 85 | ITSO | — |
| | | 101(1) | 100 | APC | — |

<<Fabrication of Light-Emitting Device 19>>

The electrode 101 was formed in such a manner that APC and an ITSO film were sequentially formed over the substrate 200 to a thickness of 100 nm and a thickness of 85 nm, respectively.

Next, as the hole-injection layer 111, calcium fluoride (CaF$_2$), TAPC, and MoO$_3$ were deposited on the electrode 101 by co-evaporation at a weight ratio of (CaF$_2$:TAPC:MoO$_3$)=3:1:0.5 to a thickness of 35 nm. The hole-injection layer 111 functions as a layer with a low refractive index. Then, PCPPn and MoO$_3$ were deposited by co-evaporation at a weight ratio of (PCPPn: MoO$_3$)=2:0.5 to a thickness of 5 nm.

Then, as the hole-transport layer 112, PCPPn was deposited on the hole-injection layer 111 by evaporation to a thickness of 10 nm.

Then, as the light-emitting layer 130, cgDBCzPA and 1,6BnfAPrn-03 were deposited on the hole-transport layer 112 by co-evaporation at a weight ratio (cgDBCzPA: 1,6BnfAPrn-03) of 1:0.03 to a thickness of 25 nm. Note that in the light-emitting layer 130, 1,6BnfAPrn-03 is a guest material exhibiting blue fluorescence.

Then, as the electron-transport layer 118, NBPhen was deposited on the light-emitting layer 130 by evaporation to a thickness of 5 nm.

Then, as the electron-injection layer 119, BPhen and LiF were deposited on the electron-transport layer 118 by co-evaporation at a weight ratio (BPhen: LiF) of 8:1 to a thickness of 30 nm. The electron-injection layer 119 functions as a layer with a low refractive index.

Then, as the electrode 102, Ag and magnesium (Mg) were deposited on the electron-injection layer 119 at a weight ratio (Ag: Mg) of 1:0.017 to a thickness of 15 nm.

Then, as the cap layer 145, DBT3P-II was deposited on the electrode 102 by evaporation to a thickness of 70 nm.

Then, in a glove box containing a nitrogen atmosphere, the light-emitting device 19 was sealed by fixing a glass substrate for sealing to a glass substrate on which organic materials were formed, using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the light-emitting device 19 was obtained.

<<Fabrication of Comparative Light-Emitting Device 20>>

For comparison with the light-emitting device 19, a comparative light-emitting device 20 was fabricated. The hole-injection layer 111 and the electron-injection layer 119 in the comparative light-emitting device 20 do not have a function of a layer with a low refractive index.

The electrode 101 was formed in such a manner that APC and an ITSO film were sequentially formed over the substrate 200 to a thickness of 100 nm and a thickness of 85 nm, respectively.

Next, as the hole-injection layer 111, PCPPn and MoO$_3$ were deposited on the electrode 101 by co-evaporation at a weight ratio (PCPPn: MoO$_3$) of 2:1 to a thickness of 35 nm.

Then, as the hole-transport layer 112, PCPPn was deposited on the hole-injection layer 111 by evaporation to a thickness of 10 nm.

Then, as the light-emitting layer 130, cgDBCzPA and 1,6BnfAPrn-03 were deposited on the hole-transport layer 112 by co-evaporation at a weight ratio (cgDBCzPA: 1,6BnfAPrn-03) of 1:0.03 to a thickness of 25 nm.

Then, as the electron-transport layer 118, NBPhen was deposited on the light-emitting layer 130 by evaporation to a thickness of 25 nm.

Then, as the electron-injection layer 119, LiF was deposited on the electron-transport layer 118 by evaporation to a thickness of 1 nm. Subsequently, as the electrode 102, Ag and magnesium (Mg) were deposited on the electron-injection layer 119 at a weight ratio (Ag: Mg) of 1:0.017 to a thickness of 15 nm.

Then, as the cap layer 145, DBT3P-II was deposited on the electrode 102 by evaporation to a thickness of 70 nm.

Then, in a glove box containing a nitrogen atmosphere, the comparative light-emitting device 20 was sealed by fixing a glass substrate for sealing to the glass substrate on which the organic materials were formed using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the comparative light-emitting device 20 was obtained.

<Characteristics of Light-Emitting Devices>

Next, the characteristics of the fabricated light-emitting device 19 and comparative light-emitting device 20 were measured. Luminance and CIE, chromaticity were measured with a spectroradiometer (SR-UL1R manufactured by TOPCON TECHNOHOUSE CORPORATION), and electroluminescence spectra were measured with a multi-channel spectrometer (PMA-11 manufactured by Hamamatsu Photonics K.K.). Note that the measurements of the light-emitting devices were performed at room temperature (in an atmosphere maintained at 23° C.).

Figure 24:
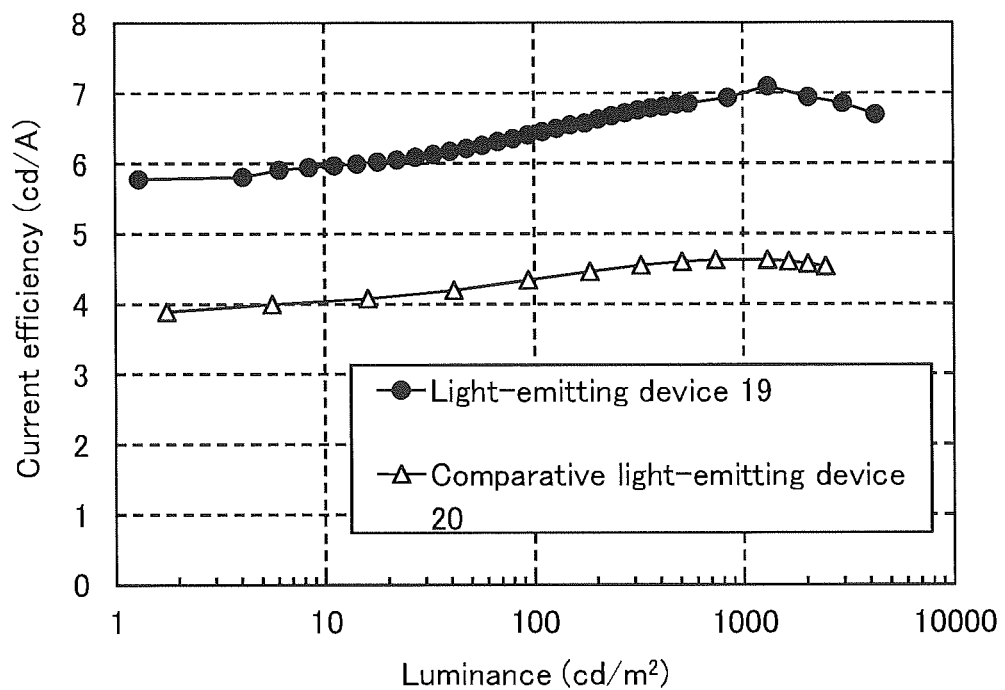
FIG. 24 is a graph showing the current efficiency-luminance characteristics of light-emitting devices in Example.
Figure 25:
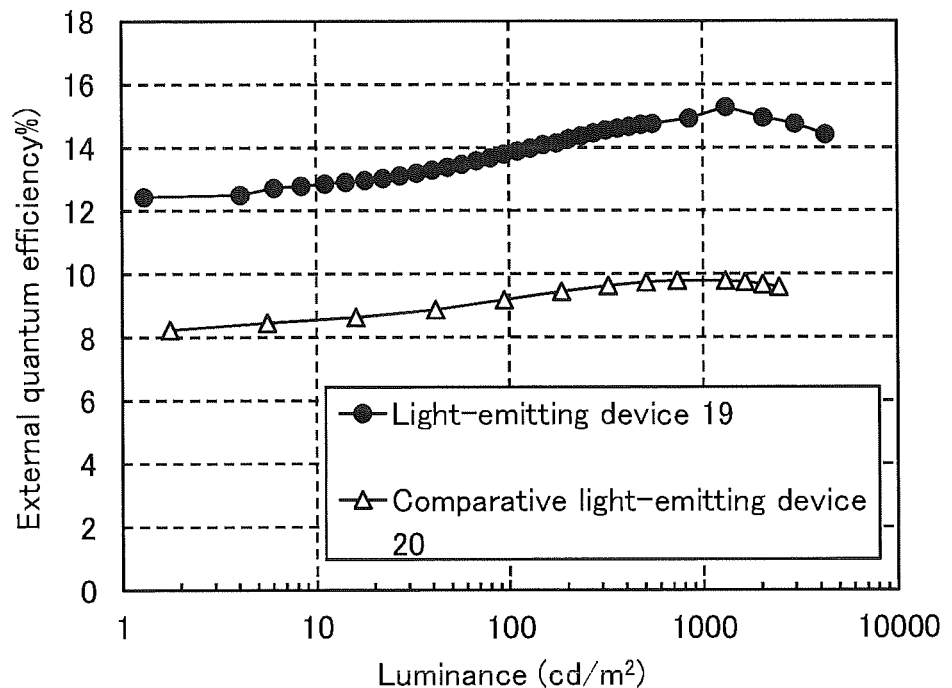
FIG. 25 is a graph showing the external quantum efficiency-luminance characteristics of the light-emitting devices in Example.

FIG. 24 shows the current efficiency-luminance characteristics of the light-emitting device 19 and the comparative light-emitting device 20. FIG. 25 shows the external quantum efficiency-luminance characteristics.

Table 8 shows the device characteristics of the light-emitting device 19 and the comparative light-emitting device 20 at around 1000 cd/m$^2$.

TABLE 8

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting device 19 | 4.20 | 12.2 | (0.142, 0.046) | 849 | 6.93 | 5.18 | 14.9 |
| Comparative light-emitting device 20 | 3.00 | 15.9 | (0.141, 0.047) | 736 | 4.63 | 4.84 | 9.79 |

FIG. 24, FIG. 25, and Table 8 demonstrate that the light-emitting device 19 and the comparative light-emitting device 20 have high current efficiency and high external quantum efficiency. It was also found that the light-emitting device 19 including a layer with a low refractive index has higher current efficiency and higher external quantum efficiency than the comparative light-emitting device 20 without a layer with a low refractive index. Thus, the use of a layer with a low refractive index in a light-emitting device including the cap layer 145 can improve emission efficiency.

Figure 26:
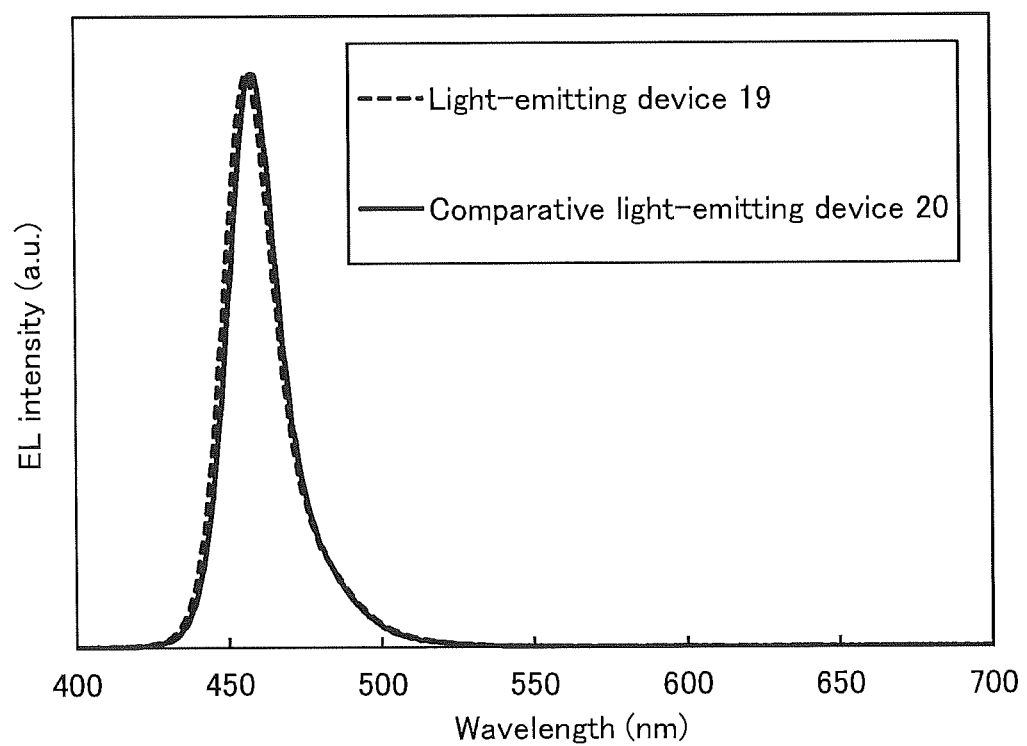
FIG. 26 is a graph showing emission spectra in Example.

FIG. 26 shows emission spectra when current at a current density of 2.5 mA/cm$^2$ was supplied to the light-emitting device 19 and the comparative light-emitting device 20. As shown in FIG. 26, the emission spectra of the light-emitting device 19 and the comparative light-emitting device 20 have peaks at around 457 nm, which were found to be derived from light emission of a guest material 1,6BnfAPm-03 contained in the light-emitting layer 130. Note that according to FIG. 26 and Table 8, the light-emitting device 19 and the comparative light-emitting device 20 have substantially the same emission spectra and substantially the same chromaticities.

Example 4

In this example, fabrication examples of light-emitting devices of embodiments of the present invention, which are different from those in the above example, and the characteristics of the light-emitting devices are described. Cross-sectional views of the device structures fabricated in this example are similar to that in FIG. 3. Table 9 shows the details of the device structures. The structures and abbreviations of compounds used are shown below. The above examples and embodiments can be referred to for other organic compounds.

[Chemical Formula 4]

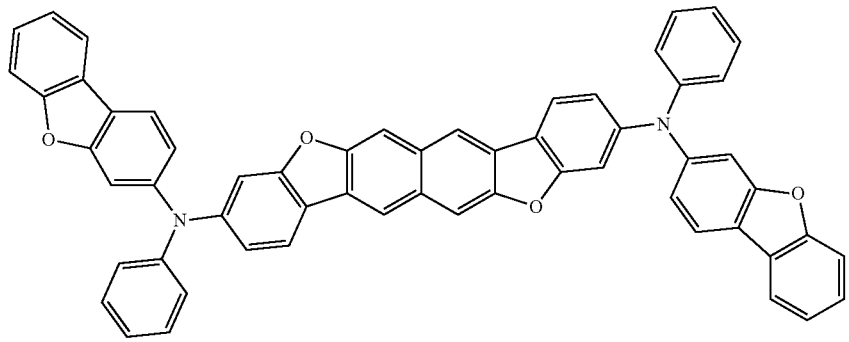

3,10FrA2Nbf(IV)-02

TABLE 9

| | Layer | Reference numeral | Thickness (nm) | Material | Weight ratio |
|---|---|---|---|---|---|
| Light-emitting device 21 | Cap film | 145 | 70 | DBT3P-II | — |
| | Electrode (cathode) | 102 | 15 | Ag:Mg | 1:0.017 |
| | Electron-injection layer | 119 | 25 | BPhen:LiF | 8:1 |
| | Electron-transport layer | 118 | 5 | NBPhen | — |
| | Light-emitting layer | 130 | 25 | cgDBCzPA:3,10FrA2Nbf(IV)-02 | 1:0.01 |
| | Hole-transport layer | 112 | 10 | PCPPn | — |
| | Hole-injection layer | 111(2) | 5 | PCPPn:MoO$_3$ | 2:0.5 |
| | | 111(1) | 30 | CaF$_2$:TAPC:MoO$_3$ | 3:1:0.5 |
| | Electrode (anode) | 101(2) | 85 | ITSO | — |
| | | 101(1) | 100 | APC | — |

<<Fabrication of Light-Emitting Device 21>>

The electrode 101 was formed in such a manner that APC and an ITSO film were sequentially formed over the substrate 200 to a thickness of 100 nm and a thickness of 85 nm, respectively.

Next, as the hole-injection layer 111, calcium fluoride (CaF$_2$), TAPC, and MoO$_3$ were deposited on the electrode 101 by co-evaporation at a weight ratio (CaF$_2$:TAPC:MoO$_3$) of 3:1:0.5 to a thickness of 30 nm. The hole-injection layer 111 functions as a layer with a low refractive index. Then, PCPPn and MoO$_3$ were deposited by co-evaporation at a weight ratio (PCPPn: MoO$_3$) of 2:0.5 to a thickness of 5 nm.

Then, as the hole-transport layer 112, PCPPn was deposited on the hole-injection layer 111 by evaporation to a thickness of 10 nm.

Then, as the light-emitting layer 130, cgDBCzPA and 3,10-bis[N-(dibenzofuran-3-yl)-N-phenylamino]naphtho[2,3-b;6,7-b']bisbenzofuran (abbreviation: 3,10FrA2Nbf(IV)-02) were deposited on the hole-transport layer 112 by co-evaporation at a weight ratio (cgDBCzPA: 3,10FrA2Nbf (IV)-02) of 1:0.01 to a thickness of 25 nm. Note that in the light-emitting layer 130, 3,10FrA2Nbf(IV)-02 is a guest material exhibiting blue fluorescence.

Then, as the electron-transport layer 118, NBPhen was deposited on the light-emitting layer 130 by evaporation to a thickness of 5 nm.

Then, as the electron-injection layer 119, BPhen and LiF were deposited on the electron-transport layer 118 by co-evaporation at a weight ratio of (BPhen: LiF) of 8:1 to a thickness of 25 nm. The electron-injection layer 119 functions as a layer with a low refractive index.

Then, as the electrode 102, Ag and magnesium (Mg) were deposited on the electron-injection layer 119 at a weight ratio (Ag: Mg) of 1:0.017 to a thickness of 15 nm.

Then, as the cap layer 145, DBT3P-II was deposited on the electrode 102 by evaporation to a thickness of 70 nm.

Then, in a glove box containing a nitrogen atmosphere, the light-emitting device 21 was sealed by fixing a glass substrate for sealing to a glass substrate on which organic materials were formed, using a sealant for organic EL. Specifically, the sealant was applied to the periphery of the organic materials formed on the glass substrate, the substrate was bonded to the glass substrate for sealing, irradiation with ultraviolet light having a wavelength of 365 nm at 6 J/cm$^2$ was performed, and heat treatment at 80° C. for one hour was performed. Through the above steps, the light-emitting device 21 was obtained.

<Characteristic of Light-Emitting Device>

Next, the characteristics of the fabricated light-emitting device 21 was measured. Luminance and CIE chromaticity were measured with a spectroradiometer (SR-UL1R manufactured by TOPCON TECHNOHOUSE CORPORATION), and electroluminescence spectra were measured with a multi-channel spectrometer (PMA-11 manufactured by Hamamatsu Photonics K.K.). Note that the measurements of the light-emitting devices were performed at room temperature (in an atmosphere maintained at 23° C.).

Figure 27:
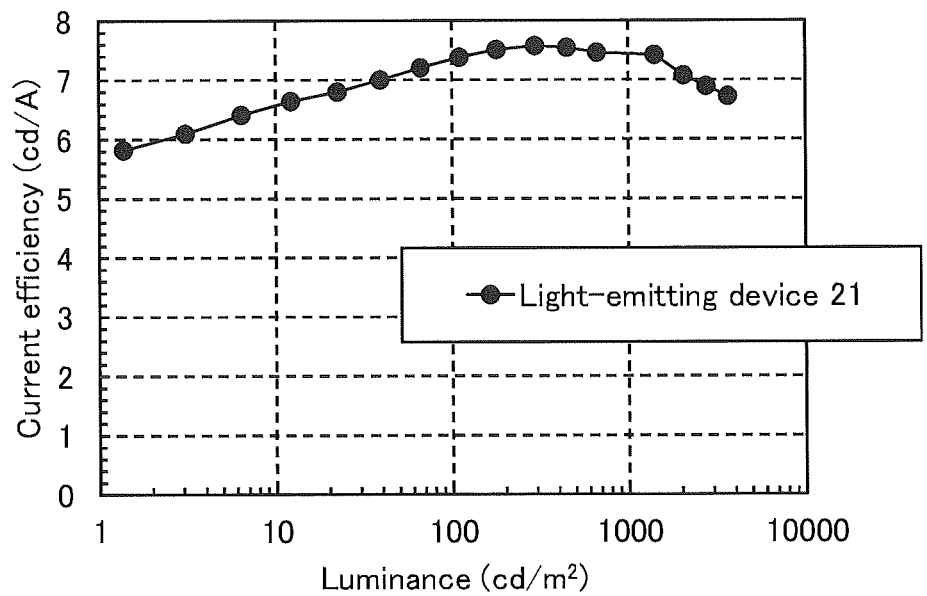
FIG. 27 is a graph showing the current efficiency-luminance characteristics of a light-emitting device in Example.
Figure 28:
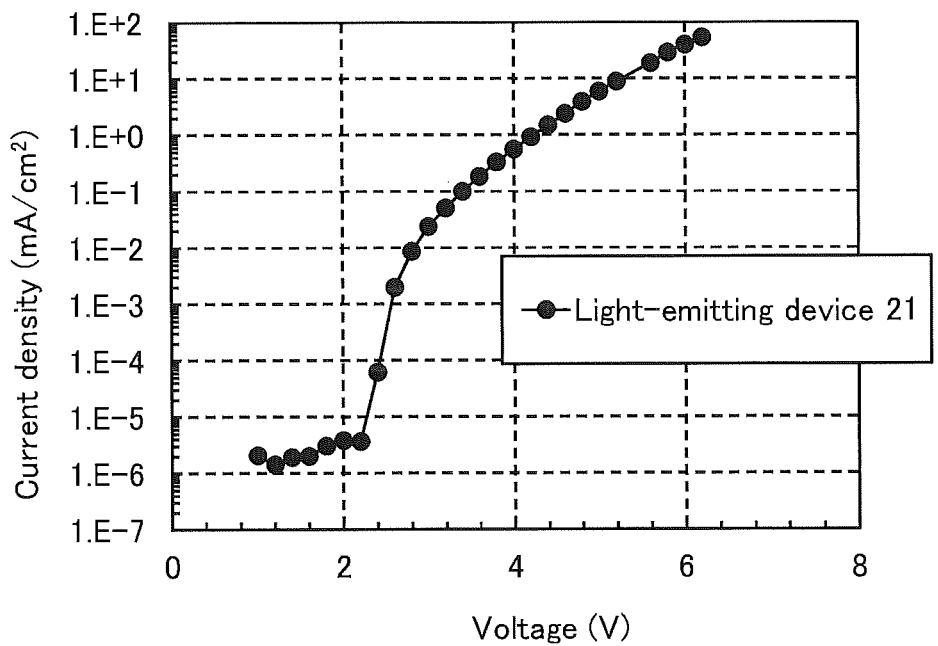
FIG. 28 is a graph showing the current density-voltage characteristics of the light-emitting device in Example.
Figure 29:
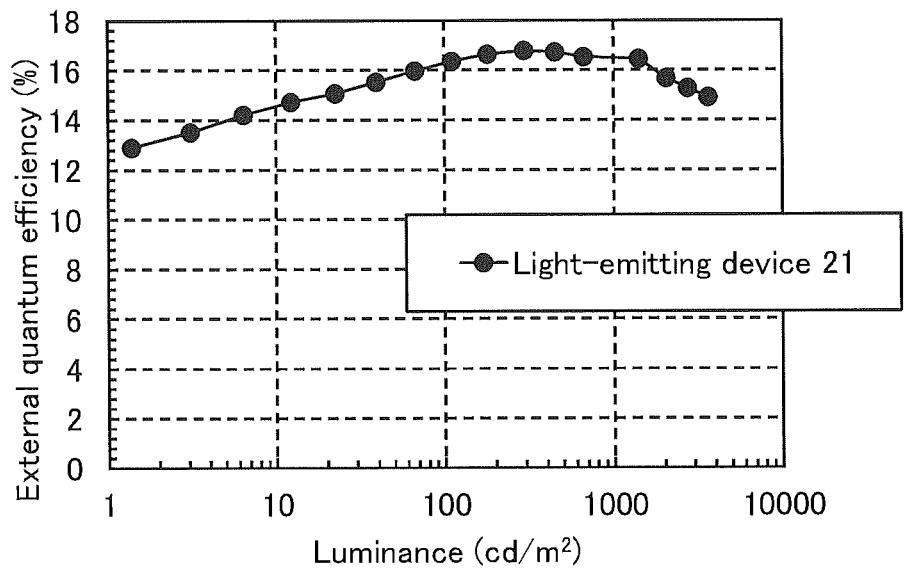
FIG. 29 is a graph showing the external quantum efficiency-luminance characteristics of the light-emitting device in Example.

FIG. 27 shows the current efficiency-luminance characteristics of the light-emitting device 21, FIG. 28 shows the current density-voltage characteristics thereof, and FIG. 29 shows the external quantum efficiency-luminance characteristics thereof.

Table 10 shows the device characteristics of the light-emitting device 21 at around 1000 cd/m$^2$.

TABLE 10

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting device 21 | 5.20 | 8.90 | (0.146, 0.043) | 664 | 7.46 | 4.51 | 16.5 |

Figure 30:
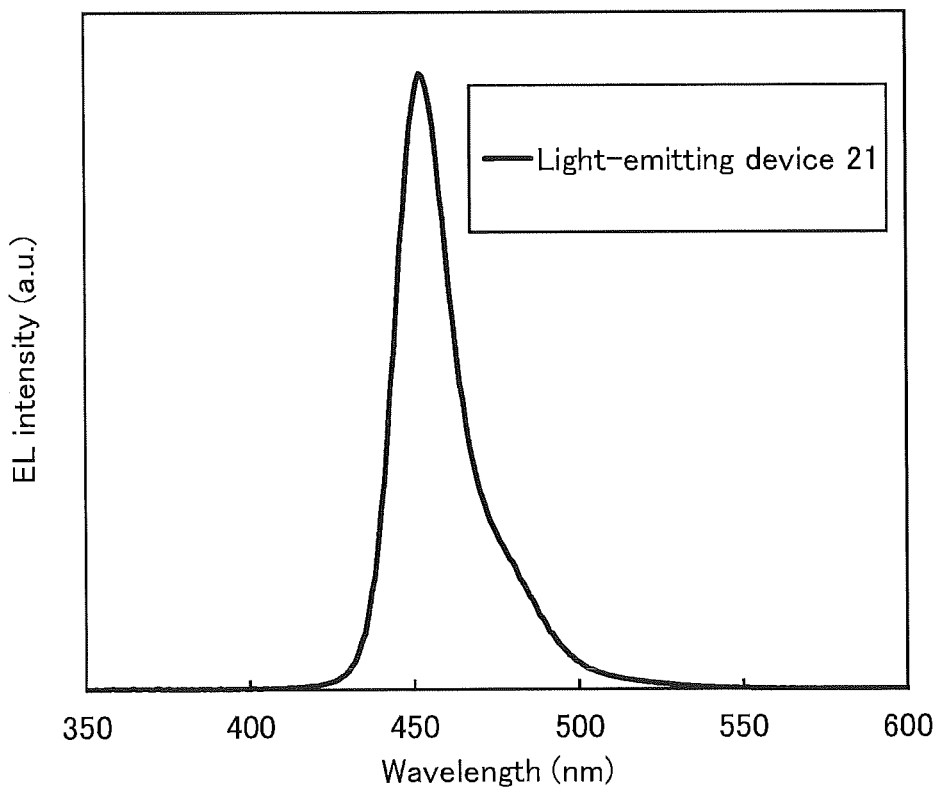
FIG. 30 is a graph showing an emission spectrum in Example.

FIG. 30 shows an emission spectrum when current at a current density of 2.5 mA/cm$^2$ was supplied to the light-emitting device 21. As shown in FIG. 30, the emission spectrum of the light-emitting device 21 has a peak at 452 nm, and the half width thereof is 22 nm. Thus, it was found that the peak is derived from fluorescence of 3,10FrA2Nbf (IV)-02, the guest material contained in the light-emitting layer 130.

FIG. 27, FIG. 29, and Table 10 demonstrate that the light-emitting device 21 has extremely high current efficiency and extremely high external quantum efficiency. The light-emitting device 21 is a fluorescent light-emitting device and has noticeably high current efficiency of approximately 7.5 cd/A although a region with a low luminosity factor exhibits light emission. Thus, the use of a layer with a low refractive index in a light-emitting device including the cap layer 145 can improve emission efficiency. Note that the optical path length from the light-emitting layer 130 to the electrode 101(2) is less than or equal to λ/4, and the optical path length from the light-emitting layer 130 to the electrode 101(1) is less than or equal to 3λ/4.

Reference Example

In this reference example, a synthesis method of 3,10FrA2Nbf(IV)-02, which is used in the light-emitting device 21, are described.

Step 1: Synthesis of 3,7-bis(4-chloro-2-fluorophenyl)-2,6-dimethoxynaphthalene

Into a 500 mL three-necked flask were put 11 g (24 mmol) of 3,7-diiodo-2,6-dimethoxynaphthalene, 14 g (78 mmol) of 4-chloro-2-fluorophenylboronic acid, 22 g (0.16 mol) of potassium carbonate, and 0.74 g (2.4 mmol) of tris(2-methylphenyl)phosphine. To this mixture was added 120 mL of toluene. This mixture was degassed by being stirred while the pressure was reduced. To this mixture was added 0.11 g (0.49 mmol) of palladium(II) acetate, and the mixture was stirred under a nitrogen stream at 110° C. for 50.5 hours.

After the stirring, toluene was added to the mixture, which was then subjected to suction filtration through Florisil (Wako Pure Chemical Industries, Ltd., Catalog Number: 540-00135), Celite (Wako Pure Chemical Industries, Ltd., Catalog Number: 531-16855), and alumina to give a filtrate. The filtrate was concentrated to give a solid.

The resulting solid was purified by silica gel column chromatography (developing solvent:toluene:hexane=1:1). The resulting solid was recrystallized with ethyl acetate to give 5.7 g of a white solid with a yield of 53%. The synthesis scheme of Step 1 is shown below.

[Chemical Formula 5]

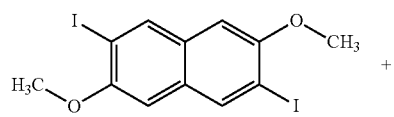

+

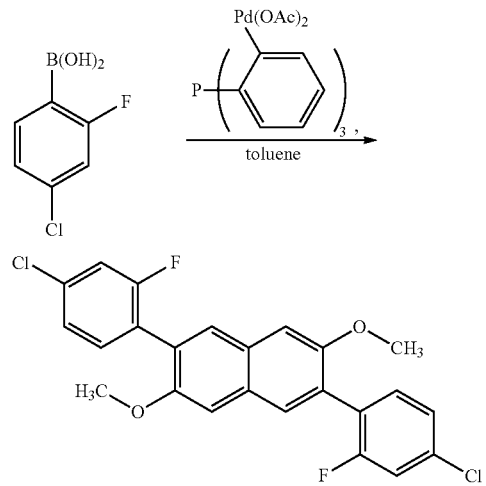

Figure 31A:
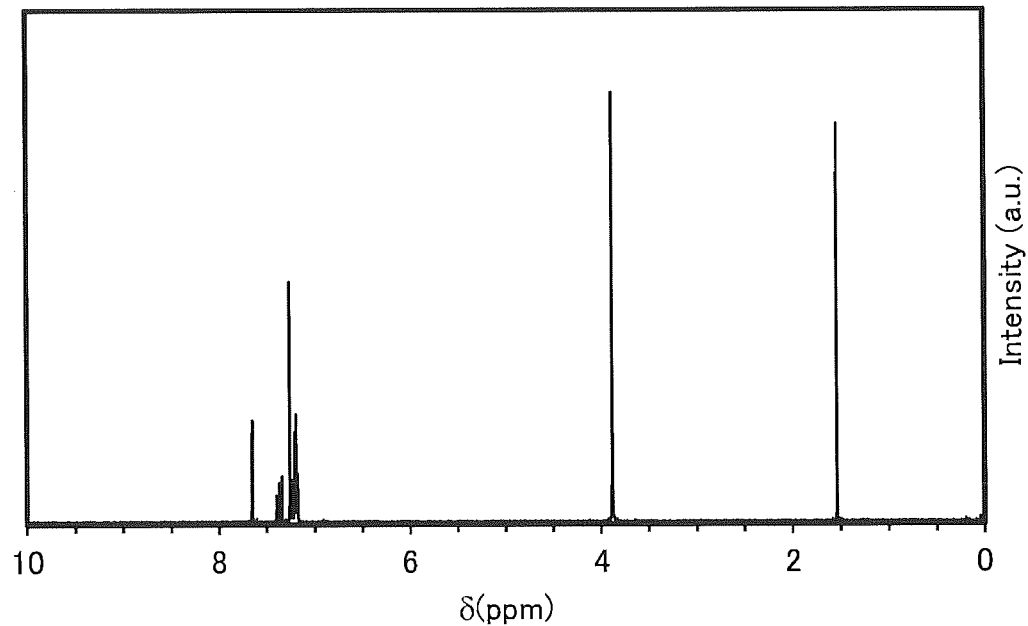
FIGS. 31A and 31B are graphs showing NMR charts of a compound in a reference example.
Figure 31B:
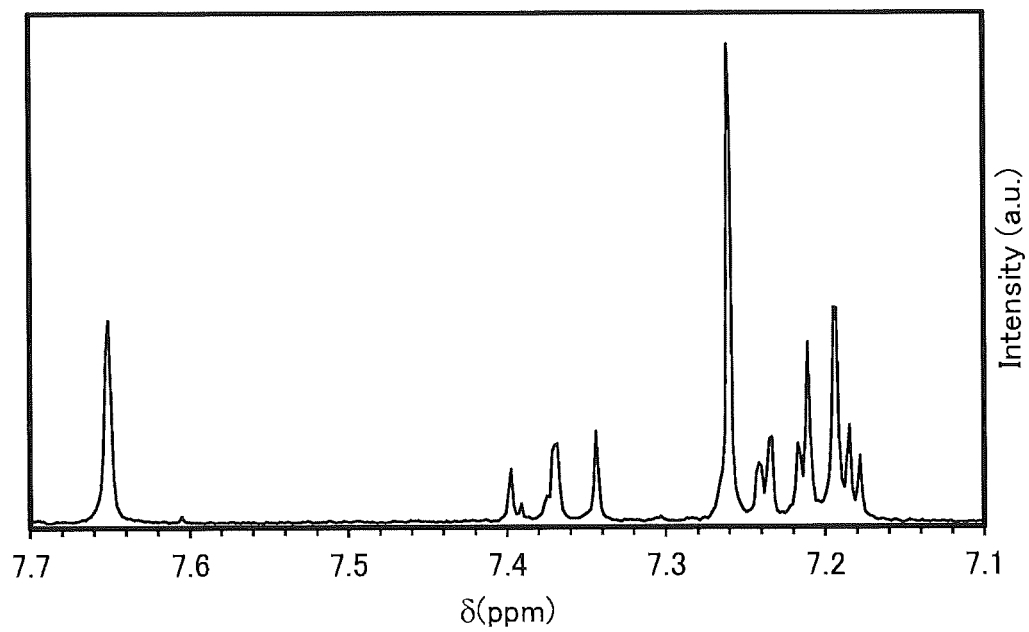

FIG. 31 shows $^1$H NMR data of the resulting solid, whose numerical data is shown below.

$^1$H NMR (CDCl$_3$, 300 MHz): δ=3.88 (s, 6H), 7.18-7.24 (m, 6H), 7.37 (t, J1=7.2 Hz, 2H), 7.65 (s, 2H).

Step 2: Synthesis of 3,7-bis(4-chloro-2-fluorophenyl)-2,6-dihydroxynaphthalene

Into a 200 mL three-necked flask was put 5.7 g (13 mmol) of 3,7-bis(4-chloro-2-fluorophenyl)-2,6-dimethoxynaphthalene, and the air in the flask was replaced with nitrogen. Into this flask was added 32 mL of dichloromethane. Into this solution, 28 mL (28 mmol) of boron tribromide (approximately 1.0 mol/L dichloromethane solution) and 20 mL of dichloromethane were dropped. After the dropping, this solution was stirred at room temperature.

After the stirring, approximately 20 mL of water was added to this solution under cooling with ice, and stirring was performed. After the stirring, an organic layer and an aqueous layer were separated from each other, and the aqueous layer was subjected to extraction with dichloromethane and ethyl acetate. The solution of the extract and the organic layer were combined and washed with saturated saline solution and a saturated aqueous solution of sodium hydrogen carbonate. Magnesium sulfate was added to the organic layer to adsorb moisture, and after the drying, this mixture was subjected to gravity filtration. The obtained filtrate was concentrated to give 5.4 g of a white solid. The synthesis scheme of Step 2 is shown below.

[Chemical Formula 6]

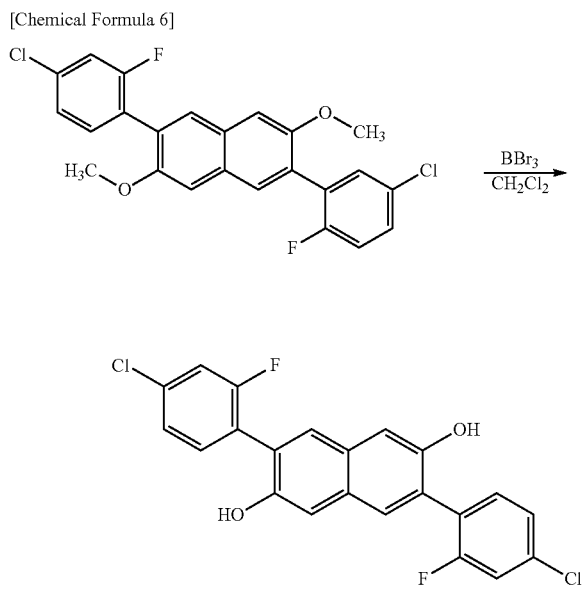

Figure 32A:
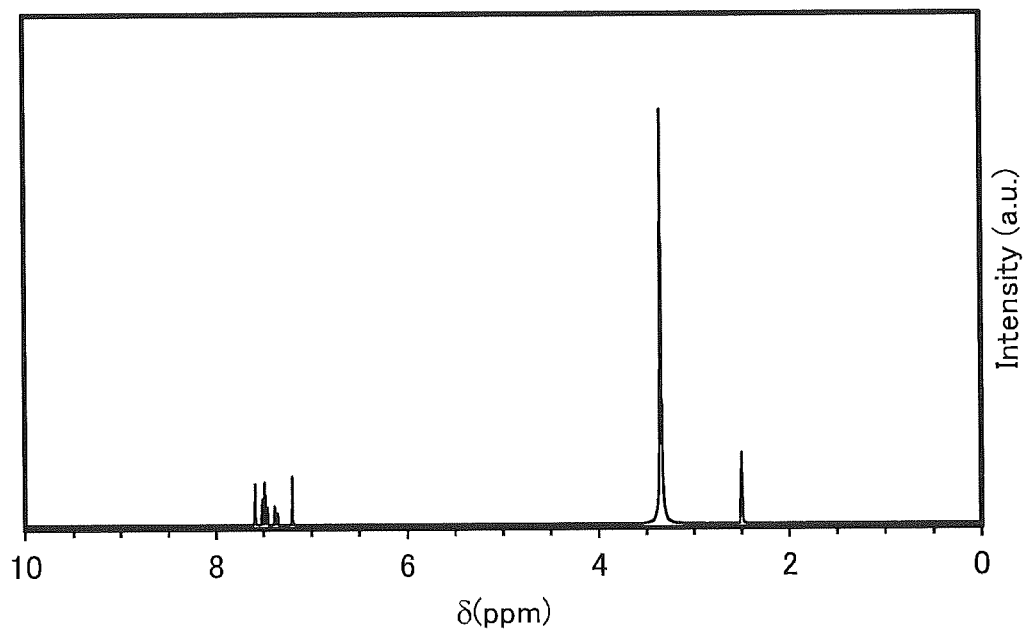
FIGS. 32A and 32B are graphs showing NMR charts of a compound in a reference example.
Figure 32B:
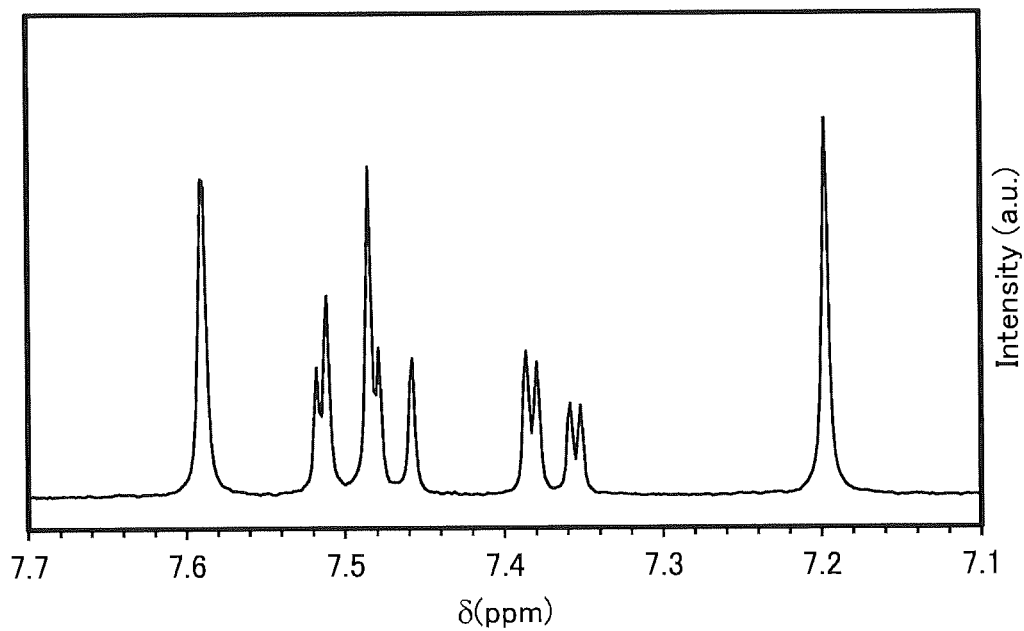

FIG. 32 shows ¹H NMR data of the resulting solid, whose numerical data is shown below.

¹H NMR (DMSO-d6, 300 MHz): δ=7.20 (s, 2H), 7.37 (dd, J1=8.4 Hz, J2=1.8 Hz, 2H), 7.46-7.52 (m, 4H), 7.59 (s, 2H), 9.71 (s, 2H).

Step 3: Synthesis of 3,10-dichloronaphtho[2,3-b;6,7-b']bisbenzofuran

Into a 200 mL three-necked flask were put 5.4 g (13 mmol) of 3,7-bis(4-chloro-2-fluorophenyl)-2,6-dihydroxynaphthalene and 7.1 g (52 mmol) of potassium carbonate. To this mixture was added 130 mL of N-methyl-2-pyrrolidone, and this mixture was degassed by being stirred while the pressure was reduced. After the degassing, this mixture was stirred under a nitrogen stream at 120° C. for seven hours. After the stirring, water was added to this mixture, and a precipitated solid was collected by filtration. This solid was washed with water and ethanol. Ethanol was added to the resulting solid, which was then stirred while being heated and filtered to give a solid. Ethyl acetate was added to the resulting solid, which was then stirred while being heated and filtered to give 4.5 g of a pale yellow solid with a yield of 92%. The synthesis scheme of Step 3 is shown below.

[Chemical Formula 7]

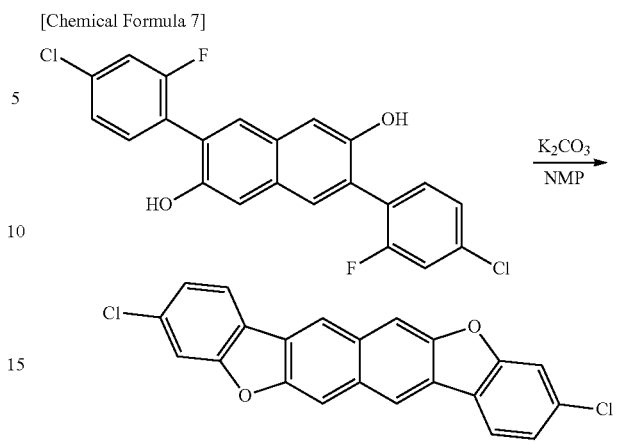

Figure 33A:
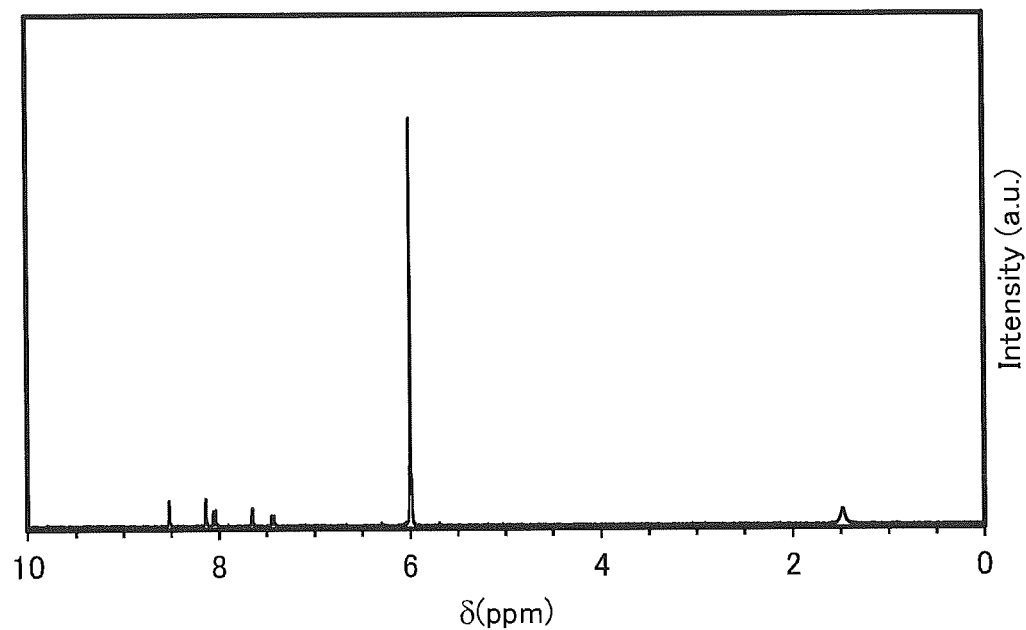
FIGS. 33A and 33B are graphs showing NMR charts of a compound in a reference example.
Figure 33B:
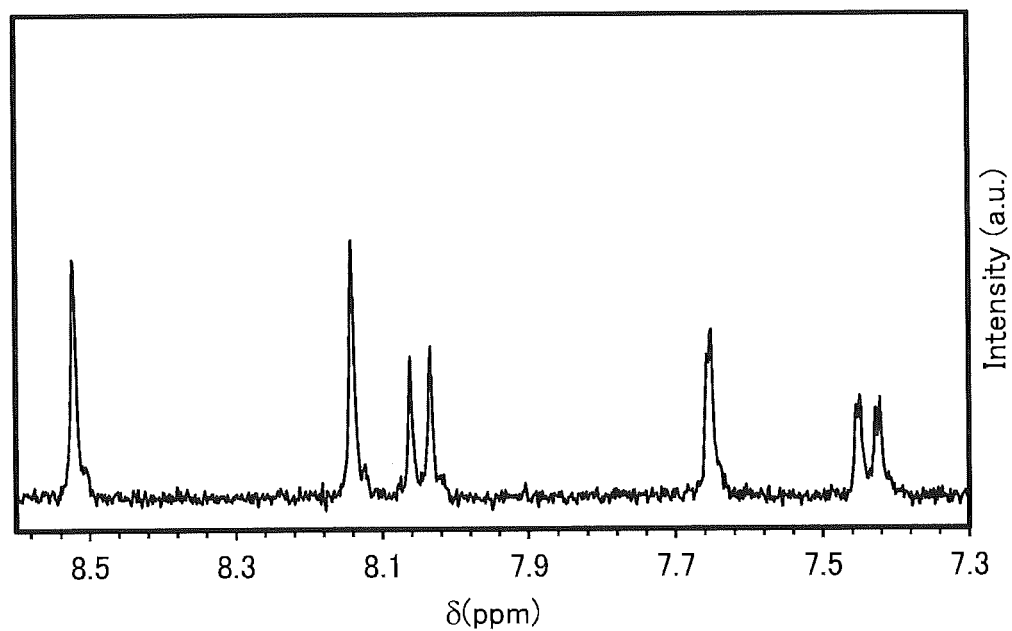

FIG. 33 shows ¹H NMR data of the resulting solid, whose numerical data is shown below.

¹H NMR (1,1,2,2-Tetrachloroethane-D2, 300 MHz): δ=7.44 (dd, J1=8.1 Hz, J2=1.5 Hz, 2H), 7.65 (d, J1=1.8 Hz, 2H), 8.05 (d, J1=8.4 Hz, 2H), 8.14 (s, 2H), 8.52 (s, 2H).

Step 4: Synthesis of 3,10-bis[N-(dibenzofuran-3-yl)-N-phenylamino]naphtho[2,3-b;6,7-b']bisbenzofuran (abbreviation: 3,10FrA2Nbf(IV)-02)

Into a 200 mL three-necked flask were put 1.2 g (3.0 mmol) of 3,10-dichloronaphtho[2,3-b;6,7-b']bisbenzofuran, 2.0 g (7.7 mmol) of N-(dibenzofuran-3-yl)-N-phenylamine, 0.11 g (0.30 mmol) of di(1-adamantyl)-n-butylphosphine, and 1.8 g (18 mmol) of sodium tert-butoxide. To this mixture was added 30 mL of xylene. This mixture was degassed by being stirred while the pressure was reduced. To this mixture was added 35 mg (61 μmol) of bis(dibenzylideneacetone)palladium(0), and the mixture was stirred under a nitrogen stream at 150° C. for 32 hours.

After the stirring, toluene and water were added to this mixture, which was then subjected to suction filtration to give a solid. Toluene was added to the resulting solid, and suction filtration through Florisil, Celite, and alumina was performed to give a filtrate. The obtained filtrate was concentrated to give a solid. This solid was purified by silica gel column chromatography (developing solvent: toluene) to give a solid. The resulting solid was recrystallized with toluene three times, so that 1.8 g of a yellow solid was obtained with a yield of 71%.

By a train sublimation method, 1.2 g of the resulting solid was sublimated and purified. The sublimation purification was performed by heating at 380° C. under the conditions where the pressure was 2.3×10⁻² Pa and the argon flow rate was 0 mL/min. After the sublimation purification, 1.0 g of a yellow solid was obtained at a collection rate of 88%. The synthesis scheme of Step 4 is shown below.

[Chemical Formula 8]

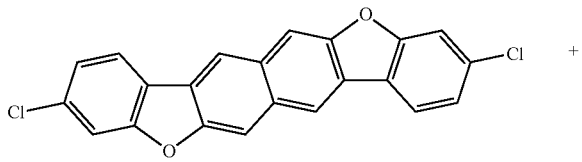

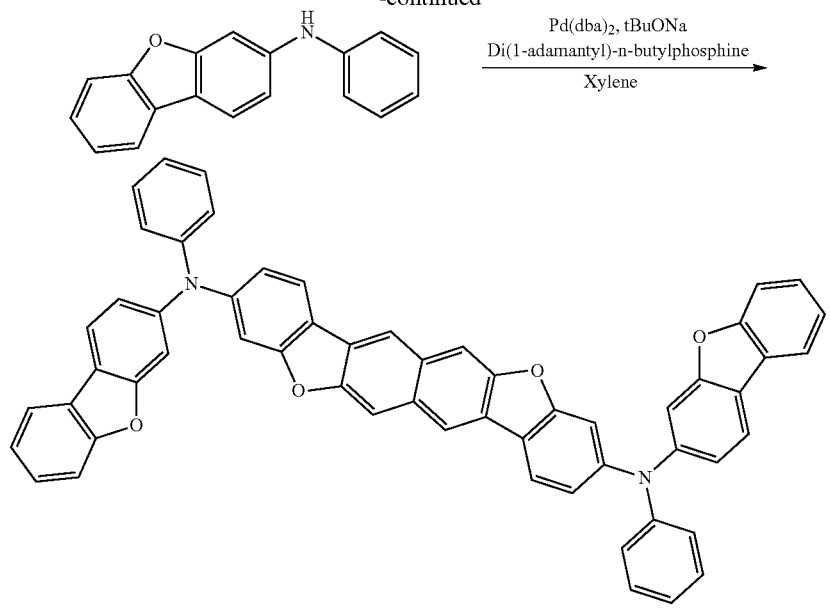

Figure 34A:
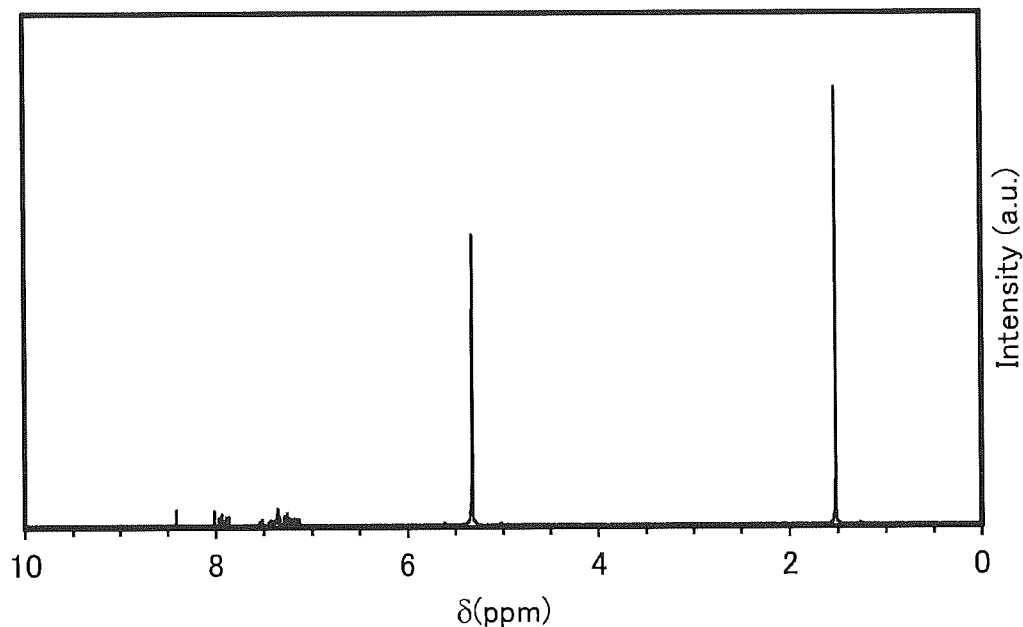
FIGS. 34A and 34B are graphs showing NMR charts of a compound in a reference example.
Figure 34B:
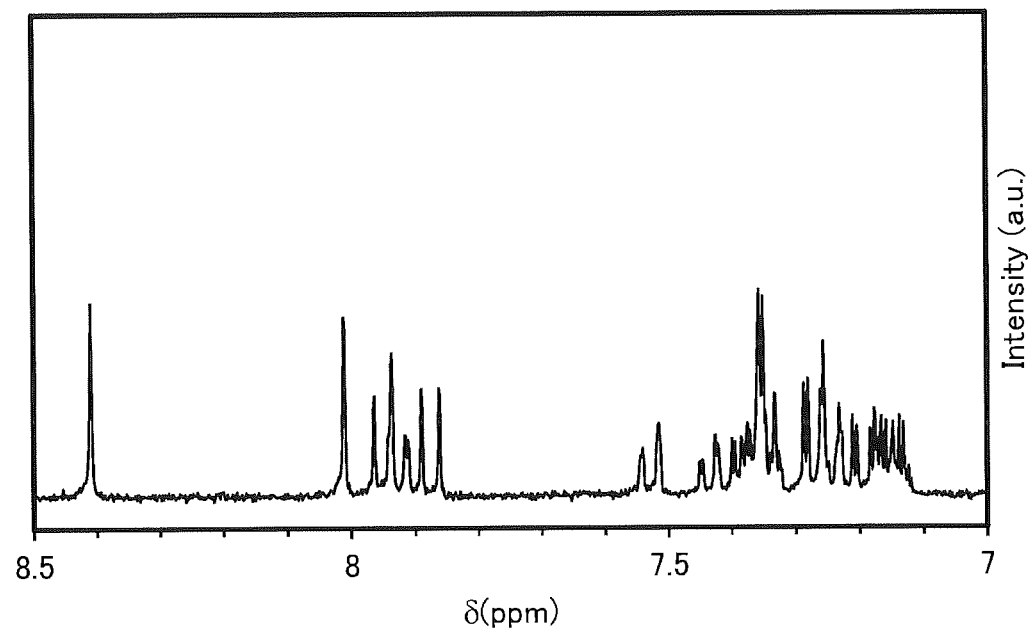

FIG. 34 shows $^1$H NMR data of the resulting solid, whose numerical data is shown below. The data indicates that 3,10FrA2Nbf(IV)-02, which is an organic compound of one embodiment of the present invention, was obtained in this synthesis example.

$^1$H NMR (CD2Cl2, 300 MHz): δ=7.12-7.21 (m, 6H), 7.23-7.26 (m, 4H), 7.28 (d, J1=2.1 Hz, 2H), 7.32-7.40 (m, 8H), 7.44 (dd, J1=7.5 Hz, J2=1.2 Hz, 2H), 7.53 (d, J1=7.8 Hz, 2H), 7.88 (d, J1=8.1 Hz, 2H), 7.91-7.96 (m, 4H), 8.01 (s, 2H), 8.41 (s, 2H).

Example 5

In this example, a light-emitting device 22 to a light-emitting device 29 were fabricated, the structures and effects of one embodiment of the present invention were examined, and the results thereof are described. The structural formulae of organic compounds used in the light-emitting device 22 to the light-emitting device 29 are shown below.

[Chemical Formulae 9]

(i)

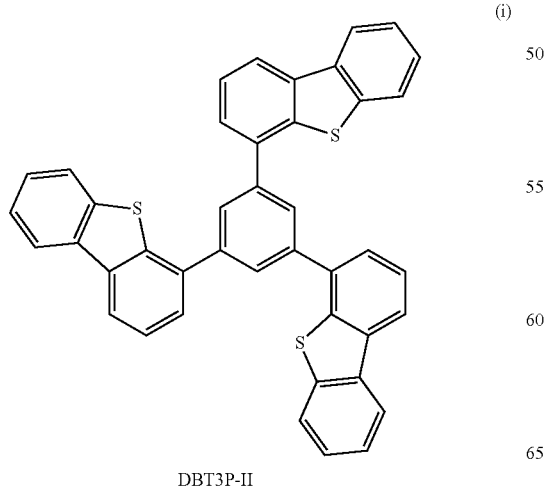

DBT3P-II

-continued (ii)

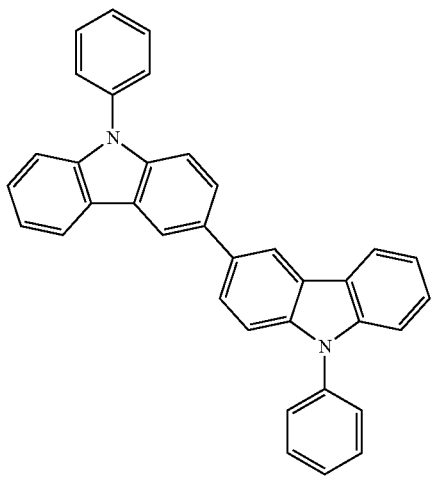

PCCP

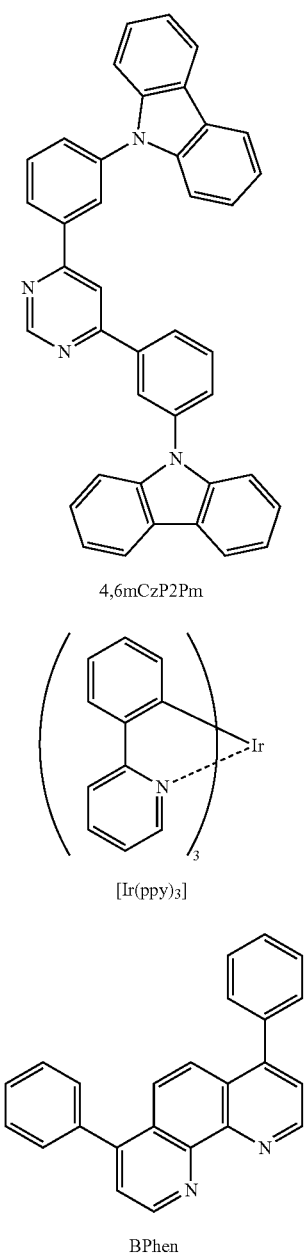

4,6mCzP2Pm

[Ir(ppy)₃]

BPhen (Fabrication Methods of Light-Emitting Device 22 to Light-Emitting Device 29)

First, indium tin oxide containing silicon oxide (ITSO) was deposited on a glass substrate by a sputtering method, so that the anode 401 in FIG. 35(B) was formed. Note that the thickness was 70 nm and the area of the electrode was 2 mm×2 mm.

Next, in pretreatment for forming the light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Then, the substrate over which the anode 401 was formed was fixed to a substrate holder provided in the vacuum evaporation apparatus such that the surface on which the anode 401 was formed faced downward, and on the anode 401, DBT3P-II represented by Structural Formula (i) shown above and molybdenum oxide were deposited by co-evaporation at a weight ratio of 2:1 (=DBT3P-II: molybdenum oxide) to a thickness of 40 nm by an evaporation method using resistance heating, so that the hole-injection layer 411 was formed.

Then, 3,3'-bis(9-phenyl-9H-carbazole) (abbreviation: PCCP) represented by Structural Formula (ii) shown above was deposited on the hole-injection layer 411 by evaporation to a thickness of 20 nm to form the hole-transport layer 412.

Subsequently, the light-emitting layer 413 was formed in such a manner that 4,6-bis[3-(9H-carbazol-9-yl)phenyl]pyrimidine (abbreviation: 4,6mCzP2Pm) represented by Structural Formula (iii) shown above, PCCP, and tris(2-phenylpyridinato-N,C²')iridium(III) (abbreviation: Ir(ppy)₃) represented by Structural Formula (iv) shown above were deposited by co-evaporation at a weight ratio of 0.5:0.5:0.1 (=4,6mCzP2Pm: PCCP: Ir(ppy)₃) to a thickness of 20 nm, and then 4,6mCzP2Pm, PCCP, and Ir(ppy)₃ were deposited by co-evaporation at a weight ratio of 0.8:0.2:0.1 (=4,6mCzP2Pm: PCCP: Ir(ppy)₃) to a thickness of 20 nm.

Furthermore, 4,6mCzP2Pm was deposited on the light-emitting layer 413 by evaporation to a thickness of 5 nm to form a first electron-transport layer, bathophenanthroline (abbreviation: BPhen) represented by Structural Formula (v) shown above was deposited by evaporation to a thickness of 10 nm to form a second electron-transport layer, and then, BPhen and/or lithium fluoride was deposited by evaporation to a thickness of 20 nm to form a third electron-transport layer, so that an electron-transport layer 414 was formed.

The third electron-transport layer of the electron-transport layer 414 was formed with different proportions of BPhen and/or lithium fluoride contained in the light-emitting device 22 to the light-emitting device 29. The concentrations of BPhen and/or lithium fluoride of the light-emitting devices are listed below.

TABLE 12

| | vol % | |
|---|---|---|
| | LiF | BPhen |
| 22 | 0% | 100% |
| 23 | 25% | 75% |
| 24 | 50% | 50% |
| 25 | 75% | 25% |
| 26 | 90% | 10% |
| 27 | 95% | 5% |
| 28 | 99% | 1% |
| 29 | 100% | 0% |

After the formation of the electron-transport layer 414, lithium fluoride (LiF) was deposited by evaporation to a thickness of 1 nm to form the electron-injection layer 415, and lastly aluminum was deposited by evaporation to a thickness of 200 nm to form the cathode 402. Thus, the light-emitting device 22 to the light-emitting device 29 of this example were fabricated.

The device structures of the light-emitting device 22 to the light-emitting device 29 are listed in the tables below.

TABLE 13

| Hole-injection layer | Hole-transport layer | Light-emitting layer | | Electron-transport layer | | | Electron-injection layer |
|---|---|---|---|---|---|---|---|
| DBT3P-II:MoO$_3$ 2:1 40 nm | PCCP 20 nm | 4,6mCzP2Pm:PCCP:Ir(ppy)$_3$ 0.5:0.5:0.1 20 nm | 0.8:0.2:0.1 20 nm | 4,6mCzP2Pm 5 nm | BPhen 10 nm | *1 20 nm | LiF 1 nm |

*1 Refer to the table below

TABLE 14

| Light-emitting device | LiF:Bphen (volume ratio) |
|---|---|
| 22 | 0:100 |
| 23 | 25:75 |
| 24 | 50:50 |
| 25 | 75:25 |
| 26 | 90:10 |
| 27 | 95:5 |
| 28 | 99:1 |
| 29 | 100:0 |

Each of the light-emitting device 22 to the light-emitting device 29 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (in an atmosphere maintained at 25° C.).

Figure 55:
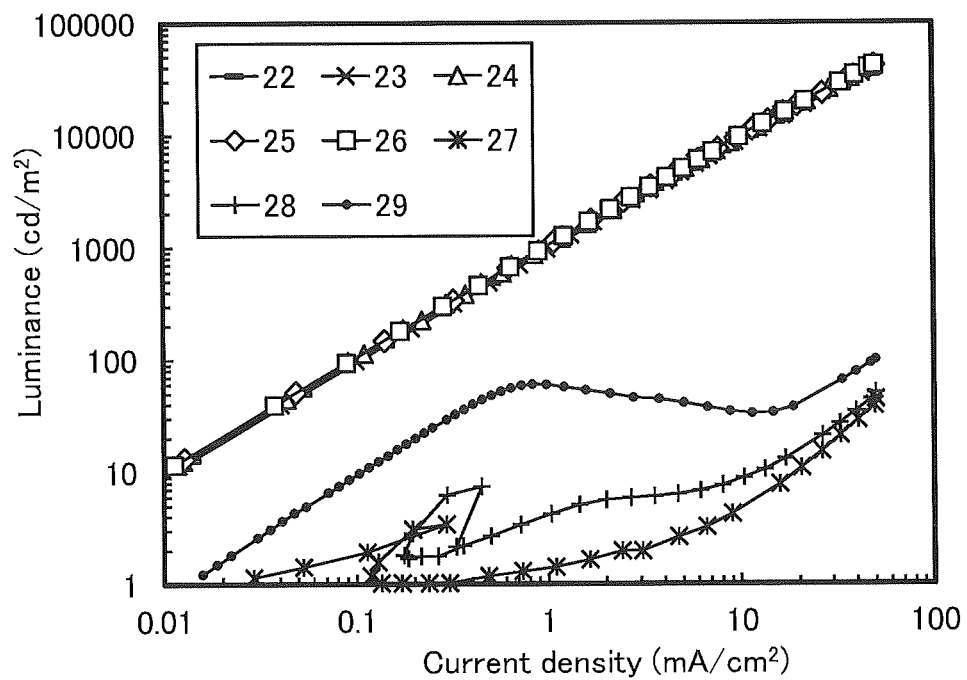
FIG. 55 is a graph showing the luminance-current density characteristics of a light-emitting device 22 to a light-emitting device 29 in Example.
Figure 56:
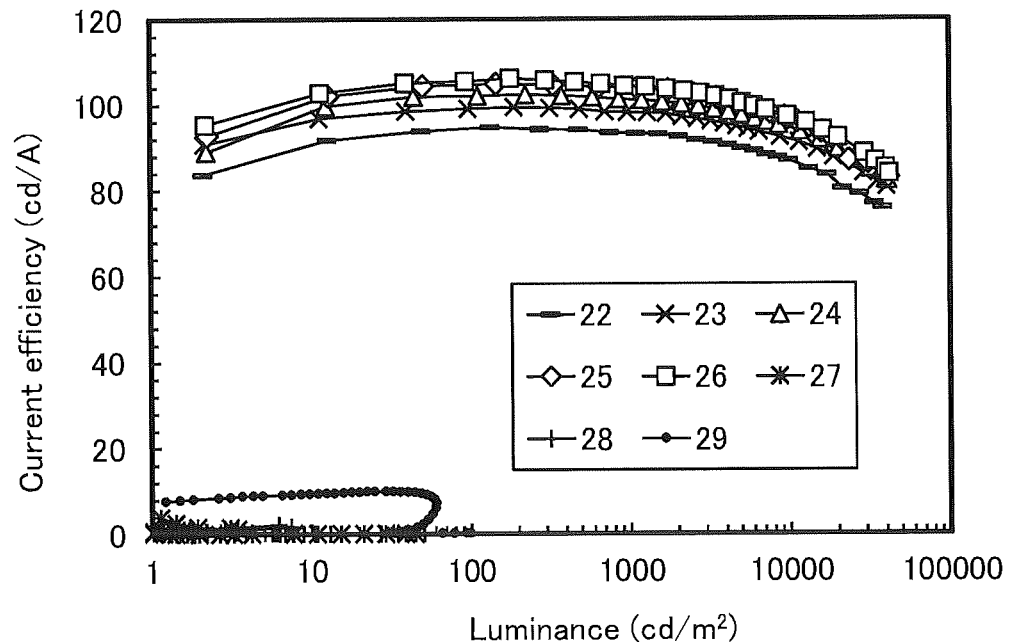
FIG. 56 is a graph showing the current efficiency-luminance characteristics of the light-emitting device 22 to the light-emitting device 29 in Example.
Figure 57:
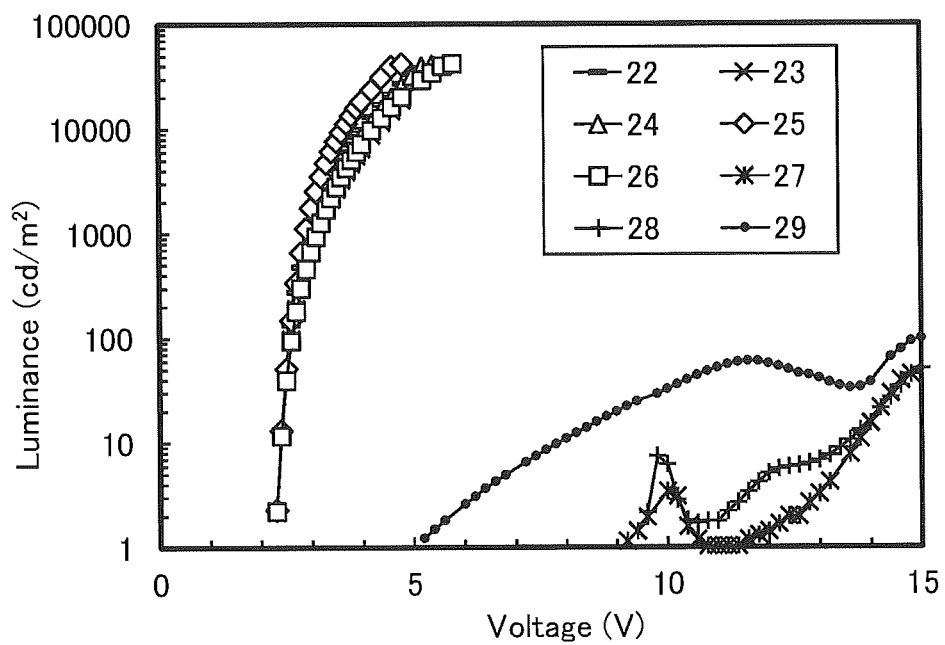
FIG. 57 is a graph showing the luminance-voltage characteristics of the light-emitting device 22 to the light-emitting device 29 in Example.
Figure 58:
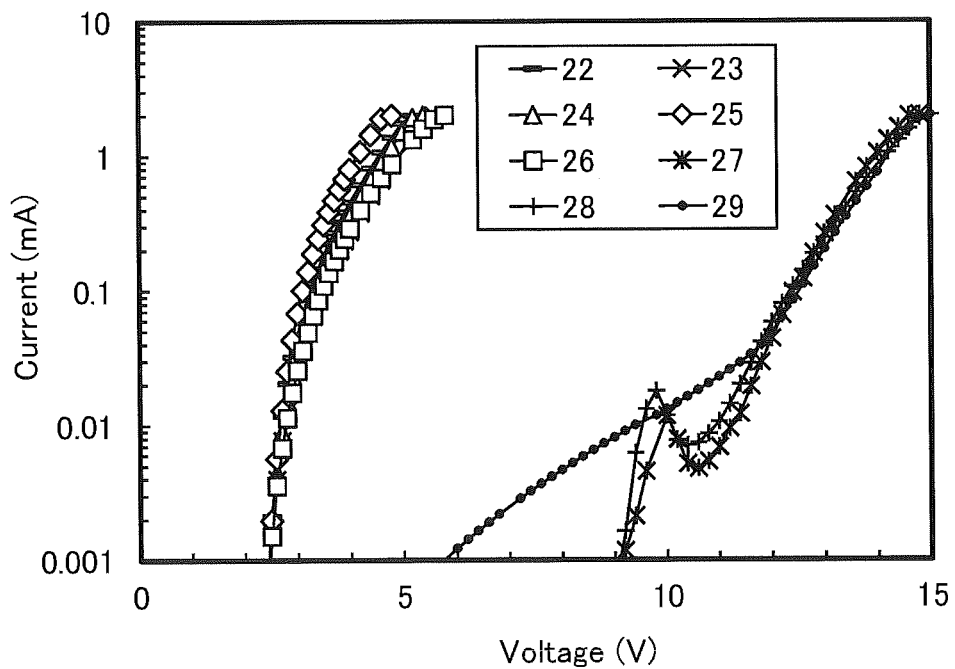
FIG. 58 is a graph showing the current-voltage characteristics of the light-emitting device 22 to the light-emitting device 29 in Example.
Figure 59:
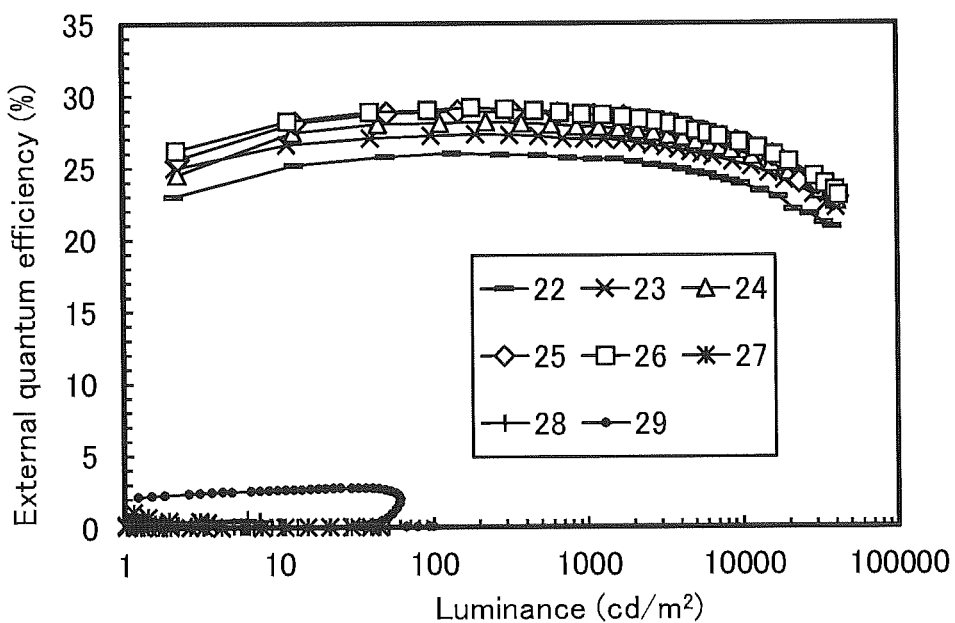
FIG. 59 is a graph showing the external quantum efficiency-luminance characteristics of the light-emitting device 22 to the light-emitting device 29 in Example.
Figure 60:
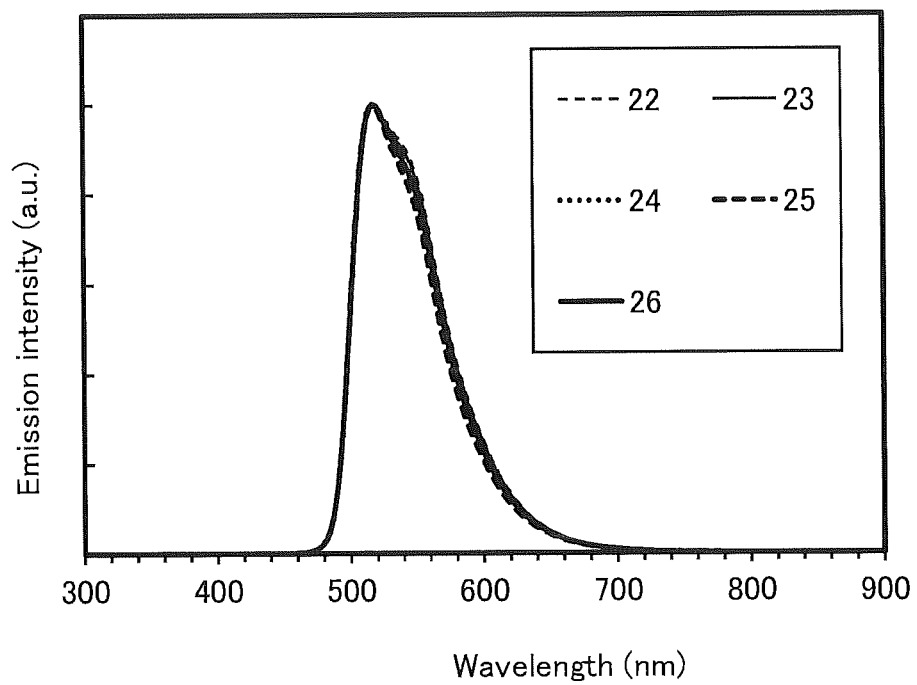
FIG. 60 is a graph showing the emission spectra of the light-emitting device 22 to the light-emitting device 26 in Example.

FIG. 55 shows the luminance-current density characteristics of the light-emitting device 22 to the light-emitting device 29; FIG. 56 shows the current efficiency-luminance characteristics thereof; FIG. 57 shows the luminance-voltage characteristics thereof; FIG. 58 shows the current-voltage characteristics thereof; FIG. 59 shows the external quantum efficiency-luminance characteristics thereof; and FIG. 60 shows the emission spectra thereof. Table 15 shows main characteristics of the light-emitting devices at around 1000 cd/m$^2$. Hereinafter, a numeral in drawings and tables represents the characteristics of a light-emitting device corresponding to the numeral. For example, the characteristics of the light-emitting device 22 are denoted by "22" in drawings and tables.

Figure 37:
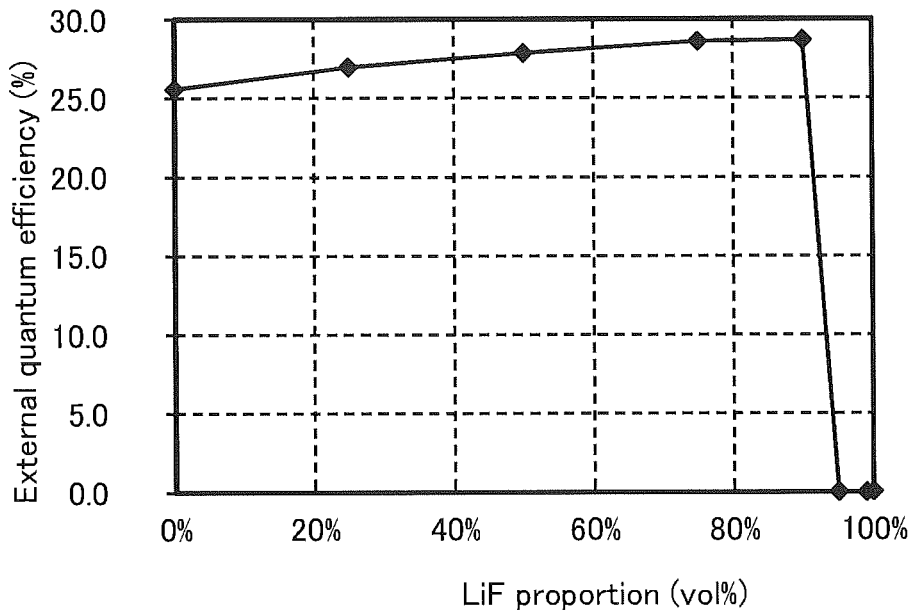
FIG. 37 is a graph showing the relation between LiF ratio and external quantum efficiency.

FIG. 37 shows a graph indicating the relation between the proportion of lithium fluoride in the third electron-transport layer at around 1000 cd/m$^2$ and external quantum efficiency of the light-emitting device 22 to the light-emitting device 29. This reveals that external quantum efficiency increases as the proportion of lithium fluoride in the third layer increases, until when the proportion of lithium fluoride becomes approximately 90 vol %. This is probably an effect of a decrease in refractive index due to an increase in the proportion of lithium fluoride in the third electron-transport layer. However, in a region where the concentration of lithium fluoride is greater than or equal to 95 vol %, the characteristics rapidly deteriorate, and external quantum efficiency sharply dropped. This may be because the concentration of lithium fluoride, which is originally an insulator, becomes too large, and thus the electron-transport property of the electron-transport layer decreases. FIG. 58 also shows that the light-emitting device 27 to the light-emitting device 29, in which the concentration of lithium fluoride is greater than or equal to 95 vol %, have significantly poor voltage-current characteristics, which confirmed that the concentration of lithium fluoride greatly influences the carrier-transport property. Thus, it was found that as the refractive index of the third electron-transport layer is lower, external quantum efficiency is higher; however, when the amount of lithium fluoride, which reduces the low refractive index, is too large, the carrier-transport property decreases to reduce efficiency considerably. In terms of a refractive index, the amount of fluoride in the third electron-transport layer is preferably greater than 0 vol % and less than 95 vol %.

FIG. 38 shows a graph indicating the relation between the proportion of lithium fluoride in the third electron-transport layer at around 3 V and current of the light-emitting device 22 to the light-emitting device 29. A light-emitting device

TABLE 15

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| 22 | 3.0 | 0.05 | 1.2 | 0.31 | 0.64 | 93.3 | 25.6 |
| 23 | 3.1 | 0.04 | 1.0 | 0.31 | 0.64 | 98.2 | 27.0 |
| 24 | 3.0 | 0.03 | 0.9 | 0.31 | 0.65 | 101.3 | 27.9 |
| 25 | 2.9 | 0.04 | 1.1 | 0.30 | 0.65 | 103.8 | 28.6 |
| 26 | 3.1 | 0.04 | 0.9 | 0.31 | 0.65 | 104.4 | 28.7 |
| 27 | 14.6 | 1.97 | 49.3 | 0.31 | 0.64 | 0.1 | 0.0 |
| 28 | 14.8 | 1.91 | 47.7 | 0.31 | 0.65 | 0.1 | 0.0 |
| 29 | 14.8 | 1.89 | 47.2 | 0.30 | 0.65 | 0.2 | 0.1 |

FIG. 55 to FIG. 59 and Table 14 demonstrate that the light-emitting device 24 to the light-emitting device 26, in which the proportion of LiF in a third hole-transport layer is higher than or equal to 50 vol % and lower than 95 vol %, have an extremely favorable driving voltage and extremely high efficiency.

with 0 vol % lithium fluoride corresponds to a light-emitting device with a conventional structure. FIG. 38 shows that mixing lithium fluoride into the third electron-transport layer reduced the current value of the light-emitting device in which the concentration of lithium fluoride is 20 vol %, by approximately 40%. However, the light-emitting device 24 with a further increased concentration of lithium fluoride of 50 vol % had a larger current value, and the light-emitting device 25 with 75 vol % lithium fluoride had a larger amount of current than the light-emitting device 22. The light-emitting device 26 with a further increased concentration of lithium fluoride had a smaller amount of current, and almost no current flows in the light-emitting device 27 to the light-emitting device 29, in which the concentration of lithium fluoride is higher than or equal to 95 vol %. In terms of driving voltage, it can be said that the amount of a fluoride in the third electron-transport layer is greater than or equal to 50 vol % and less than 95 vol %, preferably greater than or equal to 50 vol % and less than or equal to 80 vol %, further preferably greater than or equal to 70 vol % and less than or equal to 80 vol %.

Note that the value of 50 vol % or more is also the concentration at which lithium fluoride starts to generate microcrystals as described in Embodiment 2. That is, there may be a significant effect of lowering driving voltage with the progress of crystallization.

As described above, a low mixture ratio (lower than 50 vol %) of a fluoride of an alkali metal or an alkaline earth metal in a light-emitting device in which the fluoride of an alkali metal or an alkaline earth metal is mixed into part of an electron-transport layer increases driving voltage; however, when the mixture ratio of a fluoride of an alkali metal or an alkaline earth metal is higher than or equal to 50 vol %, driving voltage becomes low. Furthermore, mixing a fluoride of an alkali metal or an alkaline earth metal in part of an electron-transport layer can lower the refractive index of that portion, and the external quantum efficiency can be improved. Note that when the proportion of a fluoride becomes higher than or equal to 95 vol %, driving voltage increases again and accordingly external quantum efficiency decreases. Therefore, the proportion of a fluoride of an alkali metal or an alkaline earth metal is preferably lower than 95 vol %. An effect of improvement in external quantum efficiency can be achieved when the proportion of a fluoride of an alkali metal or an alkaline earth metal is lower than 95 vol %.

According to the above results, in one embodiment of the present invention, when a fluoride of an alkali metal or an alkaline earth metal is mixed into an electron-transport layer, the proportion of the fluoride is preferably higher than or equal to 50 vol % and lower than or equal to 95 vol %, further preferably higher than or equal to 50 vol % and lower than 95 vol %.

Example 6

In this example, a light-emitting device 30 to a light-emitting device 36 were fabricated and the results of examining the structure and effect of one embodiment of the present invention are described Structural formulae of the organic compounds used in the light-emitting device 30 to the light-emitting device 36 are shown below.

[Chemical Formulae 10]

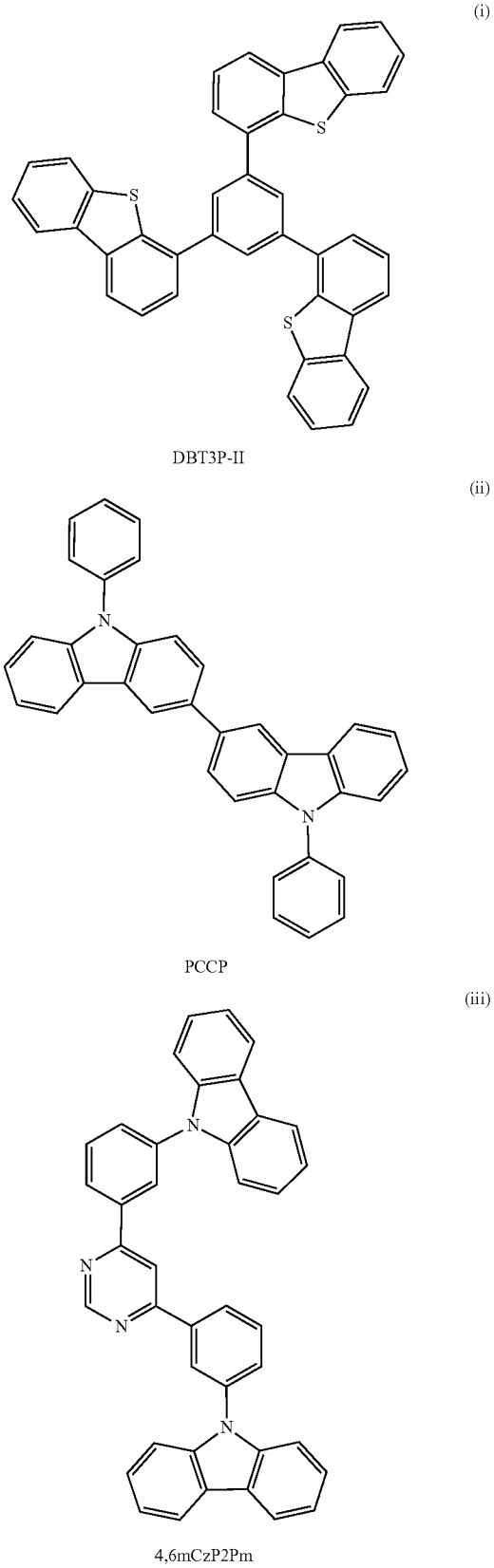

-continued

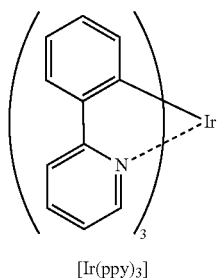

[Ir(ppy)₃]

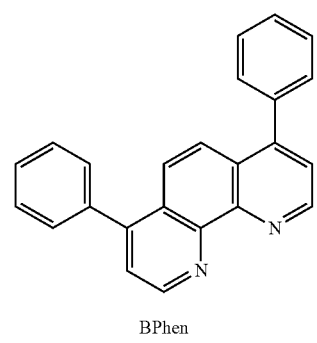

BPhen

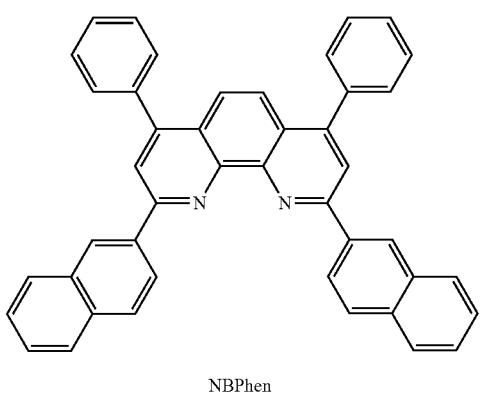

NBPhen (Method for Fabricating Light-Emitting Device 30 to Light-Emitting Device 36)

First, a film of indium tin oxide containing silicon oxide (ITSO) was deposited on a glass substrate by a sputtering method, so that an anode 401 was formed. Note that the thickness was 70 nm and the area of the electrode was 2 mm×2 mm.

Next, in pretreatment for forming a light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Then, the substrate on which the anode 401 was formed was fixed to a substrate holder provided in the vacuum evaporation apparatus such that the surface on which the anode 401 was formed faced downward. On the anode 401, 4,4',4"-(benzene-1,3,5-triyl)tri(dibenzothiophene) (abbreviation: DBT3P-II) represented by Structural Formula (i) shown above and molybdenum oxide were deposited by co-evaporation to a thickness of 40 nm at a weight ratio of 2:1 (=DBT3P-II: molybdenum oxide) by an evaporation method using resistance heating, so that the hole-injection layer 411 was formed.

After that, 3,3'-bis(9-phenyl-9H-carbazole) (abbreviation: PCCP) represented by Structural Formula (ii) shown above was deposited by evaporation to a thickness of 20 nm over the hole-injection layer 411 to form the hole-transport layer 412.

Subsequently, 4,6-bis[3-(9H-carbazol-9-yl)phenyl]pyrimidine (abbreviation: 4,6mCzP2Pm) represented by Structural Formula (iii) shown above, PCCP, and tris(2-phenylpyridinato-N,C²')iridium(III) (abbreviation: Ir(ppy)₃) represented by Structural Formula (iv) shown above were deposited by co-evaporation to a thickness of 20 nm at a weight ratio of 0.5:0.5:0.1 (=4,6mCzP2Pm: PCCP: Ir(ppy)₃), and then deposited by co-evaporation to a thickness of 20 nm at a weight ratio of 0.8:0.2:0.1 (=4,6mCzP2Pm: PCCP: Ir(ppy)₃), so that the light-emitting layer 413 was formed.

Furthermore, 4,6mCzP2Pm was deposited by evaporation on the light-emitting layer 413 to a thickness of 5 nm to form a first electron-transport layer, and then bathophenanthroline (abbreviation: BPhen) represented by Structural Formula (v) shown above was deposited by evaporation to a thickness of 10 nm to form a second electron-transport layer. In addition, as a third electron-transport layer, 2,9-bis(naphthalen-2-yl)-4,7-diphenyl-1,10-phenanthroline (abbreviation: NBPhen) represented by Structural Formula (vi) shown above and/or lithium fluoride was deposited to a thickness of 20 nm. Thus, the electron-transport layer 414 was formed.

The third electron-transport layer in the electron-transport layer 414 was formed with different proportions of NBPhen and/or lithium fluoride contained in the light-emitting device 30 to the light-emitting device 36. The concentrations of NBPhen and/or lithium fluoride in the light-emitting devices are shown below.

TABLE 16

| Light-emitting device | vol % | |
| --- | --- | --- |
| | LiF | NBPhen |
| 30 | 0% | 100% |
| 31 | 25% | 75% |
| 32 | 50% | 50% |
| 33 | 75% | 25% |
| 34 | 90% | 10% |
| 35 | 95% | 5% |
| 36 | 99% | 1% |

After the formation of the electron-transport layer 414, lithium fluoride (LiF) was deposited by evaporation to a thickness of 1 nm to form an electron-injection layer 415, and lastly aluminum was deposited by evaporation to a thickness of 200 nm to form a cathode 402. Thus, the light-emitting device 30 to the light-emitting device 36 of this example were fabricated. The device structures of the light-emitting device 30 to the light-emitting device 36 are listed in the following table.

TABLE 17

| Hole-injection layer | Hole-transport layer | Light-emitting layer | | Electron-transport layer | | | Electron-injection layer |
|---|---|---|---|---|---|---|---|
| DBT3P-II:MoO$_3$ 2:1 40 nm | PCCP 20 nm | 4,6mCzP2Pm:PCCP:Ir(ppy)$_3$ 0.5:0.5:0.1 20 nm | 0.8:0.2:0.1 20 nm | 4,6mCzP2Pm 5 nm | BPhen 10 nm | *1 20 nm | LiF 1 nm |

*1 Refer to the table below

TABLE 18

| Light-emitting device | LiF:NBPhen (volume ratio) |
|---|---|
| 30 | 0:100 |
| 31 | 25:75 |
| 32 | 50:50 |
| 33 | 75:25 |
| 34 | 90:10 |
| 35 | 95:5 |
| 36 | 99:1 |

Each of the light-emitting device 30 to the light-emitting device 36 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (an atmosphere maintained at 25° C.).

Figure 61:
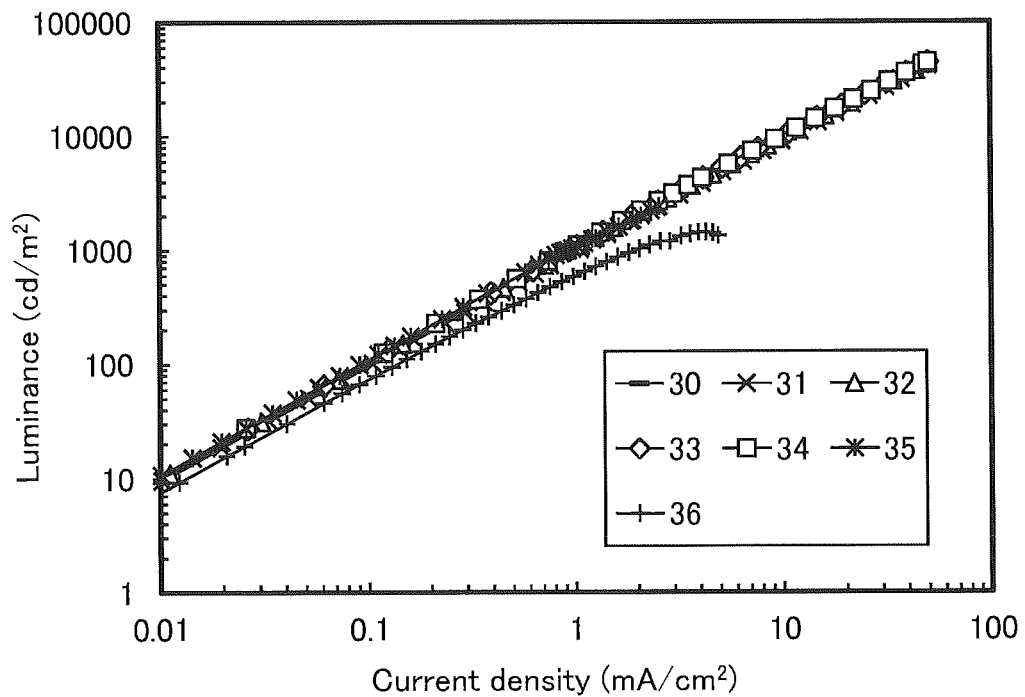
FIG. 61 is a graph showing the luminance-current density characteristics of a light-emitting device 30 to a light-emitting device 36 in Example.
Figure 62:
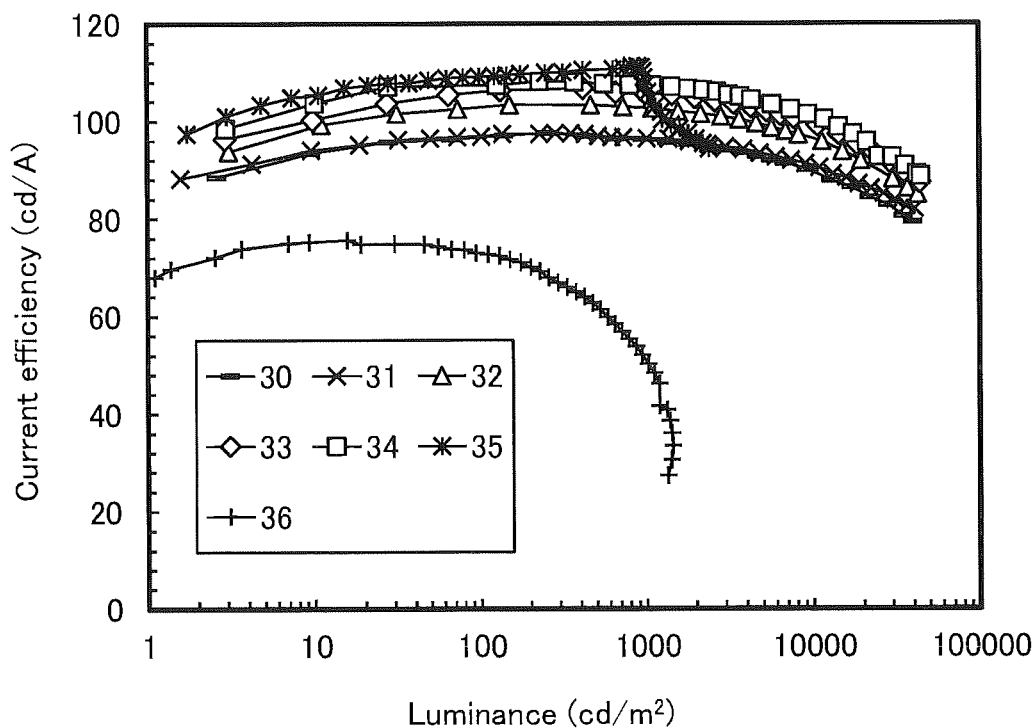
FIG. 62 is a graph showing the current efficiency-luminance characteristics of the light-emitting device 30 to the light-emitting device 36 in Example.
Figure 63:
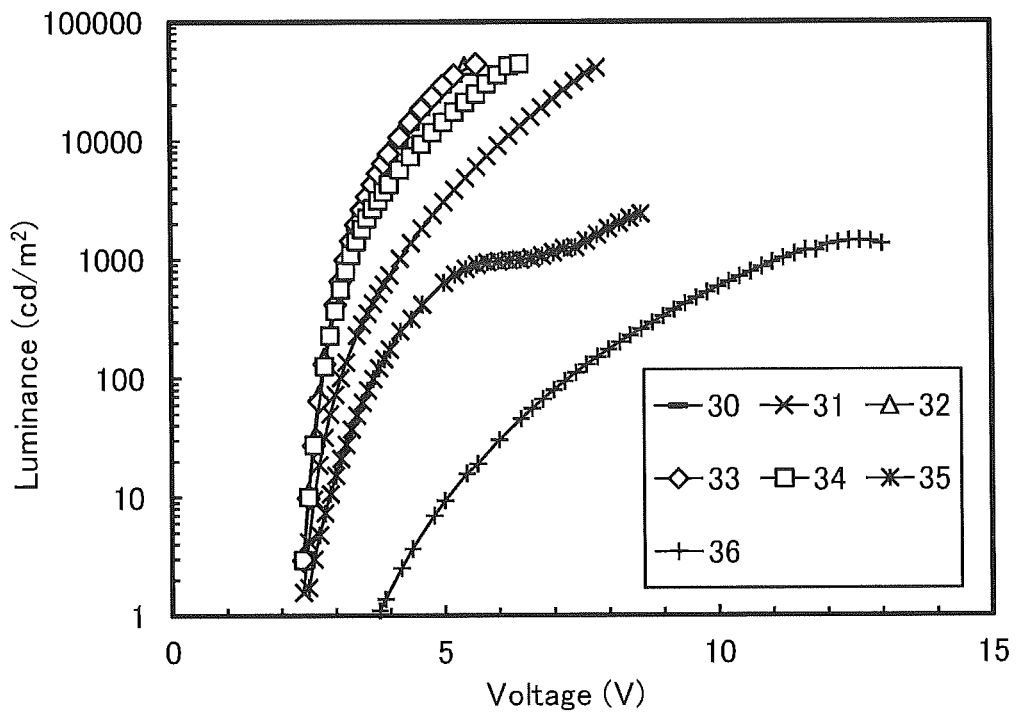
FIG. 63 is a graph showing the luminance-voltage characteristics of the light-emitting device 30 to the light-emitting device 36 in Example.
Figure 64:
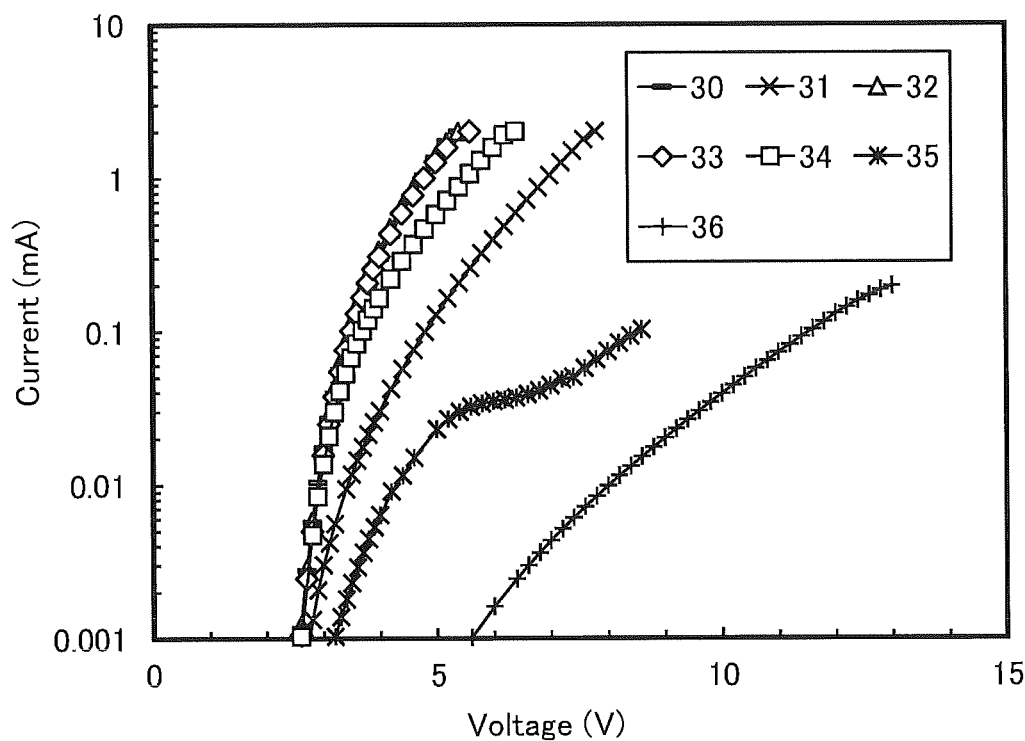
FIG. 64 is a graph showing the current-voltage characteristics of the light-emitting device 30 to the light-emitting device 36 in Example.
Figure 65:
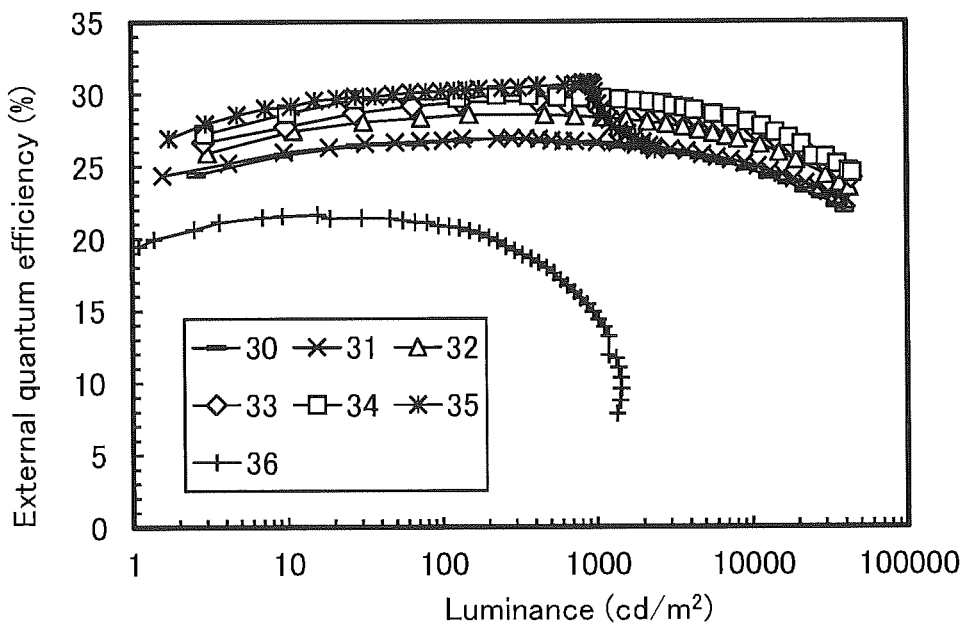
FIG. 65 is a graph showing the external quantum efficiency-luminance characteristics of the light-emitting device 30 to the light-emitting device 36 in Example.
Figure 66:
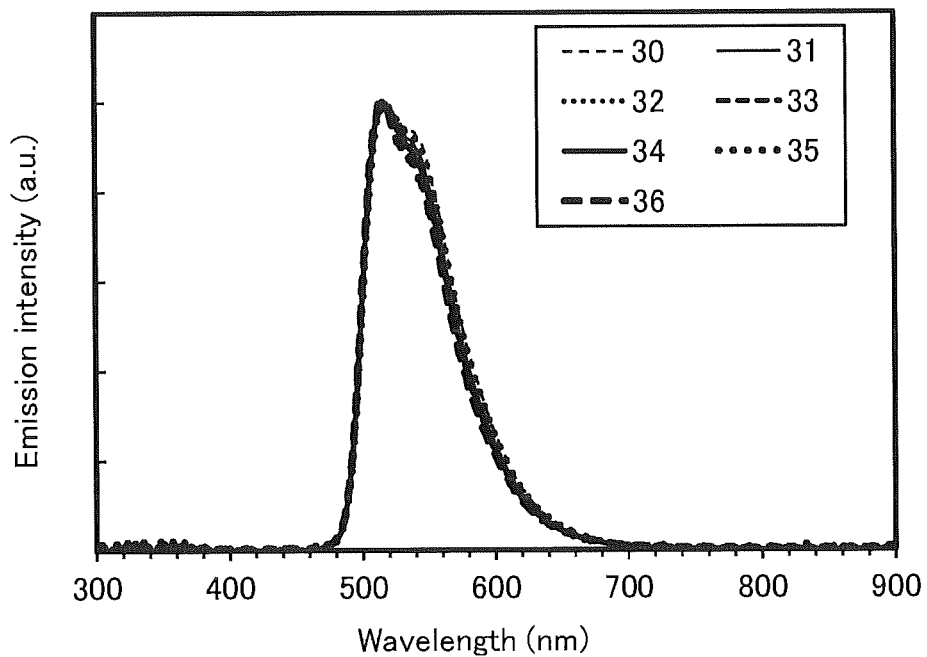
FIG. 66 is a graph showing the emission spectra of the light-emitting device 30 to the light-emitting device 36 in Example.

FIG. 61 shows the luminance-current density characteristics of the light-emitting device 30 to the light-emitting device 36. FIG. 62 shows the current efficiency-luminance characteristics thereof. FIG. 63 shows the luminance-voltage characteristics thereof. FIG. 64 shows the current-voltage characteristics thereof. FIG. 65 shows the external quantum efficiency-luminance characteristics thereof. FIG. 66 shows the emission spectrum thereof. Table 19 shows main characteristics of the light-emitting devices at approximately 1000 cd/m$^2$.

and efficiency both being very favorable. In addition, the light-emitting device 35 in which the proportion of LiF is 95 vol % is a light-emitting device with very high external quantum efficiency, like the light-emitting device 32 to the light-emitting device 34.

In this manner, the driving voltage of light-emitting devices in which a fluoride of an alkali metal or an alkaline earth metal is mixed into part of the electron-transport layer rises in the case where the mixture ratio is low (lower than 50 vol %), but falls in the case where the mixture ratio becomes 50 vol % or higher. Furthermore, mixing a fluoride of an alkali metal or an alkaline earth metal in part of the electron-transport layer can decrease the refractive index of that portion and can improve the external quantum efficiency. Note that, since the driving voltage starts to rise again and the external quantum efficiency decreases when the proportion of the fluoride becomes 95 vol % or higher, the proportion of the fluoride of an alkali metal or an alkaline earth metal is preferably lower than 95 vol %. Note that the effect of external quantum efficiency improvement can be obtained when the proportion of the fluoride of an alkali metal or an alkaline earth metal is 95 vol % or lower.

From the above results, it is preferable in one embodiment of the present invention that the proportion of a fluoride of an alkali metal or an alkaline earth metal mixed into an electron-transport layer be higher than or equal to 50 vol % and lower than or equal to 95 vol %, and it is more preferable that the proportion be higher than or equal to 50 vol % and lower than 95 vol %.

Example 7

In this example, a light-emitting device 37 to a light-emitting device 44 were fabricated and the results of exam-

TABLE 19

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| 30 | 3.2 | 0.04 | 1.0 | 0.32 | 0.64 | 96.3 | 26.6 |
| 31 | 4.2 | 0.04 | 1.1 | 0.31 | 0.64 | 96.4 | 26.6 |
| 32 | 3.2 | 0.04 | 1.1 | 0.31 | 0.65 | 102.6 | 28.4 |
| 33 | 3.2 | 0.04 | 0.9 | 0.31 | 0.65 | 105.7 | 29.2 |
| 34 | 3.3 | 0.04 | 1.0 | 0.31 | 0.65 | 107.4 | 29.7 |
| 35 | 6.4 | 0.04 | 0.9 | 0.32 | 0.64 | 107.4 | 29.7 |
| 36 | 11.2 | 0.08 | 2.0 | 0.31 | 0.65 | 50.2 | 14.4 |

From FIG. 61 to FIG. 65 and Table 16, the light-emitting device 32 to the light-emitting device 34 in each of which the proportion of LiF in the third hole-transport layer is higher than or equal to 50 vol % and lower than 95 vol % were found to be light-emitting devices with driving voltage ining the structure and effect of one embodiment of the present invention are described. The structural formulae of the organic compounds used in the light-emitting device 37 to the light-emitting device 44 are shown below.

[Chemical Formulae 11]

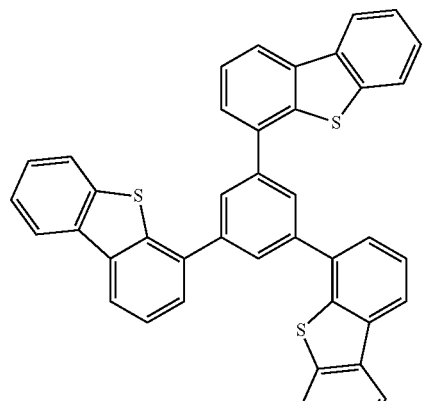

DBT3P-II (i)

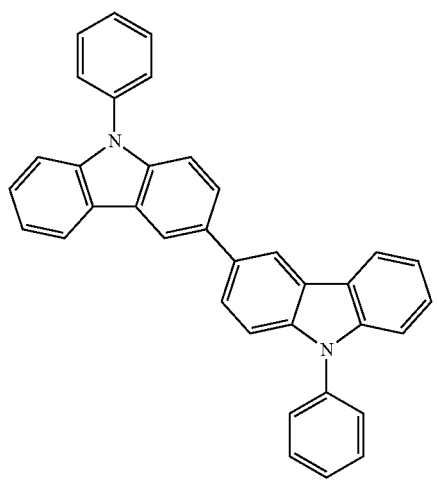

PCCP (ii)

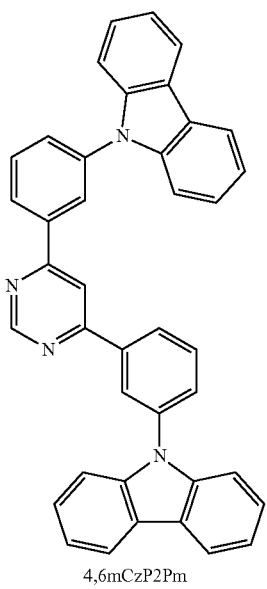

4,6mCzP2Pm (iii)

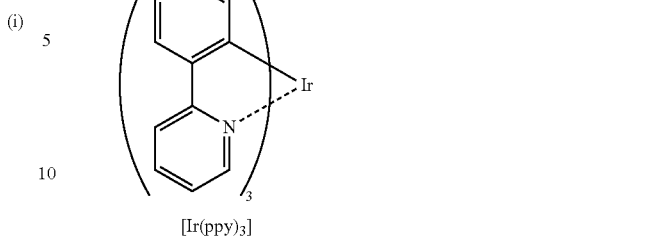

[Ir(ppy)₃] (iv)

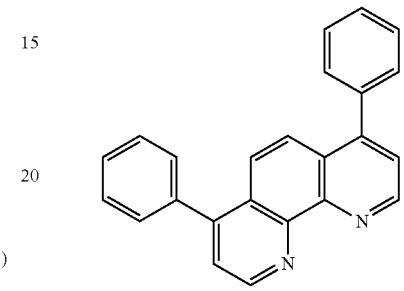

BPhen (v)

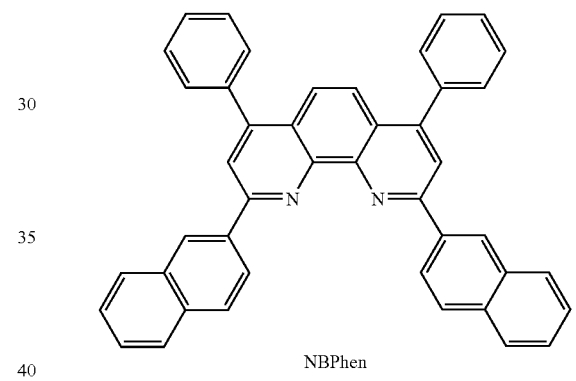

NBPhen (vi)

(Method for Fabricating Light-Emitting Device 37 to Light-Emitting Device 44)

First, a film of indium tin oxide containing silicon oxide (ITSO) was deposited on a glass substrate by a sputtering method, so that an anode 401 was formed. Note that the thickness was 70 nm and the area of the electrode was 2 mm×2 mm.

Next, in pretreatment for forming a light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Then, the substrate on which the anode 401 was formed was fixed to a substrate holder provided in the vacuum evaporation apparatus such that the surface on which the anode 401 was formed faced downward. On the anode 401, 4,4',4"-(benzene-1,3,5-triyl)tri(dibenzothiophene) (abbreviation: DBT3P-II) represented by Structural Formula (i) shown above and molybdenum oxide were deposited by co-evaporation to a thickness of 40 nm at a weight ratio of 2:1 (=DBT3P-II: molybdenum oxide) by an evaporation method using resistance heating, so that the hole-injection layer 411 was formed.

After that, 3,3'-bis(9-phenyl-9H-carbazole) (abbreviation: PCCP) represented by Structural Formula (ii) shown above was deposited by evaporation to a thickness of 20 nm over the hole-injection layer 411 to form the hole-transport layer 412.

Subsequently, 4,6-bis[3-(9H-carbazol-9-yl)phenyl]pyrimidine (abbreviation: 4,6mCzP2Pm) represented by Structural Formula (iii) shown above, PCCP, and tris(2-phenylpyridinato-N,C$^{2'}$)iridium(III) (abbreviation: Ir(ppy)$_3$) represented by Structural Formula (iv) shown above were deposited by co-evaporation to a thickness of 20 nm at a weight ratio of 0.5:0.5:0.1 (=4,6mCzP2Pm: PCCP: Ir(ppy)$_3$), and then deposited by co-evaporation to a thickness of 20 nm at a weight ratio of 0.8:0.2:0.1 (=4, 6mCzP2Pm: PCCP: Ir(ppy)$_3$), so that the light-emitting layer 413 was formed.

Furthermore, 4,6mCzP2Pm was deposited by evaporation on the light-emitting layer 413 to a thickness of 5 nm to form a first electron-transport layer, and then bathophenanthroline (abbreviation: BPhen) represented by Structural Formula (v) shown above was deposited by evaporation to a thickness of 10 nm to form a second electron-transport layer. In addition, as a third electron-transport layer, 2,9-bis(naphthalen-2-yl)-4,7-diphenyl-1,10-phenanthroline (abbreviation: NBPhen) represented by Structural Formula (vi) shown above or BPhen and/or lithium fluoride was deposited to a thickness of 20 nm. Thus, the electron-transport layer 414 was formed.

The third electron-transport layer in the electron-transport layer 414 was formed with different proportions of NBPhen and/or lithium fluoride contained in the light-emitting device 37 to the light-emitting device 44. In the light-emitting device 44, BPhen and lithium fluoride were used for the formation. The concentrations of NBPhen or BPhen and/or lithium fluoride in the light-emitting devices are shown below.

TABLE 20

| Light-emitting device | vol % | |
|---|---|---|
| | LiF | NBPhen |
| 37 | 0% | 100% |
| 38 | 25% | 75% |
| 39 | 50% | 50% |
| 40 | 75% | 25% |
| 41 | 90% | 10% |
| 42 | 95% | 5% |
| 43 | 99% | 1% |

| Light-emitting device | vol % | |
|---|---|---|
| | LiF | BPhen |
| 44 | 75% | 25% |

Lastly, aluminum was deposited by evaporation on the electron-transport layer 414 to a thickness of 200 nm to form a cathode 402. Thus, the light-emitting device 37 to the light-emitting device 44 of this example were fabricated.

The device structures of the light-emitting device 37 to the light-emitting device 44 are listed in the following table. As you can see, the light-emitting devices fabricated in this example are light-emitting devices without a layer formed only of lithium fluoride as an electron-injection layer.

TABLE 21

| Hole-injection layer | Hole-transport layer | Light-emitting layer | | Electron-transport layer | | |
|---|---|---|---|---|---|---|
| DBT3P-II:MoO$_3$ 2:1 40 nm | PCCP 20 nm | 4,6mCzP2Pm:PCCP:Ir(ppy)$_3$ 0.5:0.5:0.1 20 nm | 4,6mCzP2Pm:PCCP:Ir(ppy)$_3$ 0.8:0.2:0.1 20 nm | 4,6mCzP2Pm 5 nm | BPhen 10 nm | *1 20 nm |

*1 Refer to the table below

TABLE 22

| Light-emitting device | LiF:NBPhen (volume ratio) |
|---|---|
| 37 | 0:100 |
| 38 | 25:75 |
| 39 | 50:50 |
| 40 | 75:25 |
| 41 | 90:10 |
| 42 | 95:5 |
| 43 | 99:1 |

| Light-emitting device | LiF:Bphen (volume ratio) |
|---|---|
| 44 | 75:25 |

Each of the light-emitting device 37 to the light-emitting device 44 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (an atmosphere maintained at 25° C.).

Figure 67:
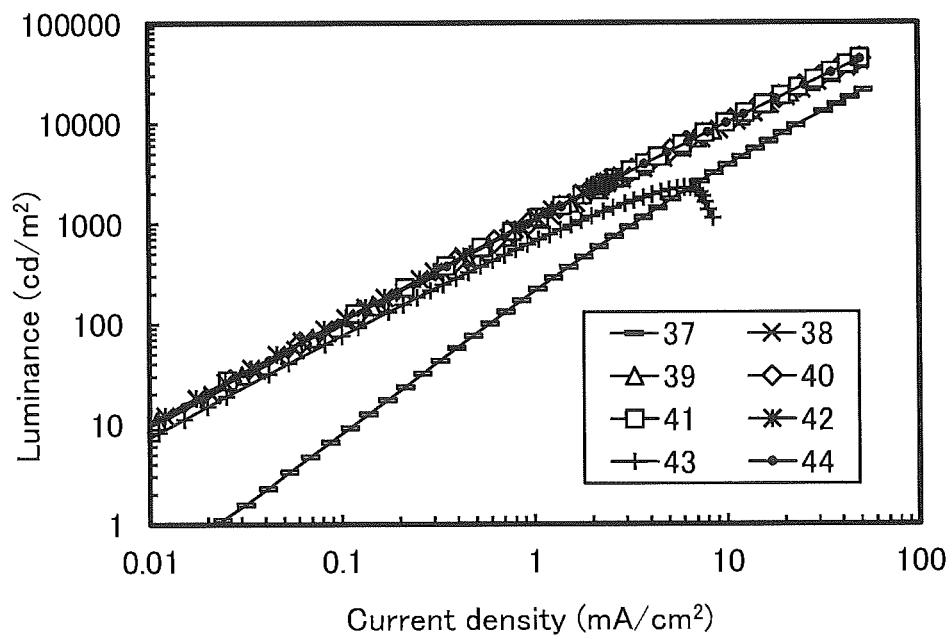
FIG. 67 is a graph showing the luminance-current density characteristics of a light-emitting device 37 to a light-emitting device 44 in Example.
Figure 68:
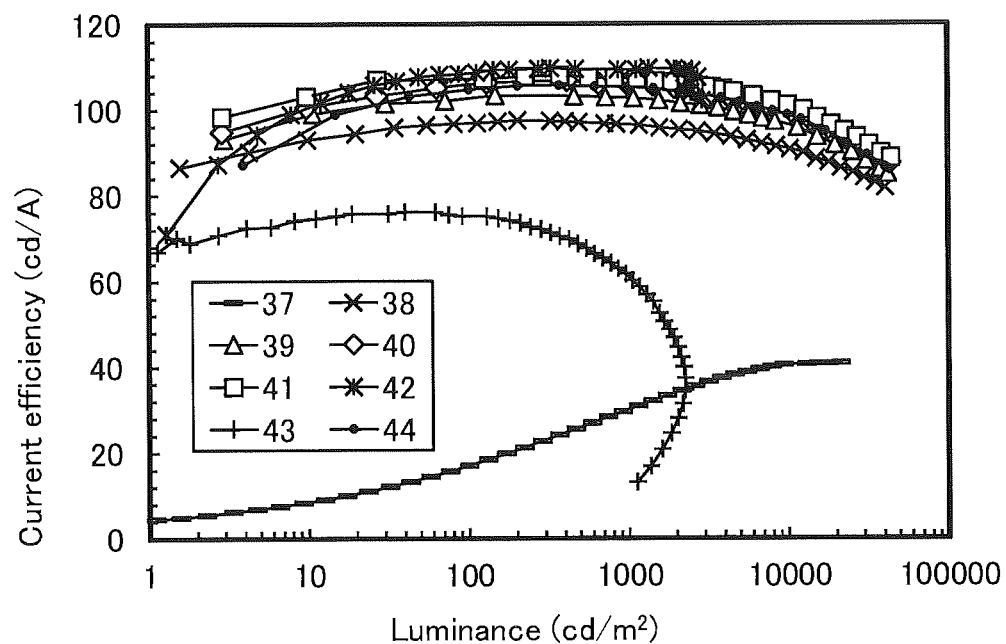
FIG. 68 is a graph showing the current efficiency-luminance characteristics of the light-emitting device 37 to the light-emitting device 44 in Example.
Figure 69:
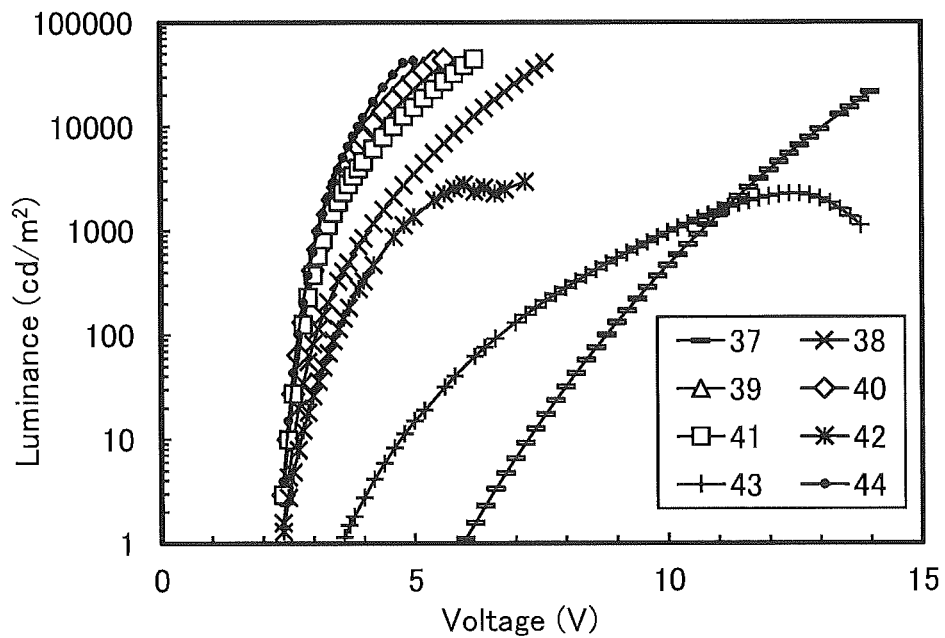
FIG. 69 is a graph showing the luminance-voltage characteristics of the light-emitting device 37 to the light-emitting device 44 in Example.
Figure 70:
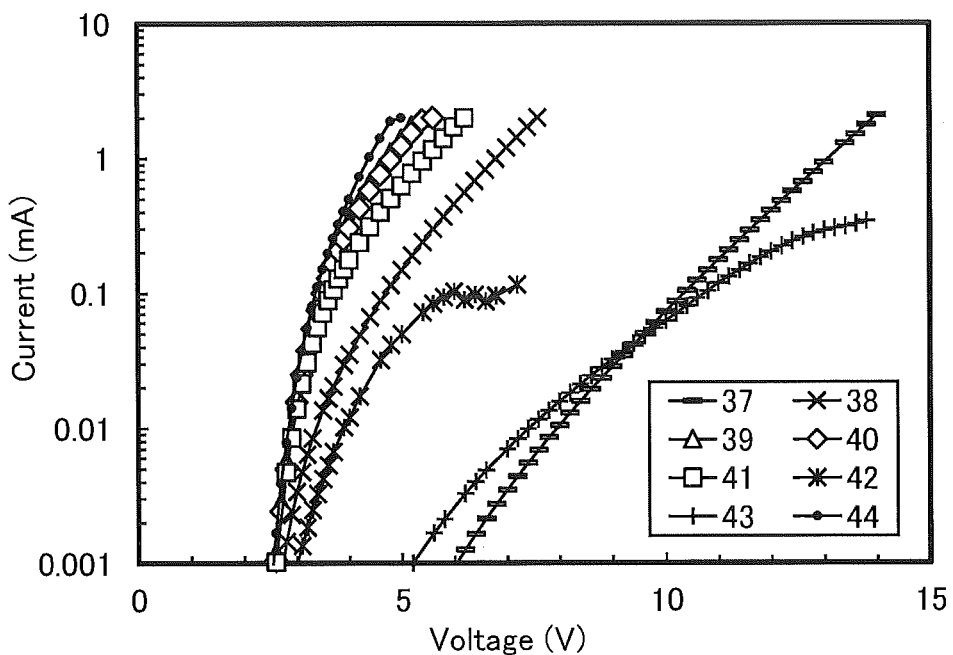
FIG. 70 is a graph showing the current-voltage characteristics of the light-emitting device 37 to the light-emitting device 44 in Example.
Figure 71:
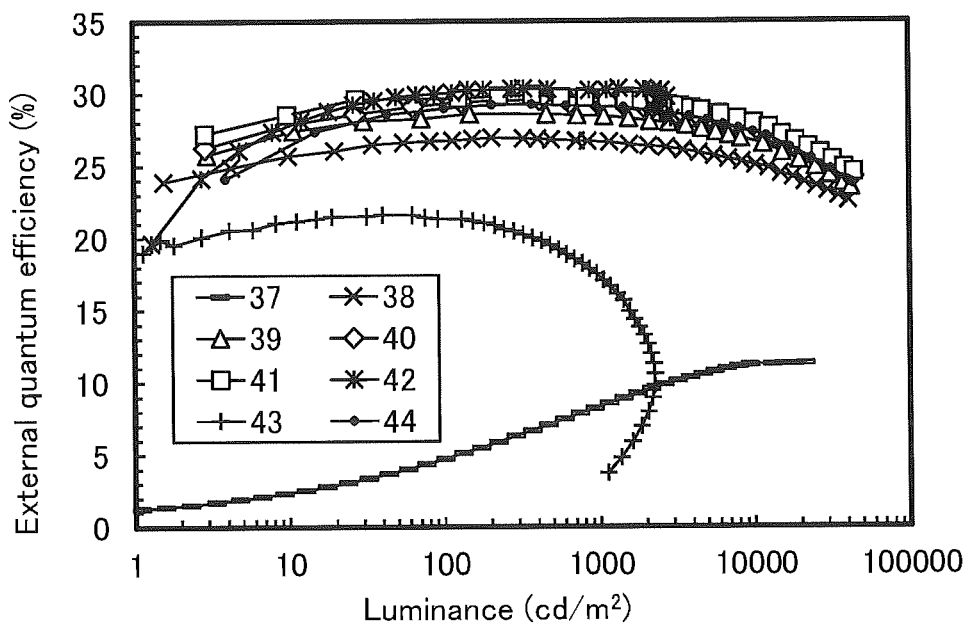
FIG. 71 is a graph showing the external quantum efficiency-luminance characteristics of the light-emitting device 37 to the light-emitting device 44 in Example.
Figure 72:
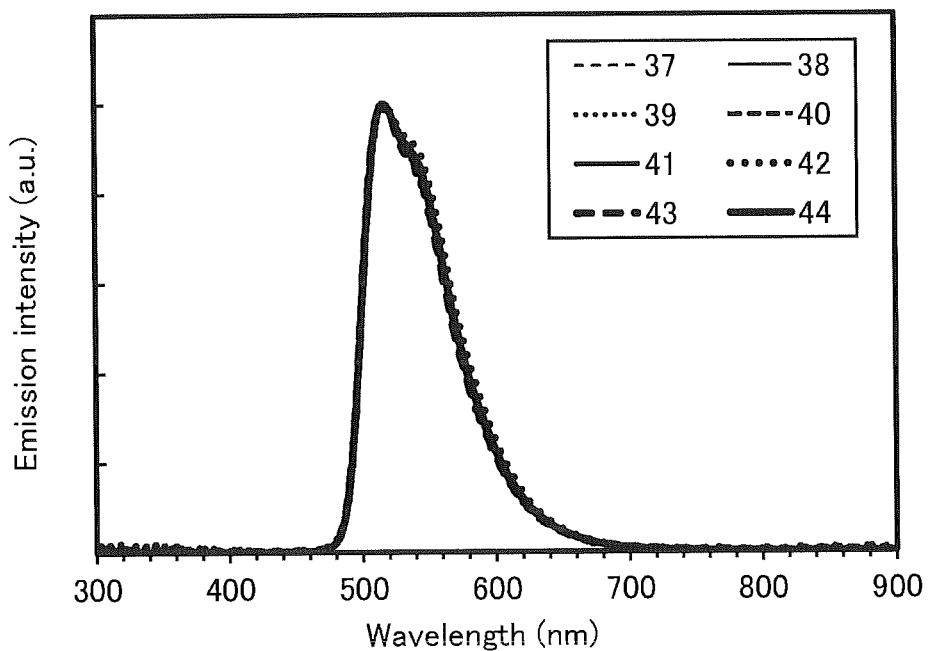
FIG. 72 is a graph showing the emission spectra of the light-emitting device 37 to the light-emitting device 44 in Example.

FIG. 67 shows the luminance-current density characteristics of the light-emitting device 37 to the light-emitting device 44. FIG. 68 shows the current efficiency-luminance characteristics thereof. FIG. 69 shows the luminance-voltage characteristics thereof. FIG. 70 shows the current-voltage characteristics thereof. FIG. 71 shows the external quantum efficiency-luminance characteristics thereof. FIG. 72 shows the emission spectrum thereof. Table 23 shows main characteristics of the light-emitting devices at approximately 1000 cd/m$^2$.

TABLE 23

| Light-emitting device | Voltage (V) | Current (mA) | Current density (mA/cm²) | Chromaticity x | Chromaticity y | Current efficiency (cd/A) | External quantum efficiency (%) |
|---|---|---|---|---|---|---|---|
| 37 | 10.6 | 0.12 | 3.1 | 0.31 | 0.64 | 29.6 | 8.2 |
| 38 | 4.0 | 0.04 | 0.9 | 0.31 | 0.64 | 96.6 | 26.7 |
| 39 | 3.2 | 0.04 | 1.1 | 0.31 | 0.65 | 102.7 | 28.4 |
| 40 | 3.2 | 0.04 | 0.9 | 0.30 | 0.65 | 106.0 | 29.3 |
| 41 | 3.3 | 0.04 | 1.1 | 0.30 | 0.65 | 107.1 | 29.6 |
| 42 | 4.6 | 0.03 | 0.8 | 0.31 | 0.64 | 109.3 | 30.2 |
| 43 | 10.0 | 0.06 | 1.6 | 0.30 | 0.65 | 61.7 | 17.5 |
| 44 | 3.1 | 0.04 | 0.9 | 0.31 | 0.65 | 105.2 | 29.1 |

From FIG. 67 to FIG. 71 and Table 20, the light-emitting device 39 to the light-emitting device 41 and the light-emitting device 44 in each of which the proportion of LiF in the third hole-transport layer is higher than or equal to 50 vol % and lower than 95 vol % were found to be light-emitting devices with driving voltage and efficiency both being very favorable.

In this manner, the driving voltage of light-emitting devices in which a fluoride of an alkali metal or an alkaline earth metal is mixed into part of the electron-transport layer rises in the case where the mixture ratio is low (lower than 50 vol %), but falls in the case where the mixture ratio becomes 50 vol % or higher. Furthermore, mixing a fluoride of an alkali metal or an alkaline earth metal in part of the electron-transport layer can decrease the refractive index of that portion and can improve the external quantum efficiency. Note that, since the driving voltage starts to rise again and the external quantum efficiency decreases when the proportion of the fluoride becomes 95 vol % or higher, the proportion of the fluoride of an alkali metal or an alkaline earth metal is preferably lower than 95 vol %. Note that the effect of external quantum efficiency improvement was found to be higher as the proportion of the fluoride of an alkali metal or an alkaline earth metal is higher, before the proportion of the fluoride exceeds 95 vol %.

From the above results, it is preferable in one embodiment of the present invention that the proportion of a fluoride of an alkali metal or an alkaline earth metal mixed into an electron-transport layer be higher than or equal to 50 vol % and lower than or equal to 95 vol %, and it is more preferable that the proportion be higher than or equal to 50 vol % and lower than 95 vol %.

Example 8

In this example, a light-emitting device 45 to a light-emitting device 48 were fabricated and the results of examining the structure and effect of one embodiment of the present invention are described. The structural formulae of the organic compounds used in the light-emitting device 45 to the light-emitting device 48 are shown below.

[Chemical Formulae 12]

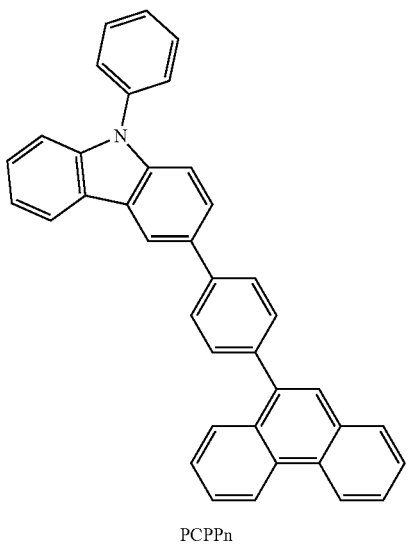

(vii)

PCPPn

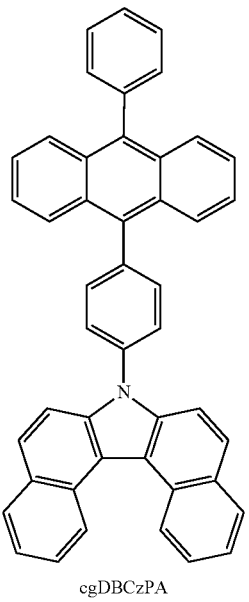

(viii)

cgDBCzPA (ix)

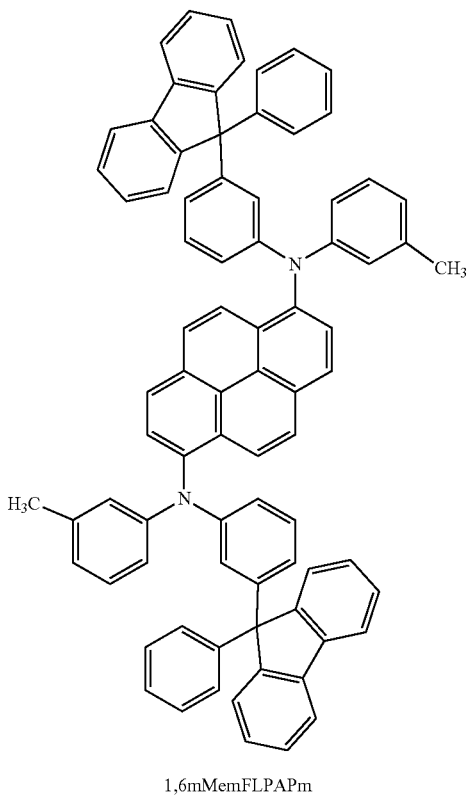

1,6mMemFLPAPm (v)

BPhen (Method for Fabricating Light-Emitting Device 45 to Light-Emitting Device 48)

First, a film of indium tin oxide containing silicon oxide (ITSO) was deposited on a glass substrate by a sputtering method, so that an anode 401 was formed. Note that the thickness was 70 nm and the area of the electrode was 2 mm×2 mm.

Next, in pretreatment for forming a light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the anode 401 was formed was fixed to a substrate holder provided in the vacuum evaporation apparatus such that the side on which the anode 401 was formed faced downward, and 3-[4-(9-phenanthryl)-phenyl]-9-phenyl-9H-carbazole (abbreviation: PCPPn) represented by Structural Formula (vii) shown above and molybdenum oxide were deposited by co-evaporation on the anode 401 at a weight ratio of 2:1 (=PCPPn: molybdenum oxide) to a thickness of 10 nm by an evaporation method using resistance heating, so that the hole-injection layer 411 was formed.

After that, PCPPn was deposited by evaporation to a thickness of 30 nm over the hole-injection layer 411 to form the hole-transport layer 412.

Subsequently, 7-[4-(10-phenyl-9-anthryl)phenyl]-7H-dibenzo[c,g]carbazole (abbreviation: cgDBCzPA) represented by Structural Formula (viii) shown above and N,N'-bis(3-methylphenyl)-N,N'-bis[3-(9-phenyl-9H-fluoren-9-yl)phenyl]pyrene-1,6-diamine (abbreviation: 1,6mMemFLPAPrn) represented by Structural Formula (ix) shown above were deposited by co-evaporation to a thickness of 25 nm at a weight ratio of 1:0.03 (=cgDBCzPA: 1,6mMemFLPAPrn), so that the light-emitting layer 413 was formed.

Furthermore, cgDBCzPA was deposited by evaporation on the light-emitting layer 413 to a thickness of 5 nm to form a first electron-transport layer, and then bathophenanthroline (abbreviation: BPhen) represented by Structural Formula (v) shown above was deposited by evaporation to a thickness of 5 nm to form a second electron-transport layer. In addition, a third electron-transport layer was formed by depositing BPhen and/or lithium fluoride by evaporation to a thickness of 20 nm. Thus, the electron-transport layer 414 was formed.

The third electron-transport layer in the electron-transport layer 414 was formed with different proportions of BPhen and/or lithium fluoride contained in the light-emitting device 45 to the light-emitting device 48. The concentrations of BPhen and/or lithium fluoride in the light-emitting devices are shown below.

TABLE 24

| Light-emitting device | vol % | |
| --- | --- | --- |
|  | LiF | BPhen |
| 45 | 0% | 100% |
| 46 | 25% | 75% |
| 47 | 50% | 50% |
| 48 | 75% | 25% |

For the light-emitting device 45, an electron-injection layer 415 was formed by depositing lithium fluoride (LiF) to a thickness of 1 nm, after the formation of the electron-transport layer 414.

Lastly, aluminum was deposited by evaporation to a thickness of 200 nm to form a cathode 402. Thus, the light-emitting device 45 to the light-emitting device 48 of this example were fabricated. The device structures of the light-emitting device 45 to the light-emitting device 48 are listed in the following table.

TABLE 25

| Hole-injection layer | Hole-transport layer | Light-emitting layer | Electron-transport layer | | (Electron-injection layer) |
|---|---|---|---|---|---|
| PCPPn:MoO$_3$ 2:1 | PCPPn | cgDBCzPA:1,6mMemFLPAPrn 1:0.03 | cgDBCzPA | BPhen *1 | (LiF) |
| 10 nm | 30 nm | 25 nm | 5 nm | 5 nm  20 nm | (1 nm) |

*1 Refer to the table below

TABLE 26

| Light-emitting device | LiF:Bphen (volume ratio) |
|---|---|
| 45 | 0:100 |
| 46 | 25:75 |
| 47 | 50:50 |
| 48 | 75:25 |

Each of the light-emitting device 45 to the light-emitting device 48 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (an atmosphere maintained at 25° C.).

Figure 73:
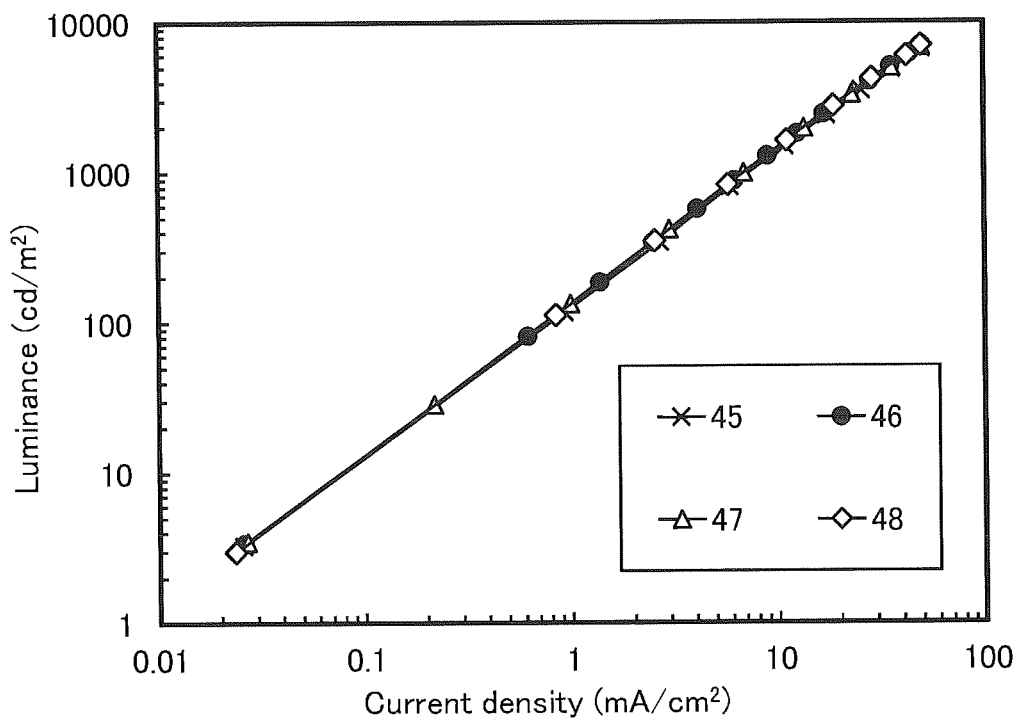
FIG. 73 is a graph showing the luminance-current density characteristics of a light-emitting device 45 to a light-emitting device 48 in Example.
Figure 74:
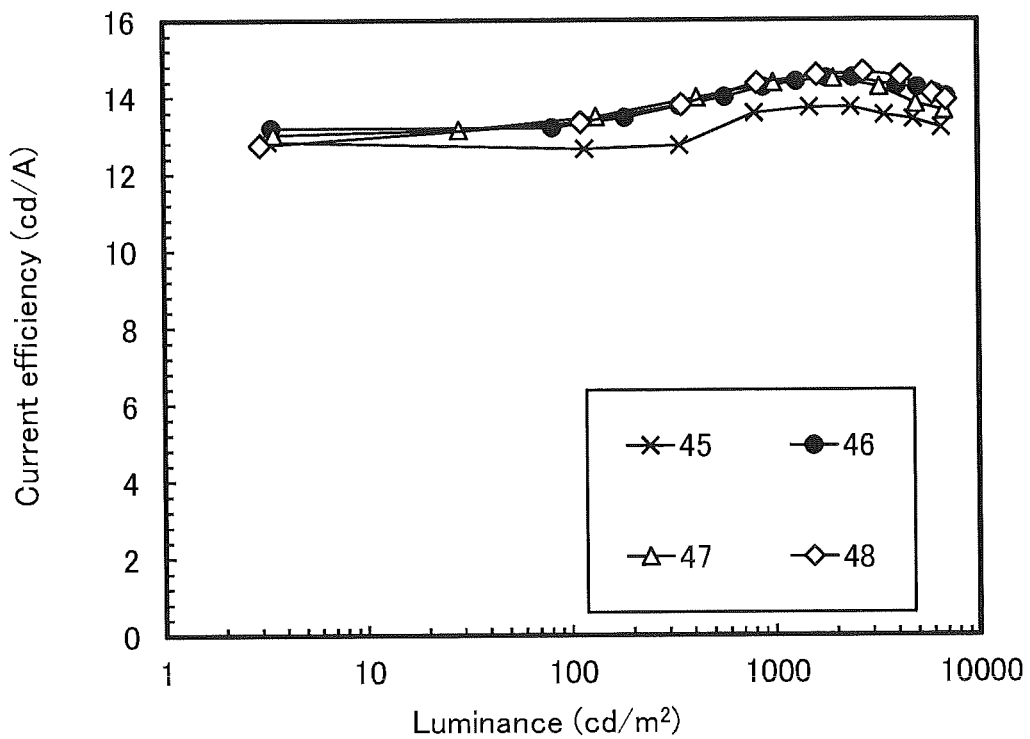
FIG. 74 is a graph showing the current efficiency-luminance characteristics of the light-emitting device 45 to the light-emitting device 48 in Example.
Figure 75:
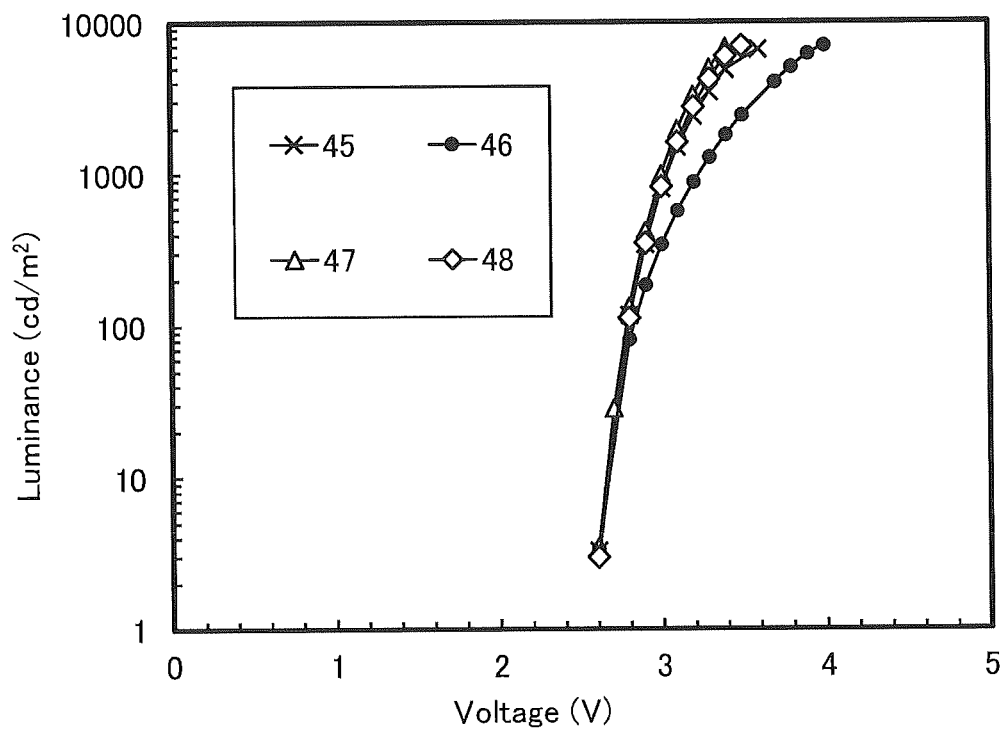
FIG. 75 is a graph showing the luminance-voltage characteristics of the light-emitting device 45 to the light-emitting device 48 in Example.
Figure 76:
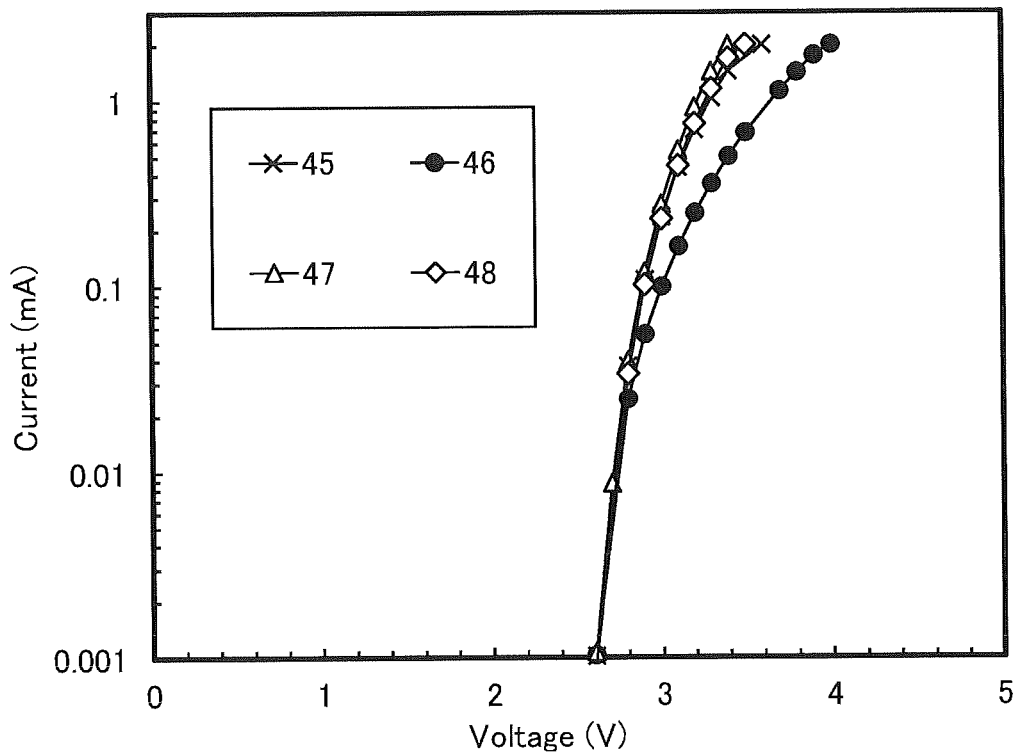
FIG. 76 is a graph showing the current-voltage characteristics of the light-emitting device 45 to the light-emitting device 48 in Example.
Figure 77:
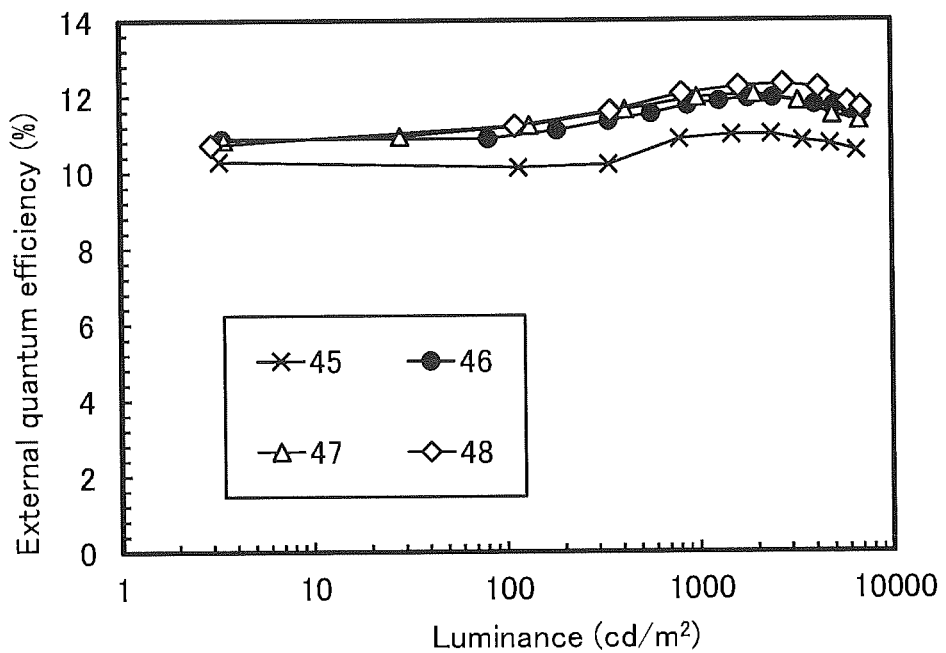
FIG. 77 is a graph showing the external quantum efficiency-luminance characteristics of the light-emitting device 45 to the light-emitting device 48 in Example.
Figure 78:
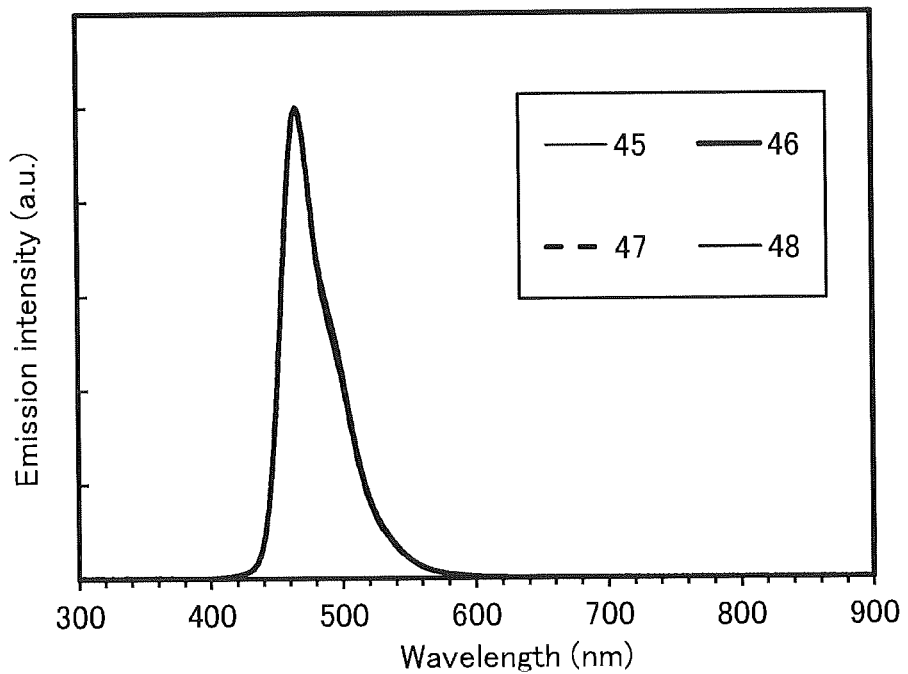
FIG. 78 is a graph showing the emission spectra of the light-emitting device 45 to the light-emitting device 48 in Example.

FIG. 73 shows the luminance-current density characteristics of the light-emitting device 45 to the light-emitting device 48. FIG. 74 shows the current efficiency-luminance characteristics thereof. FIG. 75 shows the luminance-voltage characteristics thereof. FIG. 76 shows the current-voltage characteristics thereof. FIG. 77 shows the external quantum efficiency-luminance characteristics thereof. FIG. 78 shows the emission spectrum thereof. Table 27 shows main characteristics of the light-emitting devices at approximately 1000 cd/m².

Example 9

In this example, a light-emitting device 49, a light-emitting device 50, a light-emitting device 51, and a light-emitting device 52 were fabricated and the results of examining the structure and effect of one embodiment of the present invention are described. The structural formulae of the organic compounds used in the light-emitting device 49, the light-emitting device 50, the light-emitting device 51, and the light-emitting device 52 are shown below.

[Chemical Formulae 13]

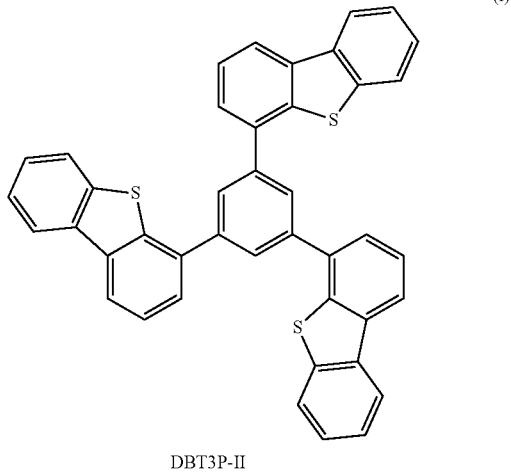

DBT3P-II (i)

TABLE 27

| Light-emitting device | Voltage (V) | Current (mA) | Current density (mA/cm²) | Chromaticity x | Chromaticity y | Current efficiency (cd/A) | External quantum efficiency (%) |
|---|---|---|---|---|---|---|---|
| 45 | 3.0 | 0.24 | 5.9 | 0.14 | 0.18 | 13.6 | 10.9 |
| 46 | 3.2 | 0.25 | 6.2 | 0.14 | 0.17 | 14.2 | 11.8 |
| 47 | 3.0 | 0.28 | 6.9 | 0.14 | 0.17 | 14.4 | 12.0 |
| 48 | 3.0 | 0.23 | 5.8 | 0.14 | 0.16 | 14.3 | 12.1 |

From FIG. 73 to FIG. 77 and Table 24, the light-emitting device 47 and the light-emitting device 48 in each of which the proportion of LiF in the third hole-transport layer is higher than or equal to 50 vol % and lower than 95 vol % were found to be light-emitting devices with driving voltage and efficiency both being very favorable. In this way, one embodiment of the present invention can suitably be applied to fluorescent light-emitting devices.

(x)

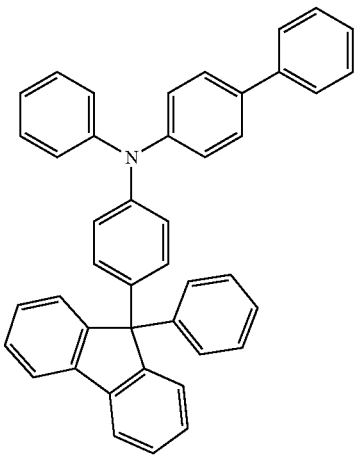

BPAFLP (xi)

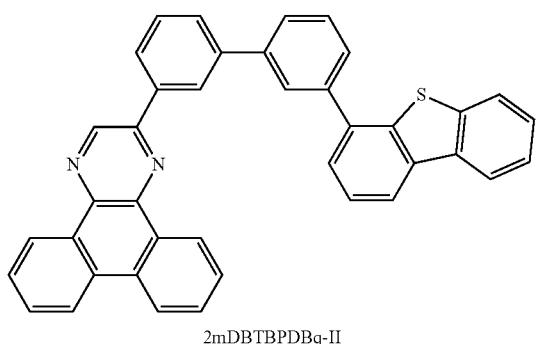

2mDBTBPDBq-II (xii)

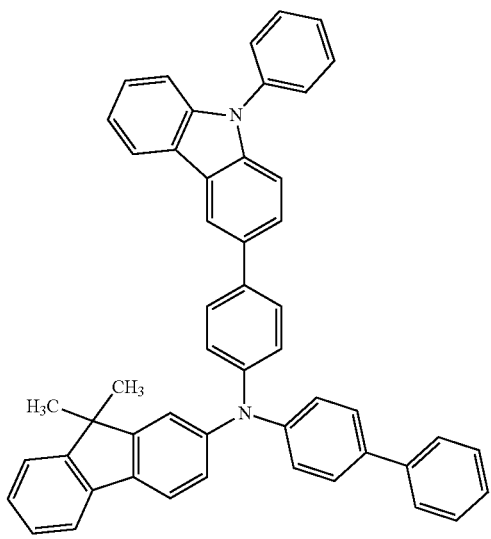

PCBBiF (xiii)

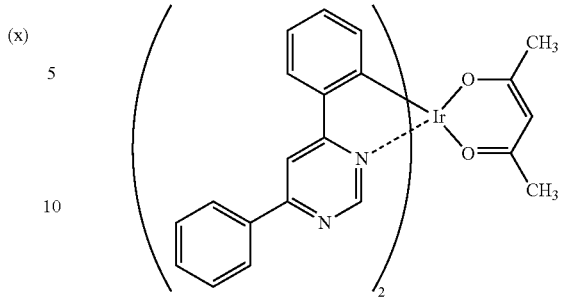

[Ir(dppm)$_2$(acac)]

(v)

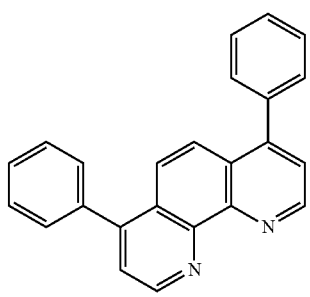

BPhen (Method for Fabricating Light-Emitting Device 49, Light-Emitting Device 50, Light-Emitting Device 51, and Light-Emitting Device 52)

First, a film of indium tin oxide containing silicon oxide (ITSO) was deposited on a glass substrate by a sputtering method, so that an anode 401 was formed. Note that the thickness was 70 nm and the area of the electrode was 2 mm×2 mm.

Next, in pretreatment for forming a light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the anode 401 was formed was fixed to a substrate holder provided in the vacuum evaporation apparatus such that the surface on which the anode 401 was formed faced downward, and 4,4',4"-(benzene-1,3,5-triyl)tri(dibenzothiophene) (abbreviation: DBT3P-II) represented by Structural Formula (i) shown above and molybdenum oxide were deposited on the anode 401 by co-evaporation to a thickness of 60 nm at a weight ratio of 2:1 (=DBT3P-II: molybdenum oxide) by an evaporation method using resistance heating, so that the hole-injection layer 411 was formed.

After that, 4-phenyl-4'-(9-phenylfluoren-9-yl)triphenylamine (abbreviation: BPAFLP) represented by Structural Formula (x) shown above was deposited by evaporation to a thickness of 20 nm over the hole-injection layer 411 to form the hole-transport layer 412.

Subsequently, 2-[3'-(dibenzothiophen-4-yl)biphenyl-3-yl] dibenzo[f,h]quinoxaline (abbreviation: 2mDBTBPDBq-II) represented by Structural Formula (xi) shown above, N-(1, 1'-biphenyl-4-yl)-9,9-dimethyl-N-[4-(9-phenyl-9H-carbazol-3-yl)phenyl]-9H-fluoren-2-amine (abbreviation: PCBBiF) represented by Structural Formula (xii) shown above, and (acetylacetonato)bis(4,6-diphenylpyrimidinato)iridium (III) (abbreviation: Ir(dppm)$_2$(acac)) represented by Structural Formula (xiii) shown above were deposited by co-evaporation to a thickness of 20 nm at a weight ratio of 0.7:0.3:0.06 (=2mDBTBPDBq-II: PCBBiF: Ir(dppm)$_2$(acac)), and then deposited by co-evaporation to a thickness of 20 nm at a weight ratio of 0.8:0.2:0.06 (=2mDBTBPDBq-II: PCBBiF: Ir(dppm)$_2$(acac)), so that the light-emitting layer 413 was formed.

Furthermore, 2mDBTBPDBq-II was deposited by evaporation to a thickness of 15 nm over the light-emitting layer 413 to form a first electron-transport layer, and then bathophenanthroline (abbreviation: BPhen) represented by Structural Formula (v) shown above was deposited by evaporation to a thickness of 5 nm to form a second electron-transport layer. In addition, as a third electron-transport layer, BPhen and/or a metal fluoride (calcium fluoride or magnesium fluoride) was deposited to a thickness of 15 nm. Thus, the electron-transport layer 414 was formed.

As the third electron-transport layer in the electron-transport layer, calcium fluoride and BPhen were deposited at a volume ratio of 0.75:0.25 for the light-emitting device 49, and magnesium fluoride and BPhen were deposited at a volume ratio of 0.75:0.25 for the light-emitting device 51.

After the formation of the electron-transport layer 414, calcium fluoride was deposited by evaporation to a thickness of 1 nm for the light-emitting device 50, and magnesium fluoride was deposited by evaporation to a thickness of 1 nm for the light-emitting device 52, to form an electron-injection layer 415.

Lastly, aluminum was deposited by evaporation to a thickness of 200 nm to form a cathode 402 for the light-emitting devices 49, 50, 51, and 52. Thus, the light-emitting devices 49, 50, 51, and 52 of this example were fabricated. The device structures of the light-emitting devices 49, 50, 51, and 52 are listed in the following table.

TABLE 28

| Hole-injection layer | Hole-transport layer | Light-emitting layer | | Electron-transport layer and electron-injection layer |
|---|---|---|---|---|
| DBT3P-II:MoO$_3$ 2:1 60 nm | BPAFLP 20 nm | 2mDBTBPDBq-II:PCBBiF:Ir(dppm)$_2$(acac) 0.7:0.3:0.06 20 nm | 0.8:0.2:0.06 20 nm | *1 |

*1 Refer to the table below

TABLE 29

| Light-emitting device | Electron-transport layer | | |
|---|---|---|---|
| | 15 nm | 5 nm | 15 nm |
| 49 | 2mDBTBPDBq-II | BPhen | CaF$_2$:BPhen (0.75:0.25)(volume ratio) |
| 51 | 2mDBTBPDBq-II | BPhen | MgF$_2$:BPhen (0.75:0.25) |

| Light-emitting device | Electron-transport layer | | Electron-injection layer |
|---|---|---|---|
| | 15 nm | 5 nm | 1 nm |
| 50 | 2mDBTBPDBq-II | BPhen | CaF$_2$ |
| 52 | 2mDBTBPDBq-II | BPhen | MgF$_2$ |

Each of the light-emitting devices 49, 50, 51, and 52 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (an atmosphere maintained at 25° C.).

Figure 79:
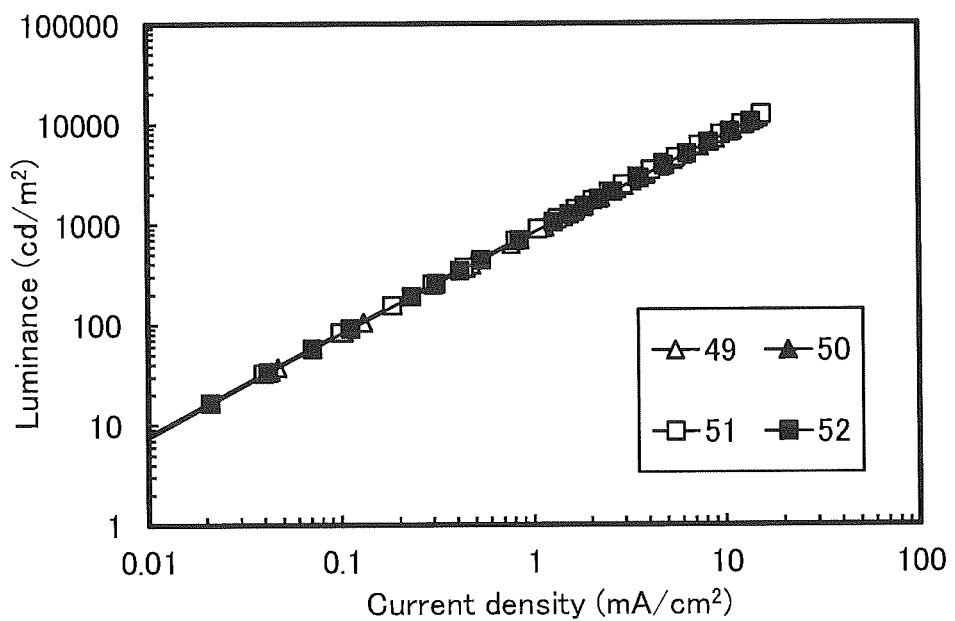
FIG. 79 is a graph showing the luminance-current density characteristics of a light-emitting device 49, a light-emitting device 50, a light-emitting device 51, and a light-emitting device 52 in Example.
Figure 80:
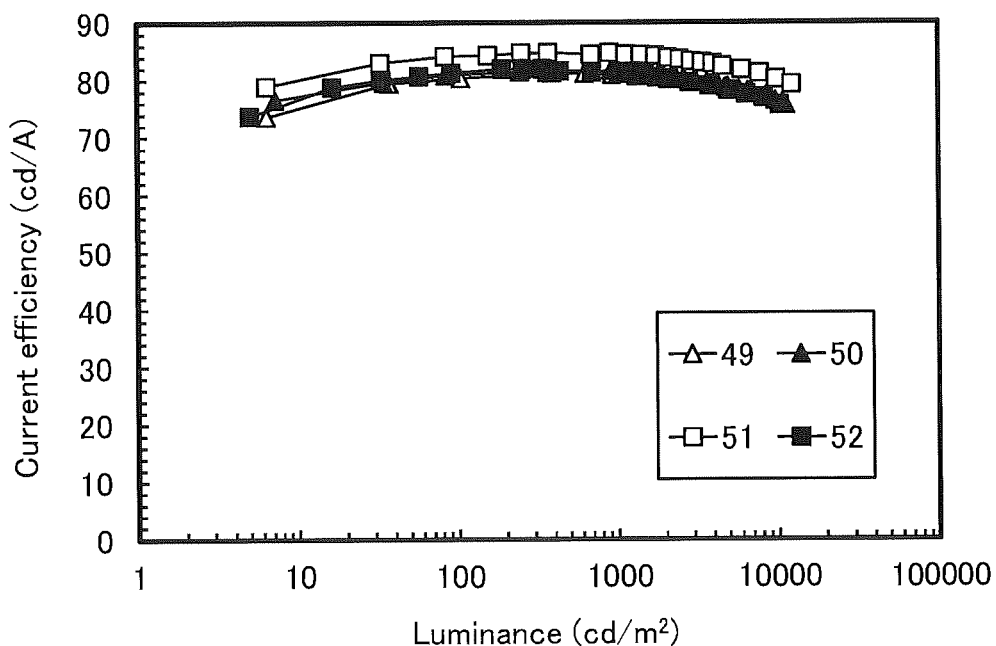
FIG. 80 is a graph showing the current efficiency-luminance characteristics of the light-emitting device 49, the light-emitting device 50, the light-emitting device 51, and the light-emitting device 52 in Example.
Figure 81:
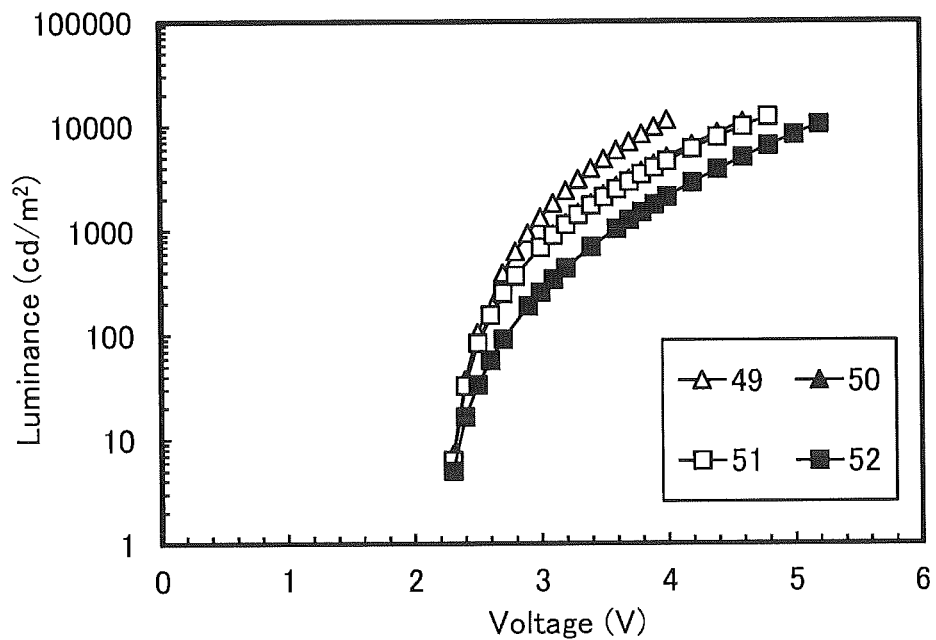
FIG. 81 is a graph showing the luminance-voltage characteristics of the light-emitting device 49, the light-emitting device 50, the light-emitting device 51, and the light-emitting device 52 in Example.
Figure 82:
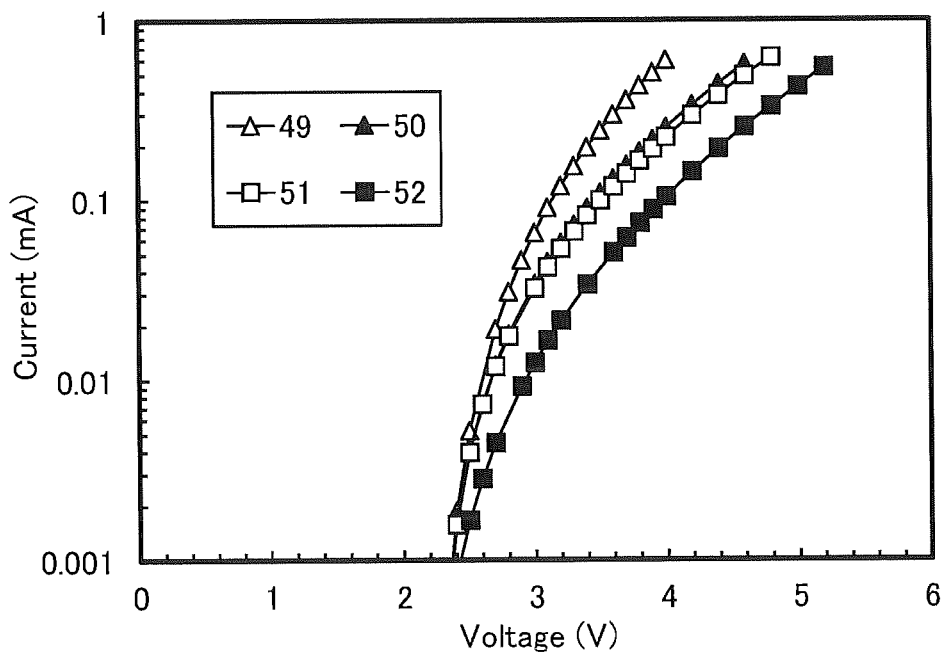
FIG. 82 is a graph showing the current-voltage characteristics of the light-emitting device 49, the light-emitting device 50, the light-emitting device 51, and the light-emitting device 52 in Example.
Figure 83:
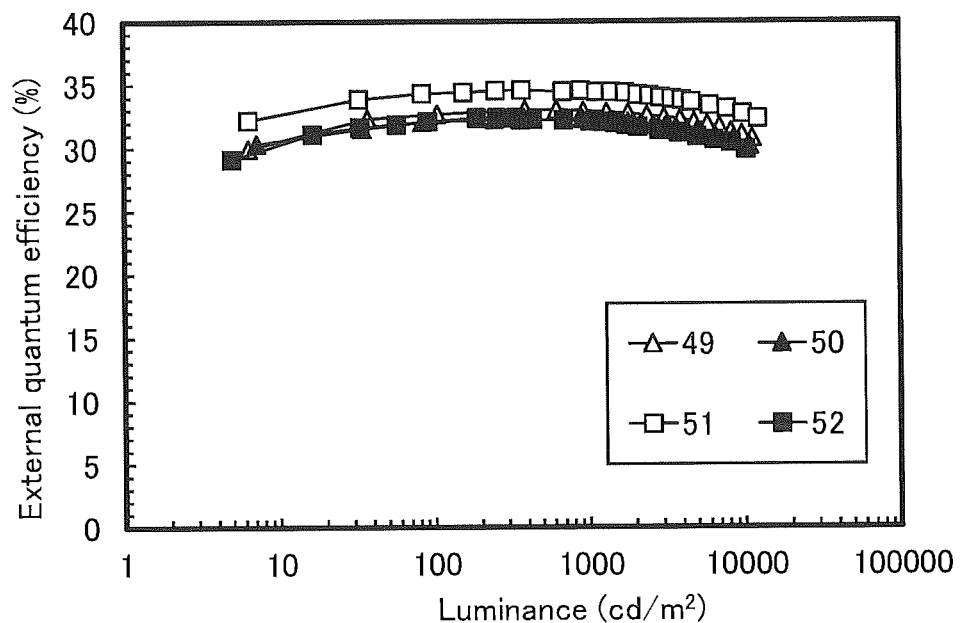
FIG. 83 is a graph showing the external quantum efficiency-luminance characteristics of the light-emitting device 49, the light-emitting device 50, the light-emitting device 51, and the light-emitting device 52 in Example.
Figure 84:
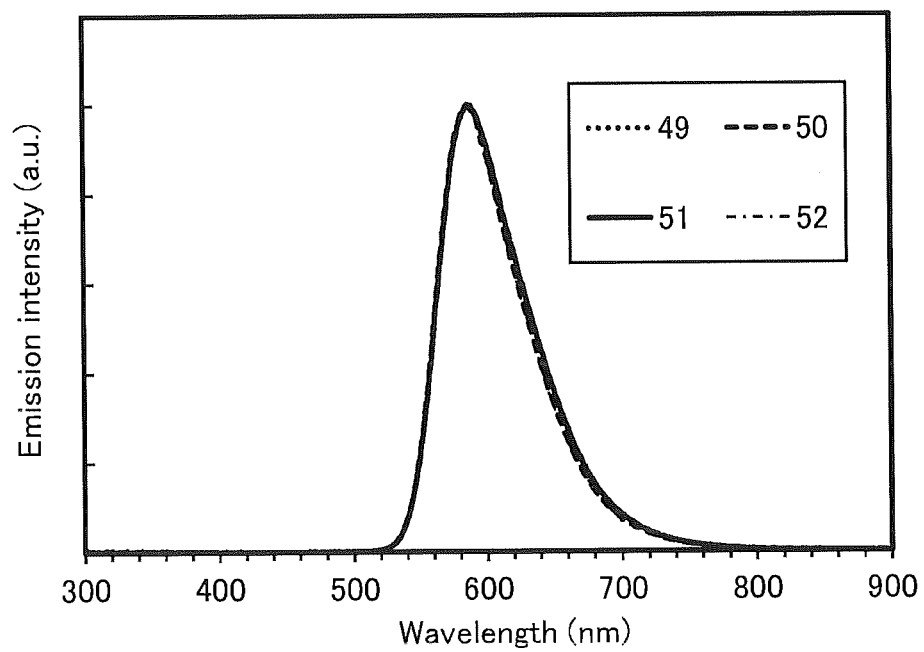
FIG. 84 is a graph showing the emission spectra of the light-emitting device 49, the light-emitting device 50, the light-emitting device 51, and the light-emitting device 52 in Example.

FIG. 79 shows the luminance-current density characteristics of the light-emitting devices 49, 50, 51, and 52. FIG. 80 shows the current efficiency-luminance characteristics thereof. FIG. 81 shows the luminance-voltage characteristics thereof. FIG. 82 shows the current-voltage characteristics thereof. FIG. 83 shows the external quantum efficiency-luminance characteristics thereof. FIG. 84 shows the emission spectrum thereof. Table 30 shows main characteristics of the light-emitting devices at approximately 1000 cd/m$^2$.

TABLE 30

| Light-emitting device | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| 49 | 2.9 | 0.05 | 1.2 | 0.56 | 0.44 | 80.9 | 32.9 |
| 50 | 3.1 | 0.05 | 1.1 | 0.56 | 0.44 | 81.6 | 32.3 |
| 51 | 3.1 | 0.04 | 1.1 | 0.56 | 0.44 | 84.7 | 34.6 |
| 52 | 3.6 | 0.05 | 1.3 | 0.56 | 0.44 | 81.2 | 32.1 |

The light-emitting device 49 is a light-emitting device of one embodiment of the present invention including, as part of the electron-transport layer, a layer containing 75 vol % of calcium fluoride, which is a fluoride of an alkaline earth metal, and 25 vol % of BPhen, which is an organic compound. The light-emitting device 51 is a light-emitting device of one embodiment of the present invention including, as part of the electron-transport layer, a layer containing 75 vol % of magnesium fluoride, which is a fluoride of an alkaline earth metal, and 25 vol % of BPhen, which is an organic compound.

From FIG. 79 to FIG. 83 and Table 30, the light-emitting device 49 was found to be a light-emitting device with a low driving voltage and high external quantum efficiency as compared with the light-emitting device 50. Similarly, the light-emitting device 51 was found to be a light-emitting device with a low driving voltage and high external quantum efficiency as compared to the light-emitting device 52. Thus, it was found that a device with good characteristics can be obtained even with the use of calcium fluoride or magnesium fluoride, which is a fluoride of an alkaline earth metal, instead of lithium fluoride, which is a fluoride of an alkali metal.

Example 10

In this example, a light-emitting device 53, a light-emitting device 54, a light-emitting device 55, and a light-emitting device 56 were fabricated and the results of examining the structure and effect of one embodiment of the present invention are described. The structural formulae of the organic compounds used in the light-emitting device 53 to the light-emitting device 56 are shown below.

[Chemical Formulae 14]

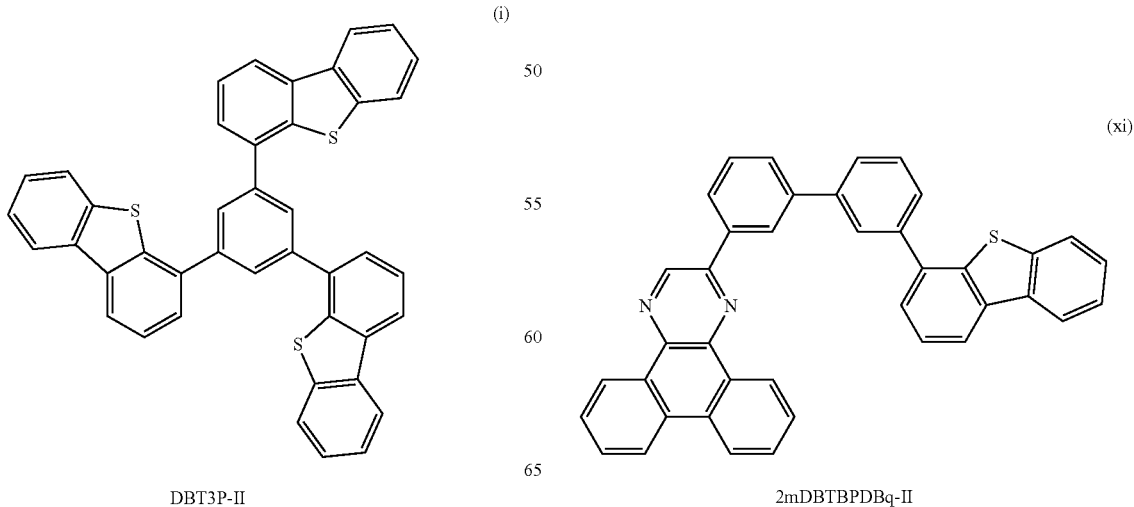

(i) DBT3P-II (x) BPAFLP (xi) 2mDBTBPDBq-II

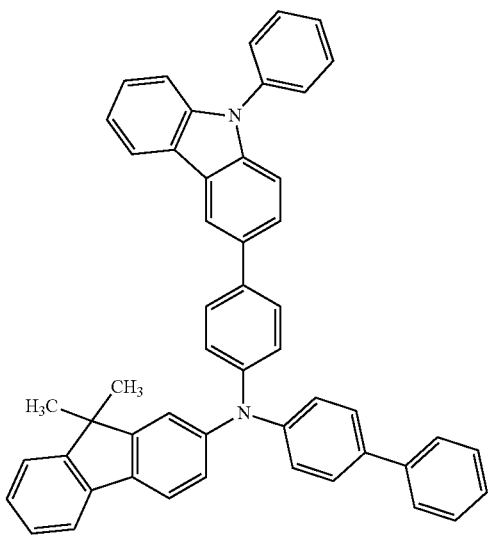

PCBBiF

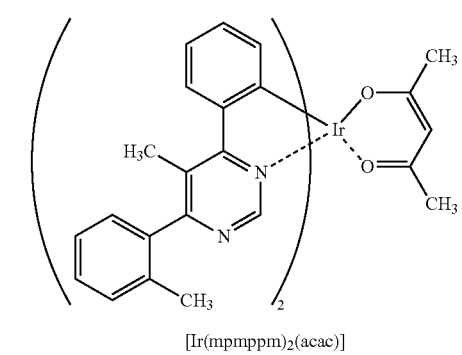

[Ir(mpmppm)₂(acac)]

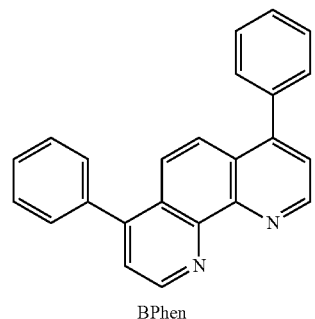

BPhen

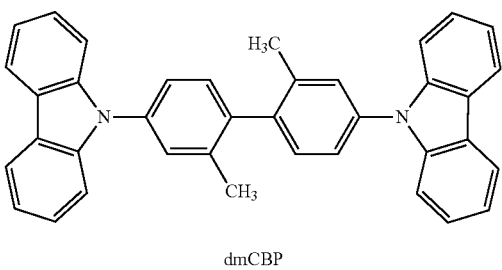

dmCBP

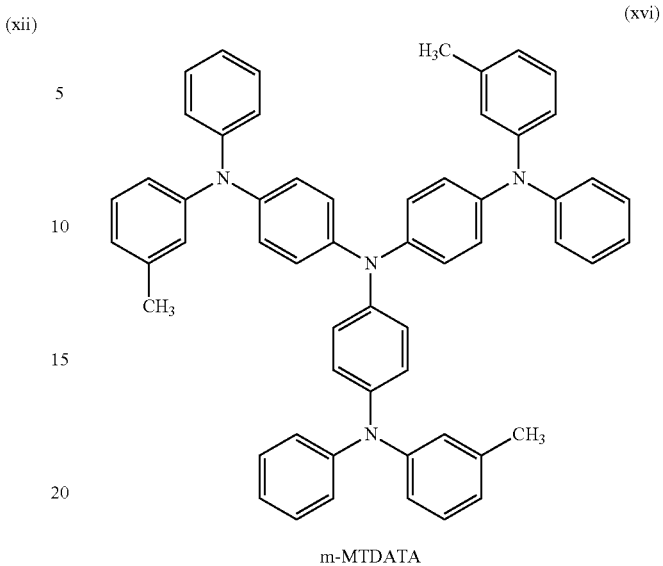

m-MTDATA (Method for Fabricating Light-Emitting Device 53 to Light-Emitting Device 56)

First, a film of indium tin oxide containing silicon oxide (ITSO) was deposited on a glass substrate by a sputtering method, so that an anode 401 was formed. Note that the thickness was 70 nm and the area of the electrode was 2 mm×2 mm.

Next, in pretreatment for forming a light-emitting device over the substrate, the surface of the substrate was washed with water and baked at 200° C. for one hour, and then UV ozone treatment was performed for 370 seconds.

After that, the substrate was transferred into a vacuum evaporation apparatus in which the pressure was reduced to about $10^{-4}$ Pa, vacuum baking at 170° C. for 30 minutes was performed in a heating chamber in the vacuum evaporation apparatus, and then the substrate was naturally cooled down for about 30 minutes.

Next, the substrate on which the anode 401 was formed was fixed to a substrate holder provided in the vacuum evaporation apparatus such that the surface on which the anode 401 was formed faced downward, and the hole-injection layer 411 was formed over the anode 401. For the light-emitting device 53 and the light-emitting device 54, 4,4',4"-(benzene-1,3,5-triyl)tri(dibenzothiophene) (abbreviation: DBT3P-II) represented by Structural Formula (i) shown above and molybdenum oxide were deposited by co-evaporation to a thickness of 60 nm at a weight ratio of 2:1 (=DBT3P-II: molybdenum oxide) by an evaporation method using resistance heating, so that the hole-injection layer 411 was formed. For the light-emitting device 55 and the light-emitting device 56, 4,4'-bis(9-carbazolyl)-2,2'-dimethyl-biphenyl (abbreviation: dmCBP) represented by Structural Formula (xv) shown above and molybdenum oxide were deposited by co-evaporation to a thickness of 5 nm at a weight ratio of 2:0.5 dmCBP: MoO₃), and then 4,4',4"-tris[N-(3-methylphenyl)-N-phenylamino]triphenylamine (abbreviation: m-MTDATA) represented by Structural Formula (xvi) shown above, calcium fluoride, and molybdenum oxide were deposited by co-evaporation at a weight ratio of 1:2.5:0.5 m-MTDATA: CaF₂: MoO₃), and lastly dmCBP and molybdenum oxide were deposited by co-evaporation to a thickness of 5 nm at a weight ratio of 2:0.5 dmCBP: MoO₃), so that the hole-injection layer 411 was formed.

After that, 4-phenyl-4'-(9-phenylfluoren-9-yl)triphenylamine (abbreviation: BPAFLP) represented by Structural Formula (x) shown above was deposited by evaporation to a thickness of 15 nm over the hole-injection layer 411 to form the hole-transport layer 412.

Subsequently, 2-[3'-(dibenzothiophen-4-yl)biphenyl-3-yl]dibenzo[f,h]quinoxaline (abbreviation: 2mDBTBPDBq-II) represented by Structural Formula (xi) shown above, N-(1,1'-biphenyl-4-yl)-9,9-dimethyl-N-[4-(9-phenyl-9H-carbazol-3-yl)phenyl]-9H-fluoren-2-amine (abbreviation: PCB- After the formation of the electron-transport layer 414, lithium fluoride was deposited by evaporation to a thickness of 1 nm to form an electron-injection layer 415 for the light-emitting device 53 and the light-emitting device 55.

Lastly, aluminum was deposited by evaporation to a thickness of 200 nm to form a cathode 402 for the light-emitting device 53 to the light-emitting device 56, whereby the light-emitting device 53 to the light-emitting device 56 were fabricated. The structures of the light-emitting device 53 to the light-emitting device 56 are listed in the tables below.

TABLE 31

| Light-emitting device | Hole-injection layer 60 nm | Hole-transport layer 15 nm | Light-emitting layer | | Electron-transport layer | Electron-injection layer 1 nm |
|---|---|---|---|---|---|---|
| | | | 20 nm | 20 nm | | |
| 53 | *1 | BPAFLP | 2mDBTBPDBq-II:PCBBiF:Ir(mpmppm)₂(acac) (0.7:0.3:0.05) | 2mDBTBPDBq-II:PCBBiF:Ir(mpmppm)₂(acac) (0.8:0.2:0.05) | *2 | LiF |
| 54 | | | | | | — |
| 55 | | | | | | LiF |
| 56 | | | | | | — |

TABLE 32

| Light-emitting device | *1 Hole-injection layer | | | *2 Electron-transport layer | | |
|---|---|---|---|---|---|---|
| | 60 nm | | | 10 nm | 5 nm | — |
| 53 | DBT3P-II:MoO₃ (2:1) | | | 2mDBTBPDBq-II | BPhen | BPhen 25 nm |
| 54 | | | | | | LiF:BPhen (0.75:0.25(vol %)) 30 nm |
| 55 | dmCBP:MoO₃ (2:0.5) 5 nm | m-MTDATA:CaF₂:MoOx (1:2.5:0.5(wt %)) 50 nm | dmCBP:MoO₃ (2:0.5) 5 nm | | | BPhen 25 nm |
| 56 | | | | | | LiF:BPhen (0.75:0.25(vol %)) 30 nm |

BiF) represented by Structural Formula (xii) shown above, and bis{2-[5-methyl-6-(2-methylphenyl)-4-pyrimidinyl-κN³]phenyl-κC}(2,4-pentanedionato-κ²O,O')iridium(III) (abbreviation: Ir(mpmppm)₂(acac)) represented by Structural Formula (xiv) shown above were deposited by co-evaporation to a thickness of 20 nm at a weight ratio of 0.7:0.3:0.05 (=2mDBTBPDBq-II: PCBBiF: Ir(mpmppm)₂(acac)), and then deposited by co-evaporation to a thickness of 20 nm at a weight ratio of 0.8:0.2:0.05 (=2mDBTBPDBq-II: PCBBiF: Ir(mpmppm)₂(acac)), so that the light-emitting layer 413 was formed.

Furthermore, 2mDBTBPDBq-II was deposited by evaporation over the light-emitting layer 413 to a thickness of 10 nm to form a first electron-transport layer, and then bathophenanthroline (abbreviation: BPhen) represented by Structural Formula (v) shown above was deposited by evaporation to a thickness of 5 nm to form a second electron-transport layer. In addition, as a third electron-transport layer, BPhen was deposited by evaporation to a thickness of 25 nm for the light-emitting device 53 and the light-emitting device 55, and lithium fluoride and BPhen were deposited by co-evaporation to a thickness of 30 nm at a volume ratio of 0.75:0.25 (=LiF: BPhen) for the light-emitting device 54 and the light-emitting device 56. Thus, the electron-transport layer 414 was formed.

Each of the light-emitting device 53 to the light-emitting device 56 was subjected to sealing with a glass substrate (a sealing material was applied to surround the device, followed by UV treatment and one-hour heat treatment at 80° C. at the time of sealing) in a glove box containing a nitrogen atmosphere so that the light-emitting device is not exposed to the air. Then, initial characteristics of these light-emitting devices were measured. Note that the measurement was carried out at room temperature (an atmosphere maintained at 25° C.).

Figure 85:
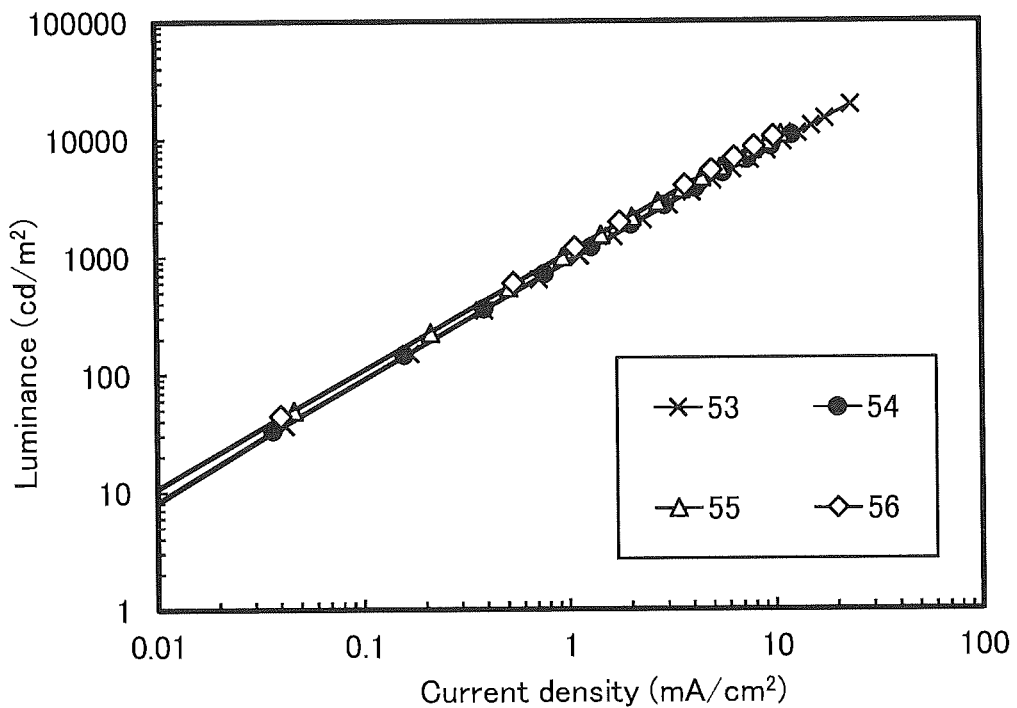
FIG. 85 is a graph showing the luminance-current density characteristics of a light-emitting device 53 to a light-emitting device 56 in Example.
Figure 86:
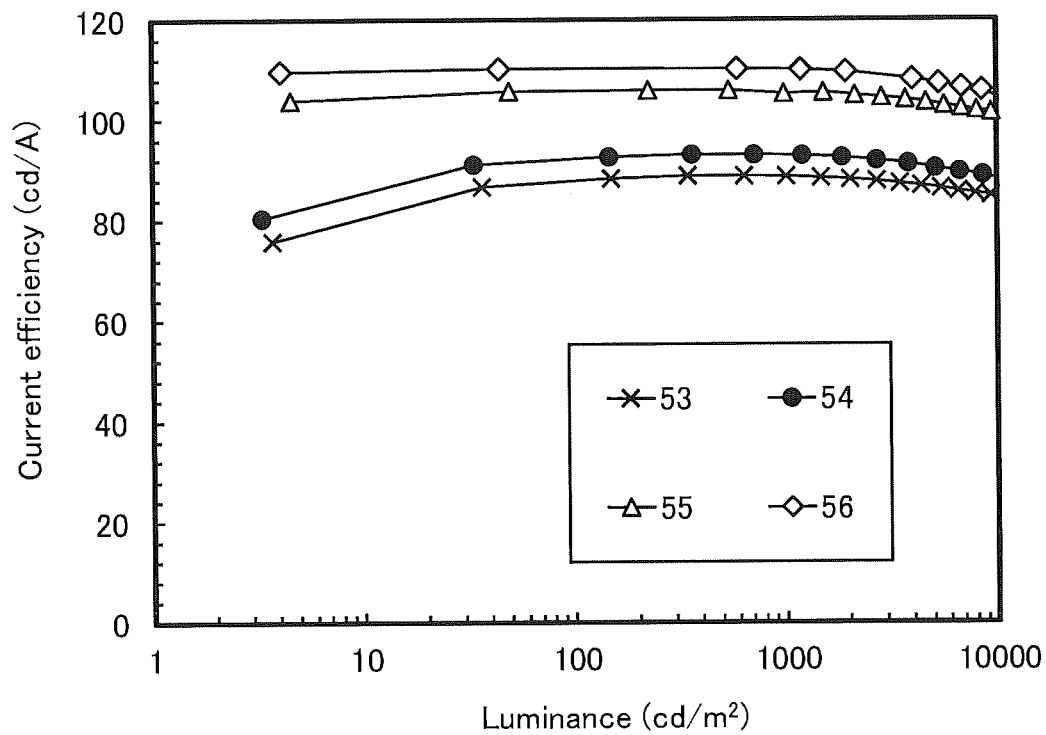
FIG. 86 is a graph showing the current efficiency-luminance characteristics of the light-emitting device 53 to the light-emitting device 56 in Example.
Figure 87:
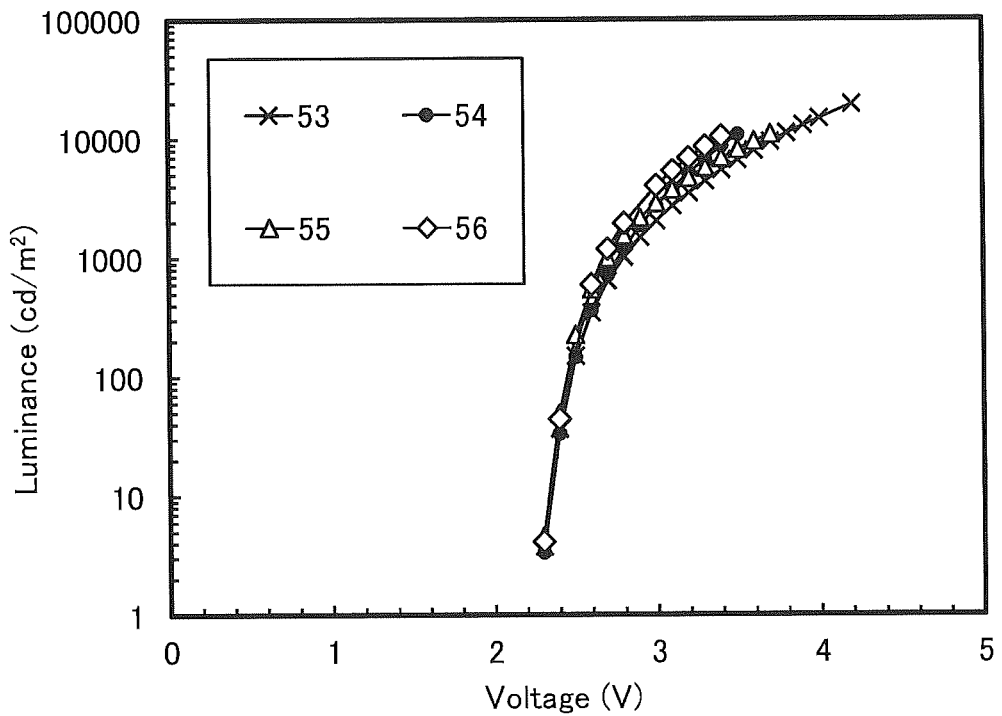
FIG. 87 is a graph showing the luminance-voltage characteristics of the light-emitting device 53 to the light-emitting device 56 in Example.
Figure 88:
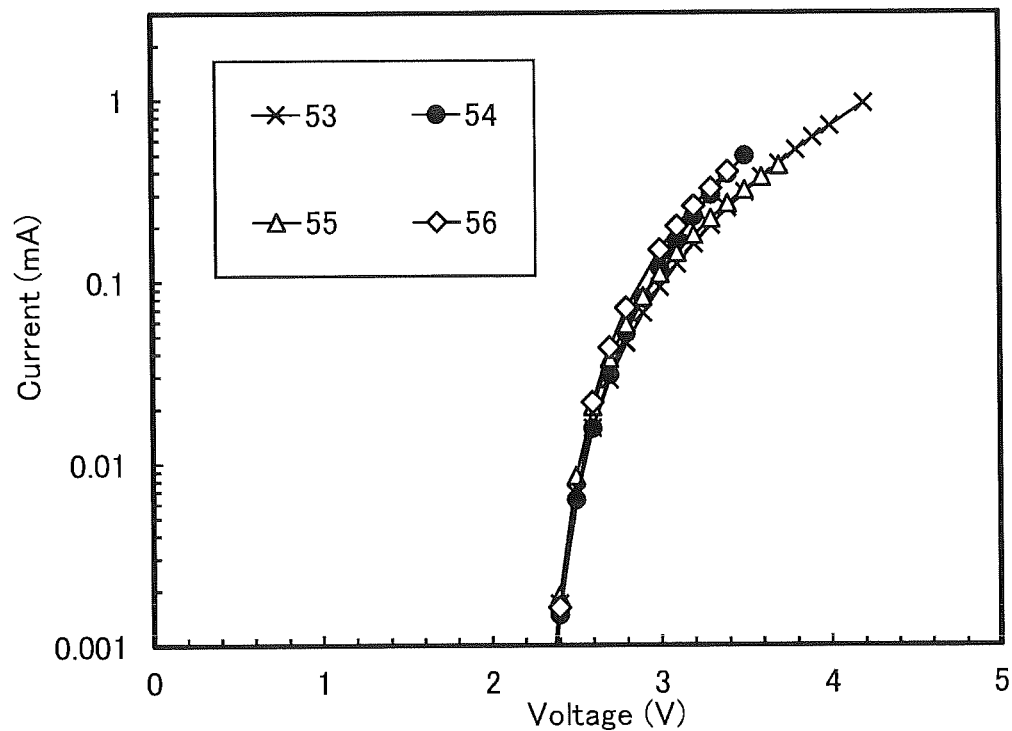
FIG. 88 is a graph showing the current-voltage characteristics of the light-emitting device 53 to the light-emitting device 56 in Example.
Figure 89:
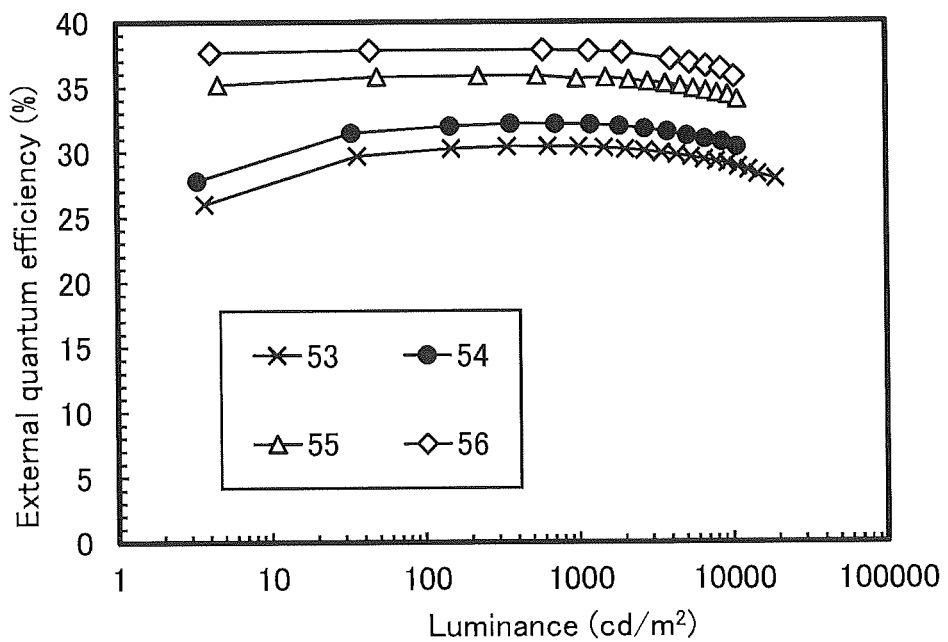
FIG. 89 is a graph showing the external quantum efficiency-luminance characteristics of the light-emitting device 53 to the light-emitting device 56 in Example.
Figure 90:
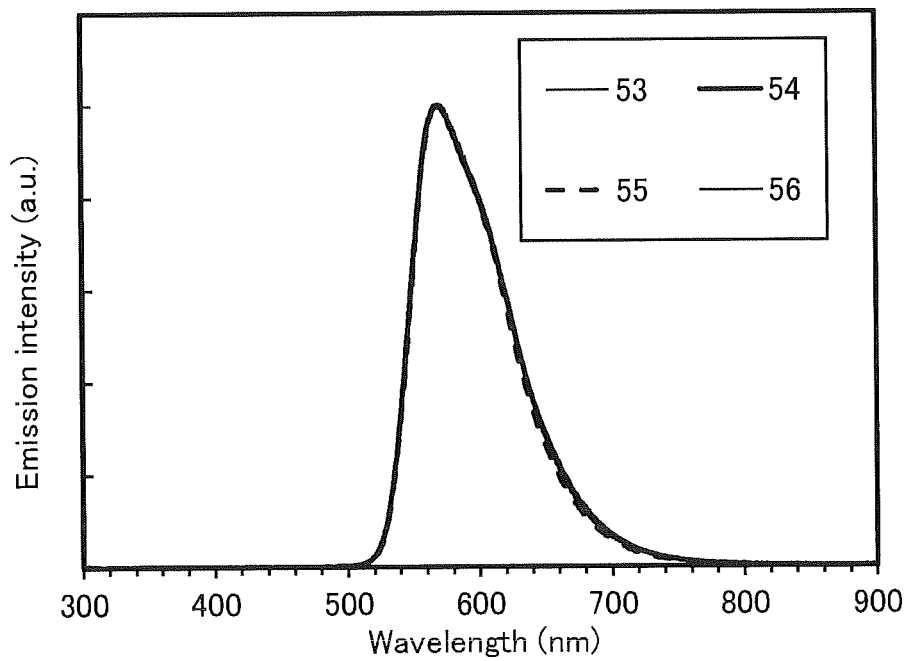
FIG. 90 is a graph showing the emission spectra of the light-emitting device 53 to the light-emitting device 56 in Example.
Figure 91:
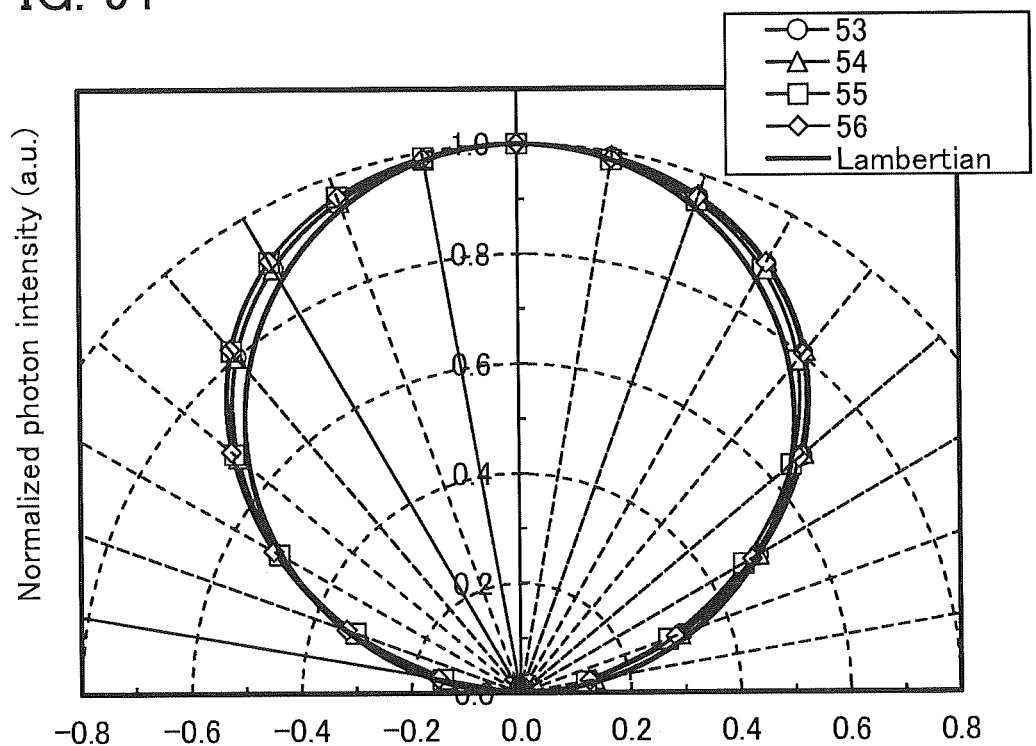
FIG. 91 is a diagram showing the viewing angle dependences of the light-emitting device 53 to the light-emitting device 56 in Example.

FIG. 85 shows the luminance-current density characteristics of the light-emitting device 53 to the light-emitting device 56. FIG. 86 shows the current efficiency-luminance characteristics thereof. FIG. 87 shows the luminance-voltage characteristics thereof. FIG. 88 shows the current-voltage characteristics thereof. FIG. 89 shows the external quantum efficiency-luminance characteristics thereof. FIG. 90 shows the emission spectrum thereof. FIG. 91 shows the viewing angle characteristics thereof. Table 33 shows main characteristics of the light-emitting devices at approximately 1000 cd/m².

TABLE 33

| Light-emitting device | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| 53 | 2.8 | 0.05 | 1.1 | 0.52 | 0.48 | 88.7 | 30.5 |
| 54 | 2.8 | 0.05 | 1.3 | 0.52 | 0.48 | 92.9 | 32.2 |
| 55 | 2.6 | 0.02 | 0.5 | 0.52 | 0.48 | 105.9 | 35.5 |
| 56 | 2.7 | 0.04 | 1.1 | 0.52 | 0.48 | 110.0 | 37.8 |

The light-emitting device 53 is a comparative light-emitting device which does not include a layer with a low refractive index in the EL layer. The light-emitting device 54 is a light-emitting device of one embodiment of the present invention, which includes a layer with a low refractive index in the electron-transport layer. The light-emitting device 55 is a reference light-emitting device which includes a layer with a low refractive index in the hole-injection layer. The light-emitting device 56 is a light-emitting device of one embodiment of the present invention, which includes a layer with a low refractive index in the hole-injection layer and the electron-transport layer.

Since these light-emitting devices include layers with different refractive indices, the optical path lengths were adjusted such that the optical distances become equal. Because of the adjustment of the optical path lengths, the emission spectra and viewing angle characteristics of the four kinds of light-emitting devices were all the same as can be seen from FIG. 90 and FIG. 91. The optical distances in EL are considered equal, based on the results. Thus, it is possible to compare the efficiencies of the light-emitting device 53 to the light-emitting device 56 highly accurately.

For external quantum efficiency, the value obtained by correcting deviation with respect to Lambertian distribution after measuring the angular dependency of an emission spectrum is adopted. Table 33 shows an external quantum efficiency of 30.5% for the light-emitting device 53, which is a comparative light-emitting device. Considering that the light extraction efficiency of light-emitting devices is usually reported to be 25 to 30%, the external quantum efficiency of the light-emitting device 53 is a sufficiently high value, but the external quantum efficiency of the light-emitting device 54 to the light-emitting device 56 was higher than that.

The light-emitting device 54, which is a light-emitting device of one embodiment of the present invention using a layer with a low refractive index in the electron-transport layer, exhibited an external quantum efficiency of 32.2%, which is 1.06 times that of the light-emitting device 53. The light-emitting device 55, which is a reference light-emitting device using a layer with a low refractive index in the hole-injection layer, exhibited an external quantum efficiency of 35.3%, which is 1.16 times that of the light-emitting device 53. The light-emitting device 56, which is a light-emitting device of one embodiment of the present invention using a layer with a low refractive index in both the electron-transport layer and the hole-injection layer, exhibited an external quantum efficiency of 38.1%, which is 1.25 times that of the light-emitting device 53. In other words, it was demonstrated that lowering the reflective index of injection layers enables light-emitting devices with high external quantum efficiency to be obtained.

FIG. 88 shows that the current-voltage characteristics of the light-emitting devices 54 to 56 in which a layer with a low refractive index was introduced were almost the same as those of the light-emitting device 53. In addition, the driving voltage at approximately 1000 cd/m$^2$ was very low, being around 2.7 to 2.8 V. The carrier injection layers and transport layers with a low refractive index we developed were found to have high charge-injection properties and transport properties.

Figure 92:
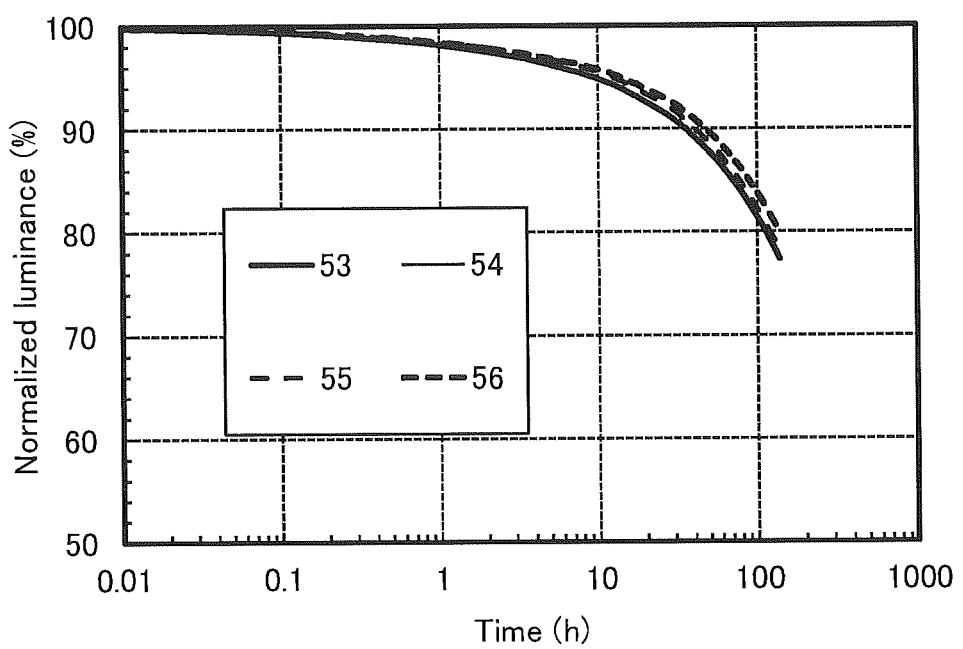
FIG. 92 is a graph showing the normalized luminance-temporal change characteristics of the light-emitting device 53 to the light-emitting device 56 in Example.

The results of reliability tests conducted with a constant current density (50 mA/cm$^2$) are shown in FIG. 92. The light-emitting devices 54 to 56 in which a layer with a low refractive index was introduced had performance equivalent to that of the light-emitting device 53, which confirmed the fact that the layer with a low refractive index of one embodiment of the present invention does not deteriorate the reliability of light-emitting devices. From the above results, the light-emitting device of one embodiment of the present invention was found to have not only high emission efficiency but also superior driving voltage and reliability.

Figure 93:
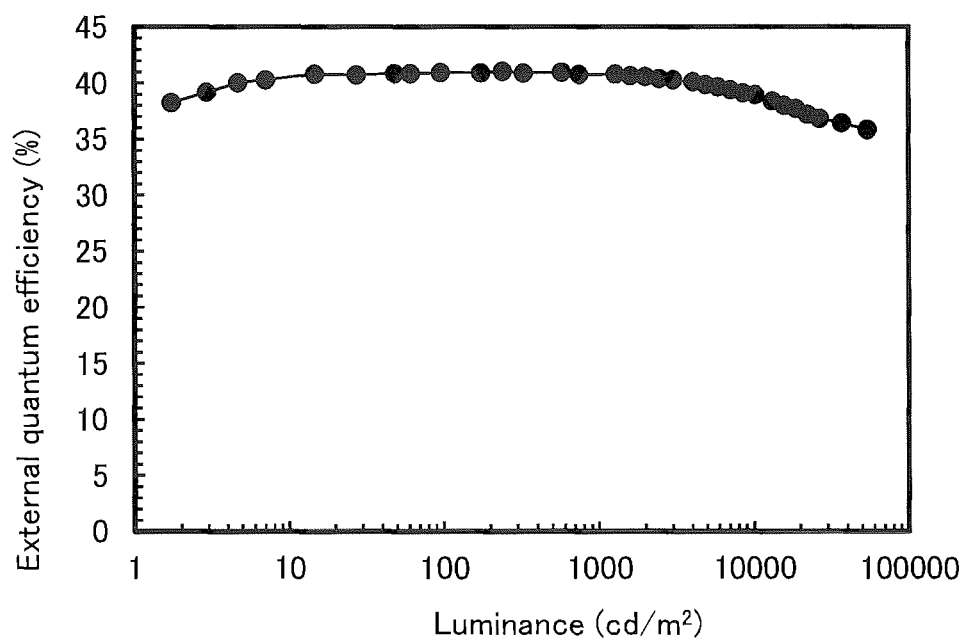
FIG. 93 is a graph showing the external quantum efficiency-luminance characteristics of a light-emitting device 57 in Example.

The light-emitting device 57, which was obtained by changing the material and thickness of the hole-injection layer of the light-emitting device 56, was found to have very high efficiency, external quantum efficiency exceeding 40%, as shown in FIG. 93.

The hall-injection layer of the light-emitting device 57 was formed in the following manner: dmCBP and molybdenum oxide were deposited by co-evaporation to a thickness of 5 nm at a weight ratio of 2:0.5 (=dmCBP: MoO$_3$), and then, 1,1-bis-[4-bis(4-methyl-phenyl)-amino-phenyl]-cyclohexane (abbreviation: TAPC) represented by Structural Formula (xvii) shown below, calcium fluoride, and molybdenum oxide were deposited by co-evaporation to a thickness of 50 nm at a weight ratio of 0.5:4:0.5 (=TAPC: CaF$_2$: MoO$_3$), and then, dmCBP and molybdenum oxide were deposited by co-evaporation to a thickness of 7 nm at a weight ratio of 2:0.5 (=dmCBP: MoO$_3$). The structural formula of TAPC is shown below.

[Chemical Formula 15]

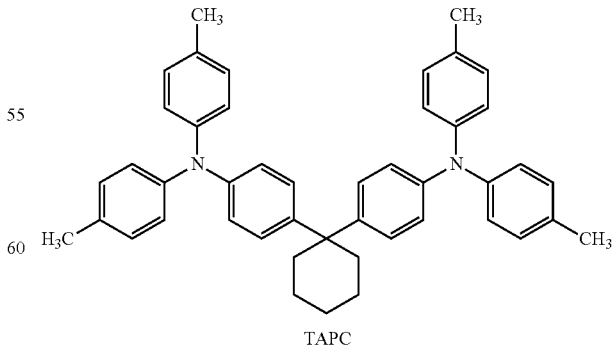

(xvii)

TAPC

The structure of the hole-injection layer of the light-emitting device 57 is shown in Table 34.

TABLE 34

| | Hole-injection layer | | |
|---|---|---|---|
| Thickness | 5 nm | 50 nm | 7 nm |
| Material | dmCBP:MoO$_3$ | TAPC:CaF$_2$:MoO$_3$ | dmCBP:MoO$_3$ |
| Mixture ratio | 2:0.5 | 0.5:4:0.5 | 2:0.5 |

As described above, the light-emitting device of one embodiment of the present invention can be a light-emitting device having very high efficiency, the external quantum efficiency being 40% or higher.

Example 11

In this example, ESR measurement results and absorbance measurement results of thin films of one embodiment of the present invention are described.

<Fabrication of Thin Films for Measurement>

The methods of fabricating thin films for the measurement are described below.

As a thin film 1, BPhen and LiF were deposited over a quartz substrate by vacuum evaporation at a volume ratio (BPhen: LiF) of 0.75:0.25 to a thickness of 50 nm. Subsequently, aluminum was deposited by evaporation to a thickness of 200 nm.

In a similar manner, a thin film 2 to a thin film 4 were formed. The structures of the thin film 1 to the thin film 4 are shown in Table 35. Thus, the fabrication methods of the thin film 2 to the thin film 4 are omitted.

TABLE 35

| | Thin film 1 | | Thin film 2 | | Thin film 3 | | Thin film 4 |
|---|---|---|---|---|---|---|---|
| Thickness (nm) | 50 | 200 | 50 | 200 | 50 | 200 | 50 |
| Material | BPhen:LiF | Al | BPhen:LiF | Al | BPhen:LiF | Al | BPhen:LiF |
| Mixture ratio (volume ratio) | 0.75:0.25 | — | 0.5:0.5 | — | 0.25:0.75 | — | 0.25:0.75 |

<ESR Measurement>

The ESR was measured with an electron spin resonance spectrometer (E500, produced by Hitachi High-Technologies Corporation). The measurement conditions were as follows. The measurement temperature was room temperature (23° C.); 1 mW of high-frequency power (microwave power) with 9.2 GHz was applied; and the direction of a magnetic field was parallel to the surface of the thin film.

Figure 94:
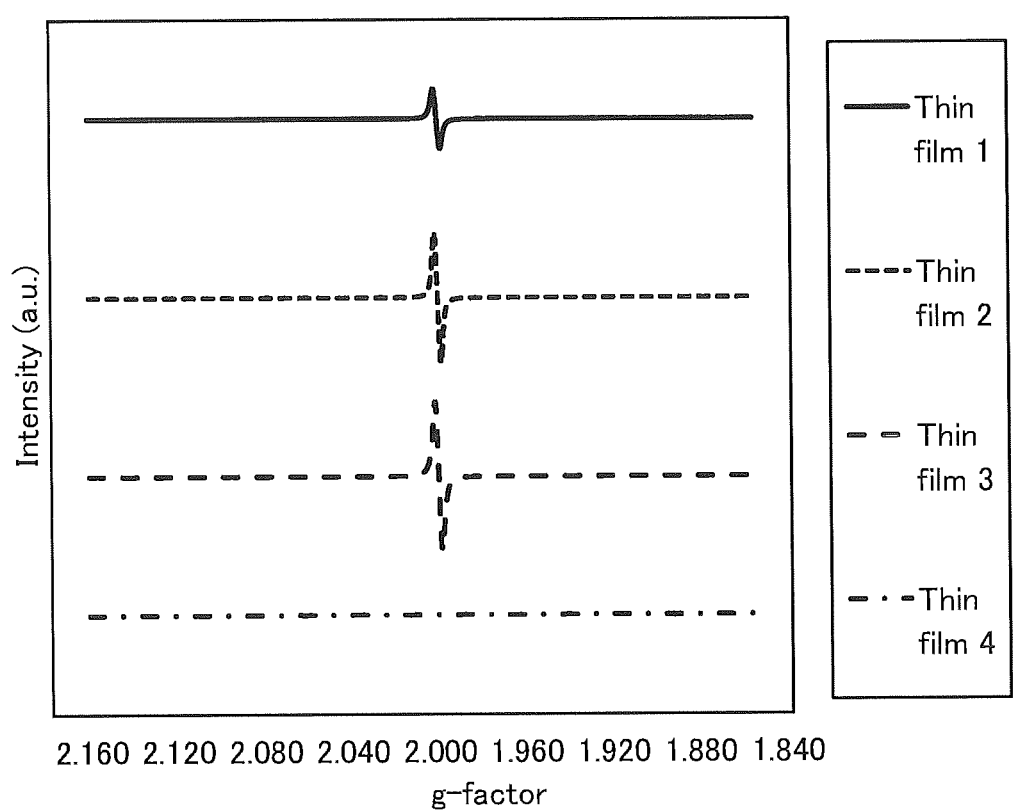
FIG. 94 is a graph for explaining ESR measurement results in Example.

FIG. 94 shows first derivative curves of the ESR measurement results of the thin film 1 to the thin film 4. As shown in FIG. 94, a signal was observed at around g-factor of 2.163 for each of the thin film 1 to the thin film 3. In contrast, no signal was observed for the thin film 4. Accordingly, it is found that LiF and Al being in contact with each other lead to the generation of an electron spin in a mixed film of BPhen and LiF. As for the thin film 2 and the thin film 3, the generation of an electron spin in a mixed film of BPhen and LiF due to the microcrystal of LiF and Al being in contact with each other is indicated.

The spin amounts and spin densities in the thin film 1 to the thin film 4 are shown in Table 36.

TABLE 36

| | Spin amount (spins) | Spin density (spins/cm$^3$) |
|---|---|---|
| Thin film 1 | 1.4E+14 | 1.2E+19 |
| Thin film 2 | 2.2E+14 | 1.8E+19 |

TABLE 36-continued

| | Spin amount (spins) | Spin density (spins/cm$^3$) |
|---|---|---|
| Thin film 3 | 3.4E+14 | 2.9E+19 |
| Thin film 4 | 0.0 | 0.0 |

From FIG. 94 and Table 35, the thin film 1 to the thin film 3 each have a spin density of $1 \times 10^{19}$ spins/cm$^3$ or more. The results indicate that the thin film 1 to the thin film 3 have become n-type. From this, the thin film 1 to the thin film 3 are found to have an electron-injection property. Thus, the thin film 1 to the thin film 3 were each found to be suitably usable as an electron-injection layer of a light-emitting device. In addition, from Table 35, it was found that the spin amount and the spin density increase as the mixed amount of LiF increases. Thus, it is found that the increase in the mixed amount of LiF improves the electron-injection property. This does not contradict the results of the other examples above.

<Absorbance Measurement>

The absorption spectra of the thin films were measured with a spectrophotometer (U-4100 Spectrophotometer, manufactured by Hitachi High-Technologies Corporation). The measurement was performed at room temperature. The transmittance (T %) and the reflectance (R %) of each thin film were measured, and absorbance was calculated from the following: absorbance=log[T %/(100−R %)]. Note that the measurements of the transmittance and reflectance were conducted after aluminum was peeled off from each thin film. The results are shown in FIG. 95.

Figure 95:
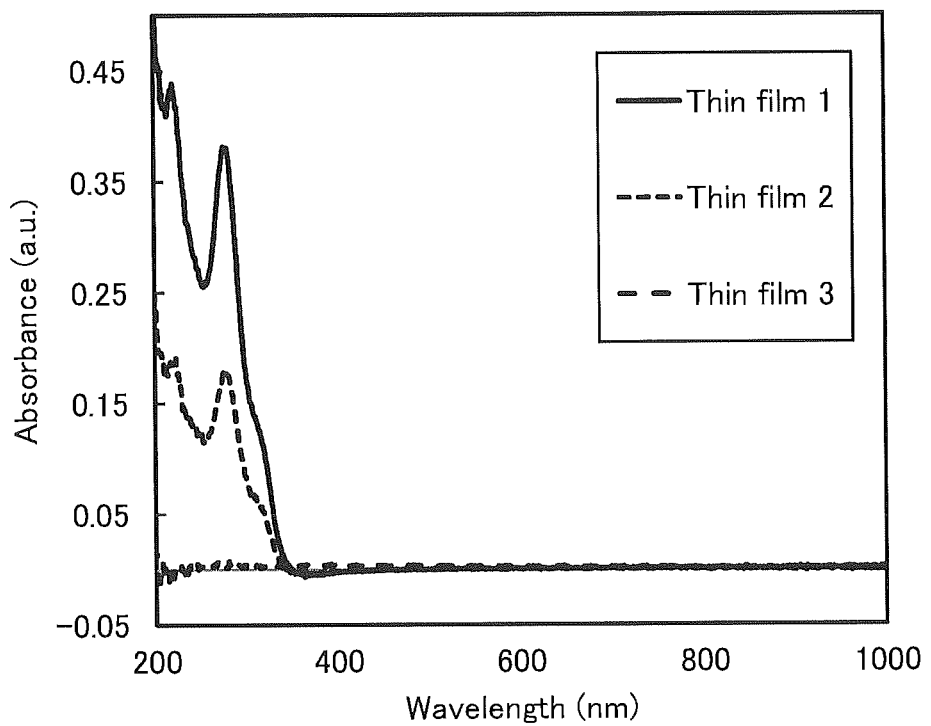
FIG. 95 is a graph for explaining absorbance measurement results in Example.

It was found from FIG. 95 that the thin film 1 to the thin film 3 do not have noticeable absorbance in a visible light region. In other words, it can be said that the thin film 1 to the thin film 3 are thin films with very high transparency. Thus, according to one embodiment of the present invention, a transparent thin film with a low refractive index and a high electron-injection property can be provided. Furthermore, the tendency for the absorbance to decrease as the mixture ratio of LiF increases was found.

DESCRIPTION OF NUMERALS

100: EL layer, 101: electrode, 102: electrode, 103: electrode, 106: light-emitting unit, 108: light-emitting unit, 110: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 121: guest material, 122: host material, 130: light-emitting layer, 131: host material, 131_1: organic compound, 131_2: organic compound, 132: guest material, 140: light-emitting layer, 141: guest material, 142: host material, 142_1: organic compound, 142_2: organic compound, 145: cap layer, 150: light-emitting device, 152: light-emitting device, 154: light-emitting device, 156: light-emitting device, 158: light-emitting device, 160: layer with a low refractive index, 170: light-emitting layer, 200: substrate, 250: light-emitting device, 252: light-emitting device, 310: anode, 311: cathode, 312: EL layer, 313: layer, 314: light-emitting layer, 315: layer, 401: anode, 402: cathode, 403: EL layer, 405: sealing material, 406: sealing material, 411: hole-injection layer, 412: hole-transport layer, 413: light-emitting layer, 414-1: electron-transport layer, 414-2: electron-transport layer, 415: electron-injection layer, 601: source side driver circuit, 602: pixel portion, 603: gate side driver circuit, 604: sealing substrate, 605: sealing material, 607: space, 608: wiring, 610: device substrate, 611: switching TFT, 612: current controlling TFT, 613: electrode, 614: insulator, 616: EL layer, 617: electrode, 618: light-emitting device, 623: n-channel TFT, 624: p-channel TFT, 654: light-emitting device, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1025B: lower electrode, 1025G: lower electrode, 1025R: lower electrode, 1026: partition wall, 1028: EL layer, 1029: electrode, 1031: sealing substrate, 1032: sealing material, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 2001: housing, 2002: light source, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 3001: lighting device, 3054: display portion, 3500: multifunction terminal, 3502: housing, 3504: display portion, 3506: camera, 3508: lighting, 3600: light, 3602: housing, 3608: lighting, 3610: speaker, 4400: substrate, 4401: anode, 4403: EL layer, 4404: cathode, 4405: sealing material, 4406: sealing material, 4407: sealing substrate, 4412: pad, 4420: IC chip, 5000: housing, 5001: display portion, 5002: display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: display portion, 7401: housing, 7402: display portion, 7403: operation button, 7404: external connection port, 7405: speaker, 7406: microphone, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9055: hinge, 9200: portable information terminal, 9201: portable information terminal, 9202: portable information terminal, 9310: portable information terminal, 9311: display panel, 9312: display region, 9313: hinge, 9315: housing This application is based on Japanese Patent Application Serial No. 2017-174456 filed with Japan Patent Office on Sep. 12, 2017, Japanese Patent Application Serial No. 2017-231719 filed with Japan Patent Office on Dec. 1, 2017, Japanese Patent Application Serial No. 2018-037254 filed with Japan Patent Office on Mar. 2, 2018, and Japanese Patent Application Serial No. 2018-096997 filed with Japan Patent Office on May 21, 2018, the entire contents of which are hereby incorporated herein by reference.

The invention claimed is:

1. A light-emitting device comprising:
a first electrode;
a second electrode over the first electrode;
a first layer over and in contact with the second electrode;
a light-emitting layer over the first layer;
a third electrode over the light-emitting layer; and
an organic layer over and in contact with the third electrode,
wherein the first electrode is capable of reflecting light,
wherein the third electrode is capable of reflecting and transmitting light,
wherein the second electrode is capable of transmitting light,
wherein the second electrode has a higher refractive index than the first layer,
wherein the first layer comprises an organic compound and an acceptor material,
wherein the second electrode is a layer of an inorganic material,
wherein an emission spectrum of the light-emitting device has a peak wavelength $\lambda$,
wherein each of the first layer and the light-emitting layer has a first interface on a side of the first electrode and a second interface on a side of the third electrode,
wherein one of an optical path length from the first interface of the light-emitting layer to the first interface of the first layer and an optical path length from the second interface of the light-emitting layer to the first interface of the first layer is less than or equal to $\lambda/2$, and
wherein a refractive index of the first layer is less than or equal to 1.80.

2. The light-emitting device according to claim 1,
wherein the second electrode has a first interface on a side of the first electrode and a second interface on a side of the third electrode,
wherein an optical path length from one of the first interface and the second interface of the light-emitting layer to the second interface of the second electrode is greater than or equal to $\lambda/4-50$ nm and less than or equal to $\lambda/4+50$ nm, and
wherein an optical path length from one of the first interface and the second interface of the light-emitting layer to the first interface of the second electrode is greater than or equal to $3\lambda/4-50$ nm and less than or equal to $3\lambda/4+50$ nm.

3. The light-emitting device according to claim 1, wherein the first layer has a thickness of greater than or equal to 5 nm.

4. The light-emitting device according to claim 1, wherein the first electrode is an anode and the third electrode is a cathode.

5. The light-emitting device according to claim 1, wherein the first layer has a lower refractive index less than or equal to 1.70.

6. The light-emitting device according to claim 1, wherein the second electrode is conductive.

7. The light-emitting device according to claim 1, wherein the first layer is a hole-injection layer.

8. An electronic device comprising:
the light-emitting device according to claim 1; and
one of a sensor, an operation button, a speaker and a microphone.

9. A light-emitting apparatus comprising:
the light-emitting device according to claim 1; and
one of a transistor and a substrate.

10. A lighting device comprising:
the light-emitting apparatus according to claim 9; and
a housing.

11. A light-emitting device comprising:
a first electrode;
a second electrode over the first electrode;
a first layer over and in contact with the second electrode;
a light-emitting layer over the first layer;
a third electrode over the light-emitting layer; and
an organic layer over and in contact with the third electrode,
wherein the first electrode is capable of reflecting light,
wherein the third electrode is capable of reflecting and transmitting light,
wherein the second electrode is capable of transmitting light,
wherein the second electrode has a higher refractive index than the first layer,
wherein the first layer comprises an organic compound and an acceptor material,
wherein the second electrode is a layer of an inorganic material,
wherein an emission spectrum of the light-emitting device has a peak wavelength $\lambda$,
wherein the light-emitting layer has a first interface on a side of the first electrode and a second interface on a side of the third electrode,
wherein one of an optical path length from the first interface of the light-emitting layer to the first layer and an optical path length from the second interface of the light-emitting layer to the first layer is less than or equal to $\lambda/2$,
wherein the first layer comprises a first organic compound, and
wherein a refractive index of the first organic compound is less than or equal to 1.80.

12. The light-emitting device according to claim 11,
wherein the second electrode has a first interface on a side of the first electrode and a second interface on a side of the third electrode,
wherein an optical path length from one of the first interface and the second interface of the light-emitting layer to the second interface of the second electrode is greater than or equal to $\lambda/4-50$ nm and less than or equal to $\lambda/4+50$ nm, and
wherein an optical path length from one of the first interface and the second interface of the light-emitting layer to the first interface of the second electrode is greater than or equal to $3\lambda/4-50$ nm and less than or equal to $3\lambda/4+50$ nm.

13. The light-emitting device according to claim 11, wherein the first layer has a thickness of greater than or equal to 5 nm.

14. The light-emitting device according to claim 11, wherein the first electrode is an anode and the third electrode is a cathode.

15. The light-emitting device according to claim 11, wherein the first layer has a refractive index less than or equal to 1.70.

16. The light-emitting device according to claim 11, wherein the second electrode is conductive.

17. The light-emitting device according to claim 11, wherein the first layer is a hole-injection layer.

18. An electronic device comprising:
the light-emitting device according to claim 11; and
one of a sensor, an operation button, a speaker and a microphone.

19. A light-emitting apparatus comprising:
the light-emitting device according to claim 11; and
one of a transistor and a substrate.

20. A lighting device comprising:
the light-emitting apparatus according to claim 19; and
a housing.

* * * * *